(12) United States Patent
Pellegrino et al.

(10) Patent No.: US 10,696,428 B2
(45) Date of Patent: Jun. 30, 2020

(54) LARGE-AREA STRUCTURES FOR COMPACT PACKAGING

(71) Applicant: California Institute of Technology, Pasadena, CA (US)

(72) Inventors: Sergio Pellegrino, Pasadena, CA (US); Harry A. Atwater, South Pasadena, CA (US); Seyed Ali Hajimiri, La Canada, CA (US); Manan Arya, Pasadena, CA (US); Christophe Leclerc, Pasadena, CA (US); Nicolas Lee, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 597 days.

(21) Appl. No.: 15/216,596

(22) Filed: Jul. 21, 2016

(65) Prior Publication Data

US 2017/0021947 A1     Jan. 26, 2017

Related U.S. Application Data

(60) Provisional application No. 62/195,605, filed on Jul. 22, 2015, provisional application No. 62/203,159, (Continued)

(51) Int. Cl.
*B64G 1/42* (2006.01)
*H02J 50/20* (2016.01)
(Continued)

(52) U.S. Cl.
CPC .......... *B64G 1/428* (2013.01); *B64G 1/1085* (2013.01); *B64G 1/222* (2013.01); *B64G 1/443* (2013.01);
(Continued)

(58) Field of Classification Search
CPC .......... B64G 1/428; B64G 1/288; B64G 1/36; B64G 1/1085; B64G 1/66; B64G 1/443;
(Continued)

(56) References Cited

U.S. PATENT DOCUMENTS 2,599,944 A   6/1952  Salisbury et al.
3,152,260 A  10/1964  Cummings
(Continued)

FOREIGN PATENT DOCUMENTS

CA   2833826 A1  11/2012
CA   2833862 A1   5/2014
(Continued)

OTHER PUBLICATIONS

International Search Report and Written Opinion for International Application No. PCT/US2015/030895, completed Nov. 27, 2015, dated Nov. 30, 2015,14 Pgs.
(Continued)

*Primary Examiner* — Assres H Woldemaryam
(74) *Attorney, Agent, or Firm* — KPPB LLP

(57) ABSTRACT

A space-based solar power station, a power generating satellite module and/or a method for collecting solar radiation and transmitting power generated using electrical current produced therefrom, and/or compactible structures and deployment mechanisms used to form and deploy such satellite modules and power generation tiles associated therewith are provided. Each satellite module and/or power generation tile may be formed of a compactable structure and deployment mechanism capable of reducing the payload area required to deliver the satellite module to an orbital formation within the space-based solar power station and reliably deploy it once in orbit.

23 Claims, 76 Drawing Sheets

Related U.S. Application Data filed on Aug. 10, 2015, provisional application No. 62/220,017, filed on Sep. 17, 2015, provisional application No. 62/239,706, filed on Oct. 9, 2015, provisional application No. 62/264,500, filed on Dec. 8, 2015, provisional application No. 62/268,632, filed on Dec. 17, 2015, provisional application No. 62/270,425, filed on Dec. 21, 2015, provisional application No. 62/294,859, filed on Feb. 12, 2016, provisional application No. 62/295,947, filed on Feb. 16, 2016, provisional application No. 62/320,819, filed on Apr. 11, 2016, provisional application No. 62/330,341, filed on May 2, 2016, provisional application No. 62/340,644, filed on May 24, 2016.

(51) Int. Cl.

| | | |
|---|---|---|
| *H02J 3/38* | (2006.01) | |
| *H01L 31/042* | (2014.01) | |
| *H02S 10/40* | (2014.01) | |
| *H02S 30/20* | (2014.01) | |
| *B64G 1/10* | (2006.01) | |
| *B64G 1/22* | (2006.01) | |
| *B64G 1/44* | (2006.01) | |
| *B64G 1/66* | (2006.01) | |
| *B65B 63/04* | (2006.01) | |
| *B64G 1/36* | (2006.01) | |
| *B64G 1/28* | (2006.01) | |

(52) U.S. Cl.
CPC ............... *B64G 1/66* (2013.01); *B65B 63/04* (2013.01); *H01L 31/042* (2013.01); *H02J 3/383* (2013.01); *H02J 50/20* (2016.02); *H02S 10/40* (2014.12); *H02S 30/20* (2014.12); *B64G 1/288* (2013.01); *B64G 1/36* (2013.01); *Y02E 10/563* (2013.01)

(58) Field of Classification Search
CPC ........ B64G 1/222; H01L 31/042; H02J 50/20; H02J 3/383; B65B 63/04; H02S 10/40; H02S 30/20; Y02E 10/563
See application file for complete search history.

(56) References Cited

U.S. PATENT DOCUMENTS

| | | | |
|---|---|---|---|
| 3,419,433 A | 12/1968 | Slifer, Jr. | |
| 3,427,200 A | 2/1969 | Lapin et al. | |
| 3,433,677 A | 3/1969 | Robinson et al. | |
| 3,437,527 A | 4/1969 | Webb | |
| 3,457,427 A | 7/1969 | Tarneja et al. | |
| 3,489,915 A | 1/1970 | Engelhardt et al. | |
| 3,530,009 A | 9/1970 | Linkous et al. | |
| 3,532,299 A | 10/1970 | Williamson et al. | |
| 3,562,020 A | 2/1971 | Blevins | |
| 3,611,652 A | 10/1971 | Rabenhorst et al. | |
| 3,616,528 A | 11/1971 | Goldsmith et al. | |
| 3,627,585 A | 12/1971 | Dollery et al. | |
| 3,636,539 A | 1/1972 | Gaddy | |
| 3,698,958 A | 10/1972 | Williamson et al. | |
| 3,730,457 A | 5/1973 | Williams et al. | |
| 3,735,943 A | 5/1973 | Fayet et al. | |
| 3,758,051 A | 9/1973 | Williams | |
| 3,781,647 A | 12/1973 | Glaser | |
| 3,785,590 A | 1/1974 | Wentworth | |
| 3,793,082 A | 2/1974 | Roger | |
| 3,805,622 A | 4/1974 | Kinard | |
| 3,809,337 A | 5/1974 | Andrews et al. | |
| 3,817,477 A | 6/1974 | Luther et al. | |
| 3,848,821 A | 11/1974 | Scheel | |
| 3,863,870 A | 2/1975 | Andrews et al. | |
| 3,952,324 A | 4/1976 | Wolff et al. | |
| 3,989,994 A | 11/1976 | Brown | |
| 4,078,747 A | 3/1978 | Minovitch | |
| 4,116,258 A | 9/1978 | Slysh et al. | |
| 4,133,501 A | 1/1979 | Pentlicki | |
| 4,151,872 A | 5/1979 | Slysh et al. | |
| 4,153,474 A | 5/1979 | Rex | |
| 4,155,524 A | 5/1979 | Marello et al. | |
| 4,166,919 A | 9/1979 | Carlson | |
| 4,234,856 A | 11/1980 | Jung et al. | |
| 4,282,394 A | 8/1981 | Lackey et al. | |
| 4,328,389 A | 5/1982 | Stern et al. | |
| 4,415,759 A | 11/1983 | Copeland et al. | |
| 4,416,052 A | 11/1983 | Stern | |
| 4,419,532 A | 12/1983 | Severns | |
| 4,687,880 A | 8/1987 | Morris | |
| 4,735,488 A | 4/1988 | Rancourt et al. | |
| 4,780,726 A | 10/1988 | Archer et al. | |
| 4,784,700 A | 11/1988 | Stern et al. | |
| 4,789,989 A | 12/1988 | Stern et al. | |
| 4,850,031 A | 7/1989 | Allsop et al. | |
| 4,947,825 A | 8/1990 | Moriarty | |
| 4,953,190 A | 8/1990 | Kukoleck et al. | |
| 5,013,128 A | 5/1991 | Stern et al. | |
| 5,114,101 A | 5/1992 | Stern et al. | |
| 5,131,955 A | 7/1992 | Stern et al. | |
| 5,154,777 A | 10/1992 | Blackmon et al. | |
| 5,177,396 A | 1/1993 | Gielen et al. | |
| 5,180,441 A | 1/1993 | Cornwall et al. | |
| 5,226,107 A | 7/1993 | Stern et al. | |
| 5,280,441 A | 1/1994 | Wada et al. | |
| 5,309,925 A | 5/1994 | Policastro | |
| 5,310,141 A | 5/1994 | Homer et al. | |
| 5,337,980 A | 8/1994 | Homer et al. | |
| 5,344,496 A | 9/1994 | Stern et al. | |
| 5,404,868 A | 4/1995 | Sankrithi | |
| 5,428,483 A | 6/1995 | Sato et al. | |
| 5,487,791 A * | 1/1996 | Everman | B64G 1/222 |
| | | | 136/245 |
| 5,496,414 A | 3/1996 | Harvey et al. | |
| 5,512,913 A | 4/1996 | Staney | |
| 5,520,747 A | 5/1996 | Marks | |
| 5,569,332 A | 10/1996 | Glatfelter et al. | |
| 5,623,119 A | 4/1997 | Yater et al. | |
| 5,653,222 A | 8/1997 | Newman | |
| 5,666,127 A | 9/1997 | Kochiyama et al. | |
| 5,785,280 A | 7/1998 | Baghdasarian | |
| 5,885,367 A | 3/1999 | Brown et al. | |
| 5,909,299 A | 6/1999 | Sheldon, Jr. et al. | |
| 5,909,860 A | 6/1999 | Lee et al. | |
| 5,969,695 A * | 10/1999 | Bassily | H01Q 1/08 |
| | | | 343/912 |
| 5,984,484 A | 11/1999 | Kruer | |
| 6,017,002 A | 1/2000 | Burke et al. | |
| 6,031,178 A | 2/2000 | Kester | |
| 6,043,425 A | 3/2000 | Assad | |
| 6,050,526 A | 4/2000 | Stribling | |
| 6,060,790 A | 5/2000 | Craig, Jr. | |
| 6,091,017 A | 7/2000 | Stern | |
| 6,118,067 A | 9/2000 | Lashley et al. | |
| 6,150,995 A | 11/2000 | Gilger | |
| 6,188,012 B1 | 2/2001 | Ralph | |
| 6,194,790 B1 | 2/2001 | Griffin et al. | |
| 6,195,067 B1 | 2/2001 | Gilger | |
| 6,284,967 B1 | 9/2001 | Hakan et al. | |
| 6,300,558 B1 | 10/2001 | Takamoto et al. | |
| 6,343,442 B1 | 2/2002 | Marks | |
| 6,366,255 B1 | 4/2002 | Chiang | |
| 6,366,256 B1 | 4/2002 | Ramanujam et al. | |
| 6,369,545 B1 | 4/2002 | Williams et al. | |
| 6,394,395 B1 | 5/2002 | Poturalski et al. | |
| 6,423,895 B1 * | 7/2002 | Murphy | H02S 30/20 |
| | | | 136/245 |
| 6,429,368 B1 | 8/2002 | Summers | |
| 6,528,716 B2 | 3/2003 | Collette et al. | |
| 6,534,705 B2 | 3/2003 | Berrios et al. | |
| 6,541,916 B2 | 4/2003 | Decker | |
| 6,547,190 B1 | 4/2003 | Thompson et al. | |
| 6,555,740 B2 | 4/2003 | Roth et al. | |
| 6,557,804 B1 | 5/2003 | Carroll | |

(56) References Cited

U.S. PATENT DOCUMENTS

| | | |
|---|---|---|
| 6,560,942 B2 | 5/2003 | Warren et al. |
| 6,565,044 B1 | 5/2003 | Johnson et al. |
| 6,577,130 B1 | 6/2003 | Adamo et al. |
| 6,587,263 B1 | 7/2003 | Iacovangelo et al. |
| 6,590,150 B1 | 7/2003 | Kiefer |
| 6,635,507 B1 | 10/2003 | Boutros et al. |
| 6,655,638 B2 | 12/2003 | Deel |
| 6,660,927 B2 | 12/2003 | Zwanenburg |
| 6,660,928 B1 | 12/2003 | Patton et al. |
| 6,689,952 B2 | 2/2004 | Kawaguchi |
| 6,690,252 B2 | 2/2004 | Scoltock, Jr. et al. |
| 6,713,670 B2 | 3/2004 | Stern et al. |
| 6,735,838 B1 | 5/2004 | Triller et al. |
| 6,735,920 B1 | 5/2004 | Cadogan |
| 6,768,048 B2 | 7/2004 | Woll et al. |
| 6,784,359 B2 | 8/2004 | Clark et al. |
| 6,799,742 B2 | 10/2004 | Nakamura et al. |
| 6,882,072 B2 | 4/2005 | Wingett et al. |
| 6,897,730 B2 | 5/2005 | Dupuis et al. |
| 6,903,261 B2 | 6/2005 | Habraken et al. |
| 6,904,749 B2 | 6/2005 | Joshi et al. |
| 6,909,042 B2 | 6/2005 | Geyer et al. |
| 6,936,760 B2 | 8/2005 | Spirnak et al. |
| 6,983,914 B2 | 1/2006 | Stribling et al. |
| 7,006,039 B2 | 2/2006 | Miyamoto et al. |
| 7,053,294 B2 | 5/2006 | Tuttle et al. |
| 7,077,361 B1 | 7/2006 | Rabinowitz |
| 7,138,960 B2 | 11/2006 | Carroll et al. |
| 7,163,179 B1 | 1/2007 | Taylor |
| 7,211,722 B1 | 5/2007 | Murphy |
| 7,271,333 B1 | 9/2007 | Fabick et al. |
| 7,301,095 B2 | 11/2007 | Murphy et al. |
| 7,303,166 B2 | 12/2007 | Geery |
| 7,319,189 B2 | 1/2008 | Ruelle et al. |
| 7,354,033 B1 | 4/2008 | Murphey et al. |
| 7,392,011 B1 | 6/2008 | Jacomb-Hood |
| 7,464,895 B2 | 12/2008 | Palmer |
| 7,474,249 B1* | 1/2009 | Williams ............... B64G 1/428 |
| | | 342/25 R |
| 7,486,431 B2 | 2/2009 | Rabinowitz |
| 7,564,149 B2 | 7/2009 | Siri et al. |
| 7,568,479 B2 | 8/2009 | Rabinowitz |
| 7,612,284 B2 | 11/2009 | Rogers et al. |
| 7,736,007 B2 | 6/2010 | Rabinowitz |
| 7,866,836 B2 | 1/2011 | Rabinowitz |
| 7,878,667 B2 | 2/2011 | Rabinowitz |
| 7,895,795 B1 | 3/2011 | Murphey et al. |
| 7,960,641 B2 | 6/2011 | Rabinowitz |
| 8,071,873 B2 | 12/2011 | Rabinowitz |
| 8,146,867 B2 | 4/2012 | Jordan et al. |
| 8,215,298 B2 | 7/2012 | Klotz |
| 8,308,111 B2 | 11/2012 | Lu et al. |
| 8,432,224 B1 | 4/2013 | Woo et al. |
| 8,439,511 B2 | 5/2013 | Stern et al. |
| 8,616,502 B1 | 12/2013 | Stribling et al. |
| 8,636,253 B1 | 1/2014 | Spence et al. |
| 8,683,755 B1* | 4/2014 | Spence ............... B64G 1/222 |
| | | 136/245 |
| 8,872,018 B1 | 10/2014 | Breen et al. |
| 9,004,410 B1 | 4/2015 | Steele et al. |
| 9,079,673 B1 | 7/2015 | Steele et al. |
| 9,120,583 B1 | 9/2015 | Spence et al. |
| 9,156,568 B1 | 10/2015 | Spence et al. |
| 9,248,922 B1 | 2/2016 | Baghdasarian et al. |
| 9,276,148 B2 | 3/2016 | Jaffe et al. |
| 9,346,566 B2 | 5/2016 | Spence et al. |
| 9,444,394 B1 | 9/2016 | Thomas et al. |
| 9,709,349 B2 | 7/2017 | Raman et al. |
| 10,144,533 B2* | 12/2018 | Atwater ............... B64G 1/44 |
| 10,340,698 B2 | 7/2019 | Pellegrino et al. |
| 10,454,565 B2 | 10/2019 | Pellegrino et al. |
| 2002/0007845 A1 | 1/2002 | Collette et al. |
| 2002/0029796 A1 | 3/2002 | Mikami et al. |
| 2002/0029797 A1 | 3/2002 | Mikami et al. |
| 2002/0032992 A1* | 3/2002 | Roth ............... B64G 1/222 |
| | | 52/109 |
| 2002/0134423 A1 | 9/2002 | Eller et al. |
| 2003/0098057 A1* | 5/2003 | Mizuno ............... B64G 1/428 |
| | | 136/244 |
| 2003/0098058 A1 | 5/2003 | Takada et al. |
| 2003/0192586 A1 | 10/2003 | Takada et al. |
| 2003/0196298 A1 | 10/2003 | Hinkley et al. |
| 2004/0011395 A1 | 1/2004 | Nicoletti et al. |
| 2004/0140930 A1 | 7/2004 | Harles |
| 2004/0187912 A1 | 9/2004 | Takamoto et al. |
| 2004/0231718 A1 | 11/2004 | Umeno et al. |
| 2005/0046977 A1 | 3/2005 | Shifman |
| 2005/0178921 A1 | 8/2005 | Stribling et al. |
| 2005/0241691 A1 | 11/2005 | Wakefield |
| 2005/0257823 A1 | 11/2005 | Zwanenburg |
| 2006/0038083 A1 | 2/2006 | Criswell |
| 2006/0109053 A1 | 5/2006 | Kim et al. |
| 2006/0157103 A1 | 7/2006 | Sheats et al. |
| 2006/0186274 A1 | 8/2006 | Wang et al. |
| 2007/0029446 A1 | 2/2007 | Mosher et al. |
| 2007/0087704 A1 | 4/2007 | Gilberton |
| 2008/0000232 A1 | 1/2008 | Rogers et al. |
| 2008/0088409 A1 | 4/2008 | Okada |
| 2008/0149162 A1 | 6/2008 | Martinelli et al. |
| 2008/0173349 A1 | 7/2008 | Liu et al. |
| 2008/0185039 A1 | 8/2008 | Chan |
| 2008/0251113 A1 | 10/2008 | Horne et al. |
| 2008/0283109 A1 | 11/2008 | Mankins et al. |
| 2009/0126792 A1 | 5/2009 | Gruhlke et al. |
| 2009/0151769 A1 | 6/2009 | Corbin |
| 2009/0199893 A1 | 8/2009 | Bita et al. |
| 2009/0223554 A1 | 9/2009 | Sharps |
| 2009/0250094 A1 | 10/2009 | Robison et al. |
| 2009/0301544 A1 | 12/2009 | Minelli |
| 2010/0170560 A1 | 7/2010 | Sapienza et al. |
| 2010/0180946 A1 | 7/2010 | Gruhlke et al. |
| 2010/0224231 A1 | 9/2010 | Hoke |
| 2010/0263709 A1 | 10/2010 | Norman et al. |
| 2010/0269885 A1 | 10/2010 | Benitez et al. |
| 2010/0276547 A1 | 11/2010 | Rubenchik et al. |
| 2010/0289342 A1* | 11/2010 | Maness ............... B64G 1/007 |
| | | 307/104 |
| 2010/0300507 A1 | 12/2010 | Heng et al. |
| 2010/0319774 A1 | 12/2010 | Schwartz |
| 2011/0041894 A1 | 2/2011 | Liao |
| 2011/0049992 A1 | 3/2011 | Sant'Anselmo et al. |
| 2011/0061718 A1 | 3/2011 | Fork et al. |
| 2011/0080135 A1 | 4/2011 | Bland |
| 2011/0100425 A1 | 5/2011 | Osamura et al. |
| 2011/0120524 A1 | 5/2011 | Wares et al. |
| 2011/0203574 A1 | 8/2011 | Harding |
| 2011/0210209 A1* | 9/2011 | Taylor ............... B64G 1/222 |
| | | 244/172.6 |
| 2011/0232718 A1 | 9/2011 | Nawab |
| 2011/0300664 A1 | 12/2011 | Chung et al. |
| 2011/0315192 A1 | 12/2011 | Swatek et al. |
| 2012/0019942 A1 | 1/2012 | Morgan et al. |
| 2012/0024362 A1 | 2/2012 | Gossman |
| 2012/0031393 A1 | 2/2012 | Linderman et al. |
| 2012/0125415 A1 | 5/2012 | Tischler |
| 2012/0138749 A1 | 6/2012 | Ellinghaus |
| 2012/0138997 A1 | 6/2012 | Tasaki et al. |
| 2012/0160299 A1 | 6/2012 | Reid et al. |
| 2012/0243252 A1 | 9/2012 | Kim |
| 2013/0009851 A1 | 1/2013 | Danesh |
| 2013/0032673 A1 | 2/2013 | Kobayashi |
| 2013/0093287 A1 | 4/2013 | Biso et al. |
| 2013/0099599 A1 | 4/2013 | Jaffe et al. |
| 2013/0133730 A1 | 5/2013 | Pan et al. |
| 2013/0220399 A1 | 8/2013 | Gruhlke et al. |
| 2013/0233974 A1 | 9/2013 | Maiboroda et al. |
| 2013/0319504 A1 | 12/2013 | Yang et al. |
| 2013/0319505 A1 | 12/2013 | Yang et al. |
| 2013/0332093 A1 | 12/2013 | Adest et al. |
| 2014/0041705 A1 | 2/2014 | Kang et al. |
| 2014/0083479 A1 | 3/2014 | Takayama et al. |
| 2014/0102686 A1 | 4/2014 | Yu et al. |
| 2014/0131023 A1 | 5/2014 | Raman et al. |

(56) References Cited

U.S. PATENT DOCUMENTS

| | | |
|---|---|---|
| 2014/0148197 A1 | 5/2014 | Shields |
| 2014/0150865 A1 | 6/2014 | Kwon et al. |
| 2014/0158197 A1 | 6/2014 | Rubenstein et al. |
| 2014/0159636 A1 | 6/2014 | Yang et al. |
| 2014/0261621 A1 | 9/2014 | Gruhlke et al. |
| 2014/0261622 A1 | 9/2014 | Floyd et al. |
| 2014/0263844 A1 | 9/2014 | Cook, Jr. et al. |
| 2014/0263847 A1 | 9/2014 | Eskenazi et al. |
| 2014/0326833 A1 | 11/2014 | Spence et al. |
| 2014/0356613 A1 | 12/2014 | Weisenberger et al. |
| 2015/0022909 A1 | 1/2015 | O'Neill |
| 2015/0053253 A1 | 2/2015 | O'Neill |
| 2015/0130293 A1 | 5/2015 | Hajimiri et al. |
| 2015/0144740 A1 | 5/2015 | Turse et al. |
| 2015/0155413 A1 | 6/2015 | Pokharna et al. |
| 2015/0217876 A1* | 8/2015 | Halsband ............... B64G 1/10 244/172.6 |
| 2016/0056321 A1 | 2/2016 | Atwater et al. |
| 2016/0065006 A1 | 3/2016 | Woods |
| 2016/0122041 A1 | 5/2016 | Abrams et al. |
| 2016/0164451 A1 | 6/2016 | McEnaney et al. |
| 2016/0376037 A1 | 12/2016 | Pellegrino et al. |
| 2016/0380486 A1 | 12/2016 | Hajimiri et al. |
| 2016/0380580 A1 | 12/2016 | Atwater et al. |
| 2017/0025992 A1 | 1/2017 | Atwater et al. |
| 2017/0047463 A1 | 2/2017 | Hajimiri et al. |
| 2017/0047886 A1 | 2/2017 | Atwater et al. |
| 2017/0047889 A1 | 2/2017 | Atwater et al. |
| 2017/0047987 A1 | 2/2017 | Pellegrino et al. |
| 2017/0063296 A1 | 3/2017 | Cruijssen et al. |
| 2018/0315877 A1 | 11/2018 | Kelzenberg et al. |

FOREIGN PATENT DOCUMENTS

| | | |
|---|---|---|
| CN | 104158471 A | 11/2014 |
| EP | 0541052 A1 | 5/1993 |
| EP | 0977273 A1 | 2/2000 |
| EP | 977273 A1 | 2/2000 |
| EP | 0996170 A2 | 4/2000 |
| EP | 1501132 A2 | 1/2005 |
| EP | 976655 B1 | 9/2005 |
| EP | 1852919 A2 | 11/2007 |
| EP | 1852919 A3 | 2/2009 |
| EP | 2318045 A1 | 5/2011 |
| EP | 3149777 A1 | 4/2017 |
| EP | 3325347 A1 | 5/2018 |
| EP | 3334655 A1 | 6/2018 |
| FR | 2956774 A1 | 8/2011 |
| GB | 2247564 A | 3/1992 |
| JP | 6298781 A | 5/1987 |
| JP | 63254772 A | 10/1988 |
| JP | 0369258 U | 7/1991 |
| JP | 05107328 A | 4/1993 |
| JP | 06253477 A | 9/1994 |
| JP | H06327173 A | 11/1994 |
| JP | 082500 A | 9/1996 |
| JP | 2000114571 A | 4/2000 |
| JP | 2001088799 A | 4/2001 |
| JP | 2001309581 A | 11/2001 |
| JP | 2002362500 A | 12/2002 |
| JP | 2003164077 A | 6/2003 |
| JP | 2003164078 A | 6/2003 |
| JP | 2003191899 A | 7/2003 |
| JP | 2004090817 A | 3/2004 |
| JP | 2004196051 A | 7/2004 |
| JP | 2004253471 A | 9/2004 |
| JP | 2004296658 A | 10/2004 |
| JP | 2009184603 A | 8/2009 |
| JP | 2010259301 A | 11/2010 |
| WO | 2004049538 A2 | 6/2004 |
| WO | 2008073905 A2 | 6/2008 |
| WO | 2009124098 A2 | 10/2009 |
| WO | 2010033632 A2 | 3/2010 |
| WO | 2011006506 A1 | 1/2011 |
| WO | 2011062785 A2 | 5/2011 |
| WO | 2011067772 A1 | 6/2011 |
| WO | 2011109275 A1 | 9/2011 |
| WO | 2011062785 A3 | 11/2011 |
| WO | 2015175839 | 11/2015 |
| WO | 2015179213 A2 | 11/2015 |
| WO | 2015179214 A2 | 11/2015 |
| WO | 2015187221 A2 | 12/2015 |
| WO | 2015187739 | 12/2015 |
| WO | 2017015508 | 1/2017 |
| WO | 2017015605 | 1/2017 |
| WO | 2017027615 | 2/2017 |
| WO | 2017027617 | 2/2017 |
| WO | 2017027629 | 2/2017 |
| WO | 2017027633 | 2/2017 |

OTHER PUBLICATIONS

International Search Report and Written Opinion for International Application No. PCT/US2015/030909, completed Nov. 27, 2015, dated Nov. 27, 2015, 13 Pgs.
International Search Report and Written Opinion for International Application PCT/US2015/030900, Completed Aug. 11, 2015, dated Aug. 13, 2015, 11 pgs.
International Search Report and Written Opinion for International Application PCT/US2015/033841, Completed Sep. 10, 2015, dated Sep. 11, 2015, 11 pgs.
Arya et al., "Wrapping Thick Membranes with Slipping Folds", American Institute of Aeronautics and Astronautics, date unknown, pp. 1-17.
Delapierre et al., "Spin-Stabilized Membrane Antenna Structures", American Institute of Aeronautics and Astronautics, date unknown, pp. 1-15.
NASA TV, "Solar Power, Origami-Style", printed Aug. 14, 2014 from http://www.nasa.gov/jpl/news/origami-style-power-20140814, 4 pgs.
International Preliminary Report on Patentability for International Application PCT/US2015/030900, dated Nov. 15, 2016, dated Nov. 24, 2016, 9 Pgs.
International Preliminary Report on Patentability for International Application PCT/US2015/030909, dated Nov. 15, 2016, dated Nov. 24, 2016, 11 Pgs.
International Preliminary Report on Patentability for International Application PCT/US2015/033841, dated Dec. 6, 2016, dated Dec. 15, 2016, 8 Pgs.
International Search Report and Written Opinion for International Application No. PCT/US2016/043424, completed Nov. 15, 2016, dated Nov. 15, 2016, 14 Pgs.
International Search Report and Written Opinion for International Application No. PCT/US2016/043677, completed Oct. 21, 2016, dated Oct. 21, 2016, 8 Pgs.
International Search Report and Written Opinion for International Application No. PCT/US2016/046389, completed Nov. 22, 2016, dated Nov. 2, 2016, 11 Pgs.
International Search Report and Written Opinion for International Application No. PCT/US2016/046394, completed Nov. 17, 2016, dated Nov. 17, 2016, 12 Pgs.
International Search Report and Written Opinion for International Application No. PCT/US2016/046415, completed Nov. 17, 2016, dated Nov. 17, 2016, 10 Pgs.
International Search Report and Written Opinion for International Application No. PCT/US2016/046421, completed Nov. 17, 2016, dated Nov. 17, 2016, 10 Pgs.
Aieta et al., "Multiwavelength achromatic metasurfaces by dispersive phase compensation", Science, vol. 347, Issue 6228, DOI:10.1126/science.aaa2494, Mar. 20, 2015, pp. 1342-1345.
Aoki et al., "A Fully Integrated Quad-Band GSM/GPRS Power Amplifier", IEEE Journal of Solid-State Circuits, vol. 43, Issue 12, Dec. 12, 2008, pp. 2747-2758.
Bakr et al., "Impact of phase and amplitude errors on array performance", UC Berkeley Technical Report No. UCB/EECS-2009-1. Retrieved from http://www.eecs.berkeley.com/Pubs/TechRpts/2009/EECS-2009-1.html, Jan. 1, 2009, 12 pgs.

(56) References Cited

OTHER PUBLICATIONS

Bohn et al., "Fully Integrated Frequency and Phase Generation for a 6-18GHz Tunable Multi-Band Phased-Array Receiver in CMOS", Radio Frequency Integrated Circuits Symposium (RFIC), Apr. 17-Jun. 17, 2008. IEEE, pp. 439-442.
Brongersma et al., "Light management for photovoltaics using high-index nanostructures", Nature Materials, vol. 13, No. 25, May 2014, pp. 451-460.
Callahan et al., "Light trapping in ultrathin silicon photonic crystal superlattices with randomly-textured dielectric incouplers", Optics Express, vol. 21, Issue 25, DOI: 10.1364/OE.21.030315, 2013, pp. 30315-30326.
Campbell et al., "A Pixel Readout Chip for Mrad in Standard 0.25um CMOS", IEEE Transactions on Nuclear Science, vol. 46, issue: 3, Jun. 1999, pp. 156-160.
Cao et al., "A 4.5MGy TID-Tolerant CMOS Bandgap Reference Circuit Using a Dynamic Base Leakage Compensation Technique", IEEE Transactions on Nuclear Science, vol. 60, issue 4, Aug. 2013, pp. 2819-2824.
Geisz et al., "Infrared Reflective and Transparent Inverted Metamorphic Triple Junction Solar Cells", AIP Conference Proceedings, vol. 1277, Issue 11, pp. 11-15, Oct. 14, 2010.
Kaltenbrunner et al., "Flexible high power-per-weight perovskite solar cells with chromium oxide—metal contacts for improved stability in air", Nature Materials, vol. 14, doi:10.1038/nmat4388, Aug. 24, 2015, pp. 1032-1039.
Lacoe, R. C., "Improving Integrated Circuit Performance Through the Application of Hardness-by-Design Methodology", IEEE Transactions on Nuclear Science, vol. 55, issue: 4, Aug. 2008, pp. 1903-1925.
Lamoureux et al., "Dynamic kirigami structures for integrated solar tracking", Nature Communications, DOI:10.1038/ncomms9092, Sep. 8, 2015, pp. 1-6.
Lohmeyer et al., "Correlation of GEO communication satellite anomalies and space weather phenomena: Improved satellite performance and risk mitigation", paper presented at 30th AIAA International Communications Satellite Systems Conference (ICSSC), Ottawa, Canada, pp. 1-20, Jul. 13, 2012.
Messenger et al., "Status of Implementation of Displacement Damage Dose Method for Space Solar Cell Degradation Analyses", 2008 Dd EOL Calc via SPENVIS manuscript SRM2, Jan. 2008, 8 pgs.
Narita et al., "Development of high accuracy phase control method for space solar power system", Proc. IEEE International Microwave Workshop Series on Innovative Wireless Power Transmission: Technologies, Systems, and Applications, May 12-13, 2011, p. 227-230.
Nishioka et al., "Evaluation of temperature characteristics of high-efficiency InGaP/InGaAs/Ge triple-junction solar cells under concentration", Solar Energy Materials and Solar Cells, vol. 85, Issue 3, Jan. 31, 2005, pp. 429-436.
O'Brien et al., "The AE9/AP9 Radiation Specification Development", Aerospace Corporation, Sep. 15, 2009, Report No. TOR-2009(3905)-8, 29 pgs.
Petrovic et al., "Design Methodology for Fault Tolerant ASICs", IEEE 15th International Symposium, Design and Diagnostics of Electronic Circuits & Systems (DDECS), Apr. 18-20, 2012, pp. 8-12.
Rephaeli et al., "Ultrabroadband Photonic Structures to Achieve High-Performance Daytime Radiative Cooling", Nano Letters, vol. 13, Mar. 5, 2013, pp. 1457-1461.
Sato et al., "Modeling of degradation behavior of InGaP/GaAs/Ge triple-junction space solar cell exposed to charged particles", Journal of Applied Physics, vol. 105, 2009, pp. 044504-1-044504-6.
Silverman et al., "Outdoor Performance of a Thin-Film Gallium-Arsenide Photovoltaic Module", presented at the 39th IEEE Photovoltaic Specialist Conference, Conference Jun. 16-21, 2013, Tampa, Florida, USA, 6 pgs.
Snoeys et al., "Integrated Circuits for Particle Physics Experiments", IEEE Journal Solid-State Circuits, vol. 35, issue 12, Dec. 2000, pp. 2018-2030.
Wang et al., "A Broadband Self-Healing Phase Synthesis Scheme", Radio Frequency Integrated Circuits Symposium (RFIC), IEEE, Jun. 5-7, 2011, 4 pgs.
Borriello et al., "Ab initio investigation of hybrid organic-inorganic perovskites based on tin halides", Physical Review B, Jun. 23, 2008, vol. 77, 235214, 9 pgs.
Conings et al., "Intrinsic thermal instability of methylammonium lead trihalide perovskite", Advanced Energy Materials, Jun. 2, 2015, DOI: 10.1002/aenm.201500477, 8 pgs.
Preston et al., "From plasmon spectra of metallic to vibron spectra of dielectric nanoparticles", Accounts of Chemical Research, Jan. 9, 2012, vol. 45, No. 9, pp. 1501-1510.
Scholl et al., "Quantum plasmon resonances of individual metallic nanoparticles", Nature, Mar. 22, 2012, vol. 483, doi:10.1038/nature10904, pp. 421-428.
Tsai et al., "High-efficiency two-dimensional Ruddlesden-Popper perovskite solar cells", Nature, Aug. 18, 2016, vol. 536, doi:10.1038/nature18306, 15 pgs.
Weinberg et al., "Radiation and temperature effects in gallium arsenide, indium phosphide, and silicon solar cells", NASA Technical Memorandum 89870, Washington, D.C., May 4-8, 1987, 14 pgs.
Zhang et al., "Intrinsic instability of the hybrid halide perovskite semiconductor CH3NH3PbI3", Chinese Physics Letters, Jun. 3, 2015, vol. 35, No. 3, 036104, 11 pgs.
DuPont Kapton, Mar. 2012, 26 pgs.
Extended European Search Report for European Application No. 15795587.3, Search completed Feb. 5, 2018, dated Feb. 12, 2018, 7 Pgs.
Extended European Search Report for European Application No. 15803447.0, Search completed Oct. 17, 2017, dated Oct. 25, 2017, 10 Pgs.
International Preliminary Report on Patentability for International Application PCT/US2016/043424, Report completed Dec. 2, 2017, dated Dec. 15, 2017, 153 Pgs.
International Preliminary Report on Patentability for International Application PCT/US2016/043677, Report dated Jan. 23, 2018, dated Feb. 1, 2018, 6 Pgs.
International Preliminary Report on Patentability for International Application PCT/US2016/046389, Report dated Feb. 13, 2018, dated Feb. 22, 2018, 9 Pgs.
International Preliminary Report on Patentability for International Application PCT/US2016/046394, Report dated Feb. 13, 2018, dated Feb. 22, 2018, 10 Pgs.
International Preliminary Report on Patentability for International Application PCT/US2016/046415, Report dated Feb. 13, 2018, dated Feb. 22, 2018, 8 Pgs.
International Preliminary Report on Patentability for International Application PCT/US2016/046421, Report dated Feb. 13, 2018, dated Feb. 22, 2018, 8 Pgs.
"Corona Resistant Kapton CR Takes Electrical Insulation Design and Reliability to New Levels", Kapton, DuPont Films, H-54506-1.
"DuPont Kapton 100CRC: Technical Data Sheet", kapton.dupont.com, Jul. 2014, K-28402.
"DuPont Kapton 120FWN616B", kapton.dupont.com, K-28459, Sep. 2014.
"DuPont Kapton 150FCRC019", kapton.dupont.com, K-28402, Jun. 2014.
"DuPont Kapton 150FWN019: Magnet Wre Insulation", www.kapton.dupont.com, H-78319-01, Mar. 2005.
"DuPont Kapton 150FWR019: Insulation Substrate", www.dupont.com/kapton, H-78312, Nov. 2001.
"DuPont Kapton 150PRN411", kapton.com, K-28731, Dec. 2014.
"DuPont Kapton 200FWR919: Insulation Substrate", www.dupont.com/kapton, H78313, Nov. 2001.
"DuPont Kapton 200R5100", kapton.com, K-15354-2, Sep. 2014.
"DuPont Kapton B: Technical Bulletin", kapton.dupont.com, K-25099-1, Jul. 2013.
"DuPont Kapton FCR: Advanced Magnet Wire Insulation", Jun. 2005, H-99888.
"DuPont Kapton FN: Polyimide Film", kapton.com, K-15347-2, Jun. 2015.

(56) References Cited

OTHER PUBLICATIONS

"DuPont Kapton FPC: Polyimide Film", kapton.dupont.com, K-15361, Mar. 2006.
"DuPont Kapton GS Polyimide Film: Technical Data Sheet", kapton.dupont.com, K-26875-1, Jul. 2014.
"DuPont Kapton HN:Polyimide Film", kapton.dupont.com, K-15345-1, Apr. 2011.
"DuPont Kapton HPP-ST: Polyimide Film", kapton.dupont.com, K-15357, Mar. 2006.
"DuPont Kapton MT: Technical Data Sheet", kapton.dupont.com, H-38497-3, Apr. 2014.
"DuPont Kapton PST: Polyimide Film", kapton.dupont.com, K-10790, Nov. 2005.
"DuPont Kapton PV9100 Series: Polyimide Films", kapton.dupont.com, K-26028-1_A4, Oct. 2012.
"DuPont Kapton: Polyimide Film", kapton.dupont.com, Mar. 2012, H-38479-9, 7 pgs.
Arbabi et al., "Multiwavelength polarization insensitive lenses based on dielectric metasurfaces with meta-molecules", Optics, Jan. 22, 2016, vol. 3, Issue 6, pp. 628-633.
Arbabi et al., "Subwavelength-thick lenses with high numerical apertures and large efficiency based on high-contrast transmitarrays", Nature Communications, May 5, 2015, vol. 6, pp. 7069, doi:10.1038/ncomms8069.
Lee et al., "Non-Destructive Wafer Recycling for Low-Cost Thin-Film Flexible Optoelectronics", Advanced Functional Materials, Apr. 2, 2014, vol. 24, pp. 4284-4291.
Liu et al., "Microstructure, thermal shock resistance and thermal emissivity of plasma sprayed LaMAI11 O19(M=Mg, Fe) coatings for metallic thermal protection systems", Applied Surface Science, vol. 271, Feb. 6, 2013, pp. 52-59.
Vaccaro et al., "In-flight experiment for combined planar antennas and solar cells (SOLANT)", IET Microwaves Antennas & Propaga, vol. 3, No. 8, Dec. 1, 2009, pp. 1279-1287.
ATI Industrial, Multi-Axis Force / Torque Sensor, ATI Industrial Automation, Jul. 23, 2014, pp. 1-44.
Smooth on, Mold Max® XLS® II, Jan. 15, 2016, 2 pgs.
"AZ Technology | Materials, Paint and Coatings: AZ-93 White Thermal Control, Electrically Conductive Paint / Coating (AZ's Z-93P)", Available http://www.aztechnology.com/materials-coatings-az-93.html, Accessed: Dec. 19, 2016, 2 pgs.
"ESA. Composite material structures.", printed Jun. 29, 2017 from http://www.esa.int/Our_Activities/Space_Engineering_Technology/Structures/Composite_Materials_structures, Oct. 20, 2014, 2 pgs.
"Orbital ATK", Coilable Boom Systems. Technical report, Oct. 18, 1989, 2 pgs.
"Space solar power limitless clean energy from space", National Space Society, printed Jun. 29, 2017 from http://www.nss.org/settlement/ssp/, May 2017, 11 pgs.
Aguirre-Martinez et al., "Development of a Continuous Manufacturing Method for a Deployable Satellite Mast in Cfrp", 15th Reinforced Plastics Congress, Sep. 1986, pp. 107-110.
Aieta et al., "Aberration-Free Ultrathin Flat Lenses and Axicons at Telecom Wavelengths Based on Plasmonic Metasurfaces", Nano Lett., Web publication date Aug. 2, 2012, vol. 12, No. 9, pp. 4932-4936.
Amacher et al., "Thin ply composites: Experimental characterization and modeling of size-effects", Composites Science and Technology, Jul. 11, 2014, vol. 101, pp. 121-132.
Andryieuski et al., "Rough metal and dielectric layers make an even better hyperbolic metamaterial absorber", Optics Express, Jun. 11, 2014, vol. 22, No. 12, pp. 14975-14980.
Arai, "Pitch-based carbon fiber with low modulus and high heat conduction", Nippon Steel Technical Report No. 84, Jul. 11, 2001, pp. 12-17.
Arbabi et al., "Dielectric Metasurfaces for Complete Control of Phase and Polarization with Subwavelength Spatial Resolution and High Transmission", Nature Nanotechnology, Aug. 31, 2015, 27 pgs., doi:10.1038/nnano.2015.186.
Arya, "Packaging and Deployment of Large Planar Spacecraft Structures", Thesis of Manan Arya, May 2, 2016, 131 pgs.
Arya et al., "Ultralight Structures for Space Solar Power Satellites", American Institute of Aeronautics and Astronautics, 2016, pp. 1-18.
Banik et al., "Performance Validation of the Triangular Rollable and Collapsible Mast", Proceedings of the 24th Annual AIAA/USU Conference on Small Satellites, Logan, UT, Aug. 9, 2010, 8 pgs.
Bapanapalli et al., "The Effect of Tool-Part Interactions on the Geometry of Laminated Composites", Washington State University, Jul. 10, 2016.
Biddy et al., "LightSail-1 solar sail design and qualification", Proceedings of the 41st Aerospace Mechanisms Symposium, May 16, 2012, pp. 451-463.
Cahill et al., "Nanoscale thermal transport. II. 2003-2012", Applied Physics Review, Jan. 14, 2014, vol. 1, No. 1, pp. 011305-1-011305-45.
Calladine et al., "The theory of thin shell structures 1888-1988", Proceedings of the Institution of Mechanical Engineers, Part A: Journal of Power and Energy, vol. 202, No. 3, Jan. 7, 1988, pp. 141-149.
Castle Jr., "Heat conduction in carbon materials", 1st Biennial Conference of the American Carbon Society, pp. 13-19, Nov. 2, 1953.
Chen et al., "Planar Heterojunction Perovskite Solar Cells via Vapor-Assisted Solution Process", Journal of the American Chemical Society 136, Dec. 20, 2013, pp. 622-625.
Cheng et al., "Optical metasurfaces for beam scanning in space", Optics Letters, May 1, 2014, vol. 39, No. 9, pp. 2719-2722.
David, "Extraterrestrial mining could reap riches and spur exploration", http://www.space.com/16273-extraterrestrial-mining-asteroids-moon.html, Jun. 25, 2012, 7 pgs.
Du Toit et al., "Advances in the design of Jaumann absorbers", in Antennas and Propagation Society International Symposium, 1990. AP-S. Merging Technologies for the 90's. Digest., May 7, 1990, vol. 3, pp. 1212-1215.
Elfiky et al., "Study the effects of proton irradiation on GaAs/Ge solar cells", 35th IEEE Photovoltaic Specialist Conference, Jul. 2010, pp. 002528-002532.
Emerson, "Electromagnetic wave absorbers and anechoic chambers through the years", IEEE Trans. Antennas Propag., vol. 21, No. 4, Jul. 1973, pp. 484-490.
Eperon et al., "Morphological Control for High Performance, Solution-Processed Planar Heterojunction Perovskite Solar Cells", Advanced Functional Materials 24, first published Sep. 9, 2013, pp. 151-157.
Ersoy et al., "An experimental method to study the frictional processes during composites manufacturing", Composites Part A: Applied Science and Manufacturing, Feb. 19, 2005, vol. 36, No. 11, pp. 1536-1544.
Estvanko et al., "Numerical analysis of a tape spring hinge folded about two axes", Earth and Space 2012 © Engineering, Science, Construction, and Operations in Challenging Environments, ASCE, Jul. 11, 2012, pp. 714-721.
Fallahi et al., "Thin wideband radar absorbers", Transactions on Antennas and Propagation, Nov. 30, 2010, vol. 58, No. 12, pp. 4051-4058.
Fante et al., "Reflection properties of the Salisbury screen", IEEE Transactions on Antennas and Propagation, Oct. 1988, vol. 36, No. 10, pp. 1443-1454.
Fernandez, "Advanced Deployable Shell-Based Composite Booms for Small Satellite Structural Applications Including Solar Sails", International Symposium on Solar Sailing, Jan. 17-20, 2017, Kyoto, Japan, 19 pgs.
Fernlund, "Experimental and numerical study of the effect of cure cycle, tool surface, geometry, and lay-up on the dimensional fidelity of autoclave-processed composite parts", Composites—Part A: Applied Science and Manufacturing, 33(3):341-351, 2002.
Herbeck et al., "Development and test of deployable ultra-lightweight CFRP-booms for a Solar Sail", European Space Agency, (Special Publication) ESA SP, 49(468):107-112, 2001.
Hillebrandt et al., "The Boom Design of the De-Orbit Sail Satellite", European Conference on Spacecraft Structures, Materials and Mechani-

(56) References Cited

OTHER PUBLICATIONS cal Testing, European Conference on Spacecraft Structures, Materials & Environmental Testing, Apr. 1-4, 2014, Braunschweig, Germany., 8 pgs.
Huang et al., "Gate-tunable conducting oxide metasurfaces", Nano Letters, vol. 16, No. 9., web publication date Aug. 26, 2016, pp. 5319-5325.
Irwin et al., "Low-Mass Deployable Spacecraft Booms", AIAA Space 2010 Conference & Exposition, pp. 1-11, Aug. 30, 2010.
Jang et al., "Tunable large resonant absorption in a midinfrared graphene Salisbury screen", Physical Review. B, Oct. 8, 2014, vol. 90, No. 16, pp. 165409-1-165409-5.
Kelly, "On Kirchhoff's law and its generalized application to absorption and emission by cavities", Journal of Research of the National Bureau of Standards-B. Mathematics and Mathematical Physics, Jul.-Sep. 1965, vol. 69B, No. 3, pp. 165-171.
Kildishev et al., "Planar Photonics with Metasurfaces", Science, Mar. 15, 2013, vol. 339, No. 6125, pp. 1232009-1-1232009-6.
Knott et al., "Performance Degradation of Jaumann Absorbers Due to Curvature", IEEE Transactions on Antennas and Propagation, Jan. 1980, vol. AP28, No. 1, pp. 137-139.
Kryder et al., "Heat Assisted Magnetic Recording", Proceeding of the IEEE, current version published Dec. 2, 2008, vol. 96, No. 11, pp. 1810-1835.
Leclerc et al., "Characterization of Ultra-Thin Composite Triangular Rollable and Collapsible Booms", 4th AIAA Spacecraft Structures Conference, AIAA SciTech Forum, Jan. 2017, 15 pgs.
Liang et al., "Additive Enhanced Crystallization of Solution-Processed Perovskite for Highly Efficient Planar-Heterojunction Solar Cells", Advanced Materials, Mar. 14, 2014, vol. 26, pp. 3748-3754.
Luukkonen et al., "A thin electromagnetic absorber for wide incidence angles and both polarizations", IEEE Transactions on Antennas and Propagation, IEEE Transactions on Antennas and Propagation Jul. 28, 2009, pp. 3119-3125.
Mankins, "A technical overview of the "SunTower" solar power satellite concept", Acta Astronautica, 50(6):369-377, Mar. 1, 2002.
Jaffe et al., "Development of a Sandwich Module Prototype for Space Solar Power", 2012 IEEE Aerospace Conference, Mar. 3-10, 2012, Big Sky, MT, USA, pp. 1-9, DOI: 10.1109/AERO.2012.6187077.
Jaffe et al., "Energy Conversion and Transmission Modules for Space Solar Power", Proceedings of the IEEE, Jun. 2013, vol. 101, No. 6, pp. 1424-1437, DOI: 10.1109/JPROC.2013.2252591.
Mankins, "SPS-Alpha: The First Practical Solar Power Satellite via Arbitrarily Large Phased Array (A 2011-2012 NASA NIAC Phase 1 Project)", Artemis Innovation Management Solutions LLC, Sep. 15, 2012, NIAC Phase 1 Final Report, 113 pgs.
Rubenchik et al., "Solar Power Beaming: From Space to Earth", U.S. Department of Energy Office of Scientific and Technical Information, Apr. 14, 2009, Technical Report LLLNL-TR-412782, 16 pgs. DOI: 10.2172/952766.
Sasaki et al., "A new concept of solar power satellite: Tethered-SPS", Acta Astronautica, 2006, vol. 60, pp. 153-165, doi:10.1016/j.actaastro.2006.07.010.
Messenger et al., "Quantifying low energy proton damage in multijunction solar cell", in the proceedings of the 19th Space photovoltaic research and technology conference, 2005, NASA/CP-2007-214494, pp. 8-17.
Miyazawa et al., "Evaluation of radiation tolerance of perovskite solar cell for use in space", Photovoltaic Specialist Conference (PVSC), 2015 IEEE 42nd, New Orleans, LA, USA, Dec. 17, 2015, pp. 1-4, published Jun. 1, 2015.
Mizuno et al., "A black body absorber from vertically aligned single-walled carbon nanotubes", Proc. Natl. Acad. Sci., Apr. 14, 2009, vol. 106, No. 15, pp. 6044-6047.
Narimanov et al., "Reduced reflection from roughened hyperbolic metamaterial", Optics Express, Jun. 17, 2013, vol. 21, No. 12, pp. 14956-14961.
Ni et al., "Metasurface holograms for visible light", Nature Communications, Nov. 15, 2013, vol. 4, pp. 1-6.
NTPT, "NTPT Thin prepreg 402", Data sheet, Version 1.6, May 11, 2017, 5 pgs.
O'Hara, "Mechanical properties of silicone rubber in a closed volume", Technical Report, Army Armament Research and Development Center, Dec. 1983, 21 pgs.
Pellegrino, "AAReST telescope architecture", obtained from http://www.pellegrino.caltech.edu/aarest2/, printed Jul. 5, 2017, 4 pgs.
Penjuri, "Simulation and Testing of Deployable CFRP Booms for Large Space Structures", PhD thesis, Aug. 2011, 118 pgs.
Pors et al., "Analog Computing Using Reflective Plasmonic Metasurfaces", Nano Lett., Dec. 18, 2014, vol. 15, pp. 791-797.
Radford et al., "Measurement of Manufacturing Distortion in Flat Composite Laminates", International Conference on Composite Materials, Jul. 1999, 9 pgs.
Radford et al., "Separating Sources of Manufacturing Distortion in Laminated Composites", Journal of Reinforced Plastics and Composites, first published May 1, 2000, vol. 19, No. Aug. 2000, pp. 621-641.
Rakic et al., "Algorithm for the determination of intrinsic optical constants of metal films: application to aluminum", Applied Optics, Aug. 1, 1995, vol. 34, No. 22, pp. 4755-4767.
Rakic et al., "Optical Properties of Metallic Films for Vertical-Cavity Optoelectronic Devices", Applied Optics, Aug. 1, 1998, vol. 37, No. 22, pp. 5271-5283.
Raman et al., "Passive radiative cooling below ambient air temperature under direct sunlight", Nature, Nov. 27, 2014, vol. 515, pp. 540-544.
Reha et al., "A Dual-Band Rectangular CPW Folded Slot Antenna for GNSS Applications", International Journal of Advanced Research in Electrical, Electronics and Instrumentation Engineering, Aug. 2014. pp. 11055-11061.
Rephaeli et al., "Absorber and emitter for solar thermo-photovoltaic systems to achieve efficiency exceeding the Shockley-Queisser limit", Optics. Express, Aug. 11, 2009, vol. 17, No. 17, pp. 15145-15159.
Santer et al., "Composite Tube Flexures at Nanosatellite Scale", 4th AIAA Space-craft Structures Conference, Jan. 9-13, 2017, 12 pgs.
Sasaki, "How Japan plans to build an orbital solar farm", printed from https://energy.gov/articles/space-based-solar-power, published Apr. 24, 2014.
Seffen et al., "Deployment dynamics of tape springs", Proceedings of the Royal Society of London A: Mathematical, Physical and Engineering Sciences, Mar. 9, 1999, vol. 455, pp. 1003-1048.
Shaltout et al., "Time-varying metasurfaces and Lorentz non-reciprocity", Optical Materials Express, Nov. 1, 2015, vol. 5, No. 11, pp. 2459-2467.
Shin-Etsu, "Meeting the increasingly diverse and sophisticated needs of industry with the unique properties of silicone rubbers", Characteristic properties of Silicone Rubber Compounds, 2013, 16 pgs.
Sickinger et al., "Lightweight deployable booms: Design, manufacture, verification, and smart materials application", 55th International Astronautical Congress, Vancouver, Canada, Oct. 4-8, 2004, pp. 1-11.
Sihn et al., "Experimental studies of thin-ply laminated composites", Composites Science and Technology, May 1, 2007, vol. 67, pp. 996-1008.
Silva et al., "Performing Mathematical Operations with Metamaterials", Science, Jan. 10, 2014, vol. 343, No. 6167, pp. 160-163.
Stabile et al., "Coiling dynamic analysis of thin-walled composite deployable boom", Composite Structures, Mar. 29, 2014, vol. 113, pp. 429-436.
Steeves, "Multilayer Active Shell Mirrors", Thesis of John Steeves, May 5, 2015, 164 pgs.
Streyer et al., "Strong absorption and selective emission from engineered metals with dielectric coatings", Optics Express, Apr. 8, 2013, vol. 21, No. 7, pp. 9113-9122.
Stuart et al., "Absorption enhancement in silicon-on-insulator waveguides using metal island films,", Appl. Phys. Lett., Oct. 14, 1996, vol. 69, No. 16, pp. 2327-2329.

(56) References Cited

OTHER PUBLICATIONS

Stuart et al., "Island size effects in nanoparticle-enhanced photodetectors", Appl. Phys. Lett., Dec. 28, 1998, vol. 73, No. 26, pp. 3815-3817.
Svanberg et al., "An experimental investigation on mechanisms for manufacturing induced shape distortions in homogeneous and balanced laminates", Composites—Part A: Applied Science and Manufacturing, Jun. 1, 2001, vol. 32, pp. 827-838.
Torayca, "T800H Technical Data Sheet", Technical report No. CFA-007, 2 pgs.
Walker et al., "An investigation of tape spring fold curvature", Proceedings of the 6th International Conference on Dynamics and Control of Systems and Structures in Space, Citeseer, 2004, 10 pgs.
Walters et al., "Spenvis implementation of end-of-life solar cell calculations using the displacement damage dose methodology", in the Proceedings of the 19th Space Photovoltaic Research and Technology Conference, Feb. 1, 2007, 9 pgs.
Weinberg et al., "Radiation and temperature effects in gallium arsenide, indium phosphide, and silicon solar cells", National Aeronautics and Space Administration Technical Memorandum 89870, May 4-8, 1987, 14 pgs., published Feb. 1, 1987.
Wells et al., "Metamaterials-based Salisbury screens with reduced angular sensitivity", Appl. Phys. Lett., Oct. 21, 2014, vol. 105, pp. 161105-1-161105-4.
White et al., "Cure Cycle Optimization for the Reduction of Processing-Induced Residual Stresses in Composite Materials", Journal of Composite Materials, Dec. 1, 1993, vol. 27, No. 14, pp. 1352-1378.
Whorton et al., "Nanosail-D: the first flight demonstration of solar sails for nanosatellites", 22nd AIAA/USU Conference on Small Satellites, Aug. 11, 2008, pp. 1-6.
Wood, "Space-based solar power", printed Jul. 5, 2017 from https://energy.gov/articles/space-based-solar-power, Mar. 6, 2014, 7 pgs.
Wu et al., "Retarding the crystallization of PbI2 for highly reproducible planar-structured perovskite solar cells via sequential deposition", Energy & Environmental Science 7, Jun. 24, 2014, pp. 2934-2938.
Yamaguchi, "Radiation-resistant solar cells for space use", Solar Energy Materials & Solar Cells, 2001. vol. 68, pp. 31-53.
Yamaguchi et al., "Correlations for damage in diffused-junction InP solar cells induced by electron and proton irradiation", Journal of Applied Physics, May 1, 1997, vol. 81, No. 9, 6013-6018.
Yamaguchi et al., "Mechanism for the anomalous degradation of Si solar cells induced by high fluence 1 MeV electron irradiation", Applied Physics Letters, May 27, 1996, vol. 68, No. 22, pp. 3141-3143.
Yu et al., "A Broadband, Background-Free Quarter-Wave Plate Based on Plasmonic Metasurfaces", Nano Letters, Nov. 3, 2012, vol. 12, No. 12, pp. 6328-6333.
Yu et al., "Flat optics with designer metasurfaces", Nature Materials, published online Feb. 2014, vol. 13, pp. 139-150.
Zhang et al., "Infrared Refractive Index and Extinction Coefficient of Polyimide Films", International Journal of Thermophysics, May 1, 1998, vol. 19, No. 3, pp. 905-916.
Zheng et al., "Metasurface holograms reaching 80% efficiency", Nature Nanotechnology, published online Feb. 23, 2015, pp. 1-6.
Zhu et al., "Radiative cooling of solar cells", Optica, Jul. 22, 2014, vol. 1, pp. 32-38.
Zhu et al., "Radiative cooling of solar absorbers using a visibly transparent photonic crystal thermal blackbody", PNAS, Oct. 6, 2015, vol. 112, pp. 12282-12287.
International Preliminary Report on Patentability for International Application PCT/US2016/043424, Report dated May 15, 2018, dated May 24, 2018, 12 Pgs.
Extended European Search Report for European Application No. 16828571.6, Search completed Mar. 18, 2019, dated Mar. 22, 2019, 17 Pgs.
Extended European Search Report for European Application No. 16835856.2, Search completed Feb. 22, 2019 dated Mar. 1, 2019, 8 Pgs.
International Preliminary Report on Patentability for International Application PCT/US2015/030895, dated Nov. 15, 2016, dated Nov. 24, 2016, 12 Pgs.
Banik et al., "Verification of a Retractable Solar Sail in a Thermal-Vacuum Environment", 51st AIAA/ASME/ASCE/AHS/ASC Structures, Structural Dynamics, and Materials Conference, Apr. 12-15, 2010, Orlando, Florida, 11 pgs., doi: 10.2514/6.2010-2585.
Johnson et al., "NanoSail-D: A Solar Sail Demonstration Mission", Acta Astronautica, 2011, Published Online Mar. 6, 2010, vol. 68, pp. 571-575, doi: 10.1016/j.actaastro.2010.02.008.
Leclerc et al., "Stress Concentration and Material Failure During Coiling of Ultra-Thin TRAC Booms", 2018 AIAA Spacecraft Structures Conference, Jan. 7, 2018, p. 0690, 16 pgs., doi: 10.2514/6.2018-0690.
McNutt et al., "Near-Earth Asteroid Scout", American Institute of Aeronautics and Astronautics, AIAA Space 2014 Conference and Exposition, Aug. 4-7, 2014, San Diego, CA, 9 pgs., doi: 10.2514/6.2014-4435.
Murphey et al., "TRAC Boom Structural Mechanics", American Institute of Aeronautics and Astronautics, Jan. 9-13, 2017, Grapevine, TX, 4th AIAA Spacecraft Structures Conference, 13 pgs., doi: 10.2514/6.2017-0171.
Roybal et al., "Development of an Elastically Deployable Boom for Tensioned Planar Structures", American Institute of Aeronautics and Astronautics, Apr. 23-26, 2007, 48th AIAA/ASME/ASCE/AHS/ASC Structures, Structural Dynamics, and Materials Conference, 14 pgs., doi: 10.2514/6.2007-1838.
Stohlman et al., "Thermal Deformation of Very Slender Triangular Rollable and Collapsible Booms", 3rd AIAA Spacecraft Structures Conference, San Diego, California, 2016, pp. 2016-1469.

\* cited by examiner

FIG. 4a
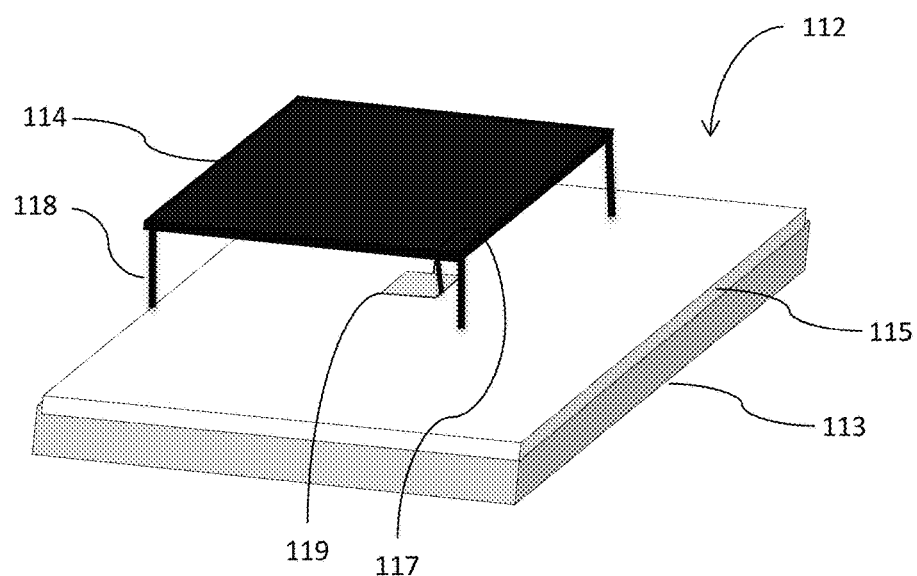
FIG. 4b1
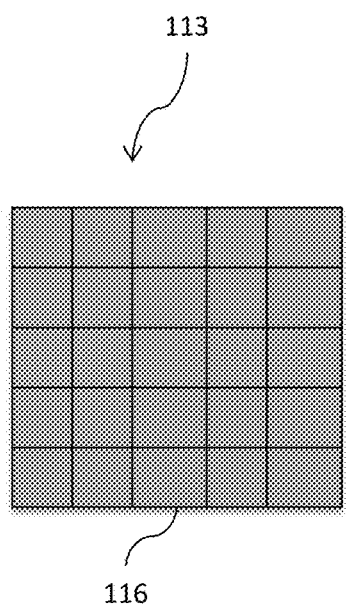
FIG. 4b2
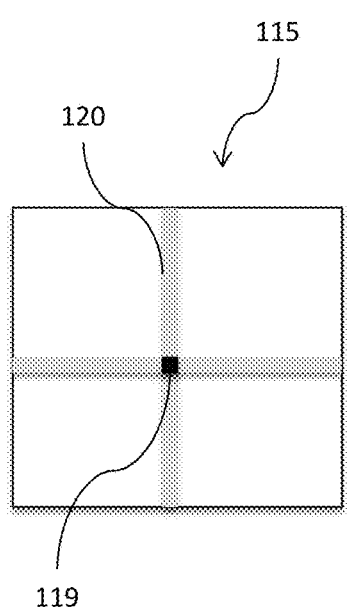
FIG. 4b3
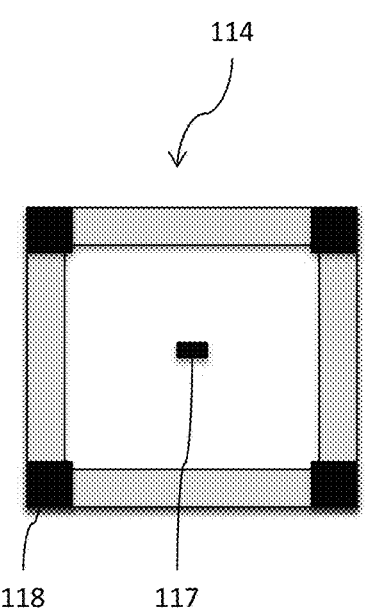

Prior Art

FIG. 15a1
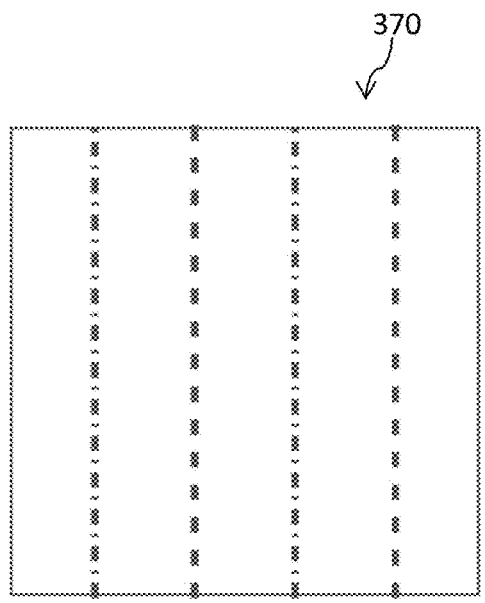
FIG. 15a2
FIG. 15a3
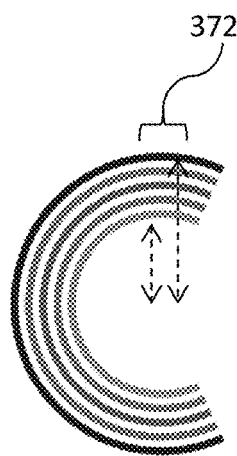
FIG. 15b1
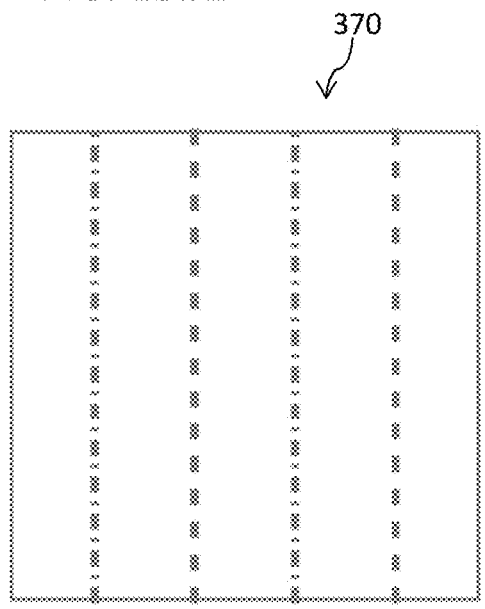
FIG. 15b2
FIG. 15b3
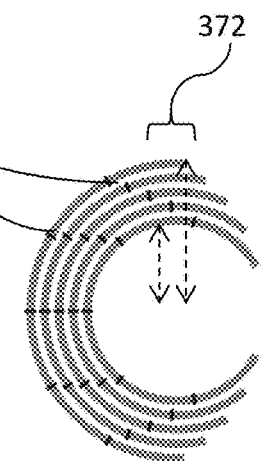

$-\dfrac{L}{2}$ $\qquad\qquad\qquad\qquad\qquad\qquad\qquad\qquad\qquad\dfrac{L}{2}$

399

FIG. 23a1
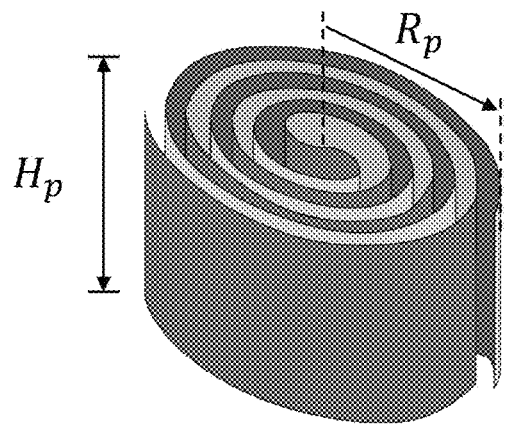
FIG. 23a2
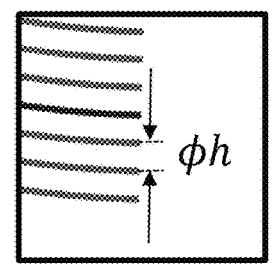
FIG. 23a3
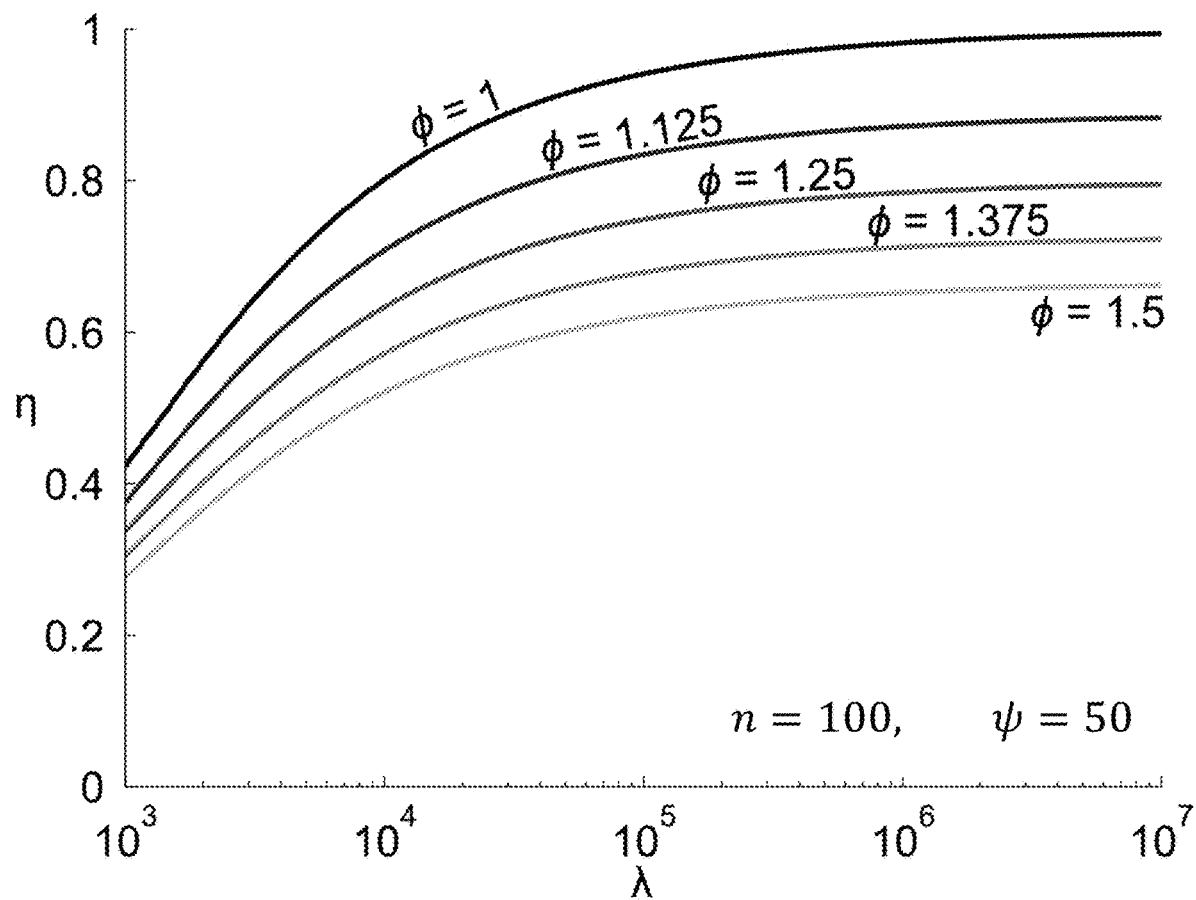

FIG. 23b1
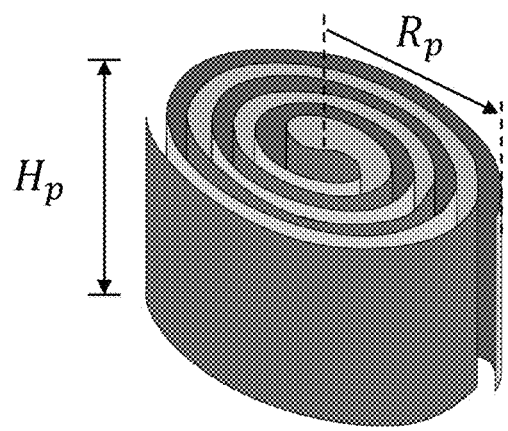
FIG. 23b2
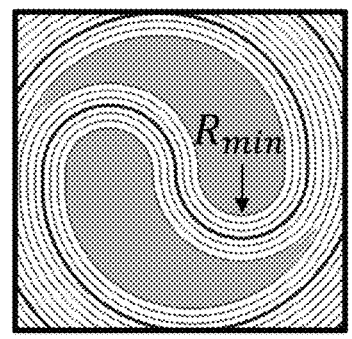
FIG. 23b3
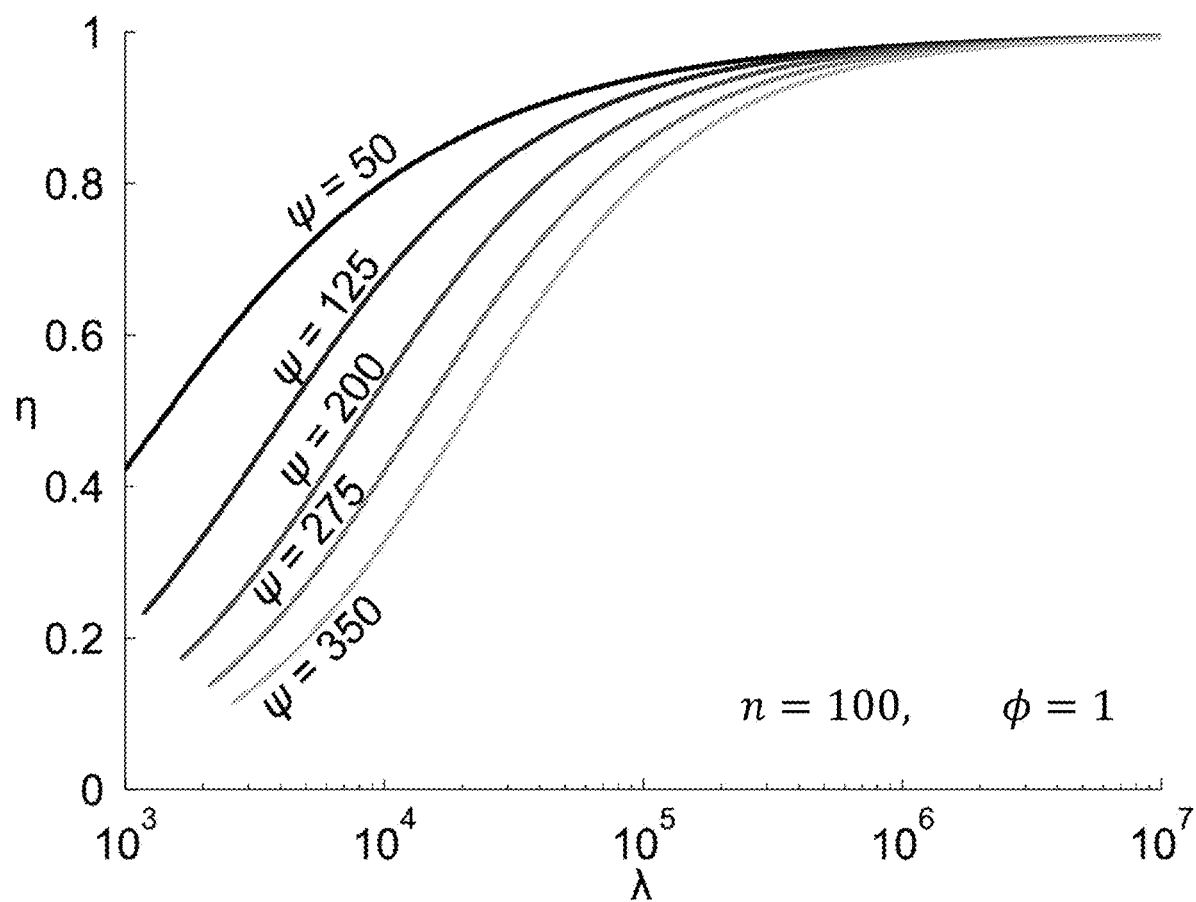

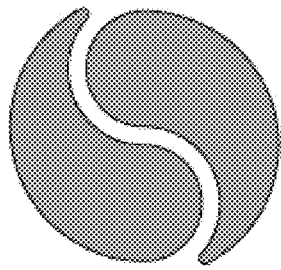
FIG. 25a2
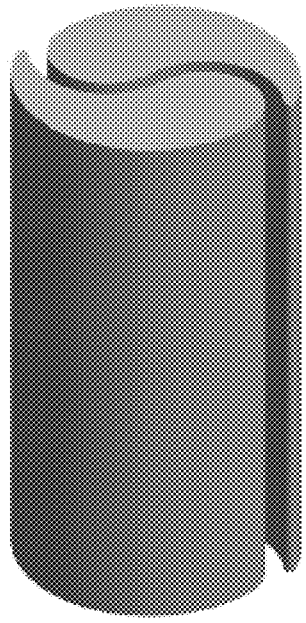
FIG. 25a1
(a) Conceptual design
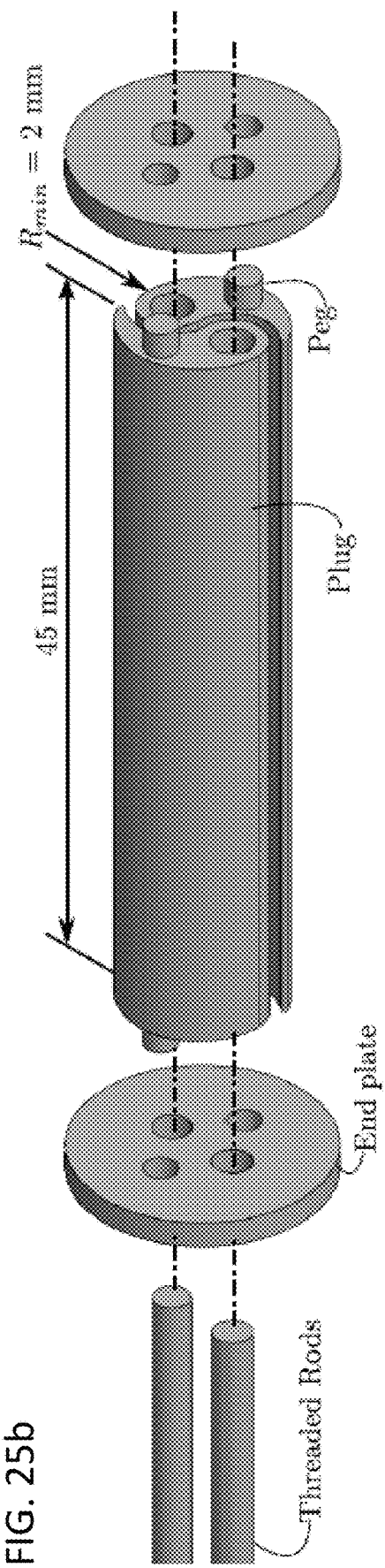
(b) Design details
FIG. 25b FIG. 27
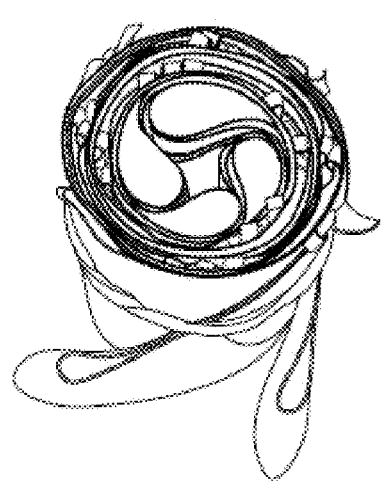
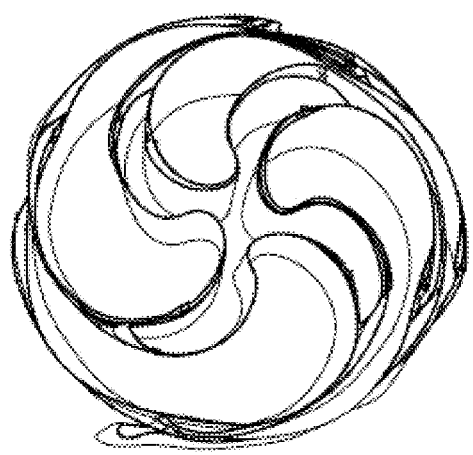
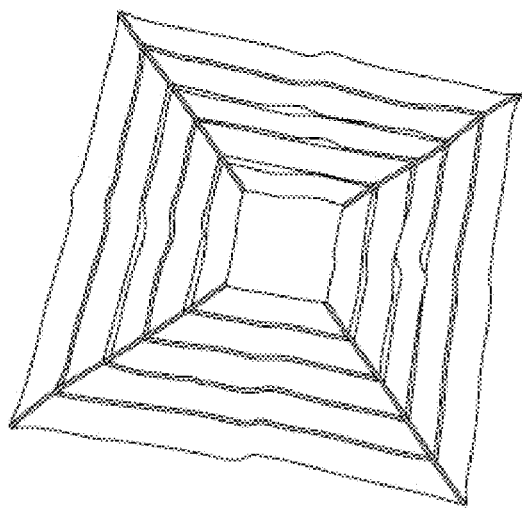
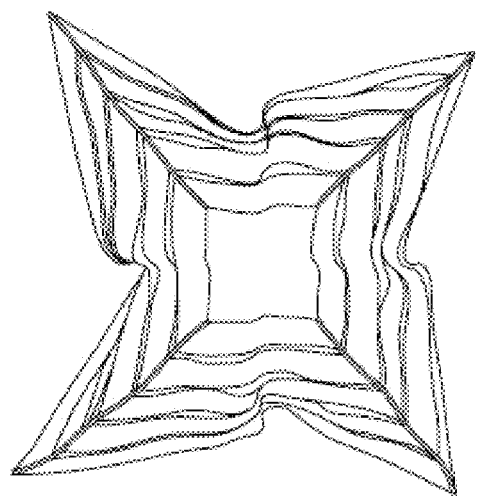

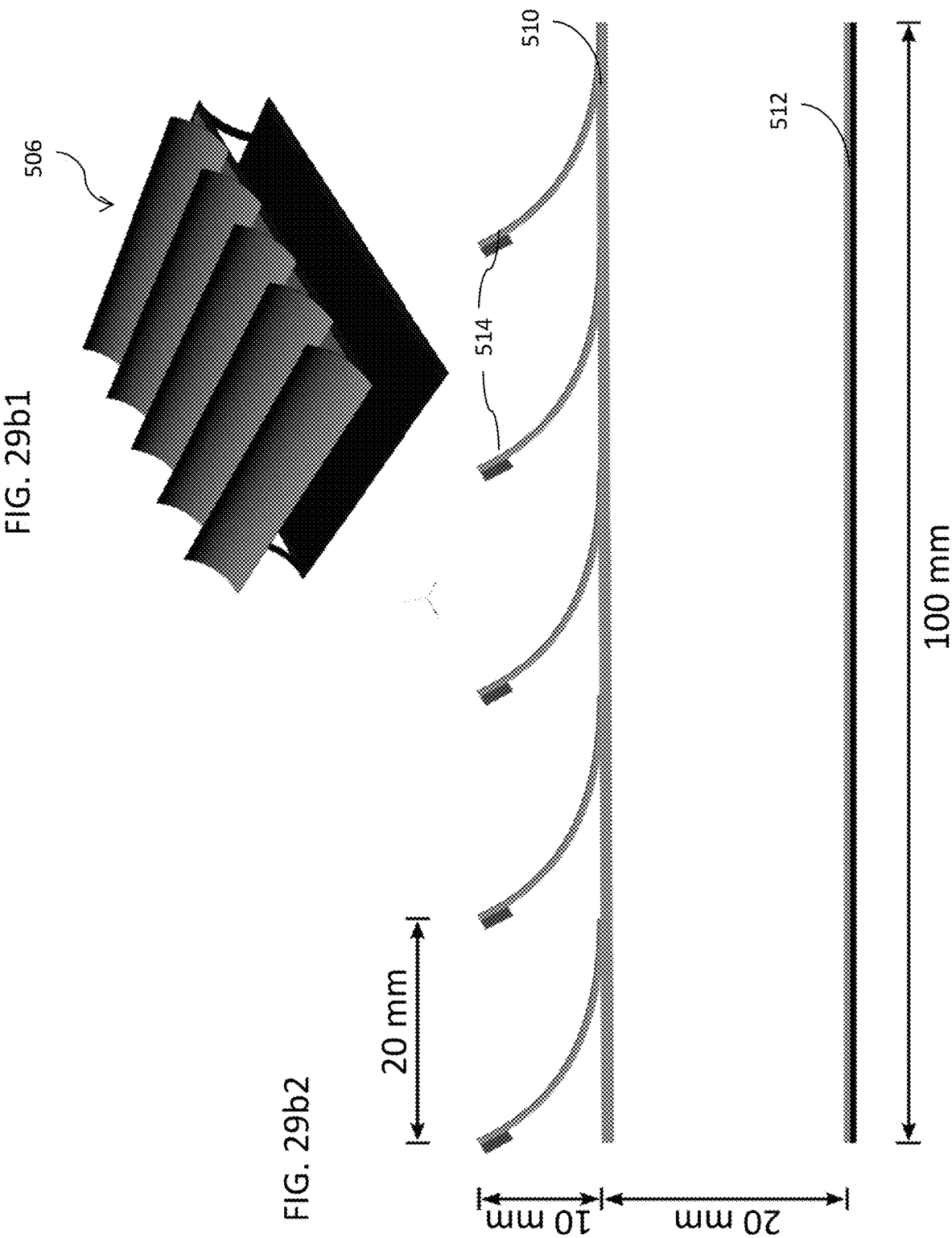

Mode 1

Mode 2

Mode 3

Mode 4

FIG. 34a
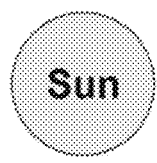
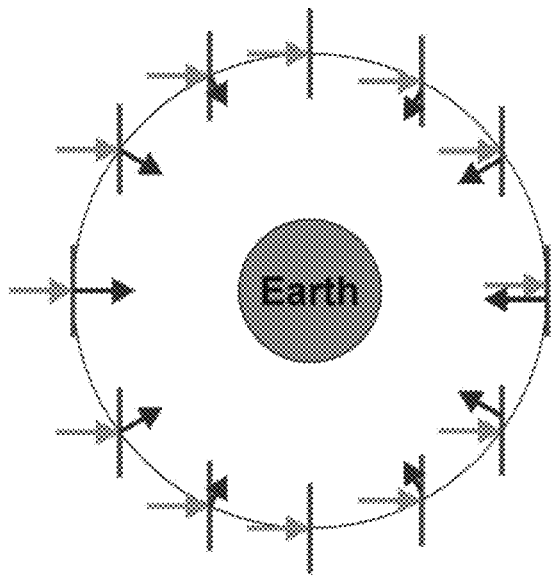
FIG. 34b
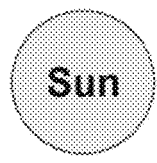
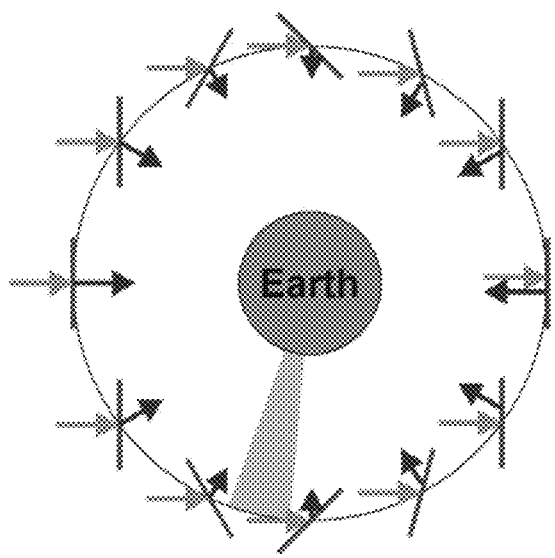

FIG. 49a
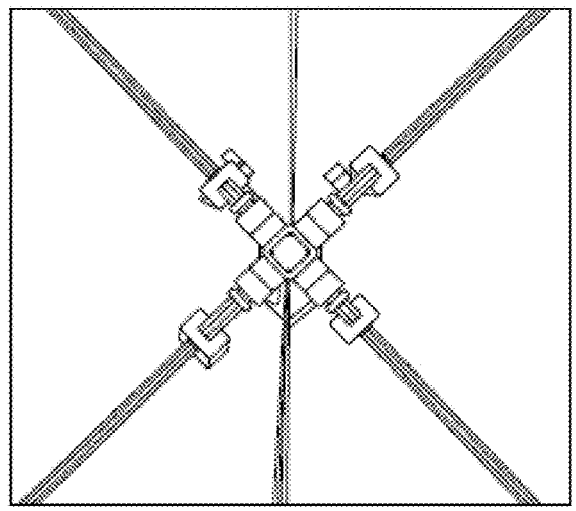
(a) Packaged
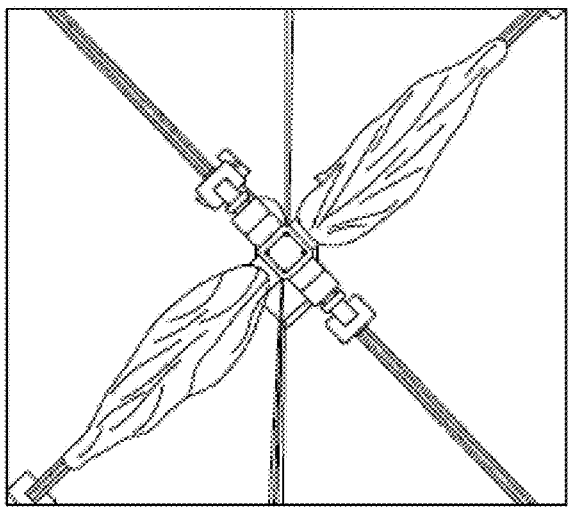
(b) Unwrapped
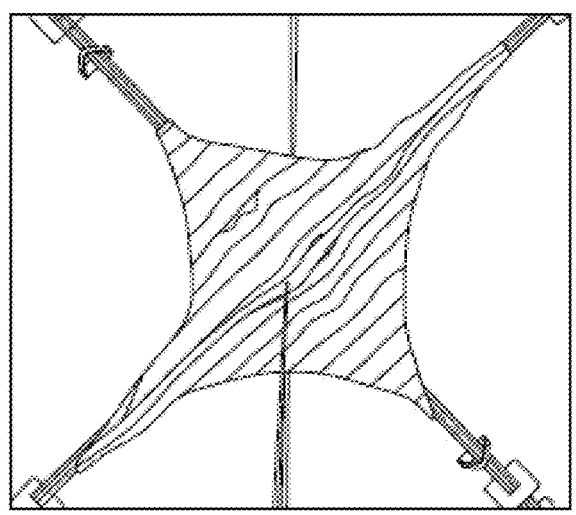
(c) Unfolding
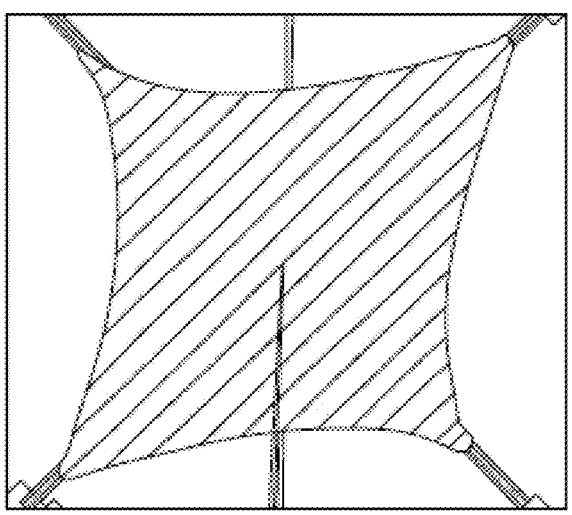
(d) Deployed 954  956  956

952
956
954
952

LARGE-AREA STRUCTURES FOR COMPACT PACKAGING

CROSS-REFERENCE TO RELATED APPLICATIONS

The current application claims priority to the following U.S. Provisional Patent Applications: 62/195,605, filed Jul. 22, 2015; 62/203,159, filed Aug. 10, 2015; 62/220,017, filed Sep. 17, 2015; 62/239,706, filed Oct. 9, 2015; 62/264,500, filed Dec. 8, 2015; 62/268,632, filed Dec. 17, 2015; 62/270,425, filed Dec. 21, 2015; 62/294,859, filed Feb. 12, 2016; 62/295,947, filed Feb. 16, 2016; 62/320,819, filed Apr. 11, 2016; 62/330,341, filed May 2, 2016; and 62/340,644, filed May 24, 2016, the disclosures of each of which are incorporated herein by reference.

FIELD OF THE INVENTION

The present invention is related to a space-based solar power station including lightweight compactible structures for a plurality of solar power satellite modules, more specifically to a modular space-based power station with a plurality of compactable independent solar power satellite modules flown in an orbital formation that by themselves or in unison form a phased and/or amplitude array at radio frequencies for power transmission from space to Earth, each module having a plurality of compactible power generation tiles having integrated photovoltaic cells, antennas, thermal radiator and control circuits in varying configurations; and methods and mechanism for the deployment of such lightweight compactible structures.

BACKGROUND

Space-based solar power (SBSP) describes the collection of solar power in space by a solar-power satellite or a satellite power system (SPS) and then the conversion and transmission of the power to a remote receiver for conversion back to electrical power. In an SBSP system, solar energy is collected as electrical energy on board, powering some manner of wireless power transmission to a receiver located remotely from the SPS. The wireless power transmission application might include a microwave transmitter or laser emitter, which would direct its beam toward a collector, such as a power receiving rectenna at the remote location, such as, on the Earth's surface.

SBSP differs from ground-based solar collection methods in that the means used to collect energy resides on an orbiting satellite instead of on the Earth's surface. Basing such a system in space results in a higher collection rate for the solar energy due to the lack of a diffusing atmosphere. In a conventional ground-based system a large percentage (55-60%) of the solar energy is lost on its way through the atmosphere by the effects of reflection and absorption. Space-based solar power systems convert solar energy to a far-field emission such as microwaves outside the atmosphere, avoiding these losses. In addition, SBSP systems have a longer collection period and the ability to collect solar energy continuously without the downtime (and cosine losses, for fixed flat-plate collectors) that result from the Earth's rotation away from the sun.

A general limitation for SBSP systems is the size of SPS required to generate sufficient electrical power from solar energy. For example, for a 500 MW system a 5 km$^2$ platform may be required. Such a platform would be formed of large satellites on the order to tens to hundreds of tonnes/satellite. The launch costs associated with placing such large structures into orbit reduces the economic viability of such SBSP systems.

SUMMARY

Systems and methods in accordance with various embodiments of the invention provide compactible lightweight structures for a space-based solar power (SBSP) system including compactible lightweight structures for a plurality of solar-power satellite modules. In a number of embodiments, the satellite modules include a plurality of lightweight compactible modular power generation tiles combining at least one photovoltaic cell, a power transmitter and circuitry configured to perform a variety of control functions including (but not limited to) coordinating the participation of the power transmitter in a phased array. Embodiments also provide compactible structures, and methods and mechanisms for deploying such compactible lightweight structures once in a selected operating location. A plurality of the standalone compactible satellite modules may be collocated, deployed into an operating configuration, and flown in any suitable orbital formation in space to collectively constitute the space-based solar power system.

Many embodiments are directed to a space-based solar power station including, a plurality of unconnected compactible satellite modules disposed in space in an orbital array formation, wherein each of the compactible satellite modules including a plurality of structural elements moveably interconnected such that the dimensional extent of the satellite modules in at least one axis is compactible, a plurality of power generation tiles disposed on each of the plurality of moveable elements, each of the power generation tiles having at least one photovoltaic cell and at least one power transmitter collocated thereon, the at least one photovoltaic cell and power transmitter in signal communication such that an electrical current generated by the collection of solar radiation by the at least one photovoltaic cell powers the at least one power transmitter, and where each of the at least one power transmitters including an antenna; and control electronics that controls the phase of a radio frequency power signal that feeds the antenna so that the power transmitter is coordinated with power transmitters on other power generation tiles to form a phased array.

In other embodiments the plurality of structural elements have a finite thickness and are foldable relative to each other by one of the following z-folding, fan-folding, double z-folding, Miura-ori, and slip-folding.

In still other embodiments the folded movably interrelated elements are further compacted by wrapping.

In yet other embodiments adjacent structural elements fold together along a fold axis and slip a predetermined distance relative to each other along the fold axis, and wherein at least the edges of the structural elements transverse to the fold axis are continuously interconnected. In some such embodiment material voids are formed along at least portions of the fold axis between the adjacent structural elements. In other such embodiments interconnections are included that bridge the material voids. In still other such embodiments the interconnections comprise one or both ligament folds or hinges. In yet other such embodiments the interconnections are one or more hinges selected from the group consisting of latchable, frictionless, and slippage. In still yet other such embodiments the structural elements are configured to fold along the plurality of fold axes into a stack of a plurality of structural elements compacted along an axis transverse to the fold axis. In still yet other such embodiments the stack of a plurality of structural elements is wrappable into a curved structure having a bend radius at which permanent deformation of the structural elements is avoided. In still yet other such embodiments the bend radius does not exceed a minimum bend radius $R_{min}$ given by:

$$\frac{1}{R_{min}} = \frac{2\sigma_y}{Eh}$$

where h is the thickness of the individual structural elements, E is the material modulus of the structural elements, and $\sigma_y$ yield stress of the structural elements. In still yet other such embodiments the ends of the longitudinal ends of the stack of a plurality of structural elements undergo no slip during wrapping.

In still yet other embodiments the packaging efficiency, of the satellite module when in a compacted state, as determined by the ratio of the packaged volume of the compacted satellite module to the material volume of the satellite module, is greater than 50%.

In still yet other embodiments the dimensionalized length $\lambda$ of the structural elements ranges from $10^3$ to $10^6$ and the spacing $\phi$ between the structural elements in a compacted state is between 1 and 1.5.

In still yet other embodiments each of the plurality of power generation tiles are formed of a plurality of movably interrelated elements such that at least the photovoltaic cell and power transmitter of each power generation tile are movable relative to each other such that the dimensional extent of the power generation tiles are reducible along at least one axis. In some such embodiments the movably interrelated elements of the power generation tiles are interconnected through one or more resilient members. In other such embodiments at least the photovoltaic cell and the power transmitter on each power generation tile are disposed on separate moveable elements such that the moveable elements displace the photovoltaic cell and power transmitter relative to each other such that an offset transverse to the planes of the photovoltaic cell and power transmitter is opened therebetween. In still other such embodiments the separate moveable elements are interconnected through one or more resilient members. In yet other such embodiments the resilient members are springs. In still yet other such embodiments the resilient members are compactable within the plane of the power transmitter. In still yet other such embodiments one or more conductive elements are included that extend between the offset to conductively couple the power transmitter and the photovoltaic cell. In still yet other such embodiments each of the power generation tiles further comprise one or more collectors configured to concentrate incoming solar radiation onto each of the photovoltaic cells, and wherein the collectors are engageable with one or more expandable structures such that the collectors are displaceable into and out of the plane of the photovoltaic cell. In still yet other such embodiments the expandable structures are resilient members.

In still yet other embodiments the structural elements are prestressed such that a tensional force is distributed thereacross, the tensional force being sufficient to resist spatial deformation of the plane of the satellite module. In some such embodiments the prestress tension is distributed across the structural elements by one or more stabilizing boom arms. In other such embodiments the prestress tension is distributed across the structural elements by one or more weighted elements being subject to a centrifugal force applied by the rotation of the satellite module. In still other such embodiments adjacent structural elements are interconnected through slip-folds, and wherein the prestress tension is distributed anisotropically across the plurality of structural elements such that the tension applied along the slip-fold axis is much greater than the tension applied transverse to the slip-fold axis. In yet other such embodiments the edges of the structural elements transverse to the slip-fold axis are continuously interconnected, and wherein the prestress tension is distributed to the plurality of structural elements through the edges of the structural elements. In still yet other such embodiments the edges of the structural elements are disposed in a parabolic profile. In still yet other such embodiments the structural elements comprise an outer supportive frame through which the prestress tension is applied, the power generation tiles being disposed within the outer supportive frame such that no prestress tension is distributed into the power generation tiles.

In still yet other embodiments a deployment mechanism engageable with the at least two structural elements is included to apply a force thereto such that the elements are moved relative to each other on application of the force. In some such embodiments the deployment mechanism comprises one or more elongatable booms. In other such embodiments the deployment mechanism comprises weighted elements, and wherein the force is applied by rotation of the satellite module.

Many other embodiments are directed to a satellite module deployment mechanism including, a cage defining an internal volume configured to contain a slip-wrapped satellite module therein, the cage being comprised of two separable halves of a hollow body, the separable halves further defining two aligned openings accessing the internal volume disposed opposite each other along the line of separation between the two halves, an elongated clip configured to releasably retain a stack of structural elements, the elongated clip being rotatably disposed within the internal volume of the cage and aligned such that the ends of the stack of structural elements of the slip-wrapped satellite module are aligned with the two openings, wherein the clip rotates about an axis within the cage as the ends of the wrapped structural elements of the slip-wrapped satellite module are extended radially outward from the cage, and wherein the halves of the cage are drawn radially outward away from each other as the structural elements of the elongated stack of structural elements of the slip-wrapped satellite module are unfolded outward from the clip axis.

In other embodiments the clip provides a retaining force sufficient such that the plurality of structural elements are unfolded sequentially.

Still many other embodiments are directed to a wrapping guide plug comprising two rotationally symmetric halves of a cylinder having a curved slit running therethrough, wherein the slit has a thickness sufficient to retain a stack of structural elements between the halves of the cylinder such that the ends of structural elements extend beyond the diameter of the cylinder, and wherein the radius of the cylinder is sufficiently large such that wrapping the structural elements about the circumference of the cylinder does not induce a bend radius on the structural elements that exceeds a minimum bend radius that would result in the plastic deformation of one or more of the structural elements.

In other embodiments the structural elements are pre-slipped relative to each other such that when wrapped about the wrapping guide plug the longitudinal ends of the structural elements are aligned.

Yet many other embodiments are directed to methods of packaging and deploying a satellite module of a space-based power station including, providing a plurality of unconnected compactible satellite modules disposed in space in an orbital array formation, wherein each of the compactible satellite modules includes, a plurality of structural elements wherein adjacent structural elements fold together along a fold axis and slip a predetermined distance relative to each other along the fold axis, and wherein at least the edges of the structural elements transverse to the fold axis are continuously interconnected such that the dimensional extend of the satellite modules in at least one axis is compatible, folding the plurality of structural elements together along an axis transverse to the fold axis such that the plurality of structural elements are compacted into a stack having a longitudinal axis and longitudinal ends transverse to the folding axis, symmetrically rotating the two halves of the stack of the plurality of structural elements at the midpoint of the longitudinal length of the stack; and wrapping the symmetrically rotate halves of the stack of the plurality of structural elements into a cylinder wherein the radius of wrapping does not exceed a minimum radius at which the structural elements would be plastically deformed.

Still yet other embodiments are directed to a space-based solar power station including: a plurality of unconnected compactible satellite modules disposed in space in an orbital array formation, wherein each of the compactible satellite modules includes a plurality of structural elements moveably interconnected such that the dimensional extent of the satellite modules in at least one axis is compatible; a plurality of power generation tiles disposed on each of the plurality of moveable elements, each of the power generation tiles having at least one photovoltaic cell and at least one power transmitter collocated thereon, the at least one photovoltaic cell and power transmitter in signal communication such that an electrical current generated by the collection of solar radiation by the at least one photovoltaic cell powers the at least one power transmitter, and where each of the at least one power transmitters includes, an antenna, and control electronics that controls the phase of a radio frequency power signal that feeds the antenna so that the power transmitter is coordinated with power transmitters on other power generation tiles to form a phased array; and wherein the external perimeter of each of the modules have straight edges such that the module defines a straight-edged geometric shape.

In other embodiments the plurality of structural elements have a finite thickness and are foldable relative to each other by slip-folding. In some such embodiments the plurality of structural elements fold relative to each other via alternating mountain and valley folds. In still other such embodiments the fold between the innermost structural elements is a mountain fold. In yet other embodiments the folded movably interrelated elements are further compacted by rotationally symmetric wrapping.

In still other embodiments adjacent structural elements fold together along a fold axis and slip a predetermined distance relative to each other along the fold axis, and wherein at least the edges of the structural elements transverse to the fold axis are continuously interconnected. In some such embodiments material voids are formed along at least portions of the fold axis between the adjacent structural elements. In still some such embodiments the elements include one or more interconnections that bridge the material voids. In still some such embodiments the interconnections include one or both ligament folds or hinges. In yet some such embodiments the interconnections are one or more hinges selected from the group consisting of latchable, frictionless, and slippage. In still yet some embodiments the structural elements are configured to fold along the plurality of fold axes into a stack of a plurality of structural elements compacted along an axis transverse to the fold axis. In still yet some such embodiments the stack of a plurality of structural elements is wrappable into a curved structure having a bend radius at which plastic deformation of the structural elements is prevented. In still yet some such embodiments the bend radius does not exceed a minimum bend radius $R_{min}$ given by:

$$\frac{1}{R_{min}} = \frac{2\sigma_y}{Eh}$$

where h is the thickness of the individual structural elements, E is the material modulus of the structural elements, and $\sigma_y$ yield stress of the structural elements. In still yet some such embodiments the longitudinal ends of the stack of a plurality of structural elements undergo no slip during wrapping.

In yet other embodiments the structural elements are prestressed such that a tensional force is distributed thereacross, the tensional force being sufficient to resist spatial deformation of the plane of the satellite module. In some such embodiments the prestress tension is distributed across the structural elements by one or more stabilizing boom arms. In still some such embodiments the prestress tension is distributed across the structural elements by one or more weighted elements being subject to a centrifugal force applied by the rotation of the satellite module. In yet some such embodiments adjacent structural elements are interconnected through slip-folds, and wherein the prestress tension is distributed anisotropically across the plurality of structural elements such that the tension applied along the slip-fold axis is much greater than the tension applied transverse to the slip-fold axis. In still yet some such embodiments the edges of the structural elements transverse to the slip-fold axis are continuously interconnected, and wherein the prestress tension is distributed to the plurality of structural elements through the edges of the structural elements. In still yet some such embodiments the structural elements comprise an outer supportive frame through which the prestress tension is applied, and wherein the power generation tiles are disposed within the outer supportive frame such that no prestress tension is distributed into the power generation tiles.

In still yet other embodiments the modules include a deployment mechanism engageable with the plurality of structural elements to apply a force thereto such that the elements are moved relative to each other on application of the force. In some such embodiments the deployment mechanism comprises one or more elongatable booms.

In still yet other embodiments the structural elements are comprised of a pair of parallel disposed longerons having a plurality of power generation tiles disposed therebetween.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF DRAWINGS

The description will be more fully understood with reference to the following figures and data graphs, which are presented as various embodiments of the disclosure and should not be construed as a complete recitation of the scope of the disclosure, wherein:

FIG. 4a conceptually illustrates a cross-sectional view of a modular power generation tile, according to one embodiment.

FIGS. 4b1 to 4b3 conceptually illustrates a cross-sectional view of a photovoltaic cell, according to one embodiment.

FIGS. 15a1 to 15a3 and 15b1 to 15b3 conceptually illustrate wrapping of: a) conventionally folded compactible structure; and b) a compactible structure incorporating slip folding, according to embodiments.

FIGS. 23a1 to 23a3 and 23b1 to 23b3 provide data graphs showing the packaging efficiency of slip-wrapped compactible structures as a function of thickness and wrapping radius, according to embodiments.

FIGS. 25a1, a2 and b conceptually illustrate a wrapping guide plug, according to embodiments.

FIG. 27 provides images of a star-folded compactible structure, according to embodiments.

FIGS. 29a and 29b1 to 29b2 conceptually illustrate: a) a perspective view, and b) a cross-sectional view of a compactible power generation tile, according to embodiments.

FIGS. 34a and 34b conceptually illustrate the slewing of a solar power station, according to embodiments.

FIG. 49a provides images of a compactible structure implementing a slip-folding compaction and deployment technique, according to embodiments.

FIG. 49b provides data graphs showing the deploying forces applied to deploy the compactible structure of FIG. 49a.

DETAILED DESCRIPTION

Figure 1:
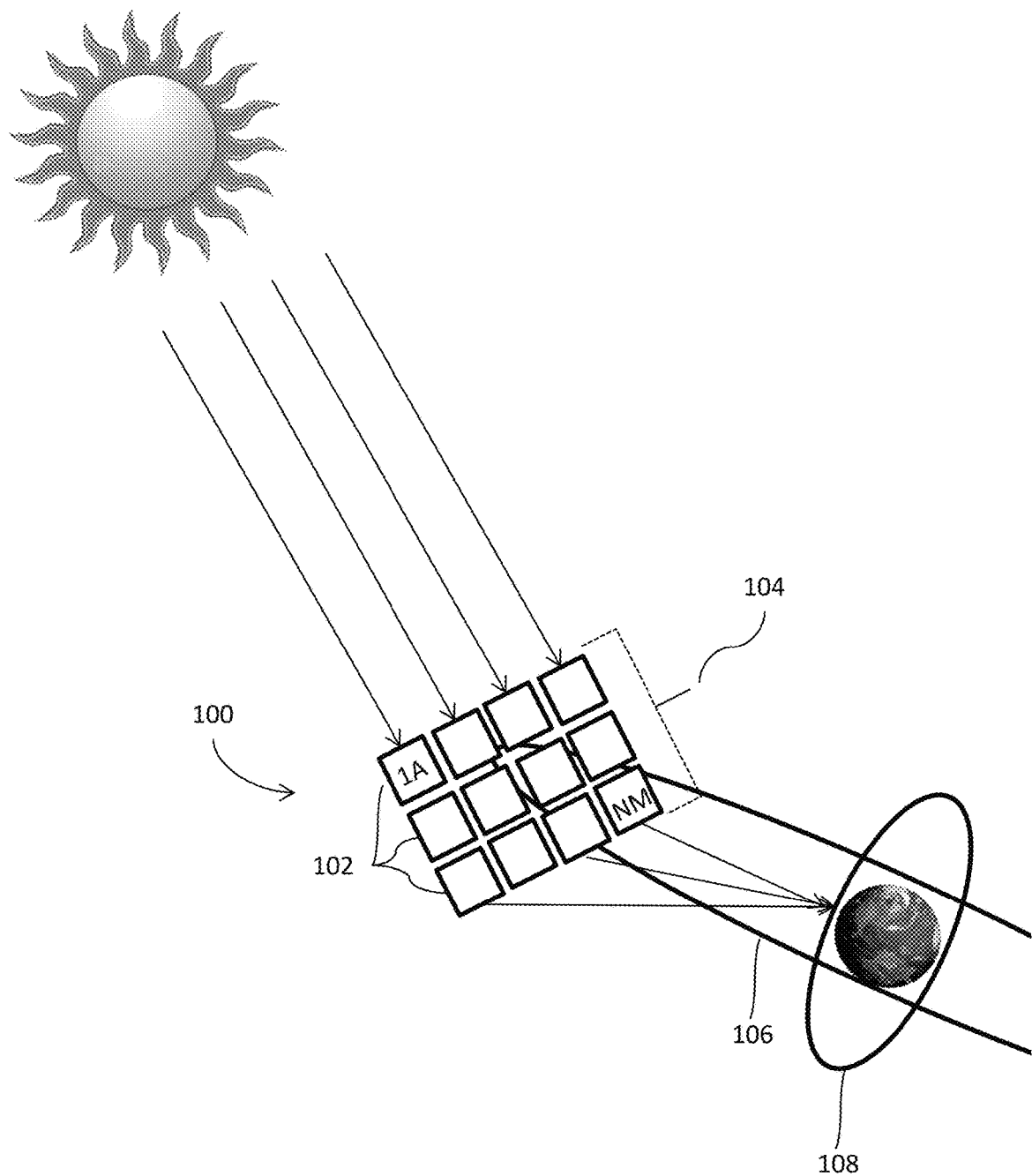
FIG. 1 conceptually illustrates a large-scale space-based solar power station with a plurality of power satellite modules in geosynchronous orbit about the Earth, according to one embodiment.

Turning now to the drawings, compactible lightweight structures for use in large-scale space-based solar power (SBSP) stations in accordance with various embodiments of the invention are illustrated. In many embodiments, the SBSP systems include arrays of independent satellite modules each formed of such compactible structures and incorporating arrays of independent solar electric power generation tiles. In several embodiments, the power generation tiles are each formed from compactible structures incorporating independent photovoltaic cells, power transmitters, and control circuits. Methods for deploying, stabilizing, operating and constructing such large-scale space-based solar power systems in accordance with a number of embodiments of the invention are also described.

A large-scale space-based solar power station is a modular space-based construct that can be formed from a plurality of independent satellite modules placed into orbit within an orbital formation such that the position of each satellite module relative to each other is known. Each of the satellite modules can include a plurality of power generation tiles that capture solar radiation as electrical current and use the current to transmit the energy to one or more remote receivers using power transmitters. In many instances, the transmissions are generated using microwave power transmitters that are coordinated to act as a phased- and/or amplitude array capable of generating a steerable beam and/or focused beam that can be directed toward one or more remote receivers. In other embodiments, any of a variety of appropriate power transmission technologies can be utilized including (but not limited to) optical transmitters such as lasers.

Embodiments relate to lightweight space structures used to construct the modular elements of the solar power station. Some lightweight space structures are used in the construction of the power generation tiles and/or satellite modules and may incorporate movable elements that allow the lightweight space structure to be compacted prior to deployment to reduce the area or dimensional length, height and/or width of the power generation tiles and/or satellite modules prior to deployment. The space structures may be made of any number, size and configuration of movable elements, and the elements may be configured to compact according to any suitable compacting mechanism or configuration, including one or two-dimensional compacting using, among others, z-folding, wrapping, rolling, fan-folding, double z-folding, Miura-ori, slip folding, wrapping, and combinations thereof. Some embodiments of movable elements are interrelated by hinges, such as, frictionless, latchable, ligament, and slippage hinges, among others. Some embodiments of structures are pre-stressed and/or provided with supportive frameworks to reduce out-of-plane macro- and micro-deformation of the lightweight structures. Structures and modules may include dynamic stabilizing movement (e.g., spinning) during deployment and/or operation. Deployment mechanisms to deploy the compactible lightweight structures into a deployed operational state may be incorporated into or associated with embodiments of the lightweight structures. Some deployment mechanisms may include (but are not limited to) expansive boom arms, centrifugal force mechanisms such as tip masses or module self-mass, among others.

Large-scale spaced-based solar power stations according to many embodiments utilize a distributed approach to capture solar radiation, and to use the energy thus captured to operate power transmitters, which transmit power to one or more remote receivers (e.g., using laser or microwave emissions). The satellite modules of the solar power station can be physically independent structures, each comprising an independent array of power generation tiles. The satellite modules are each placed into a specified flying formation within an array of such satellite modules in a suitable orbit about the Earth. The position of each of the independent satellite modules in space within the orbital array formation is controllable via a combination of station-keeping thrusters and controlled forces from absorption, reflection, and emission of electromagnetic radiation, as well as guidance controls. Using such controllers each of the independent satellite modules may be positioned and maintained within the controlled orbital array formation relative to each of the other satellite modules so that each satellite module forms an independent modular element of the large-scale space-based solar power station. The solar radiation received by each of the power generation tiles of each of the independent satellite module is utilized to generate electricity, which powers one or more power transmitters on each of the power generation tiles. Collectively, the power transmitters on each of the power generation tiles can be configured as independent elements of a phased and/or amplitude-array.

The power generation tiles and/or satellite modules may also include separate electronics to process and exchange timing and control information with other power generation tiles and/or satellite modules within the large-scale space-based solar power station. In many implementations, the separate electronics form part of an integrated circuit that possesses the ability to independently determine a phase offset to apply to a reference signal based upon the position of an individual tile and/or transmitter element. In this way, coordination of a phased array of antennas can be achieved in a distributed manner.

In embodiments of the distributive approach, different array elements of the phased array may be directed to transmit power with different transmission characteristics (e.g., phase) to one or more different remote power receiving collectors (e.g., ground based rectenna). Each satellite module of power generation tiles, or combinations of power generating tiles across one or more satellite modules, may thus be controlled to transmit energy to a different power receiving collector using the independent control circuitry and associated power transmitters.

A photovoltaic cell (PV) refers to an individual solar power collecting element on a power generation tile in a satellite module. The PV includes any electrical device that converts the energy of light directly into electricity by the photovoltaic effect including elements made from polysilicon and monocrystalline silicon, thin film solar cells that include amorphous silicon, CdTe and CIGS cells, multijunction cells, perovskite cells, organic/polymer cells, and various alternatives thereof.

A power transmitter or radiator refers to an individual radiative element on a power generation tile in a satellite module and its associated control circuitry. A power transmitter can include any device capable of converting power in the electrical current generated by the PV to a wireless signal, such as microwave radiation or light, including (but not limited to) a laser, a klystron, a traveling-wave tube, a gyrotron, or suitable transistor and/or diode. A power transmitter may also include suitable transmissive antennas, such as, dipole, patch, helical or spherical antennas, among others.

A phased array refers to an array of power transmitters in which the relative phases of the respective signals feeding the power transmitters are configured such that the effective radiation pattern of the power emission of the array is reinforced in a desired emission direction and suppressed in undesired directions. Phased arrays in accordance with embodiments may be dynamic or fixed, active or passive.

An orbital array formation refers to any size, number or configuration of independent satellite modules being flown in formation at a desired orbit in space such that the position of the satellite modules relative to each other is known such that power generation tiles on each of the satellite modules within the formation serves as an array element in the phased array of the solar power station.

A power generation tile refers to an individual solar power collecting and transmitting element in the phased array of the large-scale space-based solar power station. In many embodiments a power generation tile is a modular solar radiation collector, converter and transmitter that collects solar radiation through at least one photovoltaic cell disposed on the tile, and uses the electrical current to provide power to at least one power transmitter collocated on the same tile that transmits the converted power to one or more remote power receiving collectors. Many of the power generation tiles incorporated within a space-based solar power station include separate control electronics independently control the operation of the at least one power transmitter located on the power generation tile based upon timing, position, and/or control information that may be received from other tiles and/or other modules within the large-scale space-based solar power station. In this way, separate control electronics can coordinate (in a distributed manner) the transmission characteristics of each of the power generation tiles form a phased array. Each power generation tile may also include other structures such as radiation collectors for focusing solar radiation on the photovoltaic, thermal radiators for regulating the temperature of the power generation tile, and radiation shielding, among other structures.

A satellite module refers to an array of power generation tiles collocated on a single integral space structure. The space structure of the satellite module may be a compactable structure such that the area occupied by the structure may be expanded or contracted depending on the configuration assumed. The satellite modules may include two or more power generation tiles. Each power generation tile may include at least one solar radiation collector and power transmitter. As discussed above, each of the power generation tiles may transmit power and may be independently controlled to form an array element of one or more phased arrays formed across the individual satellite module or several such satellite modules collectively. Alternatively, each of the power generation tiles collocated on a satellite module may be controlled centrally.

A lightweight space structure refers to integral structures of movably interrelated elements used in the construction of the power generation tiles and/or satellite modules that may be configurable between at least packaged and deployed positions wherein the area and or dimensions of the power generation tiles and/or satellite modules may be reduced or enlarged in at least one direction. The lightweight space structures may incorporate or be used in conjunction with deployment mechanisms providing a deploying force for urging the movable elements between deployed and compacted configurations.

A large-scale space-based solar power station or simply solar power station refers to a collection of satellite modules being flown in an orbital array formation designed to function as one or more phased arrays. In embodiments the one or more phased arrays may be operated to direct the collected solar radiation to one or more power receiving collectors.

Transmission characteristics of a power generation tile refer to any characteristics or parameters of the power transmitter of the power generation tile associated with transmitting the collected solar radiation to a power receiving collector via a far-field emission. The transmission characteristics may include, among others, the phase and operational timing of the power transmitter and the amount of power transmitted.

Structure of Large-Scale Space-Based Solar Power Station

A large-scale space-based solar power station including a plurality of satellite modules positioned in an orbital array formation in a geosynchronous orbit about the Earth in accordance with embodiments of the invention is illustrated in FIG. 1. The large-scale space-based solar power station 100 includes an array of independent satellite modules 102. The solar power station 100 is configured by placing a plurality of independent satellite modules 102 into a suitable orbital trajectory in an orbital array formation 104, according to one embodiment. The solar power station 100 may include a plurality of such satellite modules 1A through NM. In one embodiment, the satellite modules 1A through NM are arranged in a grid format as illustrated in FIG. 1. In other embodiments, the satellite modules are arranged in a non-grid format. For example, the satellite modules may be arranged in a circular pattern, zigzagged pattern or scattered pattern. Likewise, the orbit may be either geosynchronous 106, which is typically at an altitude of 35,786 km above the Earth, or low Earth 108, which is typically at an altitude of from 800 to 2000 km above the Earth, depending on the application of the solar power station. As can readily be appreciated, any orbit appropriate to the requirements of a specific application can be utilized by a space-based solar power station in accordance with various embodiments of the invention.

Figure 2:
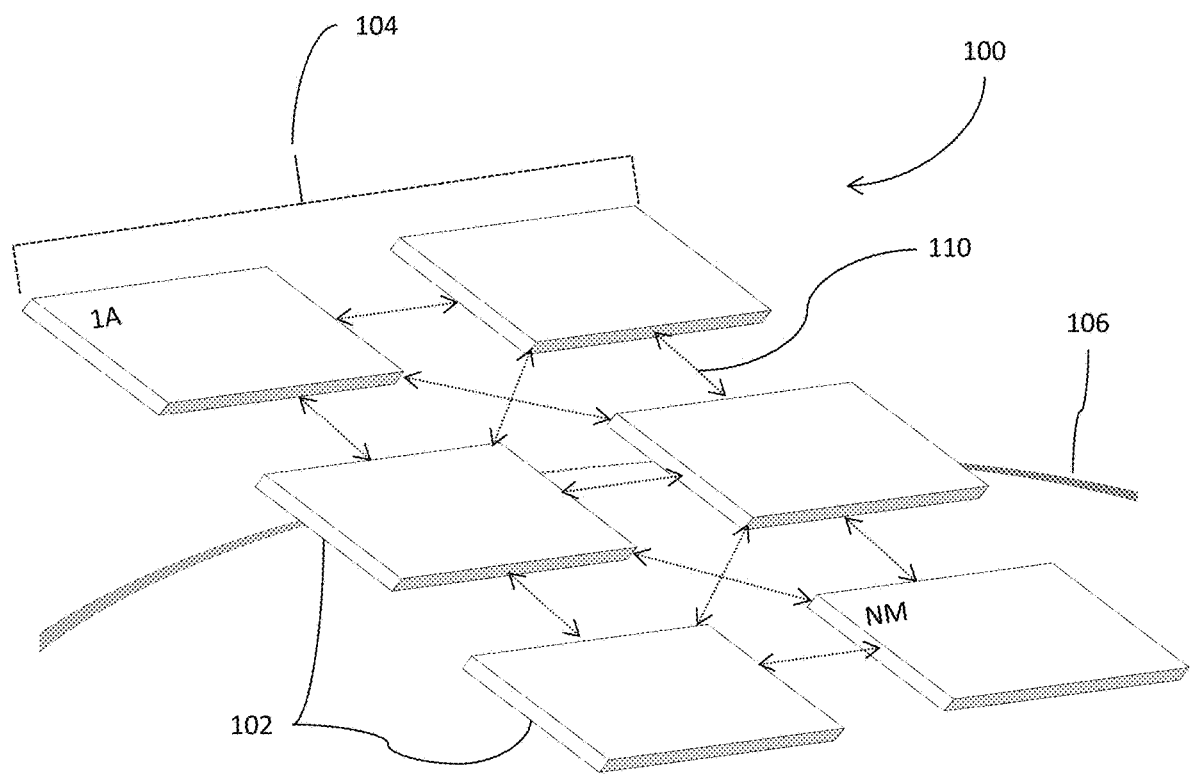
FIG. 2 conceptually illustrates a large-scale space-based solar power station with a plurality of power satellite modules flying in a rectangular orbital formation, according to one embodiment.

In embodiments, the satellite modules in the solar power station are spatially separated from each other by a predetermined distance. By increasing the spatial separation, the maneuverability of the modules in relation to each other is simplified. As discussed further below, the separation and relative orientation of the satellite modules can impact the ability of the power generation tile on each of the satellite modules to operate as elements within a phased array. In one embodiment, each satellite module 1A through NM may include its own station keeping and/or maneuvering propulsion system, guidance control, and related circuitry. Specifically, as illustrated in FIG. 2, each of the satellite modules 102 of the solar power station 100 may include positioning sensors to determine the relative position 110 of the particular satellite module 1A through NM in relation to the other satellite modules 1A to NM, and guidance control circuitry and propulsion system to maintain the satellite module in a desired position within the arbitrary formation 104 of satellite modules during operation of the solar power station. Positioning sensors in accordance with many embodiments can include the use of external positioning data from global positions system (GPS) satellites or international ground station (IGS) network, as well as onboard devices such as inertial measurement units (e.g., gyroscopes and accelerometers), and combinations thereof. In several embodiments, the positioning sensors can utilize beacons that transmit information from which relative position can be determined that are located on the satellite modules and/or additional support satellites. The guidance control and propulsion system may likewise include any suitable combination of circuitry and propulsion system capable of maintaining each of the satellite modules in formation in the solar power station array 104. In many embodiments the propulsion system may utilize, among others, one or more of chemical rockets, such as biopropellant, solid-fuel, resistojet rockets, etc., electromagnetic thrusters, ion thrusters, electrothermal thrusters, solar sails, etc. Likewise, each of the satellite modules may also include attitudinal or orientational controls, such as, for example, reaction wheels or control moment gyroscopes, among others.

Figure 3:
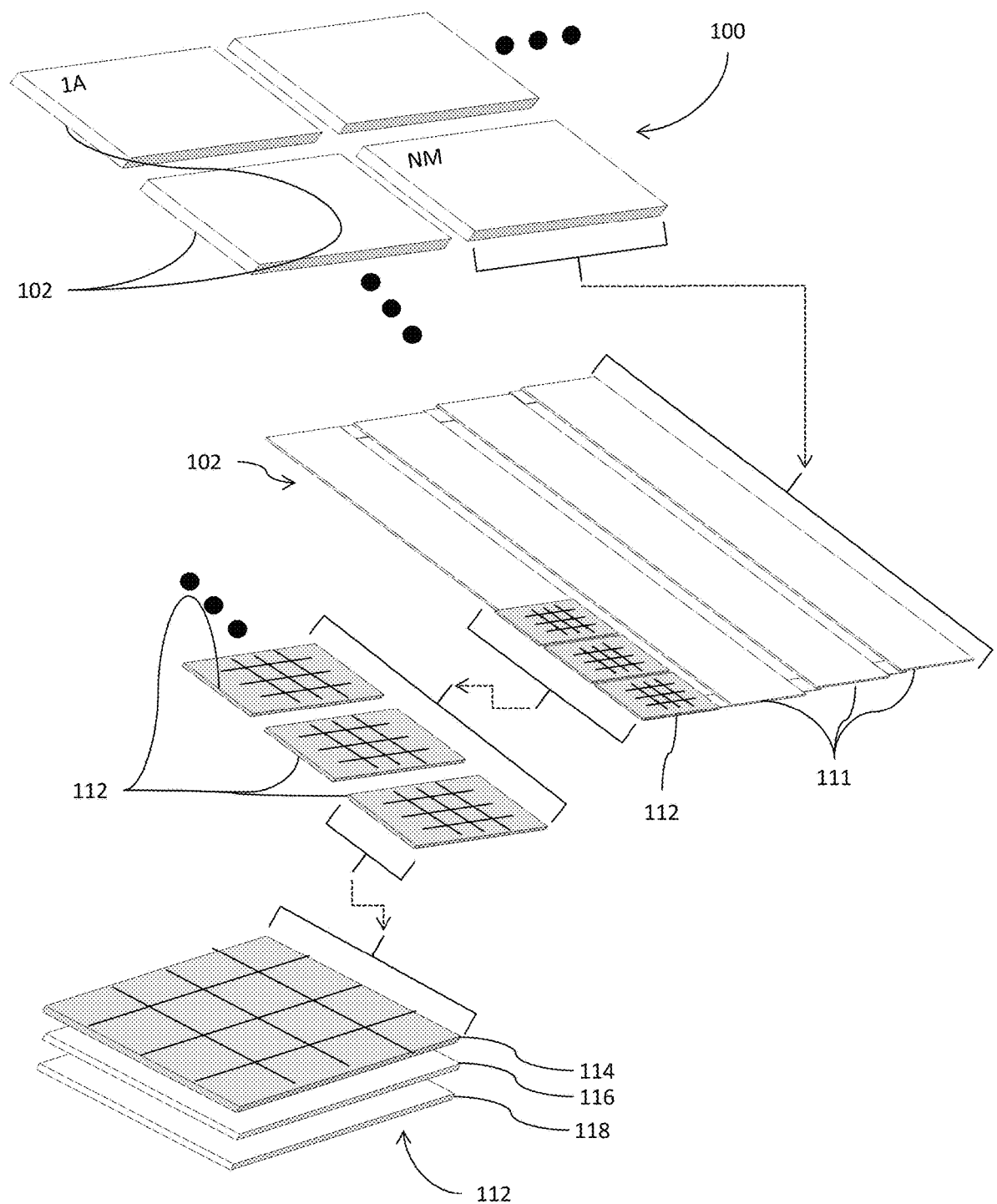
FIG. 3 conceptually illustrates a large-scale space-based solar power station, a satellite module, and a cross-sectional view of a modular power generation tile, according to one embodiment.

In many embodiments, as illustrated in FIG. 3, each satellite module 1A through NM of the solar power station 100 comprises a space structure comprised of one or more interconnected structural elements 111 having one or more power generation tiles 112 collocated thereon. Specifically, each of the satellite modules 1A through NM is associated with an array of power generation tiles 112 where each of the power generation tiles of the array each independently collect solar radiation and covert it to electric current. Power transmitters convert the electrical current to a wireless power transmission that can be received by a remote power receiving station. As discussed above, one or more power transmitters on each of a set of power generation tiles can be configured as an element in one or more phased arrays formed by collections of power generation tiles and satellite modules of the overall solar power station. In one embodiment, the power generation tiles in the satellite module are spatially separated from each other by a predetermined distance. In other embodiments, the construction of the satellite modules is such that the power generation tiles are separated by distances that can vary and the distributed coordination of the power generation tiles to form a phased array involves the control circuitry of individual power transmitters determining phase offsets based upon the relative positions of satellite modules and/or individual power generation tiles.

Figure 4C:
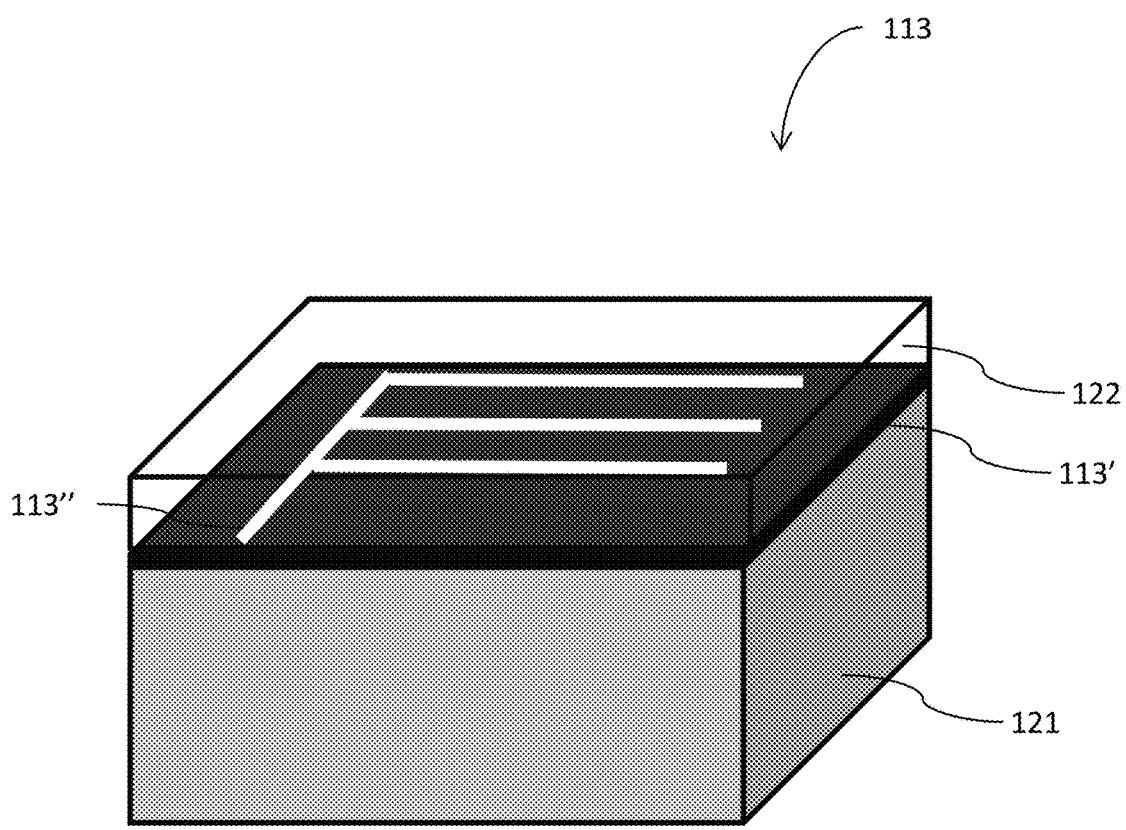
FIG. 4c conceptually illustrates a schematic view of a photovoltaic cell, according to one embodiment.

Power generation tiles 112 according to many embodiments include a multicomponent structure including a photovoltaic cell 113, a power transmitter 114, and accompanying control electronics 115 electrically interconnected as required to suit the needs of the power transmission application. As illustrated in FIG. 4a, in some embodiments photovoltaic cells 113, may comprise a plurality of individual photovoltaic elements 116 of a desired solar collection area that may be interconnected together to produce a desired electrical current output across the power generation tile. Some power transmitters 114 include one or more transmission antennas, which may be of any suitable design, including, among others, dipole, helical and patch. In the illustrated embodiment, a conventional patch antenna 114 incorporating a conductive feed 117 to conductively interconnect the RF power from the control electronics 115 to the antenna 114. As can readily be appreciated the specific antenna design utilized is largely dependent upon the requirements of a specific application. Some power transmitters 114 are physically separated from one or both of the photovoltaic cell 113 and/or the control electronics 115 such as by fixed or deployable spacer structures 118 disposed therebetween. Some control electronics 115 may include one or more integrated circuits 119 that may control some aspect of the power conversion (e.g., to a power emission such as collimated light or an radio frequency (RF) emission such as microwave radiation), movement and/or orientation of the satellite module, inter- and intra-satellite module communications, and transmission characteristics of the power generation tile and/or satellite module. Further conductive interconnections 120 may connect the control electronics 115 to the source power of the photovoltaic cell 113. Each of the power generation tiles may also include thermal radiators to control the operating temperature of each of the power generation tiles.

In some embodiments, the PV 113 is a multi-layer cell, as illustrated in FIGS. 4b1 to 4b3 and 4c, incorporating at least an absorber material 113' having one or more junctions 113" disposed between a back contact 121 on a back side of the absorber material and a top radiation shield 122 disposed on the surface of the absorber material in the direction of the incident solar radiation. The PV may include any electrical device that converts the energy of light directly into electricity by the photovoltaic effect including elements made from polysilicon and monocrystalline silicon, thin film solar cells that include amorphous silicon, CdTe and CIGS cells, multijunction cells, perovskite cells, organic/polymer cells, and various alternatives thereof. In some embodiments the made from a thin film of GaInP/GaAs that is matched to the solar spectrum. Radiation shielding may include a solar radiation transparent material such as $SiO_2$, among others. The back contact may be made of any suitable conductive material such as a conductive material like aluminum, among others. The thickness of the back contact and top radiation shield may be of any thickness suitable to provide radiation shielding to the PV. Additional structures may be provided around the PV to increase the efficiency of the absorption and operation of the device including, for example, one or more concentrators that gather and focus incoming solar radiation on the PV, such as a Cassegrain, parabolic, nonparabolic, hyperbolic geometries or combinations thereof. The PV may also incorporate a temperature management device, such as a radiative heat sink. In some embodiments the temperature management device is integrated with the control electronics and may be configured to control the operating temperature of the PV within a range of from ~150 to 300 K.

In a number of embodiments, the power transmitters that are components of power generation tiles are implemented using a combination of control circuitry and one or more antennas. The control circuitry can provide the power generation tile with the computational capacity to determine the location of the power generation tile antenna(s) relative to other antennas within the satellite module and/or the solar power station. As can readily be appreciated, the relative phase of each element within a phased array is determined based upon the location of the element and a desired beam direction and/or focal point location. The control circuitry on each power generation tile can determine an appropriate phased offset to apply to a reference signal using a determined location of the power generation tile antenna(s) and beam-steering information. In certain embodiments, the control circuitry receives position information for the satellite module and utilizes the position information to determine the location of the power generation tile antenna(s) and determine a phase offset to apply to a reference signal. In other embodiments, a central processor within a satellite module can determine the locations of antennas on power generation tiles and/or phase offsets to apply and provides the location and/or phase offset information to individual power generation tiles.

In many embodiments, the positional information of each tile is received from partially redundant systems, such as, but not limited to, gyroscopes, accelerometers, electronic ranging radar, electronic positioning systems, phase and/or timing information from beacons, as well as employing a priori knowledge from system steering and flight control commands. In several embodiments, electronic systems are located on the ground, and/or in space on satellites deployed for this purpose (and, possibly, other purposes, e.g. in the case of using GPS satellites).

In a number of embodiments, position information may be relayed in a hierarchical fashion between modules, panels and/or tiles within the space-based solar power station, such that a central processing unit relays positional information such as location and orientation of the entire space-based solar power station with respect to a ground station and/or other suitable known locations to modules within the system. The relayed information can be expressed as an absolute and/or differential location(s), and/or orientation(s) as appropriate to the requirements of specific applications. In a similar fashion, the location and/or orientation of each module with respect to the center of the space-based solar power station or other suitable reference point can be determined at each module using processes similar to those outlined above. Furthermore, going down a hierarchical level, the position and orientation information of individual panels and tiles can be determined in a similar fashion. The entirety or any useful part of this information can be used at the tile-level, the panel-level, the module-level, the system-level and/or any combination thereof to control the phase and/or amplitude of each tile radiator to form a beam or focal spot on the ground. The aggregate computational power of the computational resources of each tile, panel and/or module can be utilized since each tile (and/or panel or module) can utilize its local computational power available from a DSP, microcontroller or other suitable computational resource to control its operation such that the system in aggregate generates the desired or close-to desired beam and/or focused transmission.

Figure 4D:
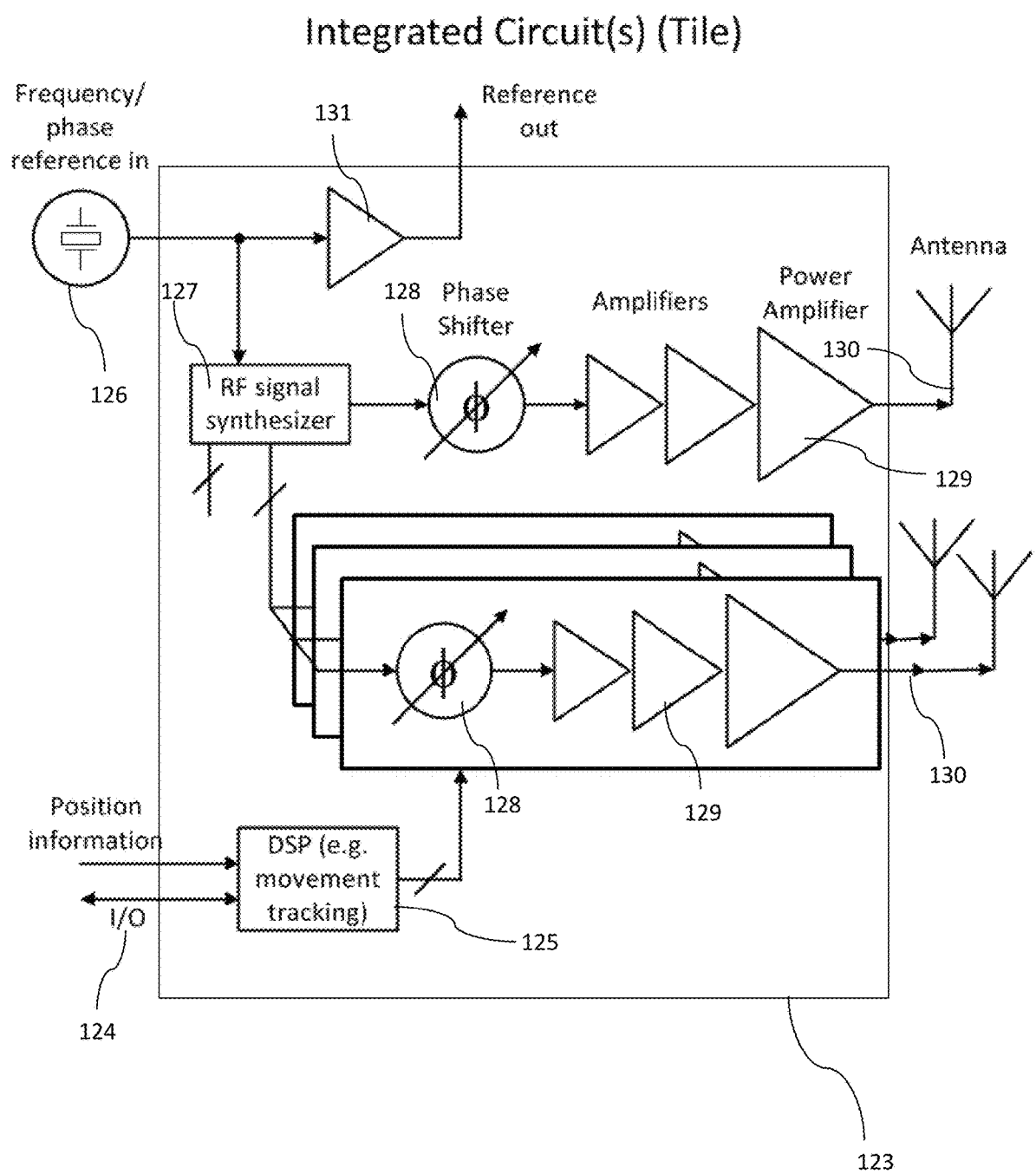
FIG. 4d conceptually illustrates a block-diagram for an integrated circuit suitable for utilization in a power transmitter forming part of a power generation tile, according to one embodiment.

In various embodiments, as illustrated conceptually in FIG. 4*d*, power generation tile control circuitry can be implemented using one or more integrated circuits. An integrated circuit 123 can include an input/output interface 124 via which a digital signal processing block 125 can send and receive information to communicate with other elements of a satellite module, which typically includes a processor and/or memory configured by a control application. In certain embodiments, the digital signal processing block 125 receives location information (see discussion above) that can be utilized to determine the location of one or more antennas. In many embodiments, the location information can include a fixed location and/or one or more relative locations with respect to a reference point. The digital signal processing block can utilize the received location information and/or additional information obtained from any of a variety of sensors including (but not limited to) temperature sensors, accelerometers, and/or gyroscopes to determine the position of one or more antennas. Based upon the determined positions of the one or more antennas, the digital signal processing block 125 can determine a phase offset to apply to a reference signal 126 used to generate the RF signal fed to a specific antenna. In the illustrated embodiment, the integrated circuit 500 receives a reference signal 126, which is provided to an RF synthesizer 127 to generate an RF signal having a desired frequency. The RF signal generated by the RF synthesizer 127 is provided to one or more phase offset devices 128, which are configured to controllably phase shift the RF signal received from the RF synthesizer. The digital signal processing block 125 can generate control signals that are provided to the phase offset device(s) 128 to introduce the appropriate phase shifts based upon the determined location(s) of the one or more antennas. In many embodiments, the amplitude of the generated signal can be modulated and/or varied alone or in conjunction with the phase appropriately upon the determined locations to form the power beam and/or focused transmission. The amplitude can be modulated in variety of ways such as at the input of a power amplifier chain via a mixer or within an amplifier via its supply voltage, an internal gate or cascade biasing voltage. As can readily be appreciated, any of a variety of techniques appropriate to the requirements of a specific application can be utilized to amplitude modulate an RF signal in accordance with various embodiments of the invention. The phase shifted RF signals can then be provided to a series of amplifiers that includes a power amplifier 129. While the entire circuit is powered by the electric current generated by the PV component(s) of the power generation tile, the power amplifier is primarily responsible for converting the DC electric current into RF power that is transmitted via the RF signal. Accordingly, the power amplifier increases the amplitude of the received phase shifted RF signal and the amplified and phase shifted RF signal is provided to an output RF feed 130 connected to an antenna. In many embodiments, the RF signal generated by the RF synthesizer is provided to an amplifier 131 and distributed to the control circuitry of other tiles. The distribution of reference signals between tiles in a module in accordance with various embodiments of the invention is discussed further below.

Although specific integrated circuit implementations are described above with reference to FIG. 4*d*, power generation tile control circuitry can be implemented using any of a variety of integrated circuits and computing platforms in accordance with various embodiments. Furthermore, satellite modules can be implemented without providing computational capabilities on each power generation tile and/or without utilizing the computational capabilities of a power generation tile to determine locations and/or phase shifts for the purposes of generating an RF signal to feed a power generation tile antenna.

Figure 5:
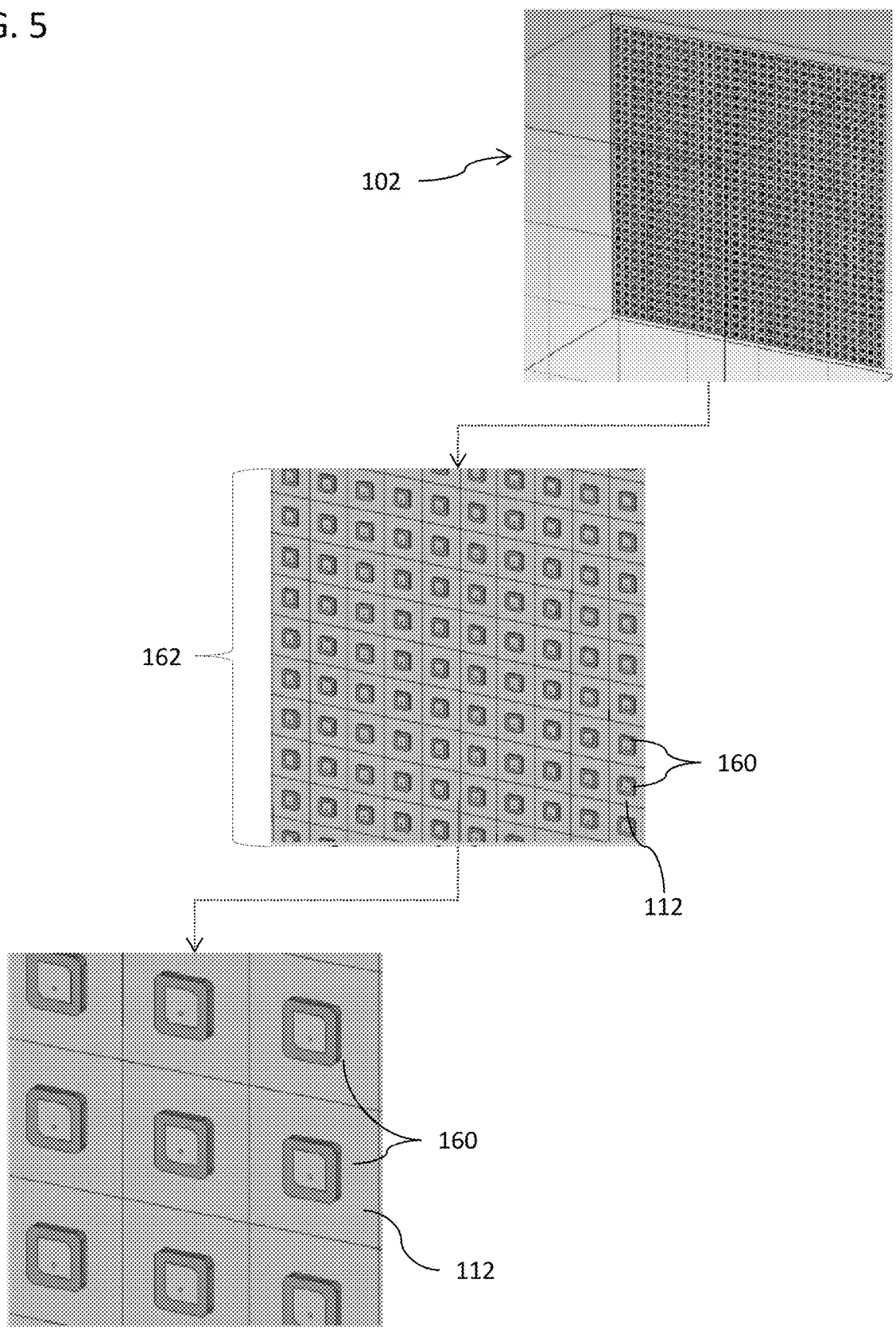
FIG. 5 conceptually illustrates an array of power generation tiles in which the antenna elements of the power generation tiles are configured as a phased array, according to one embodiment.

In many embodiments, as illustrated conceptually in FIG. 5, a plurality of power generation tiles 112 on each satellite module may each form a panel 160 of a modular phased array 162 incorporating at least self-contained, collocated photovoltaics, power transmitters and control electronics within each power generation tile. The control electronics may allow for wire or wireless communications between the individual power generation tiles for the exchange of timing and control information. The array of control electronics may also allow for the exchange of control and timing formation with other satellite modules. Collocation of at least the power collection, far-field conversion, and transmission elements on each modular power generation tile allows for the each power generation tile to operate as an independent element of the phased array without inter- and intra-module power wiring.

In one embodiment, the power generation tiles and/or satellite modules may include other related circuitry. The other circuitry may include, among others, circuitry to control transmission characteristics of the power generation tiles, thermal management, inter or intra-module communications, and sensors to sense physical parameters, such as orientation, position, etc. The control circuitry may control transmission parameters such as phase and timing information such that the arrays of power generation tiles across each module and across the solar power station may be operated as independent array elements of one or more phased arrays. The sensors may include inertial measurement units, GPS or IGS devices to estimate position and orientation, and thermocouples to estimate the temperature on the power generation tiles.

In one embodiment, the circuits for controlling transmission characteristic parameters may be collocated on the several power generation tiles or satellite modules and may control each transmitter of each power generation tile independently or in a synchronized manner such that the tiles operate as one or more element of one or more phased arrays. Reference signals (e.g., phase and timing) that can be used to synchronize the operation of the power generation tiles as a phased array may be generated locally on each power generation tile or satellite module and propagated via wired or wireless intra and inter-module communications links, or may be generated centrally from a single source on a single satellite module and propagated via wired or wireless intra and/or inter-module communications links across each of the satellite modules and power generation tiles. In addition, one or multiple timing reference signals may be generated from outside the space-based solar power station system such as one or more satellites flying in close proximity or even in different orbits; as well as from one or more ground stations.

Each power generation tile or satellite module may be operated independently or collectively as an element in a phased array. Entire or most operations associated with each individual power generation tile may be collocated on each of the power generation tiles or collectivized within the satellite module on which the power generation tiles are collocated, or across multiple satellite modules. In one embodiment, a central reference signal is generated and deviation (e.g., phase) from such reference signal is determined for each power generation tile array element of the phased array. By propagating a central reference signal from the reference signal, higher levels of control abstraction can be achieved to facilitate simpler programming for many operations of the phased array.

In some embodiments, each power generation tile of each satellite module may be the same or different. The number of distinct combinations of photovoltaic cells, transmission modules and control electronics may be as large as the number of power generation tiles in the satellite modules. Further, even where each of the power generation tiles on a satellite module are the same, each of the satellite modules 1A through NM or a group of satellite modules may have different solar radiation collection or transmission charactiles replaces a conventional monolithic solar power satellite. The solar power station includes N×N satellite modules, each module including power generation tiles of $$\frac{M}{N^2}.$$

Table 1 lists example configurations of solar power stations according to embodiments replacing conventional solar power stations.

TABLE 1

| | | SPS Configuration Parameters | | | | | |
|---|---|---|---|---|---|---|---|
| | Efficiency Standards | SPS Configuration | W/kg | Max Size | | Exemplary Phased Array System Performance* | |
| Solar Cell Efficiency | 35% | | | | | | |
| DC-Microwave Conversion | 78% | USEF | 41 | 100 × 95 m | Power Received | 12 | GW |
| Collection Efficiency | 86% | JAXA | 98 | 3.5 km | Power Received/Module | 1.72 | MW |
| Transmission Efficiency | 77% | ESA | 132 | 15 km | Power Received Rectenna | 1.34 | GW |
| Atmospheric Absorption | <2% | Alpha | 33 | 6 km | Rectenna size: | 6.65 | km |
| Overall | 14% | Modular Phased Array According to Embodiments | 2270 | 60 × 60 m | Total mass (avg: 100 g/m²) | 900000 | kg |

*Assuming a Solar Power Station having a 50 × 50 array of 60 × 60 m satellite modules in a geosynchronous orbit with a 1 GHz power transmission having a/λ = 0.5, and a solar irradiance of 1400 W/m².

teristics or may have arrays of power generation tiles of different sizes, shapes and configurations.

In embodiments, the solar power station is designed as a modular phased array where the plurality of satellite modules and power generation tiles located thereon form the array elements of the phased array. For this purpose, each of the satellite modules may be designed to be physically compatible with conventional launch vehicles although the achieved power generation of the phased array of the solar power station may exceed conventional space-based solar power satellites in many respects. Taking advantage of the increased performance, the solar power station phased array of the embodiment may include smaller payload size and overall array size to obtain equal or better power generation compared to conventional space-based solar power satellites. Alternatively, the size of the overall solar power station may be reduced compared to solar platforms in conventional solar power satellites while achieving comparable results.

In order to match the power generation of a conventional solar power satellite without increasing platform size or weight, the power collection, transmission and control logic for the individual power generation tiles is preferably collocated within each of the power generation tiles or within the satellite module on which the power generation tiles are collocated thus eliminating the need for intra- or intermodule communications, wiring or structural interconnection. In one embodiment, much of the power transmission control logic is a single collection of functions common to all or most of the power generation tiles. In this embodiment, the conventional external intra- and inter-power generation tile infrastructure for the solar power station may be entirely eliminated thus reducing the power generated per weight unit (W/kg).

In one embodiment, the phased array of the solar power station including the satellite modules and power generation The Conventional SPS performance in Table 1 are taken from published literature. The Exemplary Phased Array System Performance in Table 1 are estimates and may differ based on the actual design parameters implemented.

Figure 6:
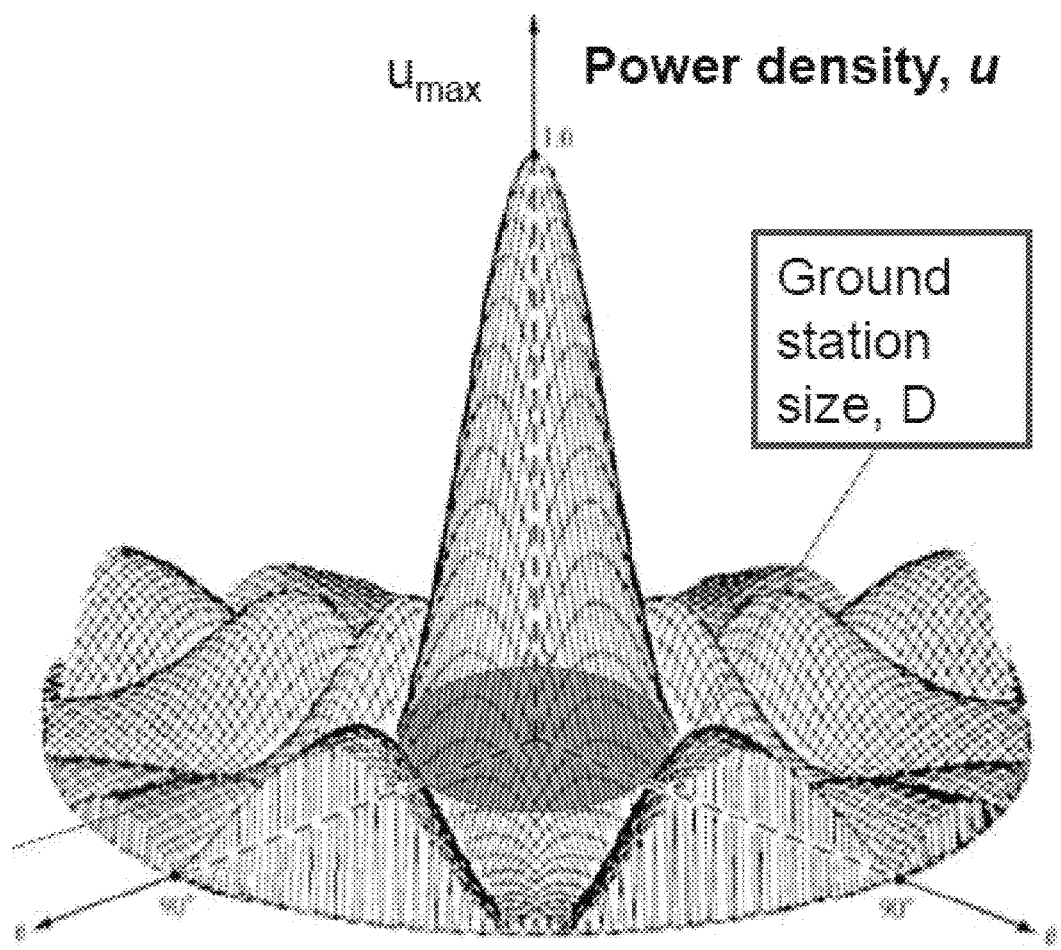
FIG. 6 conceptually illustrates the power density distribution at a ground receiver from a transmission of power from a phased array of antennas on a solar power station, according to embodiments.

The number of power generation tile array elements in each satellite module, and the number of satellite modules in the solar power station may be determined based on, among other factors, power requirements, payload restrictions, etc. A first factor for the size of an overall solar power station is the power to be generated at the power receiving rectenna. As illustrated in FIG. 6, in embodiments the power incident on the ground using a far-field RF emission can have a maximum power lobe ($U_{max}$) that is dependent on factors including (but not limited to) the size of the array, the wavelength of the RF transmission, and the phase offset error tolerated within the phased array. For example, in embodiments of a 50×50 array of satellite modules in a solar power station formed by 60×60 m satellite modules a maximum power lobe of 926 W/m² is estimated to be generated on the ground with a sidelobe level of 44 W/m². The incident area of the maximum power lobe with a 1 GHz emission is estimated to have a diameter of 6.6 km, while the incident area is estimated to have a diameter of 2.8 km for a 2.4 GHz emission. From a power transmission point of view, the preferred number of elements in the phased array formed by a solar power station and the wavelength of the transmission will depend on the size of the receiving rectenna and/or array of receiving rectennas. In many embodiments it is desirable to have the maximum power lobe on the ground coextensive with the rectenna area.

Figure 7:
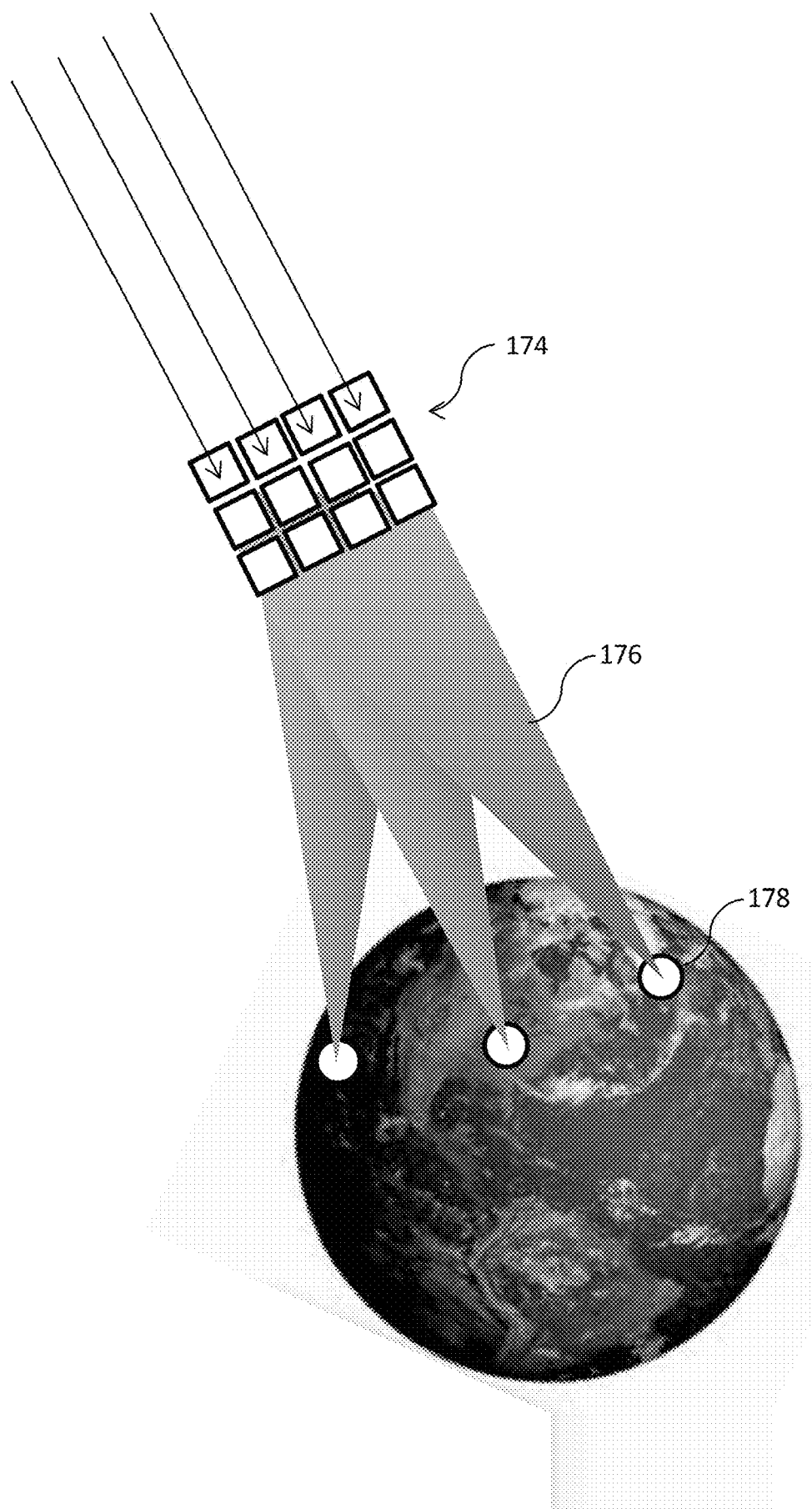
FIG. 7 conceptually illustrates dynamic power allocation from a large-scale space-based solar power system, according to one embodiment.
Figure 8A:
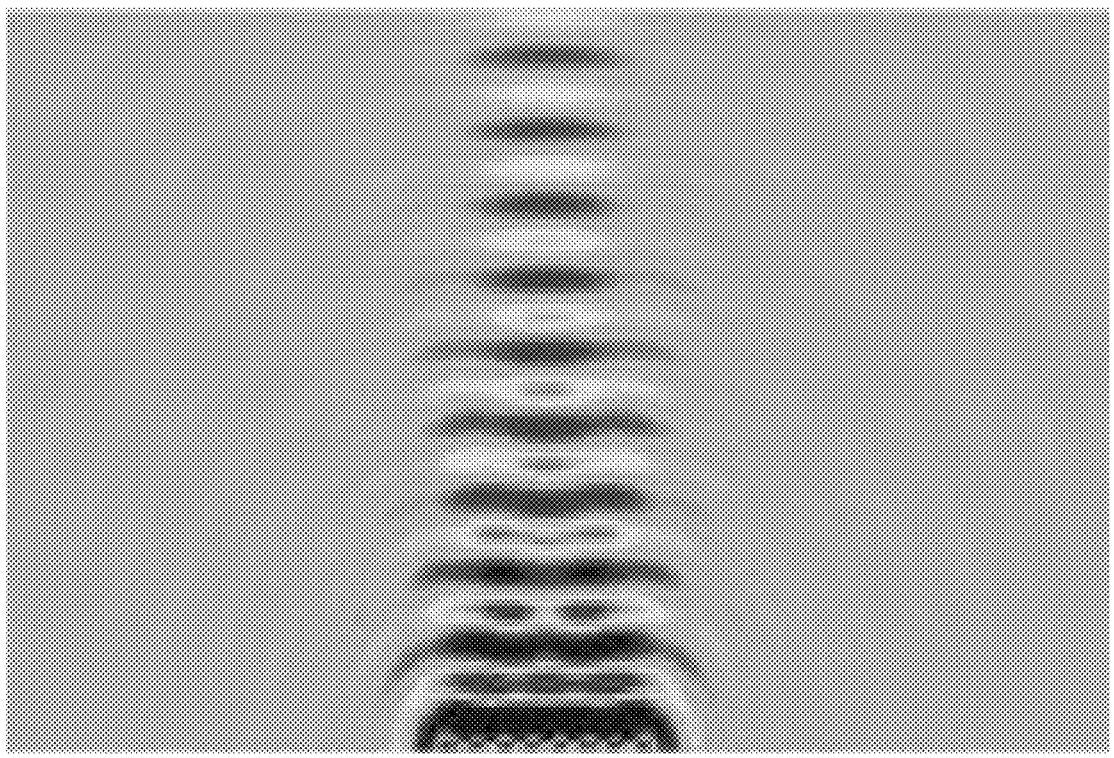
FIGS. 8a and 8b conceptually illustrate electronic beam steering using relative phase offset between elements of a phased array, according to one embodiment.
Figure 8B:
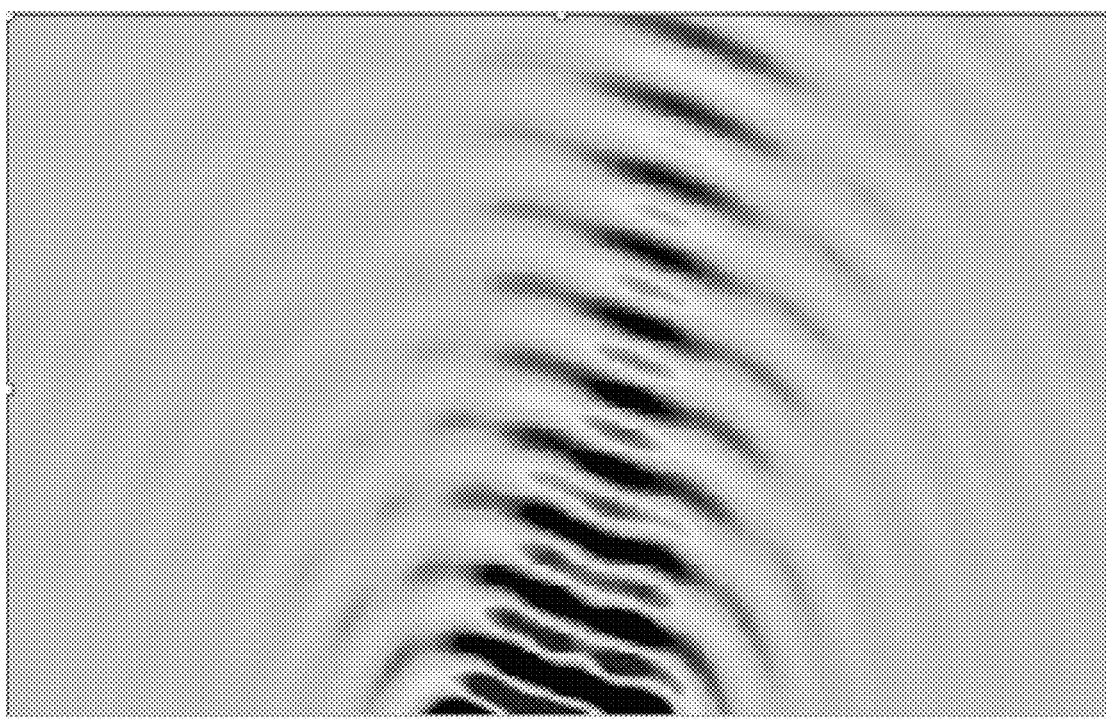

In embodiments this limitation may also be overcome by dividing the power transmission output 176 of the solar power station 174 between different rectenna power receivers 178, as illustrated conceptually in FIG. 7. In many embodiments, different collections of elements (e.g., satellite modules and/or power generation tiles) forming part of the solar power station 174 may be configured into different phased arrays that may be simultaneously directed at different rectenna power receivers 178 on the ground thus potentially reducing the individual incident areas radiated by the solar power station. In some embodiments additional control circuitry is provided either within the satellite module or within each of the power generation tiles to allow for dynamic electronic steering of the transmission beam, either from the collective power generation tiles of a satellite module or from each power generation tile independently. In some embodiments the power steering circuitry may allow for the control of the relative timing (phase) of the various power transmitters on the power generation tile array elements, as illustrated conceptually in FIGS. 8a and 8b, such that each transmission beam may be redirected electronically at micro- and/or nano-second time scales. The power transmission from such dynamically steerable phased array on a solar power station allows for the entire phased array or portions thereof to be dynamically redirected in different directions dependent on demand at one or more rectenna power receivers. Embodiments of such dynamically directable phased arrays on power solar stations, may be used to redirect the power transmission in different directions at micro and nano-second time scales by electronic steering. Embodiments also allow for power transmissions to be dynamically distributed to various ground stations either simultaneously or sequentially based on instantaneous local demand. Power levels at each of such rectenna receivers may also be dynamically adjusted. Rapid time domain switching of power amongst rectenna receivers can also be used to control duty cycle and alleviate large scale AC synchronization issues with respect to an overall power grid.

A second factor that may constrain the number of array elements in any satellite module is the issue of payload size and weight. Current payload delivery technologies for geosynchronous orbits range from 2,000 to 20,000 kg. Accordingly, the limit to the size of any single satellite module is the actual lift capacity of available payload delivery vehicles. Based on an assumption of 100 g/m$^2$ for the phased array satellite modules according to embodiments, a 60×60 m satellite module would have a weight of 360 kg, well within the limits of current delivery technologies. Larger modules could be produced provided they are within the lift capacity of available lift vehicles.

Figure 9A:
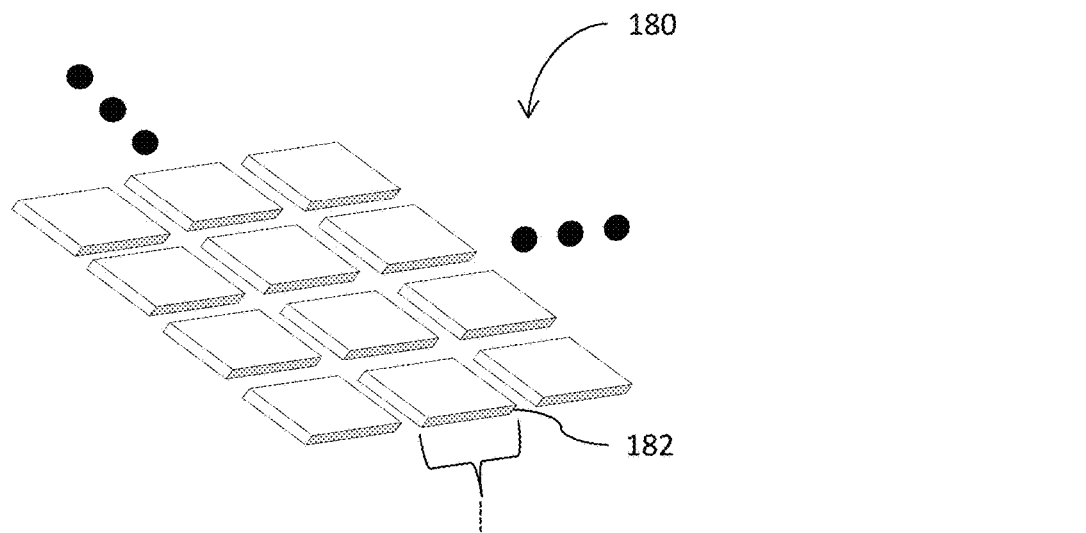
FIG. 9a conceptually illustrates a large-scale space-based solar power station and a compactable satellite module in a deployed configuration, according to embodiments.
Figure 9B:
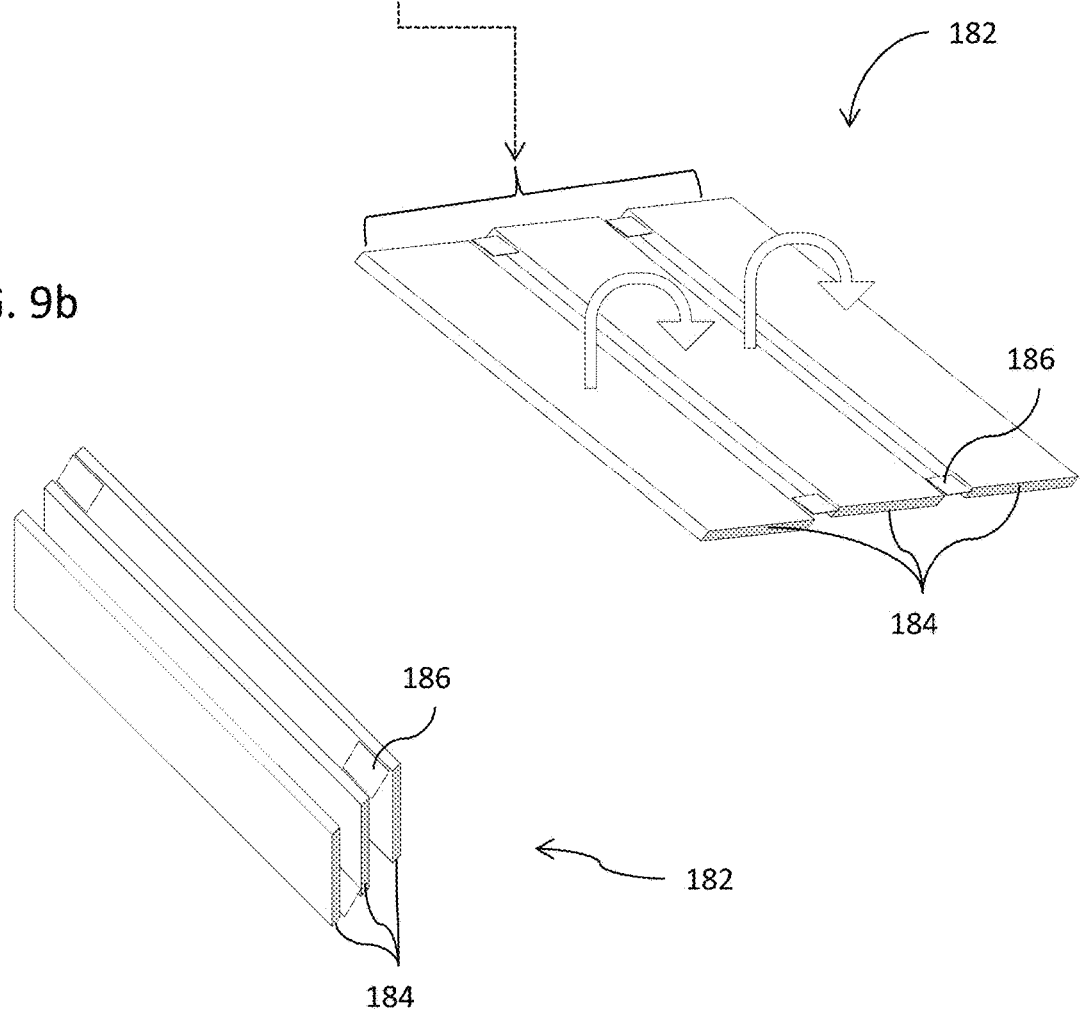
FIG. 9b conceptually illustrates a retracted compactable satellite module, according to FIG. 9a in a retracted configuration.

In some embodiments, satellite modules are compactable such that the size of the satellite module in one or more dimensions may be reduced during delivery to overcome payload space constraints and then expanded into its final operating configuration. As illustrated in FIGS. 9a and 9b, in many embodiments the solar power station 180 includes an array of satellite modules 182, each satellite module comprising a plurality of structural elements 184 that are movably interconnected such that the plurality of structural elements may be moved between at least two configurations: a deployed configuration (FIG. 9a) and a compacted configuration (9b), such that the ratio of the packaged volume to the material volume is larger in the deployed configuration when compared to the compacted or packaged configuration. In embodiments, the structural elements 184 may be hinged, tessellated, folded or otherwise interconnected 186 such that the structural elements can move in relation to each other between the compacted and deployed configurations. Each satellite module of a solar power station may be configured to compact to the same or different sizes. In addition, different compacting methods may be used to compact one or more satellite modules of a solar space station, including, among others, one and two-dimensional compaction structures. In some embodiments, one or a combination of z-folding, wrapping, rolling, fan-folding, double z-folding, Miura-ori, slip folding and symmetric wrapping may be used, among others.

In many embodiments the power generation tiles may have further compactible and expandable features and structures disposed thereon. In some embodiments of power generation tiles the photovoltaic cell and power transmitter may be movably interrelated through a compactable structure, such that when in a compacted or packaged configuration the elements of the power generating cell are compressed together to occupy a total volume lower than when in a deployed configuration. In some deployed configurations the photovoltaic cell and power transmitter are separated by a gap (e.g., to create a vertical offset therebetween). Embodiments of compactable structure include motorized interconnections and resilient members such as spring or tension arms that are bent or under compression, among others. Such compactable structures may also incorporate packaging techniques such as one or a combination of z-folding, wrapping, rolling, fan-folding, double z-folding, Miura-ori, slip folding and symmetric wrapping may be used, among others.

The power generation tiles and/or satellite modules may include other structures to enhance the collection of solar radiation or transmission of power from the power generation tiles and/or satellite modules. Embodiments of structures that may be incorporated into power generation tiles and/or satellite modules may include, among others, thermal radiators for controlling the thermal profile of the power generation tiles, light-collecting structures (e.g., radiators, reflectors and collectors) to enhance the efficiency of solar radiation collection to the photovoltaic cell, and radiation shielding to protect the photovoltaic cells, power transmitters and/or control electronics from space radiation. Such structures may also be independently compactible, between packaged and deployed configurations, as described above in relation to other elements of the power generation tiles.

A design for a satellite module or power generation tile may be applied to different satellite modules or power generation tiles. Other variables in the solar power station such as spatial distances, photovoltaics, power transmitter, control electronics and combinations with may be modified to produce a phased array with differing power collection and transmission characteristics. In this way, a diverse mix of solar power stations may be produced while maintaining the benefits of the modular solar power station described.

Compactable Space Structures

In many embodiments, the satellite modules and power generation tiles of the solar power station employ compactible structures. Compactable structures allow for the satellite modules and/or power generation tiles to be packaged in a compacted form such that the volume occupied by the satellite module and/or power generation tiles can be reduced along at least dimension to allow for the satellite modules to fit within an assigned payload envelope within a delivery vehicle, and then expanded when deployed in space. Several exemplary embodiments of possible packaging configuration are provided, however, it should be understood that the packaging methods and compactible structures may involve, among other procedures, using one and two-dimensional compaction techniques, including, one or a combination of z-folding, wrapping, rolling, fan-folding, double z-folding, Miura-ori, star folding, slip folding and wrapping.

Compactible Space Structures

Several challenges exist in forming compactible structures to be used in constructing space-based satellites and platforms, including packaging the structures efficiently (e.g., packaged with minimal volume gaps in the folded structure), packaging without exceeding the yield stress of the material of the structures, and the ability to extend the structure to a deployed state with minimal edge forces.

Figure 10A:
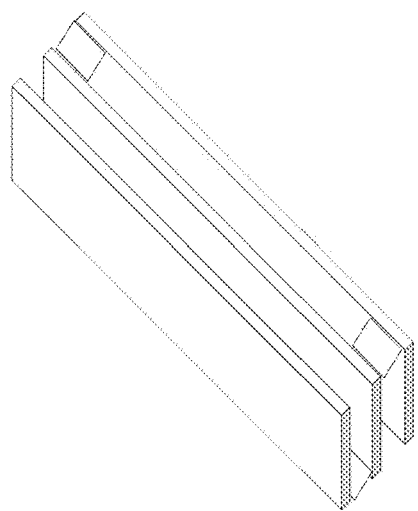
FIGS. 10a to 10c conceptually illustrate: a) z-folding of a compactible satellite module, b) wrapping of a compactible satellite module, and c) fan-folding of a compactible satellite module.
Figure 10B:
Figure 10C:
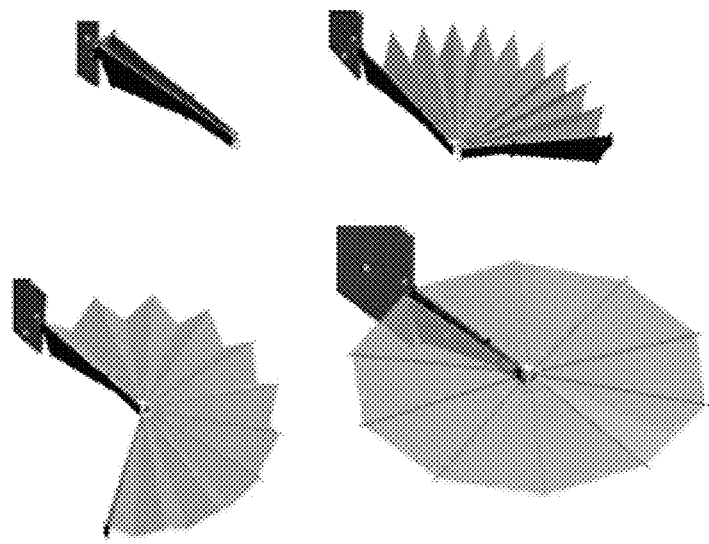

Compaction can be generally divided into techniques that compact in either one or two-dimensions. Some techniques that may be performed along one dimension, include, for example, z-folding, wrapping (or rolling), and fan-folding, illustrated in FIGS. 10a to 10c, among others. Such one-dimensional folding mechanisms may be used in compacting the space structures of the power generation tiles and satellite modules, in accordance with embodiments.

While these techniques have some advantages in that they provide efficient packaging, can accommodate for thickness in the movable panels or elements that form the compactible structure, and can avoid permanent deformation by choosing a suitably large radius of wrapping or folding, because the compaction occurs in only one dimension these techniques are not applicable when both dimensions of the deployed structure exceed the available packaging envelope (as is often the case with large-scale SPS constructs that can easily exceed 60 m in at least two dimensions).

Figure 11:
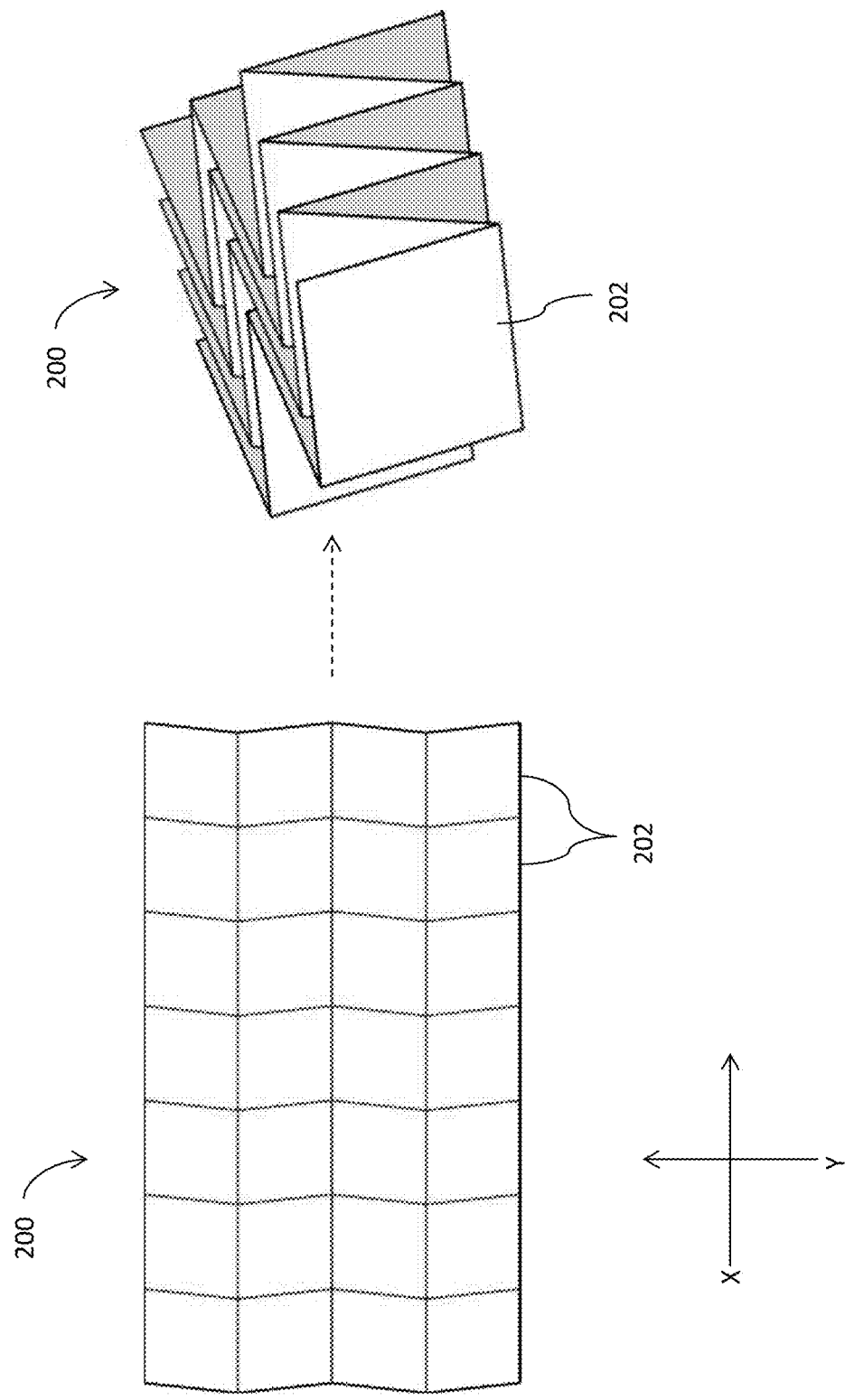
FIG. 11 conceptually illustrates a compactable satellite module having a biaxial folding configuration.
Figure 12:
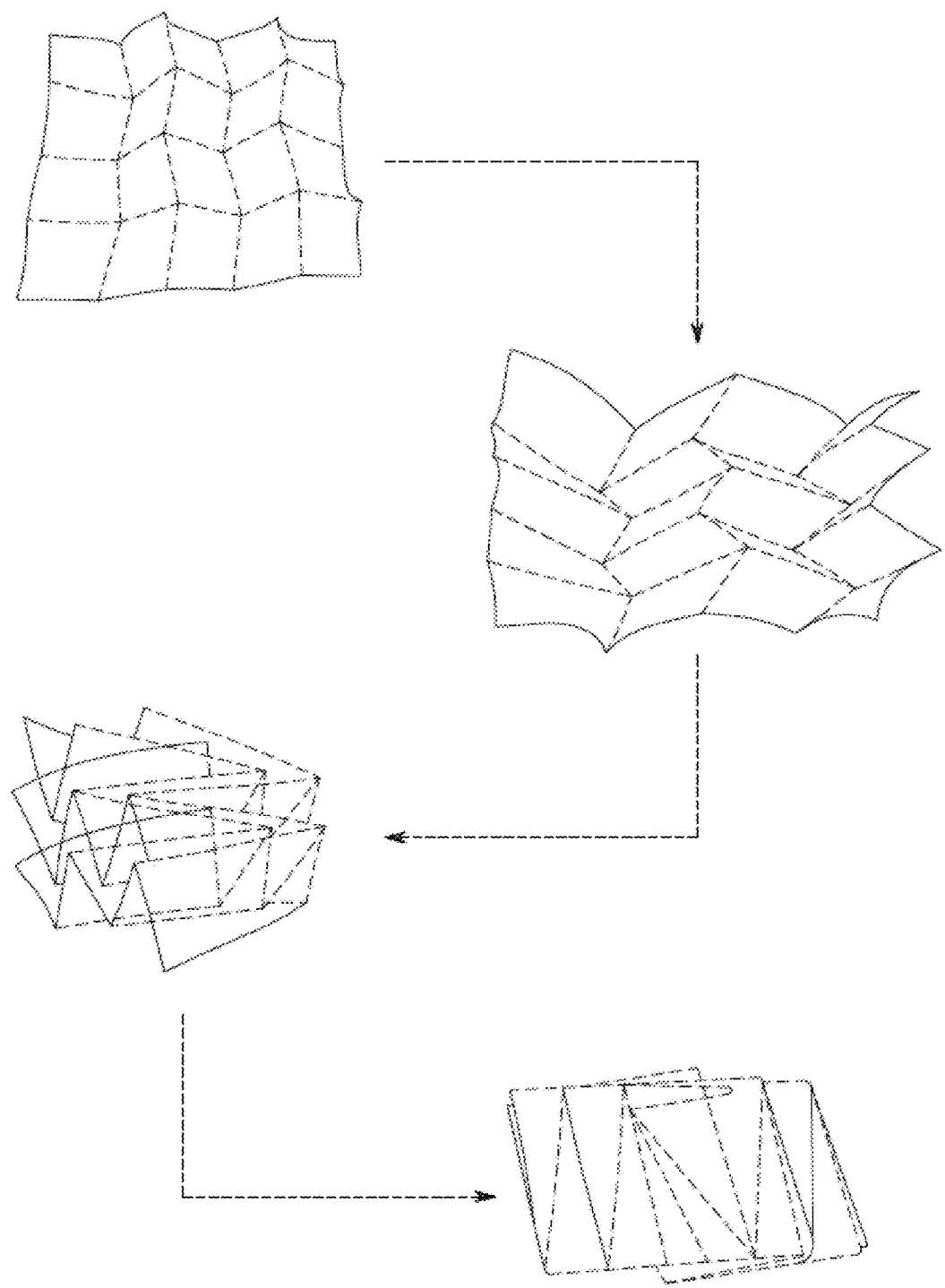
FIG. 12 provides images of the compaction of a membrane using the compaction technique of FIG. 11.

Two-dimensional compaction is able to address these larger compactible structures. Miura-ori is one scheme for biaxially packaging a compactible structure. FIG. 11 illustrates embodiments of such a Miura-ori compaction technique where a satellite module 200 divided into a series of compactible tile panels 202 is biaxially folded. It modifies the standard map folding technique (i.e. double z-folding) by skewing one set of parallel fold lines. Images of a compactible structure folded in accordance with embodiments of such a biaxial folding mechanisms are provided in FIG. 12. Both map folding and Miura-ori have been used for packaging space structures, however, neither basic map folding nor Miura-ori can accommodate space structures that have significant thickness greater than that found in thin membranes.

Figure 13A:
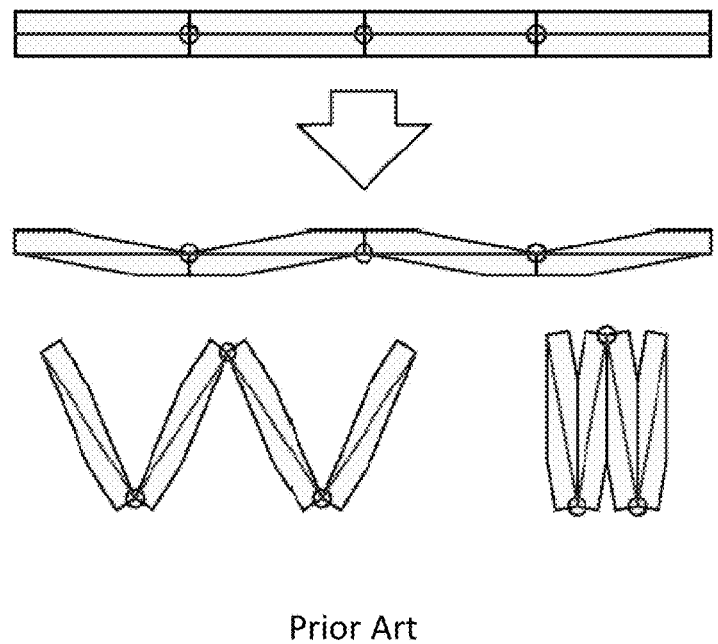
FIGS. 13a and 13b conceptually illustrate folding techniques for a compactible structure.

It is also possible to compact thin membranes along two dimensions by first folding and then wrapping. Both z-folding and wrapping, and star-folding and wrapping have been used to package membrane space structures. However, these conventional two-dimensional folding techniques require localized bending deformation, known as creasing, as the basic mechanism for compaction, and these curved creases are not able to preserve the planar flatness of the structure. For example, techniques for wrapping a membrane around a polygonal hub using straight creases have been proposed. These techniques generate crease patterns by modeling the wrapped membrane as a collection of straight-line creases intersecting at vertices. By placing the vertices set distances apart in the folded state, the crease lengths and angles can be computed. Although these patterns provide, on average, the required accommodation for the thickness of the membrane, the solution is not correct near the fold lines or at the vertices. It is possible to make these solutions exact by trimming away material. FIG. 13a illustrates an ideal zero-thickness fold pattern (denoted by the central line running longitudinally through the circles in the images) that can be applied to a finite thickness membrane (denoted by the outer lines) by trimming away material close to the fold lines and vertices. However, as the final fold angle decreases, more and more material must be trimmed away; in the limit as the final fold angle goes to zero, all material must be removed. In practice, because it is impossible to decrease the thickness of the membrane to zero, the packaging efficiencies achievable are limited. This technique also requires panels of non-uniform thickness, which may be troublesome for engineering applications.

Figure 13B:
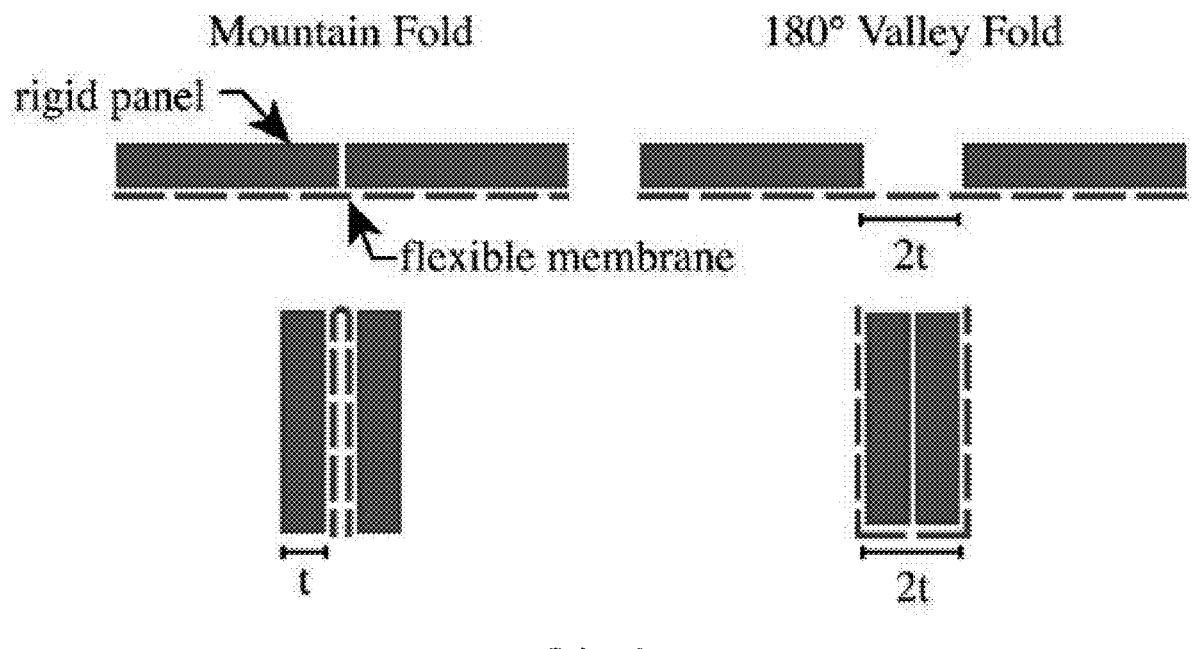

Instead of removing material, it has also been proposed to widen and reduce the thickness of the crease regions. However, this results in the presence of large voids in the packaged membrane, as illustrated in FIG. 13b. Crease widths of 10 to 14 times the panel thickness were required in previous studies to enable packaging. Modifications of Miura-ori allow for the folding of thick membranes. However, again these modified patterns also result in gaps between membrane faces in the folded state, and the size of these gaps grows with the size of the membrane, leading to loss of packaging efficiency. Finally, a degree-4 vertex has been proposed in a thick membrane enabled by sliding hinges along the crease lines. However, this scheme requires the creases to slide by an infinite amount as the crease angle tends to zero. For this reason, this method also does not result in tight and efficient packaging.

In many embodiments, compactible space structures configured to accommodate power generation tiles and satellite modules of the SPS having finite thicknesses are described. Many such embodiments utilize a combination slip-folding and wrapping compaction technique (referred to here as slip-wrapping) to extend and/or retract the power generation tiles and/or satellite modules between deployed and packaged or compacted configurations. Some embodiments of such compactible structures incorporate the removal of structure material to create gaps or empty portions along the fold lines.

Figure 14:
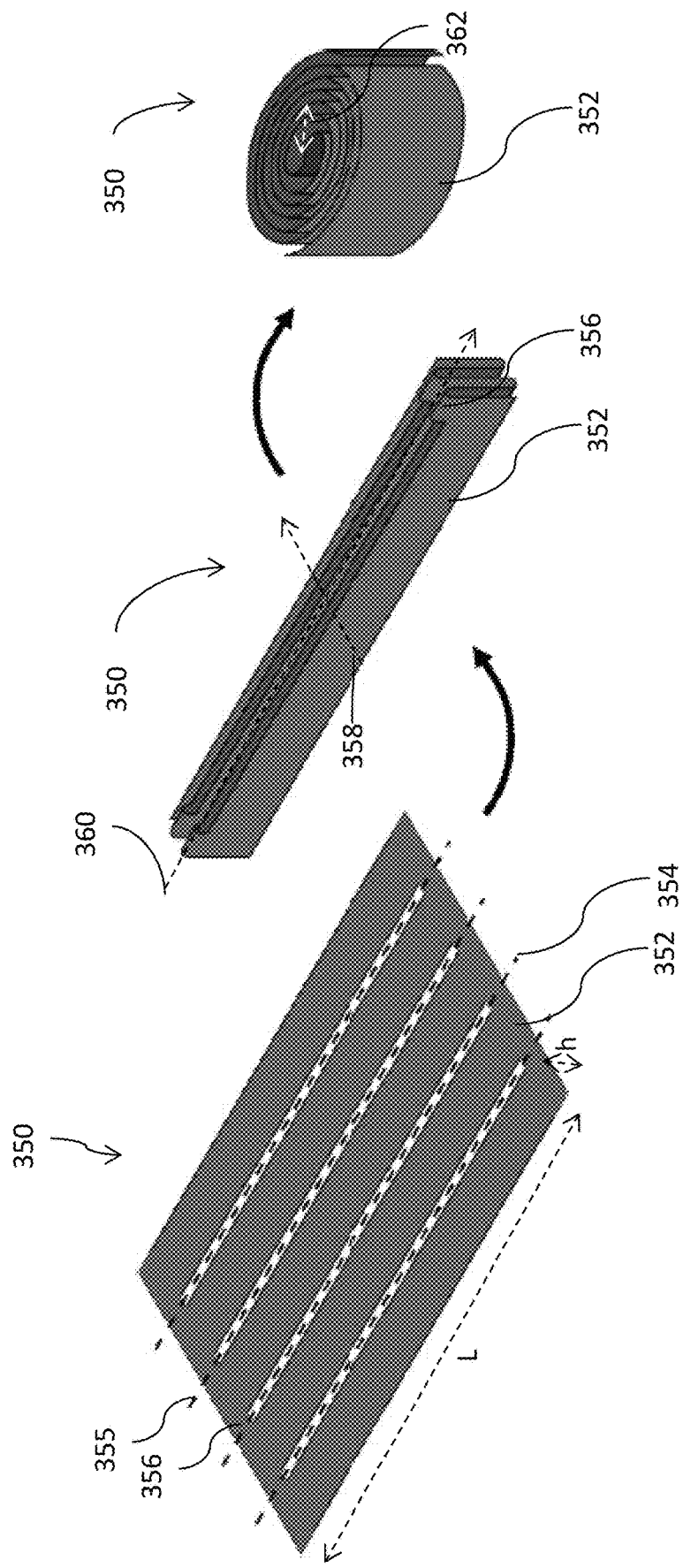
FIG. 14 conceptually illustrates a perspective view of a compactable satellite module having a slip folding and wrapping configuration, according to embodiments.

FIG. 14 illustrates embodiments of a slip-wrapping compaction mechanism and method. In some embodiments a compactible structure 350 of side length L and thickness h is divided into n compactible panels 352 by n−1 slipping folds 354. As will be described in greater detail below, a slip fold allows for rotation about the fold line as well as slip along the fold line 354. In some embodiments the slipping folds are realized by cutting a series of parallel slits 355 in the body of the compactible structure 350 at the fold line, while maintaining the continuity of the compactible structure via a continuous edge strip 356 that runs across the panels 352 at either end of each fold line 354. During compaction the structure is compacted first along a single dimension (e.g. by a z-fold) using parallel slipping folds, which produces a stack of n panels 352 that are compacted along a first axis 358 orthogonal to the fold axis 360 of the structure 350. In a second step, this stack of panels is wrapped in a rotationally symmetric fashion about a hub with a radius 362 (which is selected to be no smaller than the minimum bend radius of the elongated panel structures of the compactible satellite module) to further compact the panels along a second axis, thereby forming a fully compacted satellite module. Although a compactible structure with an overall rectangular configuration is shown in FIG. 14, it should be understood that the slip-wrapping compaction technique and mechanism may be implemented with any configuration, number or shape of individual compactible elements so long as they are joined such that shear as described above is permitted between the various panels of the compactible structure.

As shown above, embodiments of the slip-wrap compaction mechanism and method incorporate slipping folds, which accommodate the incompatibility created by wrapping panel members of the compactible structure having finite thickness around different radii. Issues related to the accommodation of compactible wrapping structures having finite thickness are illustrated in FIGS. 15*a* and 15*b*. Configurations of folded and wrapped structures have been implemented for very thin membranes, such as, for example, solar sails. However, implementing folding and wrapping for thicker structures, such as the power generation tiles and satellite modules presents additional challenges. Specifically, when a thicker structure 370 is folded and wrapped, as illustrated in FIGS. 15*a*1 to 15*a*3, each crease wraps around a different radius 372, which results in strain, crease line drift and buckles along the crease lines. In embodiments, this issue is addressed by introducing slip folds 374 within the structure, as illustrated in FIGS. 15*b*1 to 15*b*3. As shown, allowing slip along the fold lines wraps the creases without extension about the different radii.

Figure 16:
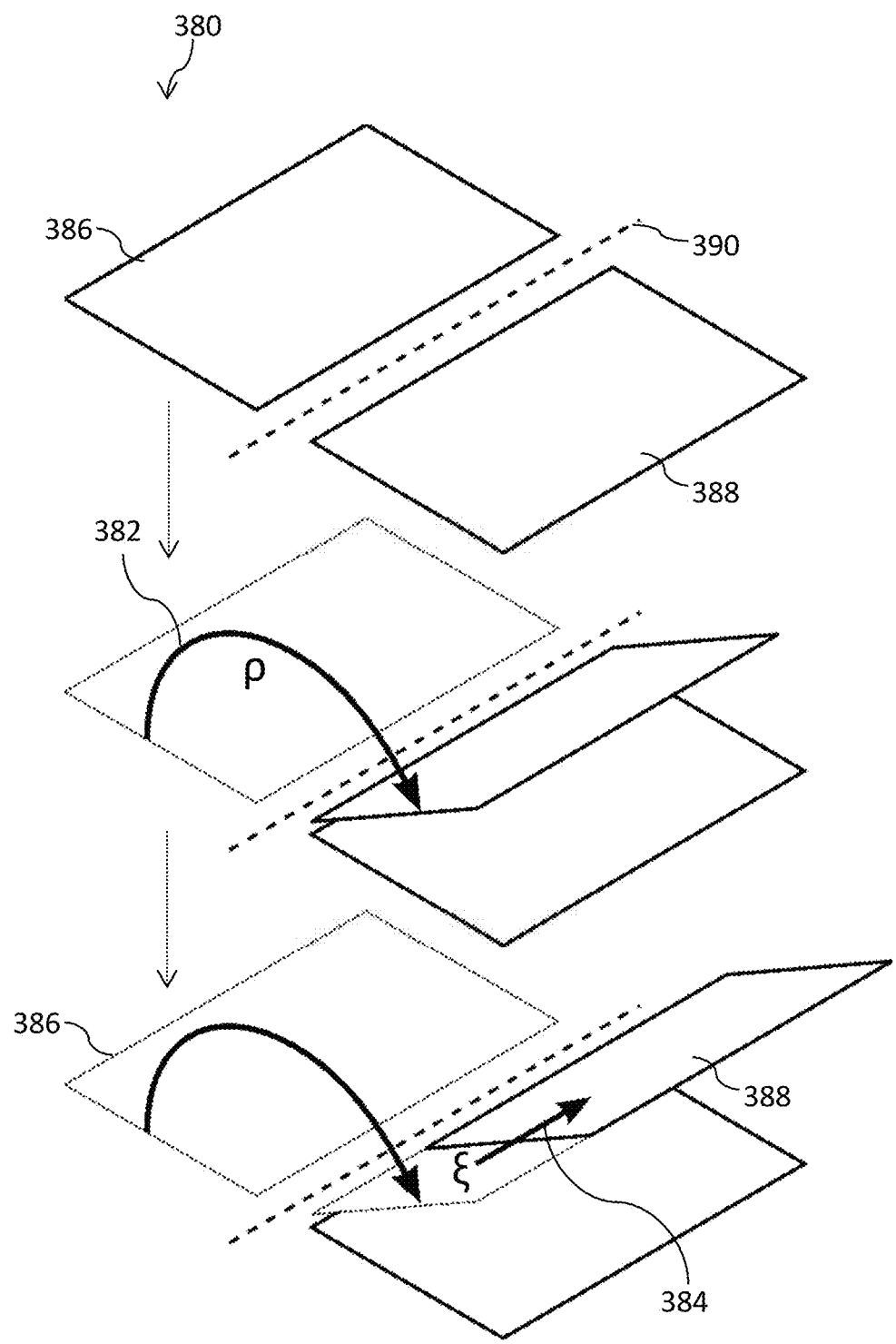
FIG. 16 conceptually illustrates a slip fold according to embodiments.

An illustration of the principles of operation of a slip fold is provided in FIG. 16. As shown, slip folds 380 offer two degrees of freedom: in addition to the fold angle 382, (ρ) slipping folds have a slip degree of freedom 384 (ξ) which is the linear displacement of the material of the compactible panel on one side 386 of the fold 380 with respect to the material of the compactible panel on the other side 388 in the direction of the fold line 390. An ideal slipping fold may have zero stiffness associated with both these degrees of freedom. Embodiments of a slip fold 380 incorporate the removal of material along at least a section 392 of the fold lines of the compactible structure. As a result of the section 392 of removed material the compactible panels of the compactible structure can be folded and unfolded, and the two panels of the compactible structure translated relative to each other at such slipping folds without straining the material of the panels of the compactible structure.

Figure 17A:
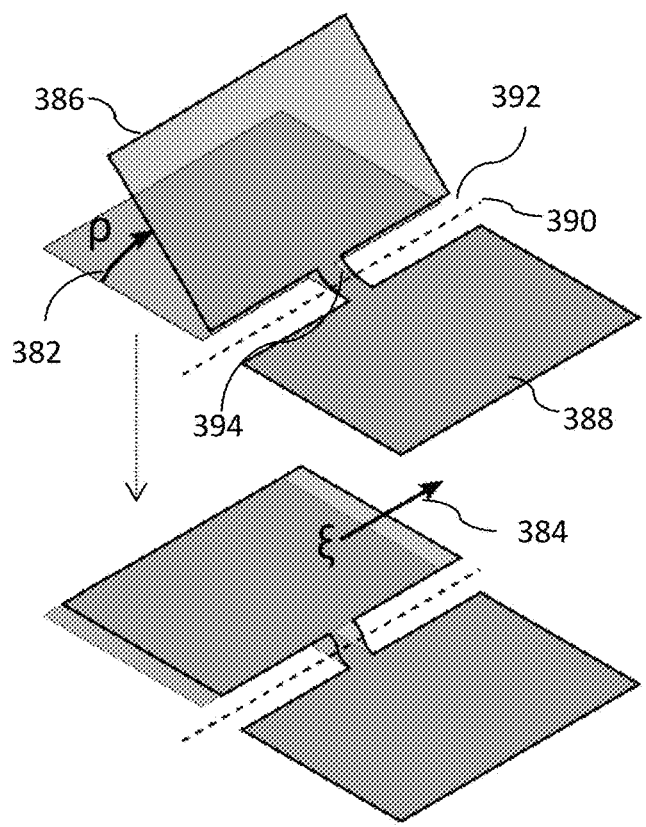
FIGS. 17a and 17b conceptually illustrate interconnections for slip folding compactible structures, according to embodiments.
Figure 17B:
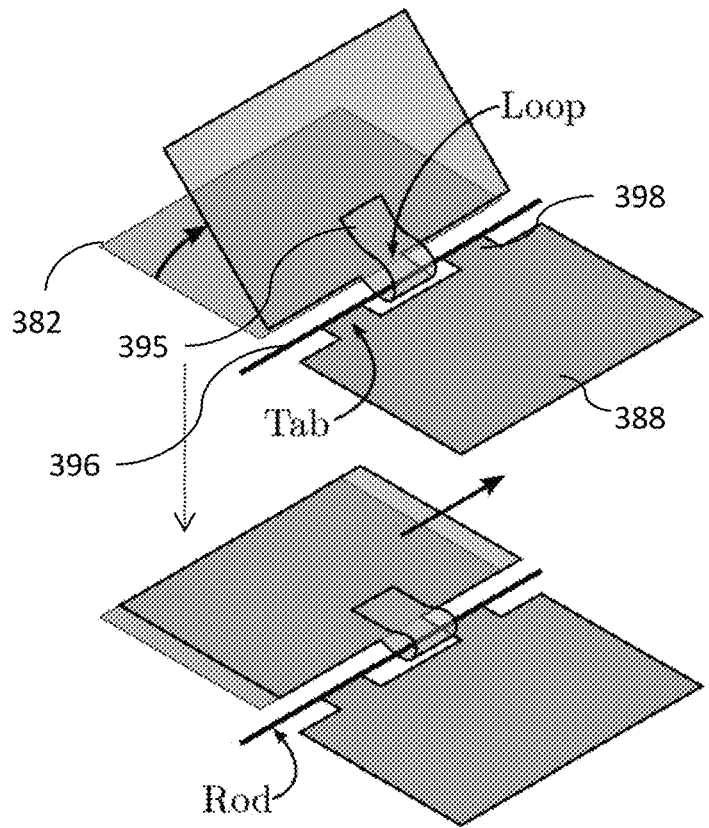
Figure 18:
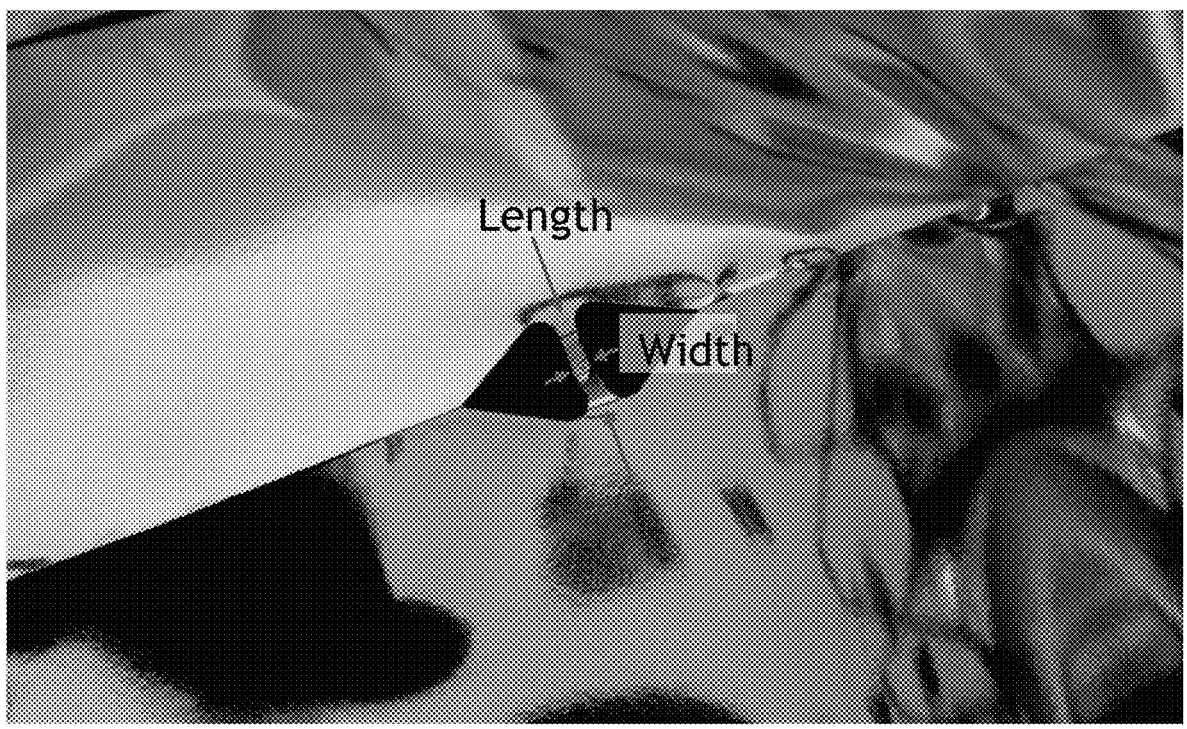
FIG. 18 provides an image of a compactible structure incorporating a ligament fold, according to embodiments.

The creation of sections of material void (e.g., through material removal) along the fold lines of the panels of the compactible structures can lead to a reduction in the continuity and hence in the stiffness of a panel or the overall compactible structure. In many embodiments slipping folds are realized that include interconnections that allow for the transmission of tension forces and the limited transmission of shearing forces across fold lines. Embodiments of implementations of such interconnected slip folds are illustrated in FIGS. 17*a* and 17*b*. As illustrated in FIG. 17*a*, some embodiments of a slip fold for compactible structures implement a ligament fold incorporating one or more strips or ligaments of material 394 left uncut at the fold line 390. A ligament fold allows for the transmission of tension and shear across the fold line. In embodiments the length of the interconnecting ligament is chosen to allow for the required deformation along the fold line. (An image of an exemplary ligament fold is provided in FIG. 18.) A ligament fold has a state of maximum slip beyond which the ligament will deform plastically. Some other embodiments may implement a hinged fold 395 where a support element 396 (e.g., a cylindrical rod) is located at the fold line, as illustrated in FIG. 17*b*. In some embodiments this support element 396 is attached to the material on one side 388 of the fold using tabs 398. The material on the other side 382 is attached to the rod using a loop 395. This loop is rotatable about the rod and may also slip along the rod. Maximum slip is reached when the loop 395 contacts a tab 398. A hinged fold transmits tension across the fold line. In the maximum slip state, a shearing force may also be transmitted. Although loop and ligament hinges are shown, many embodiments of movable panels or elements of compactible structures are interrelated by slip folds incorporating other hinge types, such as, frictionless and latchable hinges, among others.

In embodiments the amount of slip incorporated into the compactible structures is at least in part determined by the slip degree of freedom needed to accommodate the movement of elements of the compactible structure in the second slip-wrap compaction step of wrapping. The slip freedom (s) may be considered as the difference in the arc-length between two curves as illustrated schematically in FIG. 19, and as expressed by:

$$\xi(s) = L_+(s) - L_-(s) \qquad (\text{EQ. 1})$$

Thus the slip is the integral of the signed curvature over the base curvature κ(s) in accordance with:

$$\xi(s) = h \int_{-\frac{L}{2}}^{s} \kappa(\tilde{s}) d\tilde{s} \qquad (\text{EQ. 2})$$

where h is the thickness of the compactible structure elements. As illustrated and discussed in relation to FIGS. 15*a* and 15*b*, above, wrapping the z-folded stack of n elements leads to the outer elements going around larger radii than the inner elements because each element has thickness h>0. Thus, for the same arc-length, outer elements traverse smaller wrapping angles than inner elements. If the moveable elements of the compactible structures do not have a sufficient slip degree of freedom the elements will be unable to slip against each other, and wrapping the stack of elements will result in straining of the compactible structure.

Figure 19A:
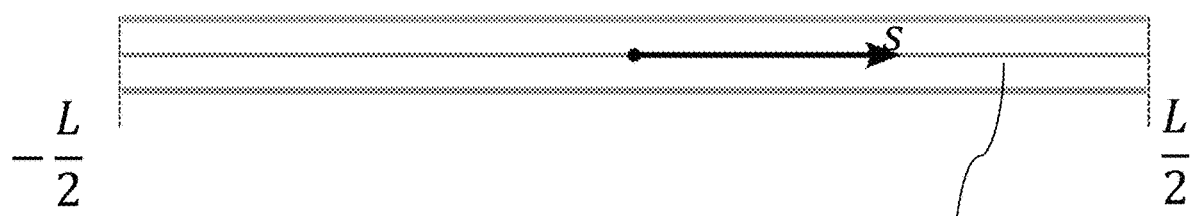
FIGS. 19a and 19b conceptually illustrate cross-sectional views of the relative movement between adjacent slip folded structures, according to embodiments.
Figure 19B:
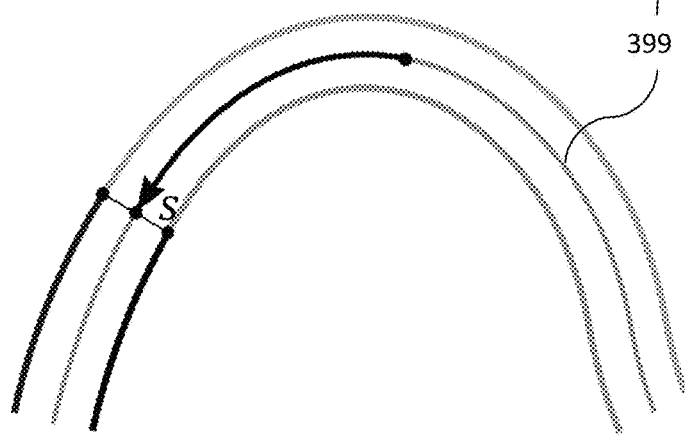
Figure 20:
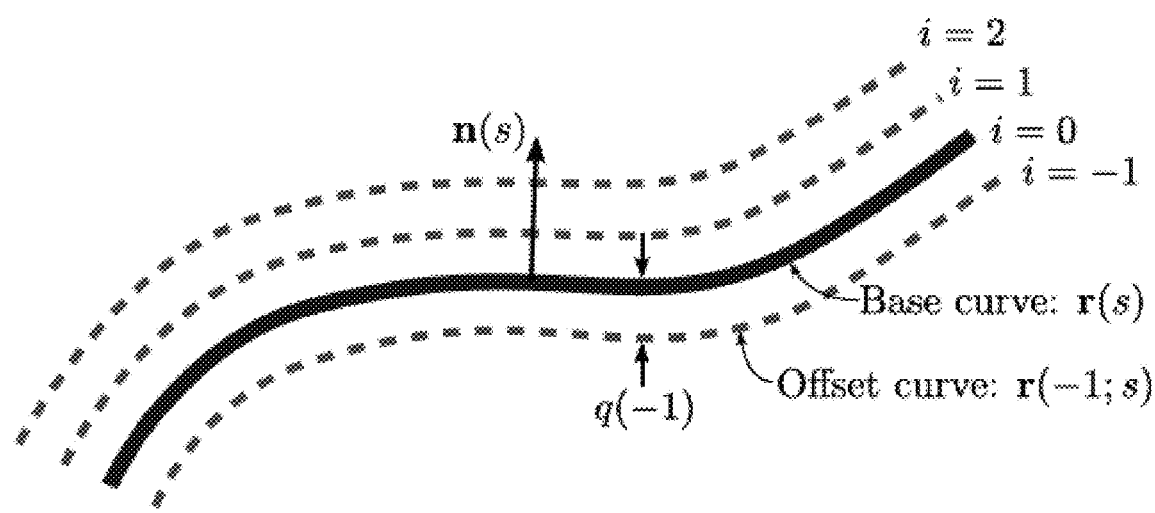
FIG. 20 conceptually illustrates cross-sectional views of the structure of adjacently slip folded structures, according to embodiments.

In addition to areas where the elements of the compactible structure can slip against each other, it is also advantageous to constrain the slip between two panels of the compactible structure to be zero at certain locations, which allows the compactible structures to be connected at the ends. In order to determine combinations, arrangements and parameters of panels of compactible structures that allow for such end connection, the compactible panel elements in the compactible structure that are to be wrapped may be modeled as a set of curves offset from a base curve, as illustrated in FIGS. 19*a*, 19*b* and 20. As shown, in this model the base curve r(s): [−L/2, L/2]→R² may be parameterized by its arc length s, where the i$^{th}$ compactible panel element is offset from the base curve by q(i)n(s), where n(s) is the normal to the base curve and q(i) is a separation distance. (If n is odd, q(i)−ih.) Thus the i$^{th}$ compactible panel element follows the offset curve r(i; s)=r(s)+q(i)n(s). Accordingly, in embodiments for the ends of the compactible panel elements to be connected, the length of the i$^{th}$ compactible panel element $L_i$ must equal the length of the base curve L for all i. This is possible when the integral of the signed curvature κ(s) of the base curve is zero according to:

$$\xi\left(-\frac{L}{2}\right) = h \int_{-\frac{L}{2}}^{-\frac{L}{2}} \kappa(\tilde{s}) d\tilde{s} = 0 \qquad (\text{EQ. 3})$$

$$\xi\left(\frac{L}{2}\right) = h \int_{-\frac{L}{2}}^{\frac{L}{2}} \kappa(\tilde{s}) d\tilde{s} = 0 \qquad (\text{EQ. 4})$$

This condition may be met according to some embodiments by having κ(s) be an odd function of the arc-length (i.e., −κ(s)=κ(s)). Accordingly, the condition of zero slip in embodiments can be achieved by using a rotationally symmetric wrapping (i.e., where the compactible structure incorporates a base curve (p(s): [0, L/2]→R²) and a copy of the base curve rotated by 180° embodiments.

Figure 21A:
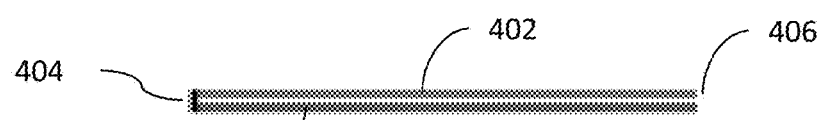
FIGS. 21a to 21d conceptually illustrate a cross-sectional view of a compactable satellite module having a slip folding and wrapping configuration, according to embodiments.
Figure 21B:
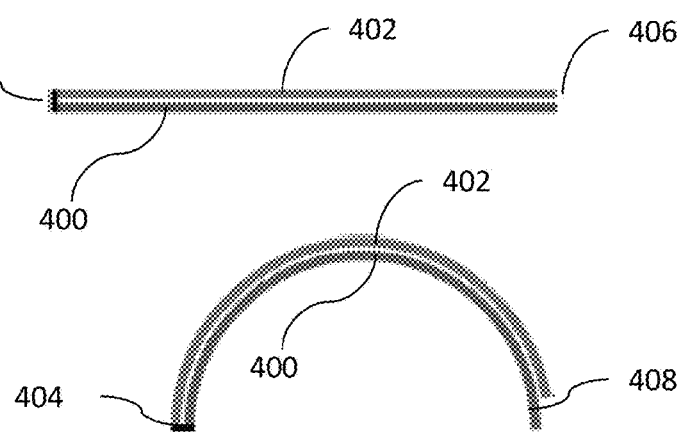
Figure 21C:
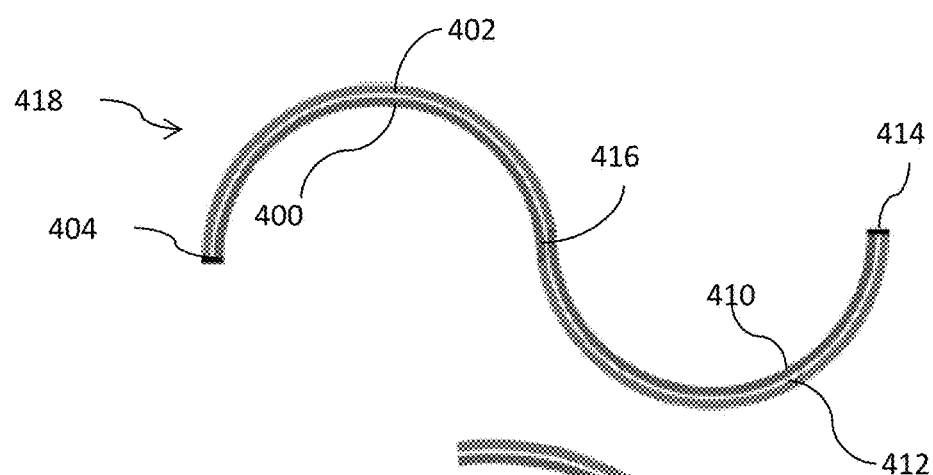
Figure 21D:
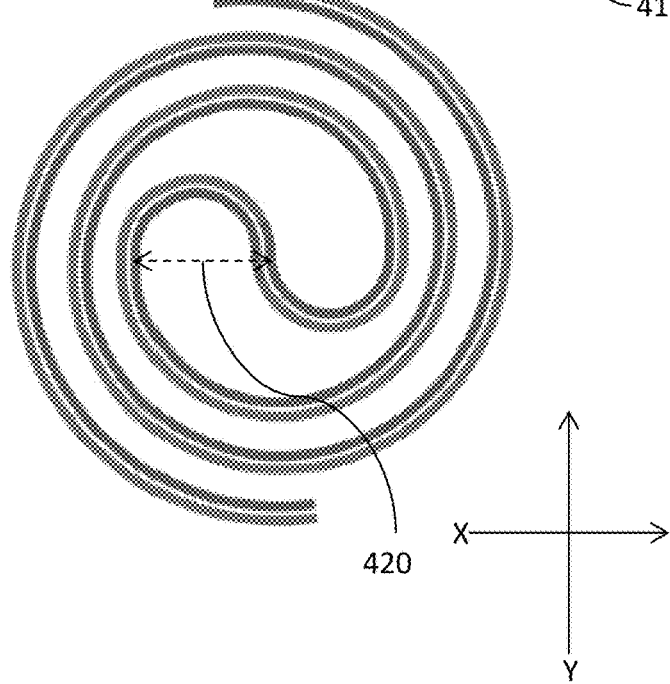

In many embodiments a slip-wrapping compacting technique utilizing such rotationally symmetric wrapping to allow the ends of the compactible structures to remain connected may be incorporated into compactible structures to package and deploy the satellite modules and/or power generation tiles. FIGS. 21a to 21d provide cross-sectional views of embodiments of such a rotationally symmetric wrapping techniques. As shown, in these embodiments a compactible structure formed of two elongated panel structures 400 and 402 interconnected at a first end 404 and open at a second end 406 (FIG. 21a) are wrapped about a hub (FIG. 21b). Such wrapping causes one of the elongated panel structures 400 to slip along its longitudinal length with respect to the second elongated panel structure 402 such that a gap 408 forms between the unconnected ends of the panels. A second set of such panel structures 410 and 412 interconnected at one end 414 are then obtained by a 180° rotation of the first set of panel structures and the non-interconnected ends are then joined together 416 such that the slip at the ends of the overall compactible structure cancel to form a single elongated compactible structure of an undulating configuration 418 interconnected at both ends 404 and 414 (FIG. 21c) with zero slip at the closed ends. The undulating structure thus formed may then be wrapped about a hub of a specified radius 420 that is no smaller than the minimum bend radius of the material of the various panels of the structure thus reducing the dimensions of the compactible structure of the satellite module biaxially in two axes (FIG. 21d).

Many embodiments of compactible structures may employ rotationally symmetric wrappings, which as described above, are a class of wrappings that result in a configuration that has two-fold symmetry, to enforce zero slip, for example, at the two ends of a folded stack of panels of a compactible structure. Such wrapping enables the edges of the compactible structures to remain uncut and able to transmit tension. Accordingly, while the slipping folds of the slip-wrap mechanism and method according to embodiments accommodate the incompatibility created by wrapping the thick panel elements around different radii, the rotationally symmetric wrapping mechanism and method according to embodiments ensures that the ends of the panel elements of the compactible structure remain connected.

Figure 22A:
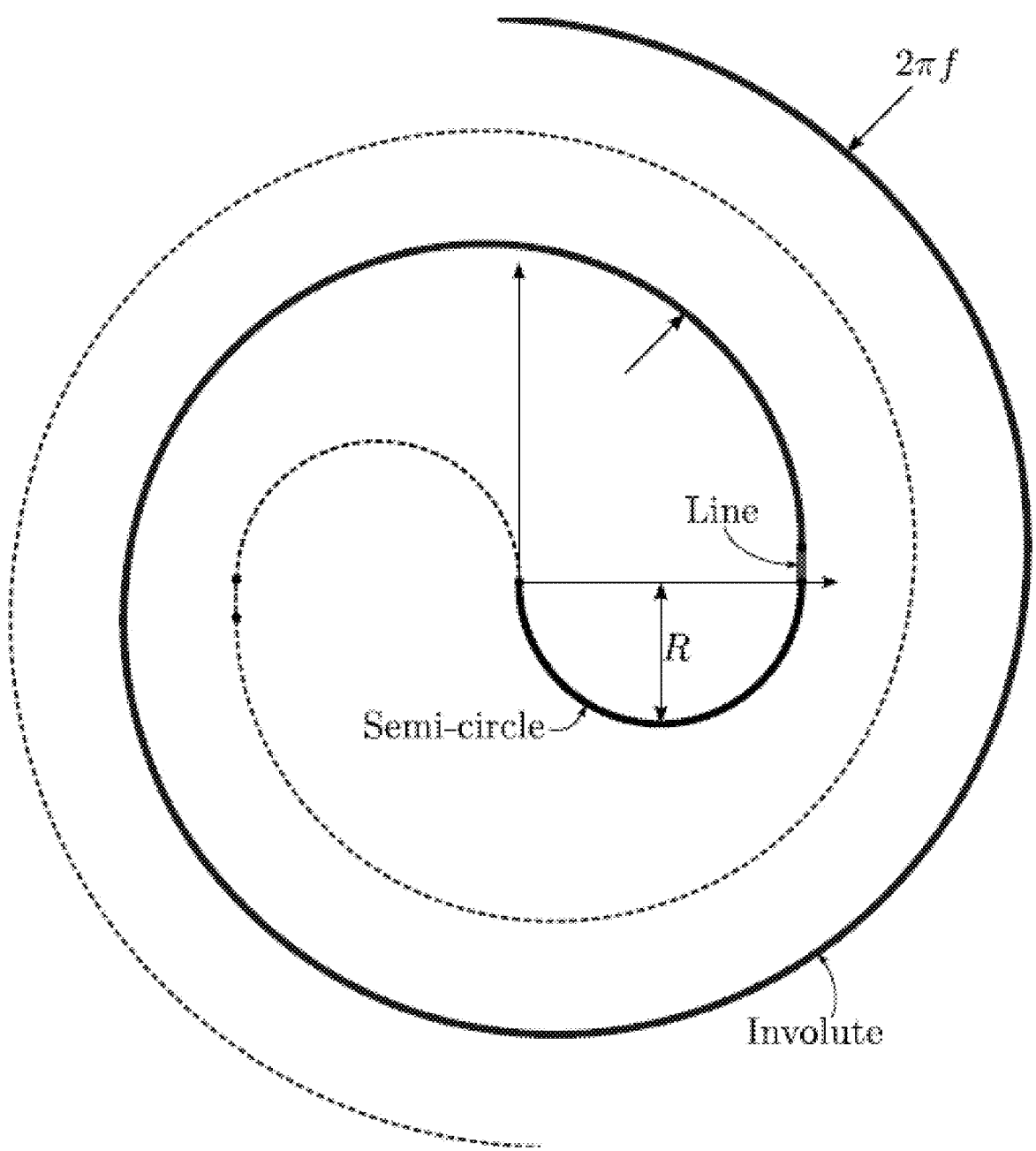
FIGS. 22a to 22d conceptually illustrate the wrapping of a compactible structure, according to embodiments.
Figure 22B:
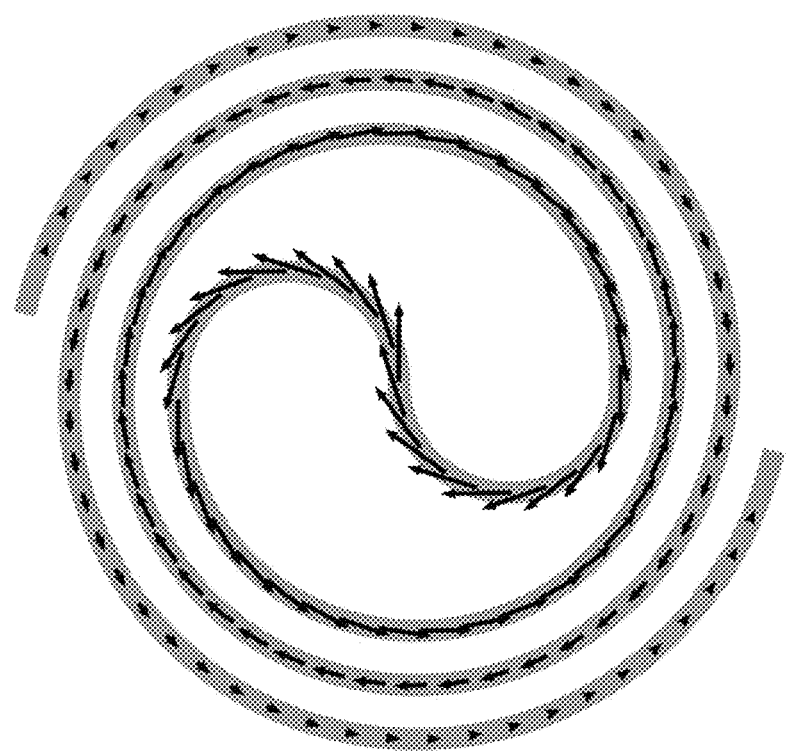

Wrapping mechanisms and methods to be used in association with slip-fold interconnected compactible structures to efficiently package and deploy the satellite modules and power generation tiles are also provided according to embodiments. Exemplary rotationally symmetric wrapping curves that may be used in embodiments of wrapping structures for compactible structures are discussing in relation to FIGS. 22a and 22b. Although many wrapping curve geometries may be used, in some exemplary embodiments, as shown in FIG. 22a, the curve consists of a semi-circle of radius R, a vertical line of length f, and an involute circle with a pitch of $2\pi f$, and which may be defined by the following:

$$p(s) = \begin{cases} R\{1 - \cos\left(\frac{s}{R}\right), -\sin\left(\frac{s}{R}\right)\} & \text{if } s \in [0, \pi R] \\ R\{2, \left(\frac{s}{R}\right) - \pi\} & \text{if } s \in (\pi R, \pi R + f) \\ f\{\cos(\alpha - \theta) + \alpha\sin(\alpha - \theta), \\ \sin(\alpha - \theta) - \alpha\cos(\alpha - \theta)\} & \text{if } s \in \left(\pi R + f, \frac{L}{2}\right) \end{cases}$$

Figure 22C:
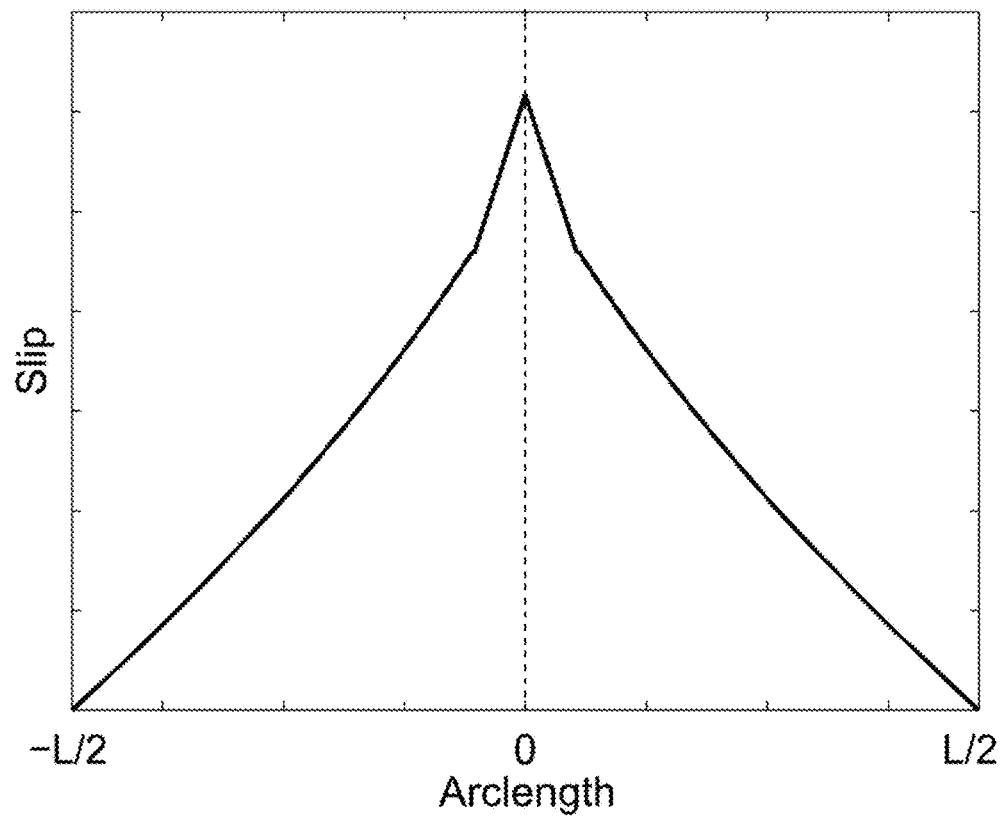
Figure 22D:
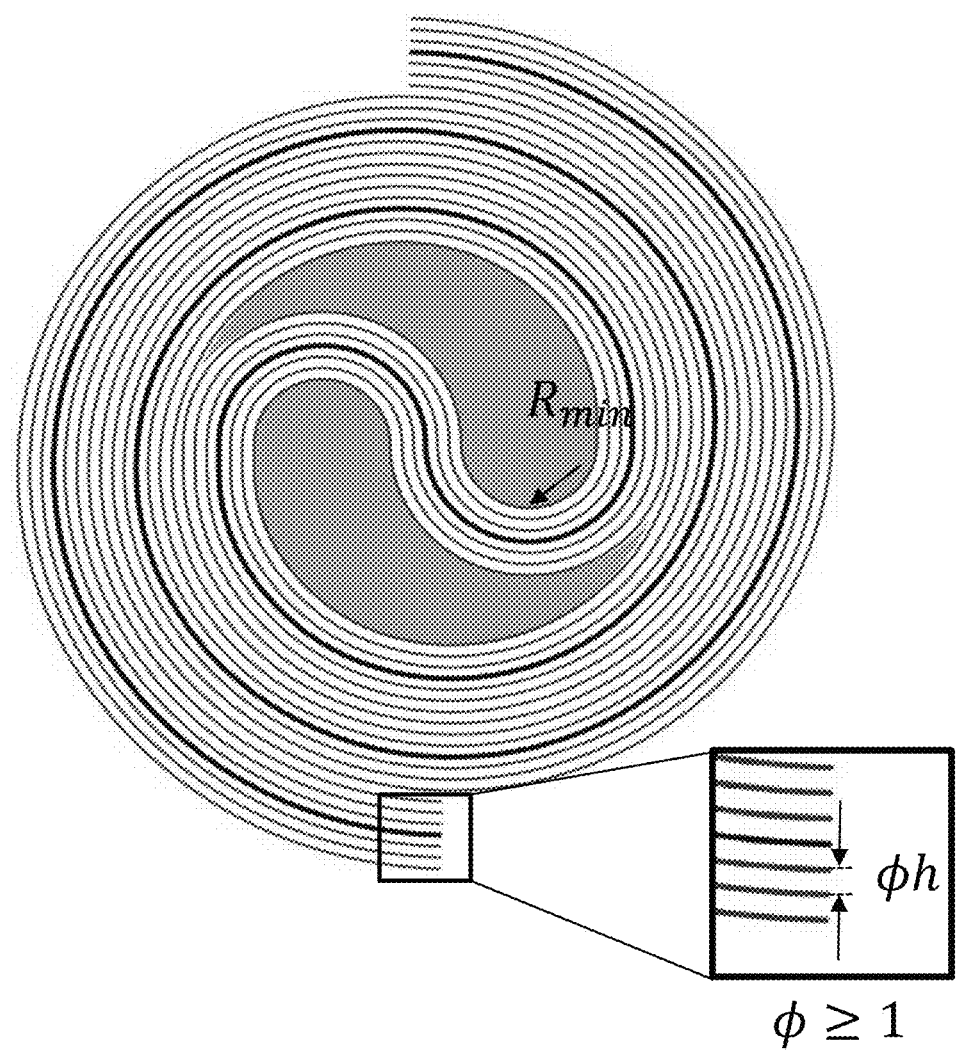

Using embodiments of this rotationally symmetric wrapping the maximum slip required between panel elements of compactible structures, as shown schematically in FIG. 22c and graphically in FIG. 22d, can be determined. In addition, the packaging efficiency of compactible structures (e.g. the size of deployed compactible structure that may be compacted into a package with a cylinder radius of $R_p$ and height of $H_p$), as shown in FIG. 22d, can also be determined. In many embodiments a compactible structure multiplier $\phi \geq 1$ may be included to account for packaging configuration where the compactible structure includes panel elements that in the packaged configuration are separated by some distance $\phi h \geq h$. In such embodiments the pitch of the involute would account for the thickness of the z-folded stack of panel elements of the compactible structure (e.g., $2\pi f = 2n\phi h$). Some embodiments of slip-wrapping also take into account the material limitations of the compactible structures, such as the radius of the semi-circle ($R = R_{min} + \phi hn/2$), which in embodiments is configured such that the curvature limit $1/R_{min}$ is dictated by the material modulus E and yield stress $\sigma_y$ such that these material limitations are not exceeded according to:

$$\frac{1}{R_{min}} = \frac{2\sigma_y}{Eh} \quad \text{(EQ. 5)}$$

In determining the packaging efficiency according to embodiments, the packaged radius $R_p = \max\|r(i;s)\|$, and the packaged height $H_p = L/n$ may be used as measures. Using these values (which are schematically illustrated in FIGS. 23a and 23b) the packaging efficiency of embodiments $\eta$, which is the ratio of the packaged volume to the material volume of the panel elements can be determined according to:

$$\eta = \frac{L^2 h}{\pi R_p^2 H_p} \quad \text{(EQ. 6)}$$

The packaging efficiency is thus a function of four non-dimensional parameters: the number of panels n, the non-dimensionalized minimum radius of curvature $\psi \equiv R_{min}/h$, the non-dimensionalized length of the panels L/h, and the thickness multiplier $\phi$). The packaging efficiency according to these four non-dimensional parameters may be given by:

$$\eta = \frac{n\lambda}{\pi\gamma^2} \quad \text{(EQ. 7)}$$

where $\gamma^2$ has the following function:

$$\gamma^2 = \left(\frac{R_p}{h}\right)^2 = \phi^2\left[\left(\frac{n}{\pi}\right)^2 + \left(\frac{n\alpha_{max}}{\pi}\right)^2 + \left(\frac{n-1}{2}\right)^2 + \frac{n(n-1)}{\pi}\alpha_{max}\right] \quad \text{(EQ. 8)}$$

and where $\alpha_{max}$ is given by:

$$\alpha_{max}^2 = \frac{\pi\lambda}{n\phi} + \frac{2\pi^2\psi}{n\phi} - 2 + \left(\frac{2\pi\psi}{n\phi}\right)^2 \quad \text{(EQ. 9)}$$

FIGS. 23a1 to 23a3, and 23b1 to 23b3 shown the packaging efficiency ($\eta$) of an exemplary compactible structure having 100 panels (n) with varying panel length ($\lambda$) for different thicknesses (ϕ), as summarized in FIG. 23a, and minimum wrapping radius (ψ), as summarized in FIG. 23b. If the compactible structure is kept constant the packaging efficiency is not sensitive to the number of panels in the compactible structure since as n increase the packaged radius would increase but the packaged height (e.g., width of panels) would decrease. FIG. 23a shows that the panel thickness ϕ has the greatest effect on packaging efficiency at large panel lengths λ. Accordingly, in many embodiments for very large panels or panels with very small thicknesses the global packaging efficiency of the compactible structures depends on the local, per panel packaging efficiency. In contrast, as illustrated in FIG. 23b, for panels of small length λ, the minimum bend radius of the material $R_{min}$=hψ has a large effect on packaging efficiency. This is because as the length of the panels λ increases, the size of the cavities (FIG. 22d) in the packaged compactible structure in relation to the overall package volume decreases, and in turn the relative importance of the bend radius ψ also decreases.

Figure 24:
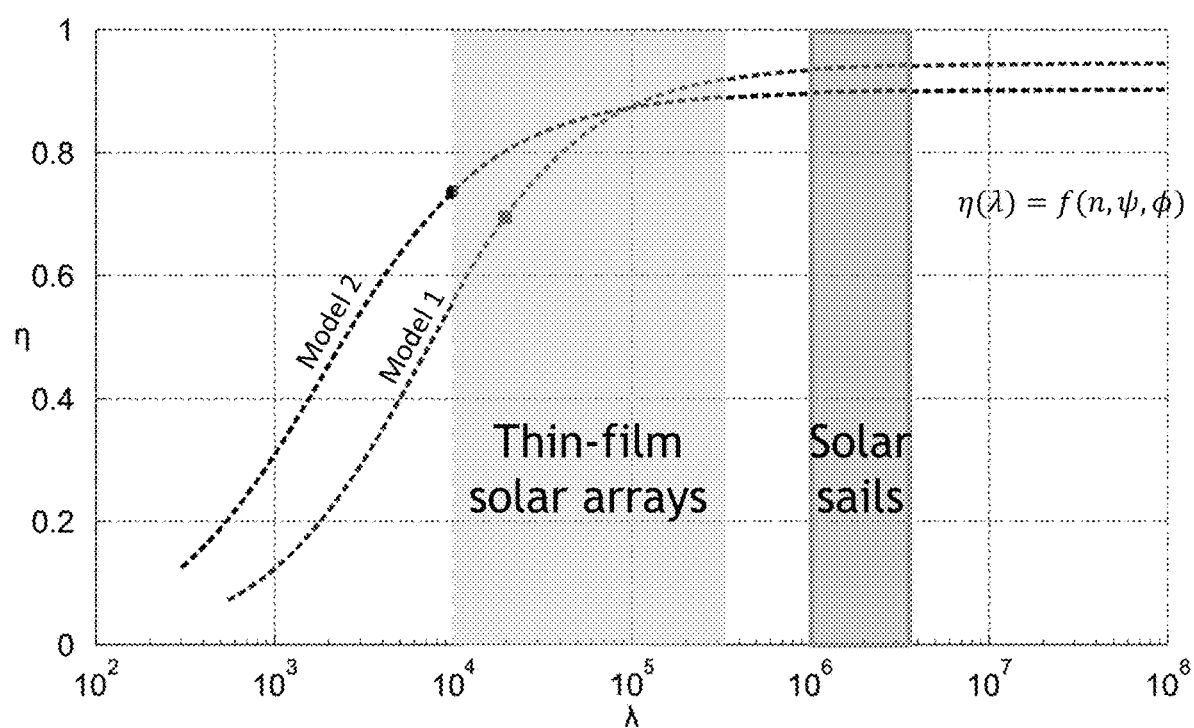
FIG. 24 provides a data graph showing the packaging efficiency of slip-wrapped compactible structures, according to embodiments.

Exemplary compactible structures having a plurality of movable panels of two different thicknesses configured for slip-wrap compaction were tested to determine a benchmark packaging efficiency for the slip-wrap method. In particular, two square models having 13 movable panels interconnected with ligament folds (7 ligaments per fold, each ligament having a width of 1.5 mm and a length of 8 mm) were made from aluminized polyester film and compacted using an embodiment of the slip-wrap compaction technique described herein. During compaction the panels were first z-folded into a stack of panel elements, and then the panels were wrapped to a specified wrapping radius and the packaging radius of the finally wrapped compactible structure measured. The parameter and packaging efficiency of the panels is summarized in FIG. 24 and Table 2. The lines represent packaging efficiencies achievable using similar manufacturing and packaging techniques, but scaled to different panel lengths.

TABLE 2

| Model | L(m) | h(μm) | $\log_{10}(\lambda)$ | η | n | ψ | ϕ |
|---|---|---|---|---|---|---|---|
| 1 | 0.5 | 25.4 | 4.3 | 69% | 13 | 78.7 | 1.057 |
| 2 | 0.5 | 50.8 | 4.0 | 73% | 13 | 39.4 | 1.106 |

In many embodiments, compactible structure incorporating moveable panels configured for slip-wrap compaction: 1) can accommodate panel thickness by incorporating slip between panel elements; 2) avoid the introduction of voids or gaps between the panels of the compactible structures either or both in the folded or wrapped configurations; and 3) can be folded and wrapped without material yielding (e.g., by removal of panel material along fold lines of the movable panels and/or by restricting the maximum curvature of the wrapped movable panels). Some compactible structures include a plurality of movable panels each interconnected by at least one slip fold such that the panels may fold relative to each other along a first folding axis and translate or slip relative to each other along an axis orthogonal to the folding axis. Slip folds may incorporate open sections along the fold lines of the movable panels where voids of panel material are disposed. Some of these open sections may be interconnected through movable elements, including, ligament folds and hinged elements, among others. The ends of adjacent panels in some embodiments may be interconnected. In some such embodiments the panels of such compactible structures are wrapped using a rotationally symmetric wrapping configuration such that the ends of the moveable panels of the compactible structure experience minimal to zero slip relative to each other. During compaction of the movable panels of the compactible structures some embodiments of compactible structures first incorporate a folding of the movable panels (e.g., by a z-fold, biaxial fold, star-fold, etc.), and further incorporate a wrapping of the stack of folded movable panels (e.g., by a rotationally symmetric wrap).

The number, size and configuration of the movable panels of the compactible structure may be chosen to minimize the compacted size of the compactible structure. Some embodiments minimize the spacing between the movable panels in the compacted configuration. In some such embodiments, where the deployed length of the movable panels of the compactible structure λ is greater than $10^3$ the spacing ϕ between the movable panels of the compactible structure is less than 1.5, in some embodiments less than 1.25, and in still other embodiments less than 1. In other embodiments the deployed length of the movable panels of the compactible structure A is greater than $10^4$, in other embodiments greater than $10^5$, and in still other embodiments greater than $10^6$. Some other embodiments minimize the bend radius ψ of the compactible structure during wrapping. In some such embodiments, where the deployed length λ is less than $10^6$ the minimum bend radius is less than 350, in other embodiments less than 200, and in still other embodiments less than 50. In other embodiments the deployed length λ of the movable panels is less than $10^5$, in still other embodiments less than $10^4$.

Embodiments of slip-wrapped compactible structures are configured such that the curvature of the compacted configuration does not exceed the maximum curvature limit given by EQ. 5. In some embodiments, a wrapping guide plug may be used to guide the wrapping of the movable panels of the compactible structure such that the compactible structure is wrapped in accordance with a preselected curve geometry and/or such that the panels do not exceed the maximum curvature limit as determined by the material modulus and yield stress of the material(s) of the panels. Exemplary embodiments of wrapping guide plugs are shown schematically in FIGS. 25a1, 25a2 and 25b. As illustrated conceptually in the top diagram, the wrapping plug comprises two rotationally symmetric halves of a cylinder with a slit disposed therebetween. Each half of the wrapping plug has an outer contour matching the profile of the rotationally symmetric wrapping curve to be used in compacting the compactible structure. During compaction the panels of the compactible structure would be wrapped about this structure to yield the final compacted package. The lower diagram provides a schematic of operable design of such a wrapping guide plug. In many embodiments a guide plug would implement endplates and threaded rods that would pass into and through the curved halves of the plug to stabilize the structure at a specified geometry during wrapping. Other constructions of such a wrapping guide plug could be contemplated such that compactible members could be controllably wrapped into a final packaging configuration at a specified minimum bend radius. Such a wrapping guide plug may be fabricated from any suitable material, such as a UV-curable acrylic plastic. The dimensions and geometry of the wrapping guide plug may be configured using stereolithography, among other suitable techniques.

During compaction using a wrapping guide plug according to embodiments, the movable panels of the compactible structure are clamped between the two plug halves such that they conform to the desired wrapping curve geometry and do not exceed the minimum bend radius. For example, a polyester film of thickness up to 50.8 μm has an E of 3.50 GPa and a $\sigma_y$ of 100 MPa, which gives an $R_{min}$, according to EQ. 6, of 0.89 mm to avoid permanent deformation in the panel material. It will be understood that these values are only exemplary and the modulus and stress values for other materials and panel constructions can be determined by techniques known in the art to allow for the determination of a minimum bend radius to avoid permanent deformation in the movable panels of the compactible structure in accordance with embodiments. As the wrapping guide plug may tightly clamp the movable panels during compaction, according to many embodiments, the various movable panels of the compactible structure may be pre-slipped with respect to each other to accommodate the thickness of the panels during subsequent wrapping.

Figure 26:
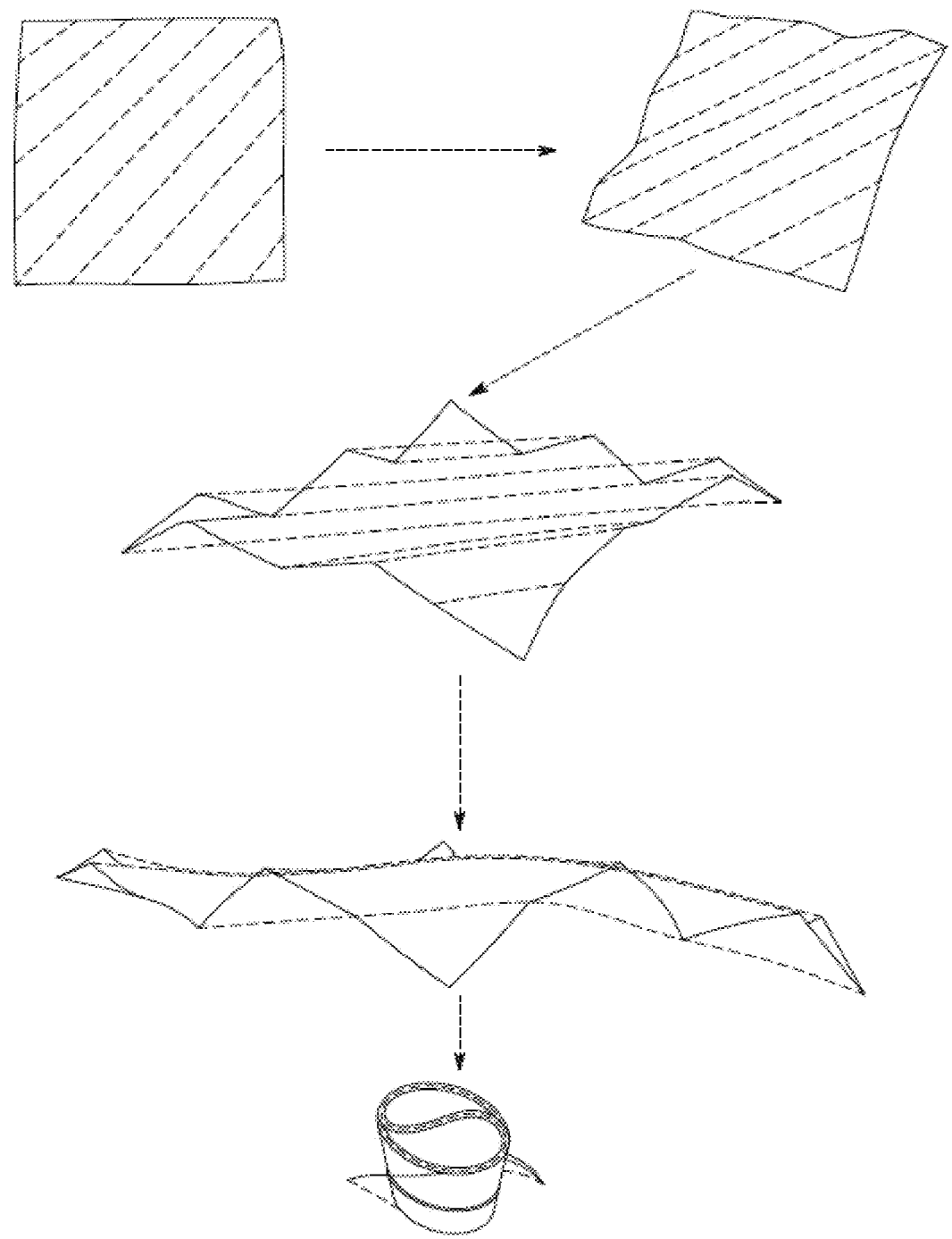
FIG. 26 provides images of a compactible structure being compacted using a slip-wrapping technique in accordance with embodiments.

Images of a compactible structure that is packaged using slip-wrapping compaction mechanisms and methods incorporating z-folds and rotationally symmetric wrapping in accordance with embodiments are provided in FIG. 26. Using such techniques it is possible to significantly reduce the packaging volume of the satellite modules. In the embodiment depicted in FIG. 26 the deployed square of 0.5 m may be packaged into a cylindrical structure with a diameter of 10 cm and a height of 7 cm. In one exemplary embodiment where the compactible structures of a satellite module have a tile/panel thickness of 1 cm and a minimum bend radius of 10 cm, a satellite module with a deployed area of 60 m×60 m and being comprised of 30 such compactible structures would be compactible using the slip-wrap packaging technique into cylindrical package with a diameter of 5 m and a height of 2 m.

Although z-fold and rotationally symmetric wrapping techniques used in combined slip-wrapping compaction mechanisms and methods have been described, it will be understood that the slip-wrapping embodiments may be used in conjunction with other types of folds, including, fan-folding, double z-folding, Miura-ori, and star-folding, among others. Images of a compactible structure incorporating star folding and symmetric wrapping in a slip-folding compaction technique in accordance with embodiments are provided in FIG. 27.

In many embodiments the number of compactible elements in each of the satellite modules in a solar space station may be the same or different and may contain one or more power generation tiles collocated thereon. One or more compacting techniques may be used in packaging the compactible elements of each of the satellite modules and the techniques used may also be the same or different. In many embodiments the compacting techniques utilized to package the satellite modules prior to deployment reduce the packaging volume of the satellite module in at least one dimension such that the satellite module fits within the allowed payload volume of the selected delivery vehicle.

Compactible Power Generation Tiles

Figure 28:
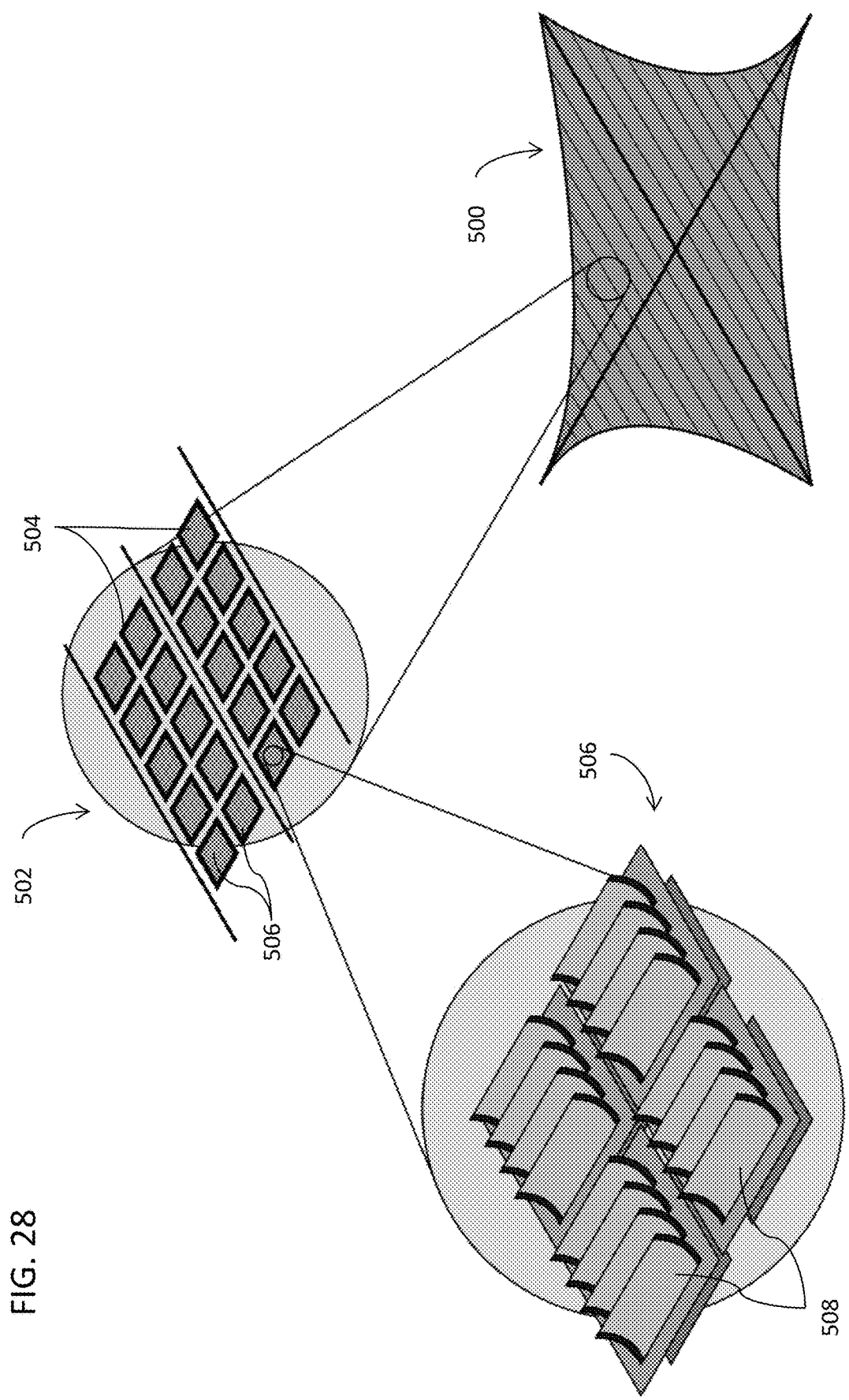
FIG. 28 conceptually illustrates a large-scale space-based solar power station, a compactable satellite module, and a compactible power generation tile in a deployed configuration, according to embodiments.
Figure 29A:
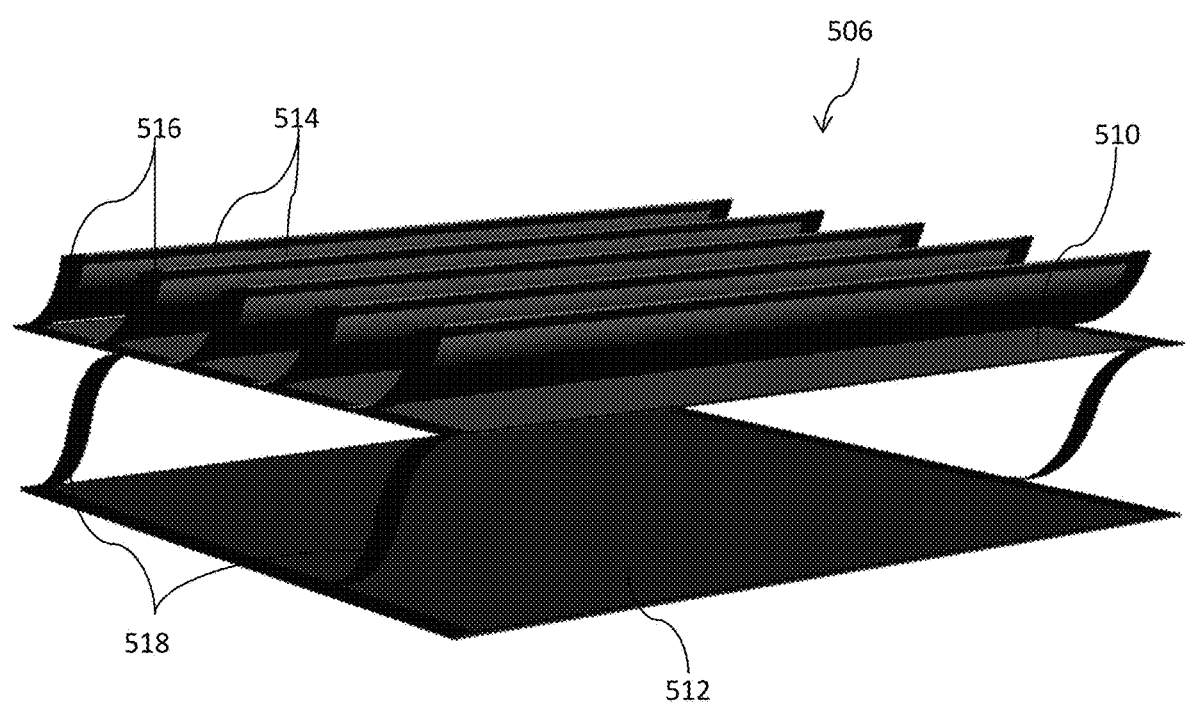

In many embodiments the power generation tiles may have further compactible and expandable features and structures disposed thereon. An illustration of such embodiments is provided in FIG. 28. As shown, in such embodiments a space-based solar power station 500 incorporates a plurality of satellite modules 502 formed from compactible structures that are implemented by a plurality of movable panels 504 on which are disposed a plurality of power generation tiles 506. Some embodiments of such power generation tiles 506 implement one or more compactible and expandable structures 508, such as deployable collectors, photovoltaic cells, antennas, etc. In some embodiments, as illustrated in FIGS. 29a and 29b1 and 29b2, power generation tiles 506 may implement photovoltaic cell structures 510 and power transmitter structures 512 that are movably interrelated through a compactable structure, such that when in a compacted or packaged configuration the elements of the power generation tiles are compressed together to occupy a total volume lower than when in a deployed configuration. In some deployed configurations the photovoltaic cell and power transmitter are separated by a gap (e.g., to create an offset, such as a vertical offset, therebetween). Embodiments of compactable structure may include one or more deployable structures and mechanisms.

Figure 30A:
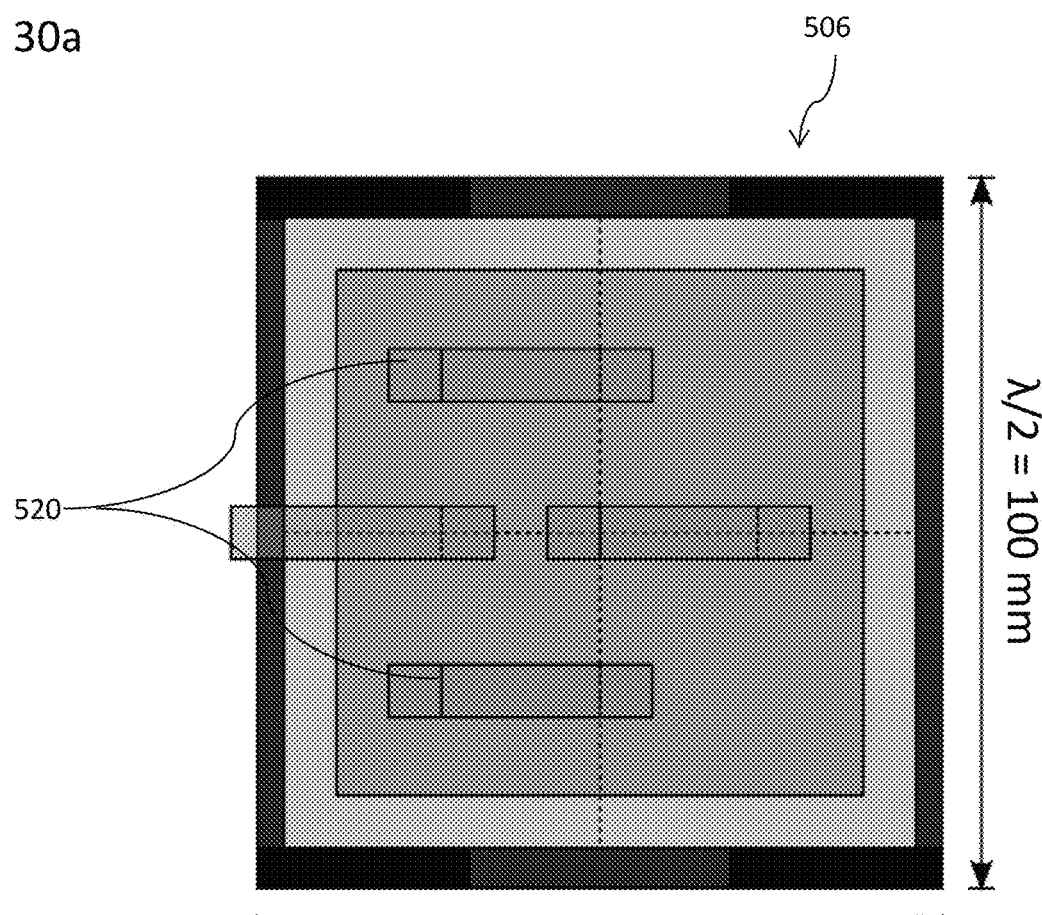
FIGS. 30a and 30b conceptually illustrate top and cross-sectional views of a compactible power generation tile, according to embodiments.
Figure 30B:
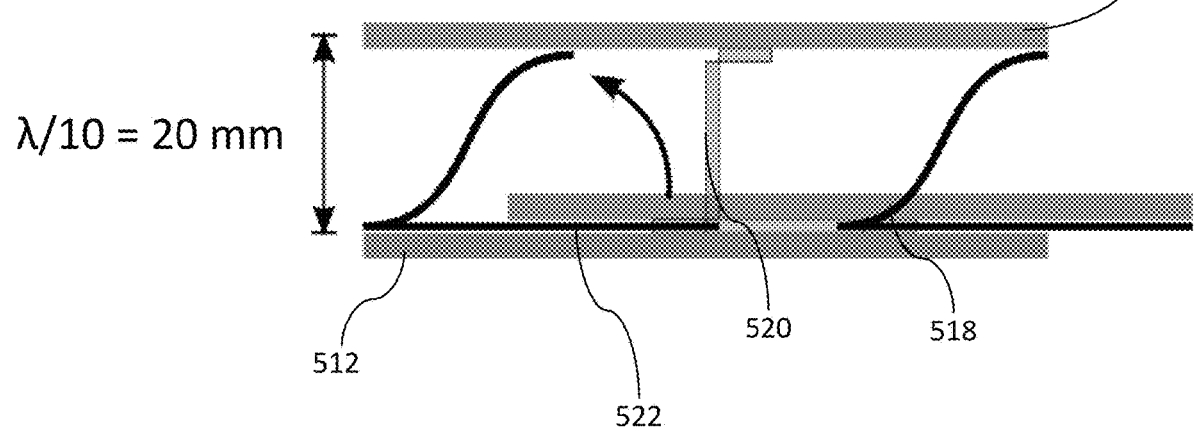

Deployable structures may be implemented through motorized interconnections and resilient members such as spring or tension arms that are bent or are under compression, among others. Some embodiments may use composite springs (e.g., carbon fiber or "S" springs). Some embodiments, for example, may include collectors 514 that are elastically deployed via spring members 516 incorporated or attached thereto. In some other embodiments the photovoltaic structure 510 may be deployed distally from the power transmitter through elastic structures such as "S" springs 518 that are attached or integrated into one or both of the photovoltaic and/or power transmitter structures. These springs 518 may be compacted into cutouts 522 formed into the body 512 of the satellite module, as illustrated in FIGS. 30a and 30b. Additional structures may be incorporated with such deployable structures. Some embodiments of power generation tiles 506 where the photovoltaic structure 510 is distally separated from the power transmitter structure 512 may include power and signal feeds 520 to electrically interconnect the photovoltaic and power transmission structures when spatially separated after deployment. Other interconnections, support structures, thermal transmission features, etc. may also be incorporate into such embodiments such that they may be deployed when the compactible structures of the power generation tiles are deployed.

Any suitable materials may be used to form such deployable power generation tiles. In many embodiments suitable conductive materials may include metals such as Au, Al, Ag, Pt. etc. Suitable insulating materials may include polyimide film, among others. The springs and other deployable structures may be made of a suitable resilient material such as carbon fiber, memory metals, etc.

Although specific spring deployable structures are shown, it should be understood that such compactable structures may also incorporate packaging techniques such as one or a combination of z-folding, wrapping, rolling, fan-folding, double z-folding, Miura-ori, slip folding and symmetric wrapping may be used, among others. In addition, although specific deployable structures (e.g., collector, photovoltaics, power transmission, antenna) in association with specific power generation tiles are described, it should be understood that embodiments of such deployable structures may be used to deploy, offset and support other numbers, geometries, configurations, shapes or sizes of such deployable structures according to embodiments.

Pre-Stressing Compactible Structures

In addition to the size and weight of the structures of the satellite modules, another consideration in their design in accordance with embodiments is their stability, i.e., conformation to a pre-designed shape and ability to resist deformation from that pre-designed shape during operation. The stability requirement for a satellite module, power generation tile, etc. depends on its size and purpose, and, for a power transmitter the wavelength of operation. For example, consider a phased array of square patch antennas on a grid of λ/2 with λ≈30 cm (1 GHz microwaves), attached to a 60 m diameter spinning membrane structure. The antennas are synchronized to emit coherently in order to transmit power in a narrow beam. If the calibration of the antennas is carried out assuming that the membrane structure is perfectly planar, a subsequent distortion of the structure distorts the radiation pattern and causes some power to be lost.

Figure 31:
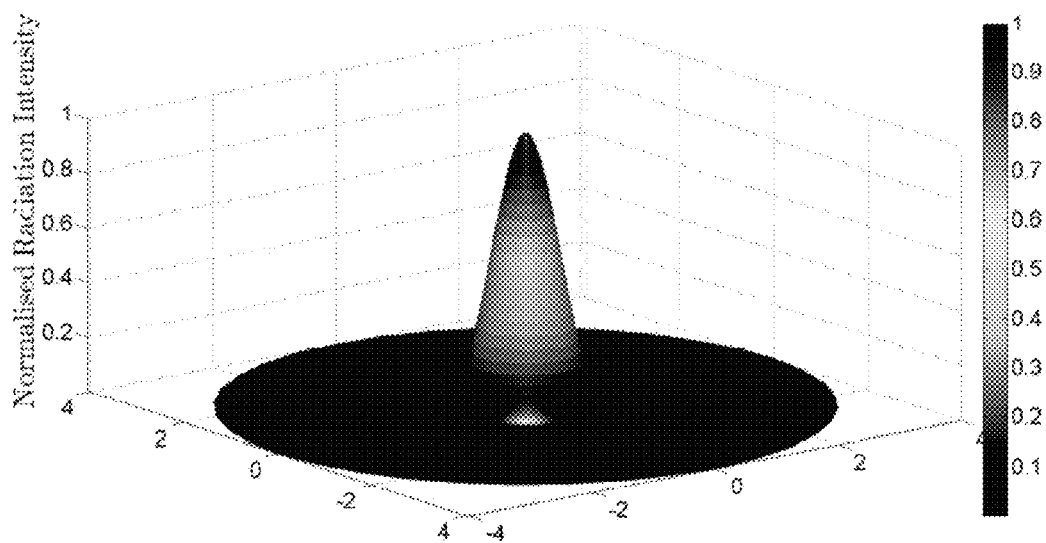
FIG. 31 provides a data graph illustrating a radiation pattern from a flat power transmitter, according to embodiments.
Figure 32:
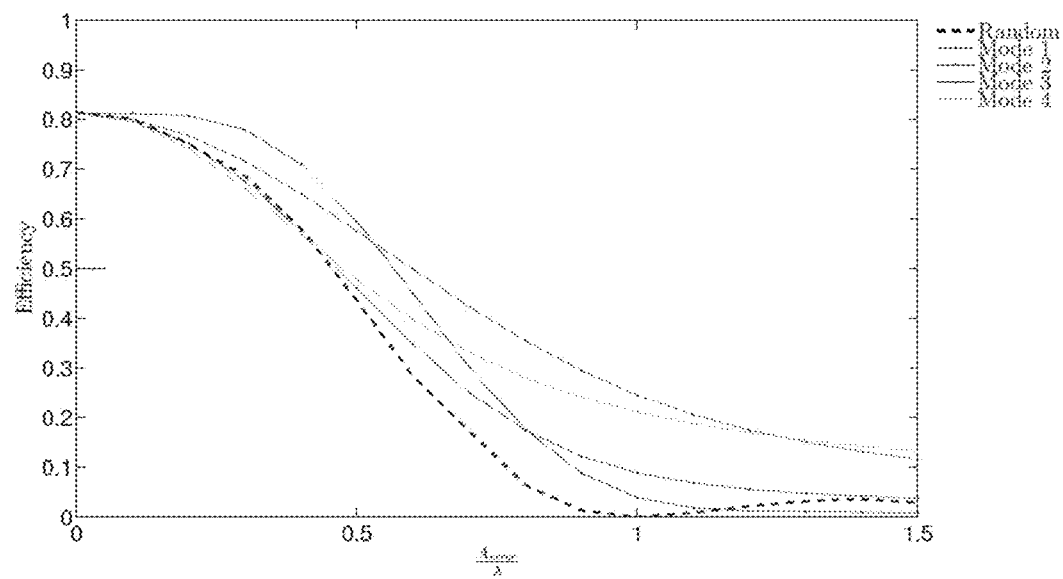
FIG. 32 provides a data graph illustrating the effect of vibrational deformation on the power transmission efficiency, according to embodiments.
Figure 33A:
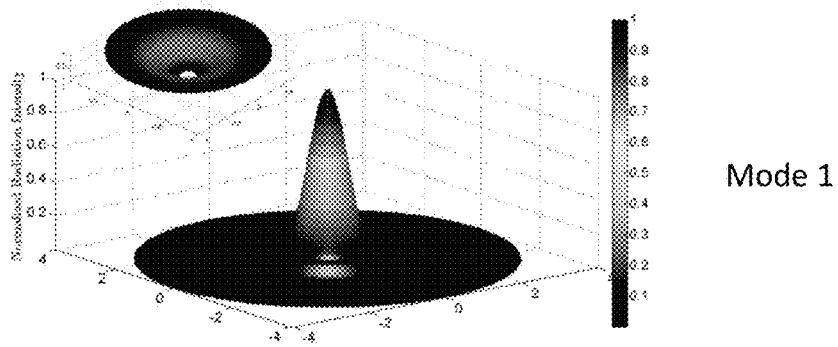
FIGS. 33a to 33d provide data graphs illustrating radiation patterns from power transmitters subject to deformation, according to embodiments.
Figure 33B:
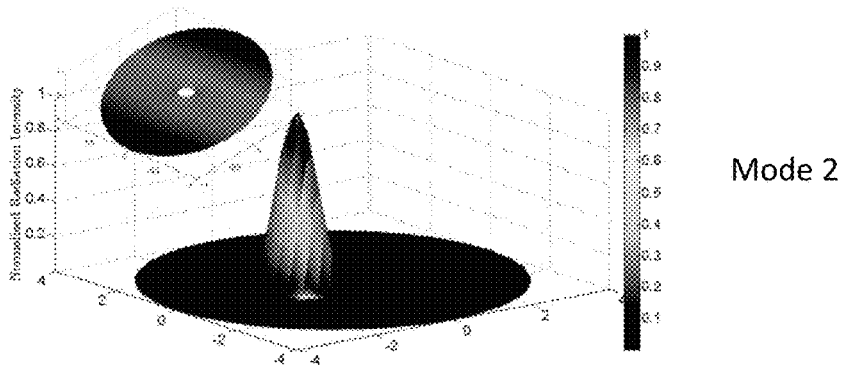
Figure 33C:
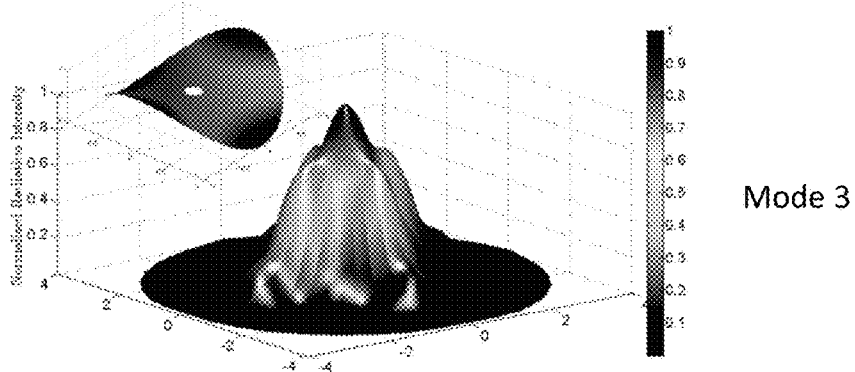
Figure 33D:
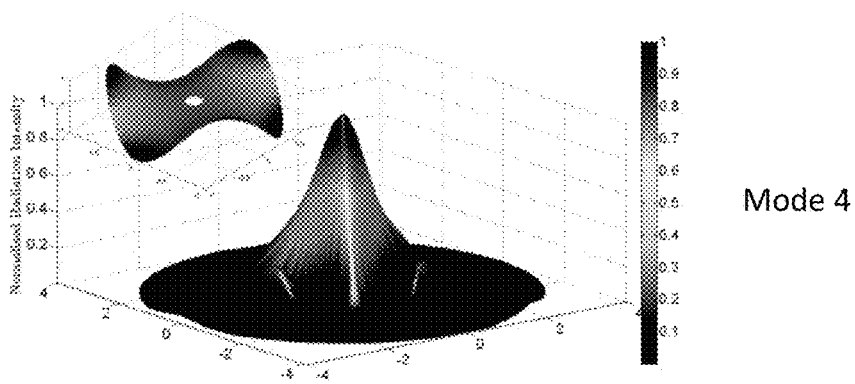

The efficiency of the array antenna is defined as the capability of transferring power in a chosen direction, which corresponds to the direction of the main beam if the antenna is perfectly planar. FIG. 31 shows the normalized radiation pattern (normalized radiation intensity in every direction) of a calibrated flat structure for λ=1 m (faster simulations). FIG. 32 shows the power transmission efficiency of the 60 m antenna array described above respectively deformed on each of the first vibration modes of a spinning membrane as a function of the deformation amplitude along with random deformation of various amplitudes. (Normalized radiation patterns from each of four vibration modes of deformation are provided in FIGS. 33a to 33d.) In the graph the x-axis is the amplitude of the mode (maximum out-of-plane deformation) divided by the wavelength. In particular, for λ=30 cm FIG. 32 shows that a shape error of as little as 18 cm over a 60 m structure can, in certain embodiments, decrease the power efficiency of the power transmission by a factor of two for at least one mode.

There are a number of sources of possible deformation in the out-of-plane flatness of satellite modules and power generation tiles according to embodiments, including: material imperfections (e.g., initial and degradation over time), compaction imperfections (e.g., creases, electrostatic self-attraction, wrinkles), thermal interference (e.g. external and internal sources), inertial loads (e.g., translations that depend on orbit and formation such as maneuvering, and rotation such as reaction wheels and slewing, among others), gravity gradients (including in-plane and out-of-plane), and solar pressure (e.g., from solar radiation).

Figure 35A:
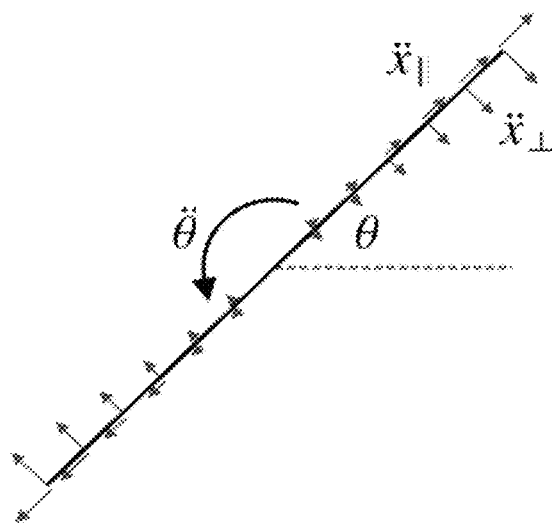
FIGS. 35a to 35c provide: a) a conceptual illustration of inertial loading forces, b) graphs of such inertial loading, and c) a data graph showing the deformation force applied to a satellite module subject to inertial loading, according to embodiments.

Consider inertial loads placed on the satellite modules of a solar space station during operation. One exemplary inertial load, as illustrated in FIGS. 34a and 34b might occur as the result of a need to slew the satellite module to keep either or both the photovoltaic or power transmitter pointed in the correct direction (e.g., in the direction of incoming solar radiation or in the direction of a power receiving rectenna, respectively). In such cases, as shown in FIG. 35a, the forces on the slewing satellite module would have two components: a normal load from Euler force related by the expression:

$$\ddot{x}_\perp = \ddot{\Theta} r_{mod} \quad \text{(EQ. 10)}$$

and a centrifugal force given by the expression:

$$\ddot{x}_\parallel = \dot{\Theta}^2 r_{mod} \quad \text{(EQ. 11)}$$

Figure 35B:
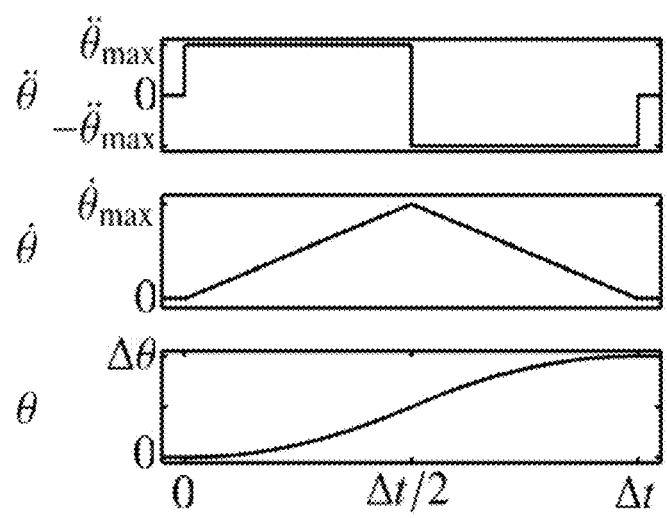
Figure 35C:
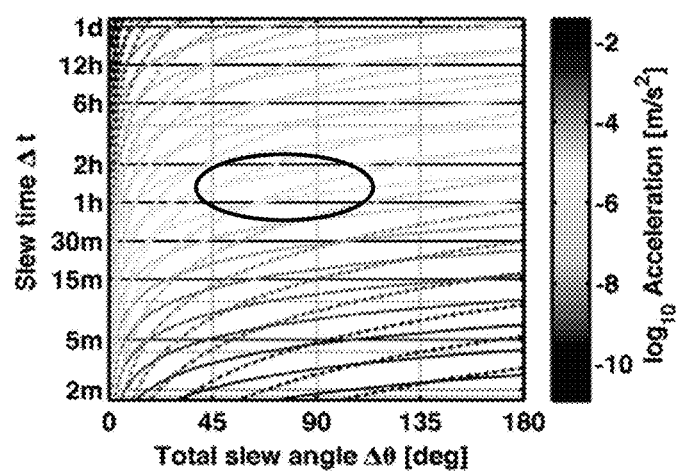

The maximum acceleration profiles for such inertial loads are shown graphically in FIG. 35b for values of Θ to Θ̈. Using these values it is possible to plot the inertial load for a particular movement over a specified time period, as shown in the data plot in FIG. 35c. Assuming a 90° slew over a one hour time period (which can be considered a fast-slew within embodiments of the SPS), an inertial load of $5.15 \times 10^{-7}$ N/m² normal to the plane of the satellite module and an inertial load of $8.10 \times 10^{-7}$ B/m² in the plane of the satellite module would be generated.

Figure 36A:
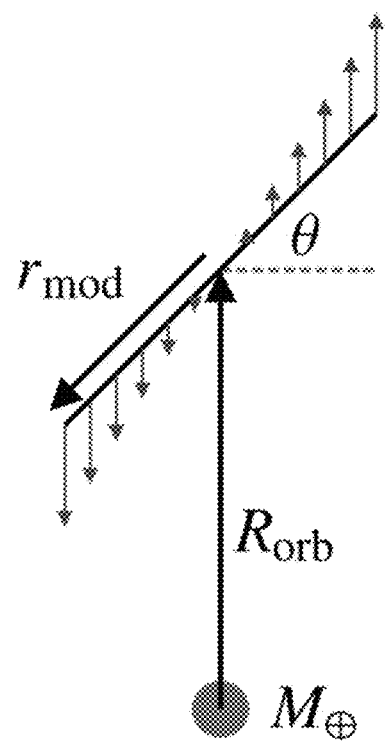
FIGS. 36a and 36b provide: a) a conceptual illustration of gravity gradient loading forces, and b) a data graph showing the deformation force applied to a satellite module subject to gravity forces, according to embodiments.

Similarly, as illustrated in FIG. 36a, it is possible to predict the gravity gradient load on a satellite module according to the expression:

$$\ddot{x}_{gg} = \left( \frac{1}{R_{orb}^2} - \frac{1}{(R_{orb} - r\sin\theta)^2} \right) GM_\oplus \quad \text{(EQ. 12)}$$

Figure 36B:
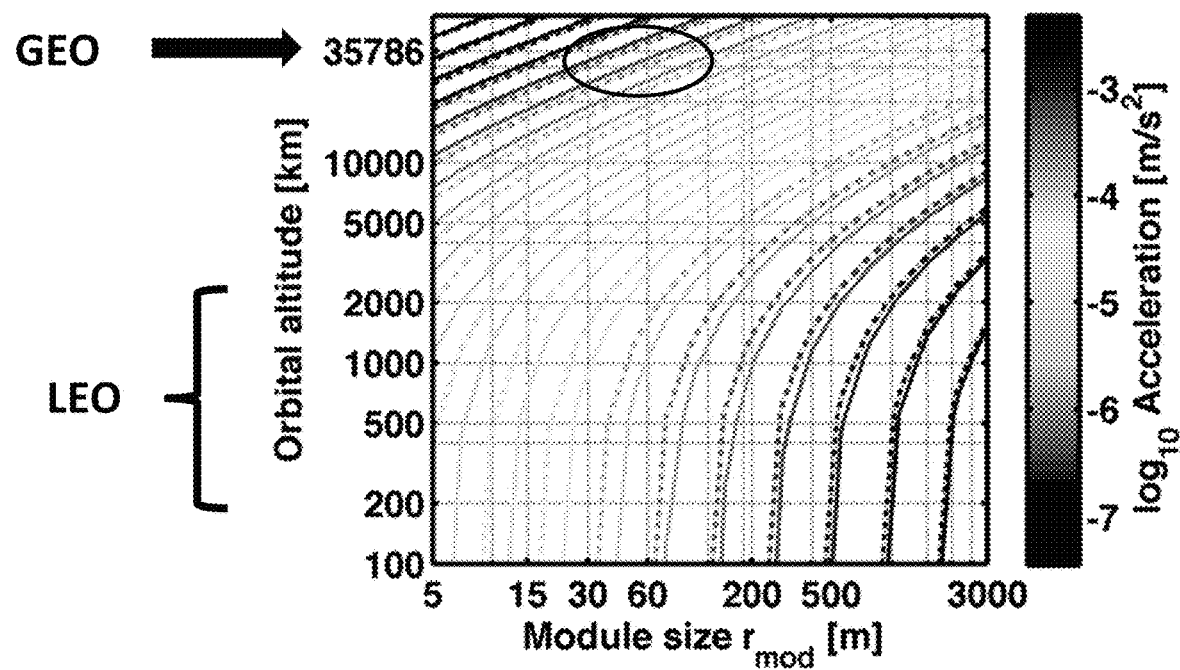

At the geosynchronous orbits at which the SPS is proposed for operation, the gravity gradient loads are $\sim 5.64 \times 10^{-9}$ N/m² (normal) and $\sim 1/13 \times 10^{-8}$ N/m² (out of plane), as shown graphically in FIG. 36b. These forces are a factor of 100 lower than the loads applied by inertial loading.

Finally, the contribution of the solar radiation pressure for an exemplary SPS (e.g., combination of photon absorption, reflection and emission) can be given by the expression:

$$P_{SRP\perp} = \frac{nE_f}{c} \cos^2\beta \quad \text{(EQ. 13)}$$

Where the reflector is normal to the sun at 1 AU the normal solar radiation pressure would be on the order of $9.08 \times 10^{-6}$ N/m², the highest deformational load of the contributions from inertial loading, gravity loading and solar radiation pressure by a factor of 10.

Figure 37:
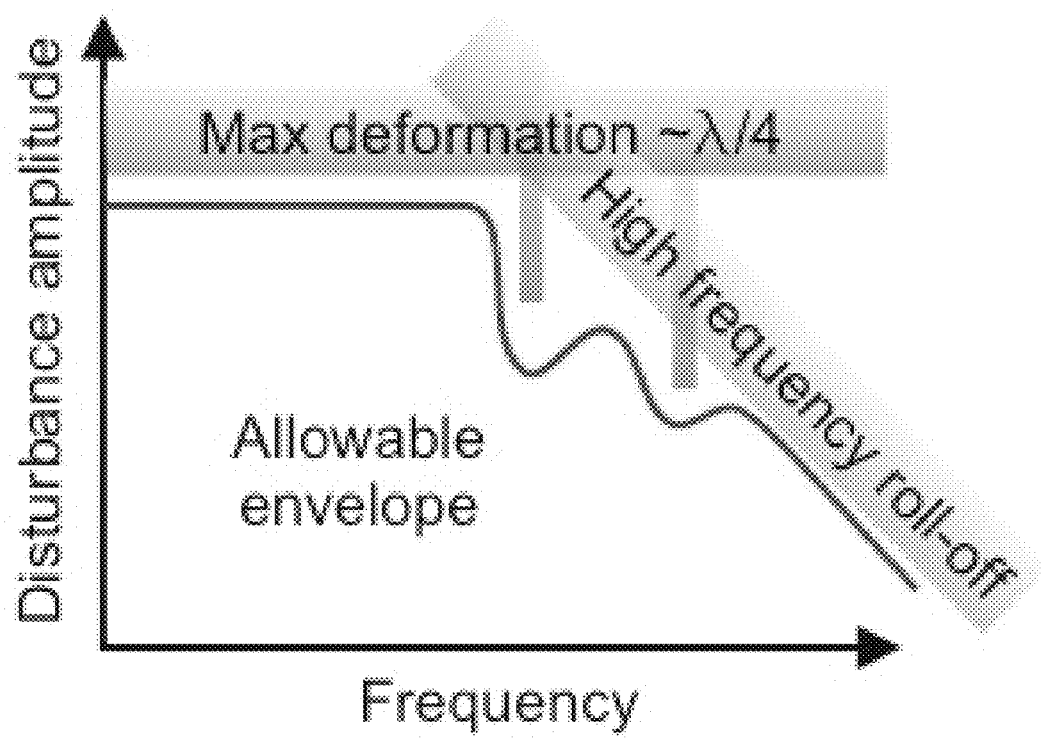
FIG. 37 provides a conceptual data graph showing the maximum allowable deformation of a satellite module, according to embodiments.

Regardless of the source of deformation, in some embodiments a maximum deformation amplitude related to the frequency can be plotted, as shown in FIG. 37. As shown, an allowable disturbance envelope may be characterized below ~λ/4 for low frequency disturbances. It will be noted that there is a roll-off at high frequency because of an inability to measure and compensate for disturbances quickly enough at high enough frequencies. Accordingly, in some embodiments the satellite module on which the power generation tiles are located is configured to be sufficiently stable to avoid the creation of, or to reduce the system's sensitivity to, deleterious deformations in the power transmission of the solar power station. Some embodiments are configured to avoid the creation of, or to reduce the system's sensitivity to disturbances below a maximum deformation amplitude of around λ/4. Alternatively or in addition, electronic recalibration can be used in many embodiments to correct for such deformations.

Figure 38A:
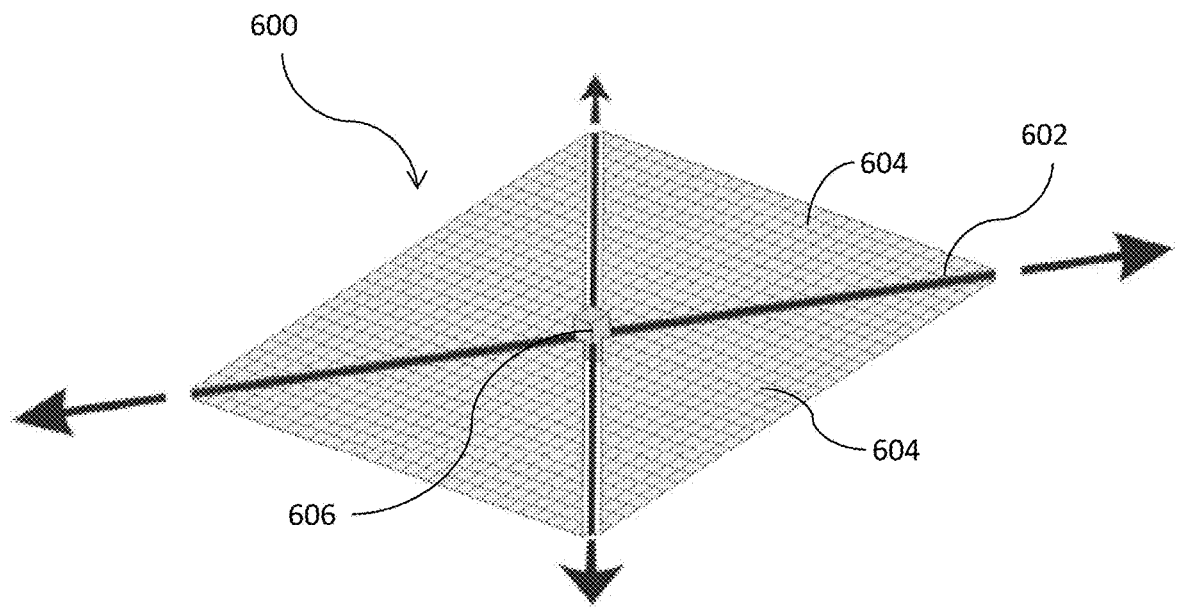
FIGS. 38a and 38b conceptually illustrate a prestress mechanism employing a series of stabilizing arms, according to embodiments.
Figure 38B:
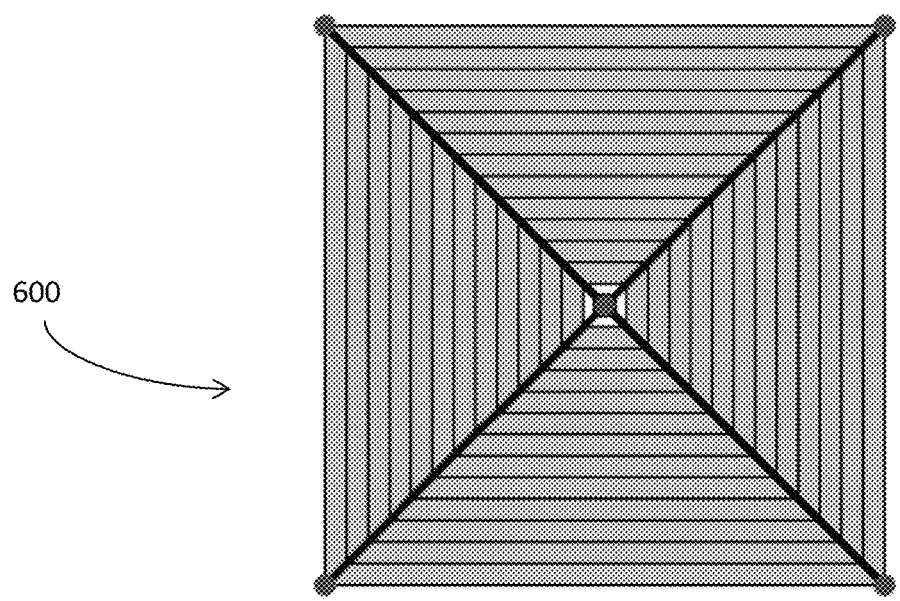

In many embodiments, deformations of the satellite modules and power generation tiles of the solar power station are mitigated by prestressing one or more of the components of each of the satellite modules such that the planar surface of the satellite module is stabilized against out of plane deformation. Some embodiments of pre-stressing mechanisms and methods include the use of stabilizing booms under compression or bending such that a prestress is applied across at least a portion of the satellite module. An illustration of a prestressed satellite module 600 using stabilizing booms 602 is illustrated in FIGS. 38a and 38b. In some embodiments the satellite module 600 is divided into quadrants of compactible structures 604 with booms 602 extending along a diagonal with respect to the quadrants. In many embodiments, the quadrants are connected to the booms on at least two points, along their length near the hub 606 and at the end of the boom 608 (e.g., such that the prestress tensions is distributed through the edges of the compactible structures of the satellite module), although the number and type of connections to the booms may take any suitable form. The quadrants 604 may be subdivided into a plurality of compactible structures that may be disposed in any number, configuration, shape or size suitable for compaction. In the exemplary embodiment illustrated in FIG. 38a, the quadrants of the satellite module are divided into a plurality of square tiles, however, other configurations could be considered, such as in elongated panels running perpendicular or parallel to the stabilizing booms (as shown in FIG. 38b). In addition, although four quadrants are shown in the figures, it should be understood that any number, size and shape of such divisions of the overall compactible structure may be formed and interconnected by any number or configuration of stabilizing booms.

Figure 39:
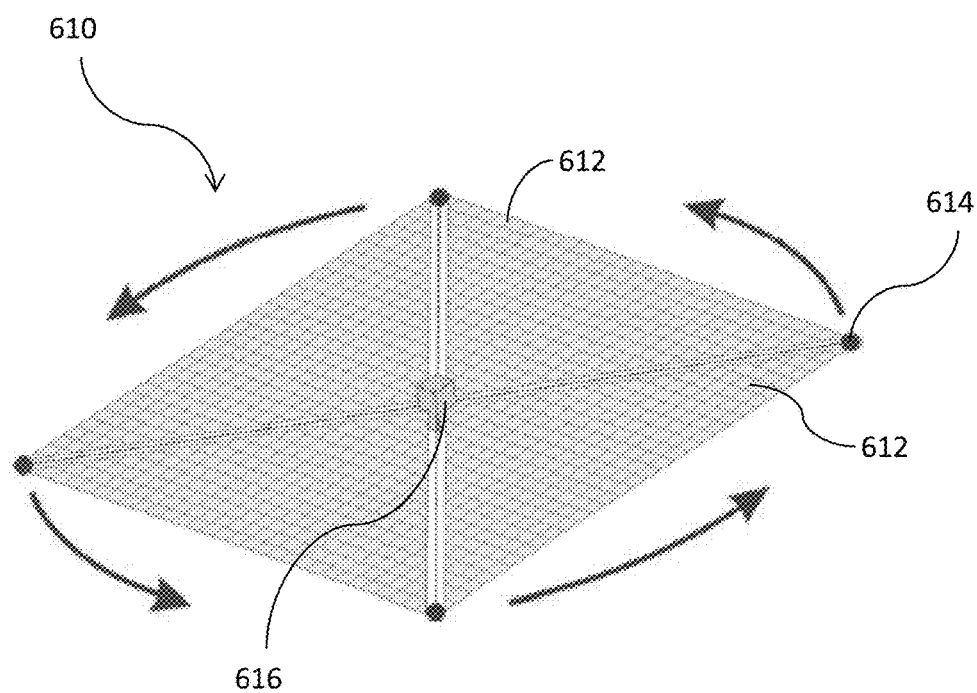
FIG. 39 conceptually illustrates a prestress mechanism employing weighted tips, according to embodiments, FIG. 40 conceptually illustrates the anistropic prestress of a slip-folded compactible structure, according to embodiments.

In other embodiments, the stabilizing pre-stress force may be applied via a dynamic force, such as a weighted spinning structure. An illustration of one such embodiment is provided in FIG. 39 where weighted elements 614 are attached between a central hub 616 and at least an edge portion of each of the compactible structures 612 of the satellite module 610 such that when the central hub of the satellite module is spun the centrifugal force of the spinning hub causes the weighted elements to apply a pre-stress to the compactible structures. In such embodiments the satellite module may be made to spin continuously to provide a stabilization force to the compactible structures. Although an embodiment shown weighted tip elements at four corners of the satellite module, it should be understood that any number, arrangement, shape and size of weighted elements may be provided such that a sufficient stabilizing force is applied to the panels of the compactible structure of the satellite module. In many embodiments, the weighted elements may be integrated with the panels such that separate weighted element are not provided.

Figure 40:
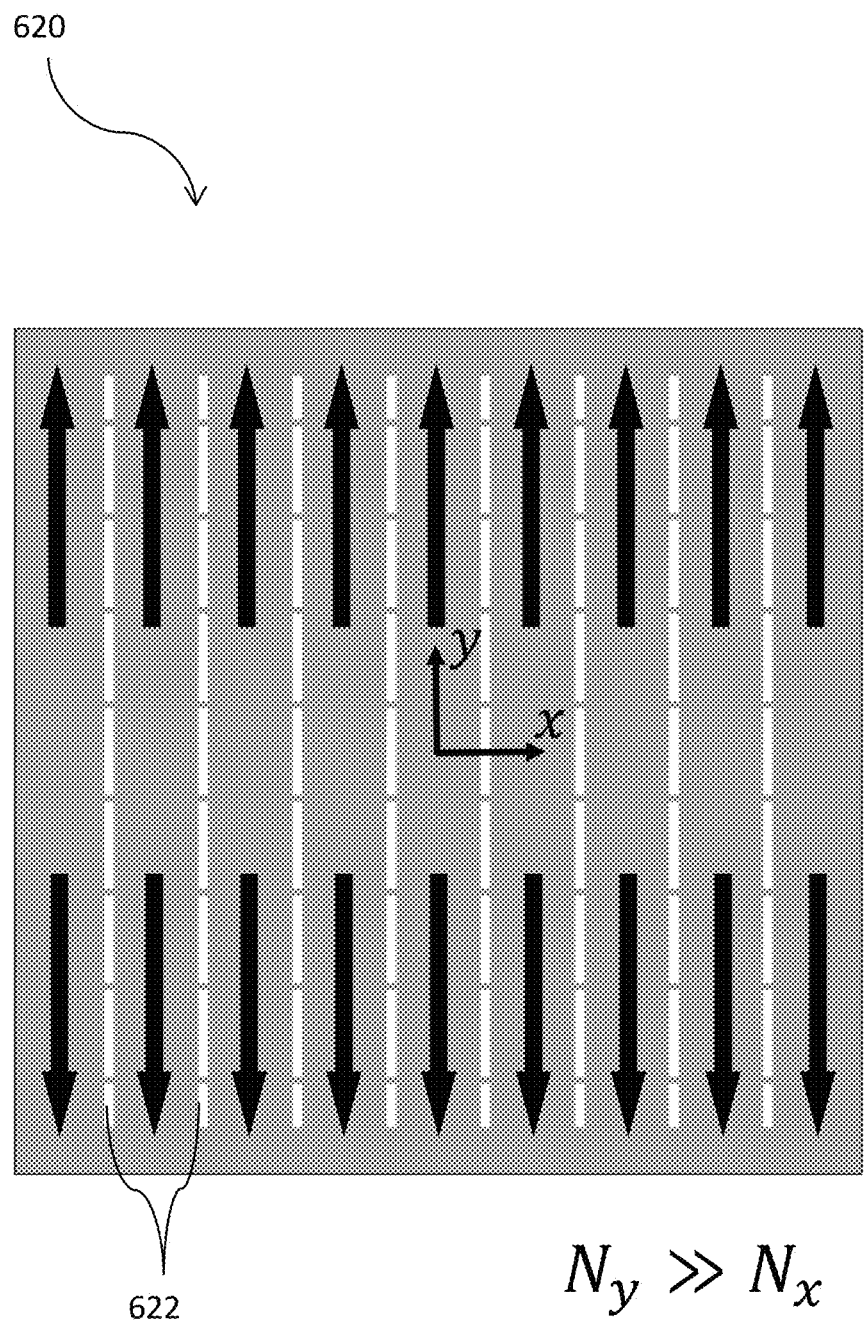

Satellite modules incorporating slip-folds may also be pre-stressed in accordance with embodiments. However, a satellite module 620 incorporating slipping folds 622 is anisotropic (e.g., the stiffness parallel to the slipping folds is much higher than the stiffness perpendicular to them), as illustrated in FIG. 40. In embodiments, this anisotropy is incorporated into the stabilizing method or mechanism when prestressing the moveable elements of the compactible structure of the satellite module. Some embodiments implement pre-stress configurations and mechanisms such that the prestress along the fold axis is much higher than the pre-stress orthogonal to the fold axis. An illustration of an embodiment of a compactible structure 630 incorporating such an anisotropic prestress configuration is provided in FIG. 41. In the embodiments slipping folds 632 are provided parallel to the y-axis 634, and the compactible structure of the satellite module has a length a along the x-axis and length b along the y-axis. The prestress is applied such that each panel has equal tension in the y-direction (i.e., parallel to the slipping folds), and no tension (or a much lower tension) is provided in the x-direction (i.e., perpendicular to the slipping folds). In such embodiments global tensioning forces $F_x$ at $[\pm a/2, 0]$ and Fy at $[0, \pm b/2]$ (e.g., using suitable external stabilizing members, such as booms or masts, or weights and a spinning force as described above) may be applied to the compactible structures of the satellite module.

In some embodiments the satellite module edges can be shaped so as to distribute prestress tensioning forces to implement uniaxial tensile loading P, which is a force per unit length, to the moveable elements of the compactible structure. Since the symmetric wrapping according to embodiments can be implemented such that the edges 636 of the membrane are continuous and uncut, they can operate to transmit the tension from the prestress to the moveable elements. In many embodiments the application of the prestress tension is configured such that the force P is uniformly distributed. Some embodiments implement uniform prestress along the moveable elements of the compactible structure by conforming the edges of the compactible structure into a parabolic conformation.

Figure 41:
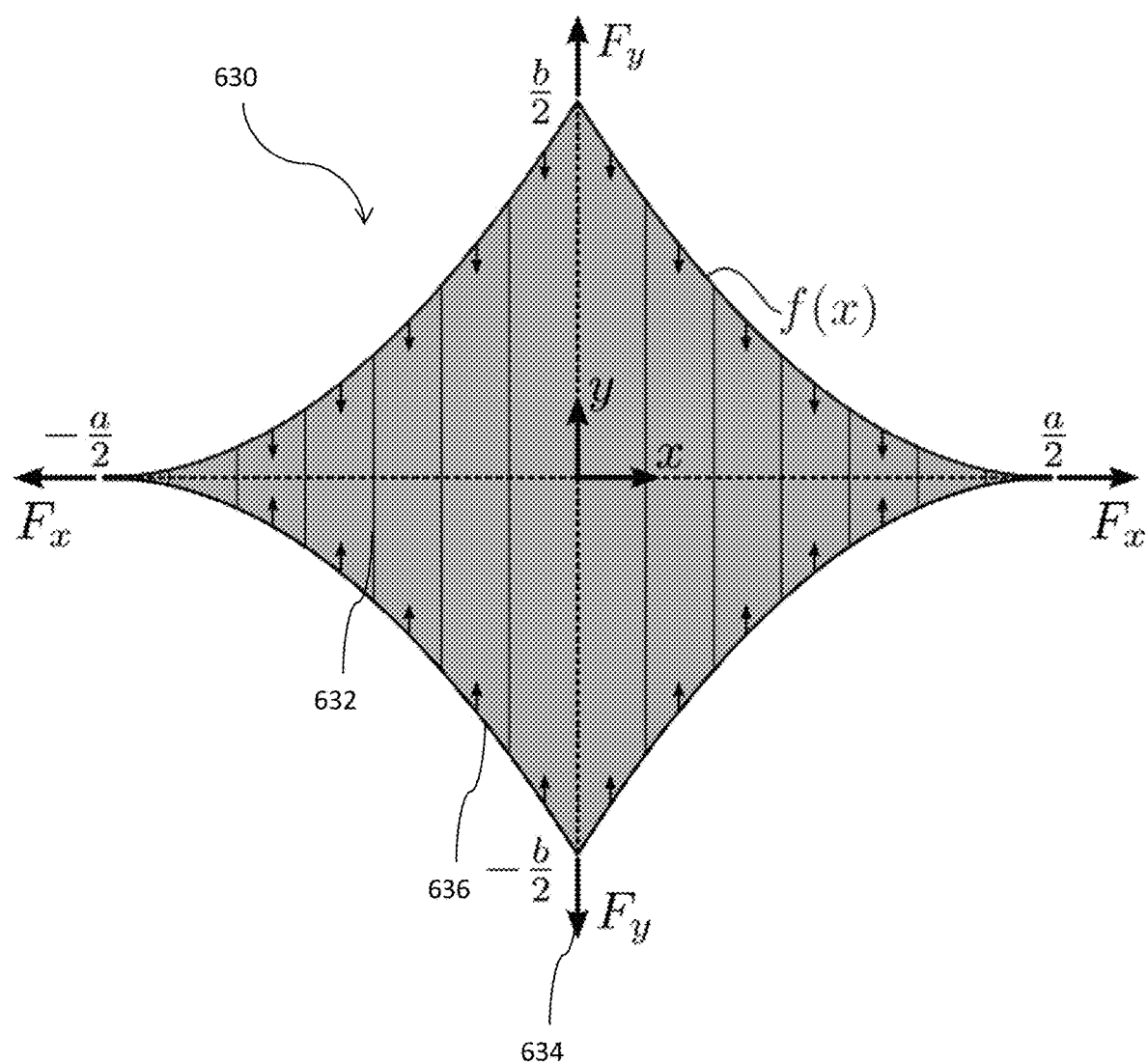
FIG. 41 conceptually illustrates a prestress mechanism for a slip-folded compactible structure, according to embodiments.
Figure 42:
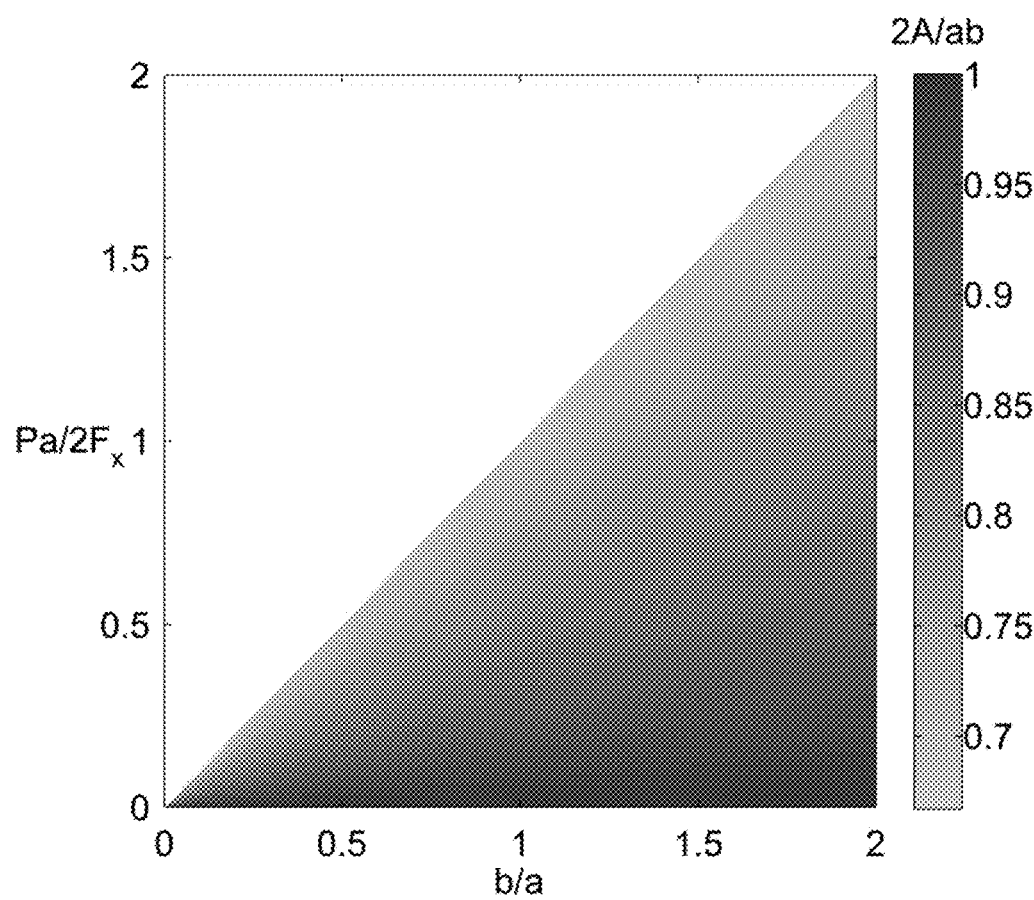
FIG. 42 provides a data graph calculating geometric profiles for a slip-folded compactible structure, according to embodiments.

Although one particular parabolic edge profile is shown in FIG. 41, the possible configuration of edge profiles (f(x):[0, a/2]→R) available can be determined by examining the area A normalized by the rhombus area ab/2 as a function of the aspect ratio b/a and the normalized loading Pa/2$F_x$. As illustrated in FIG. 42, the white area on the graph is inaccessible because f'(a/2)≤0, where:

$$f(x) = \left(\frac{P}{F_x}\right)x^2 - \left(\frac{Pa}{2F_x} + \frac{b}{a}\right)x + \frac{b}{2} \quad \text{(EQ. 14)}$$

The profile of the edges of the compactible structure of the satellite module can be constructed by taking f(x) and mirroring it about the x and y axes. To ensure f(x)≥0 then f'(a/2)≤0, and hence the following expression follows:

$$\frac{Pa}{2F_x} - \frac{b}{a} \leq 0 \quad \text{(EQ. 15)}$$

where Pa/2$F_x$ is the loading parameter and b/a is the aspect ratio. In turn, the prestressed satellite module area A normalized by the rhombus area ab/2 can be determined by these parameters, as can the ratio of the global tensioning forces $F_y/F_x$, according to the following expressions:

$$\frac{2A}{ab} = 1 - \frac{1}{3}\frac{a}{b}\frac{Pa}{2F_x} \quad \text{(EQ. 16)}$$

$$\frac{F_y}{F_x} = \frac{Pa}{2F_x} + \frac{b}{a} \quad \text{(EQ. 17)}$$

These values are plotted in FIG. 42 and provide a graphical description of the dimensionless area as a function of these parameters.

Figure 43:
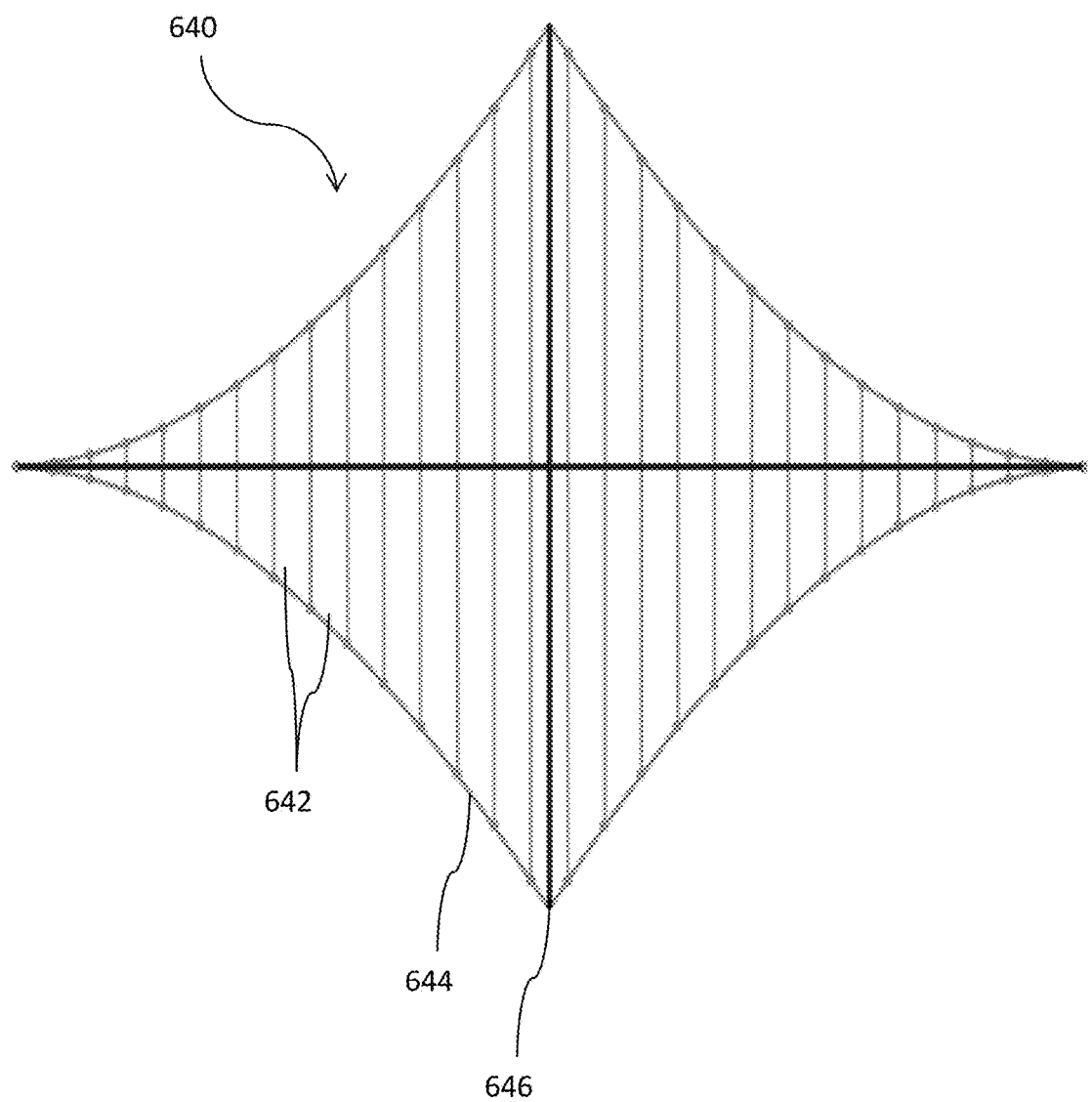
FIG. 43 conceptually illustrates a prestress mechanism for a slip-folded compactible structure, according to embodiments.

Accordingly, in some embodiments the edge profile of the compactible structure of the satellite module is configured in accordance with the loading parameter and aspect ratio such that the prestress force P provides equal tension across the movable elements of the satellite module in the direction parallel to the slip folds of the moveable elements. Some embodiments implement prestress on slip folded compactible satellite modules through one or more stabilizing members (e.g., compression or bend loaded boom arms) and/or tip weighted members that apply a prestress force to the movable members of the satellite modules along the axis of the slip folds that is higher than the prestress force applied orthogonal to the axis of the slip folds. Some embodiments apply a zero prestress force to the axis orthogonal to the slip folds. In many embodiments the prestress force may be distributed across the individual movable elements 642 of the satellite module 640 through an edge cord 644 that is attached between the stabilizing members 646 and at least one end of each of the movable elements of the satellite module, as illustrated in FIG. 43. Some edge cords are provided with a parabolic profile that matched the parabolic edge profile of the movable elements of the satellite module.

Figure 44:
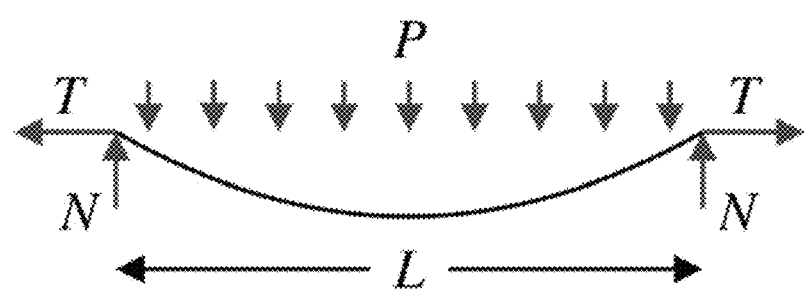
FIG. 44 conceptually illustrates the forces applied to a prestressed compactible structure, according to embodiments.

The amount of the prestress load applied to the movable elements is dependent on the amount of deformation expected and allowable for satellite module operation. The relationship between the load on the movable elements and maximum deformational deflection can be determined according to embodiments. FIG. 44 illustrates the loads on a movable element of length L with a prestress tension T applied thereto. According to embodiments, the maximum deflection for such a movable element may be given by:

$$\Delta y_{max} = \frac{WP}{2T}\left(\frac{L}{2}\right)^2 \quad \text{(EQ. 18)}$$

and the maximum rotation of the movable element may be given by:

$$\left(\frac{dy}{dx}\right)_{max} = \frac{LWP}{2T} \quad \text{(EQ. 19)}$$

According to embodiments, for a 60 m satellite module formed of 30 movable panel elements to keep the maximum deflection below 8 cm would entail implementing a tension of 4.24 N to the movable elements, which could be accomplished by carbon fiber composite booms having a radius of 2.5 cm. It will be understood that using embodiments many other configurations of prestress forces and moveable elements capable of stabilizing the satellite module may be implemented.

Figure 45:
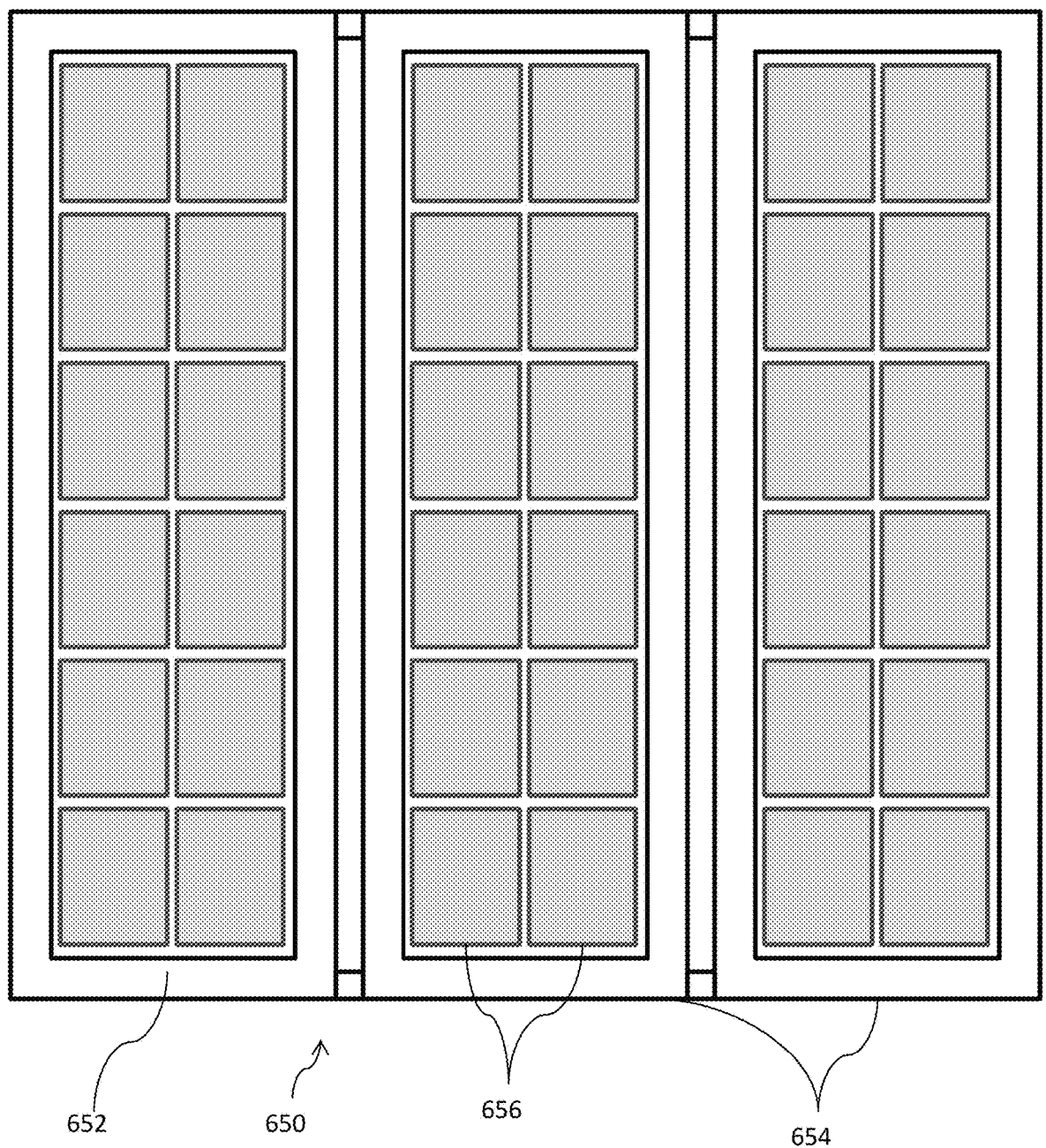
FIG. 45 conceptually illustrates moveable panels having a plurality of power generation tiles incorporating frameworks for isolating prestress from the power generation tiles, according to embodiments.

Some embodiments of prestressed satellite modules 650 implement lightweight structures 652 (e.g. a network of rigid or semi-rigid frames) either at the module or the movable element level 654 onto which the power generation tiles 656 may be attached (e.g. hung) such that the prestress is distributed through the lightweight structure and the individual power generation tiles carry very little or no prestress, as illustrated in FIG. 45. Alternatively, the prestress may be directly distributed through a network of interconnected power generation tiles.

Although specific embodiments of mechanisms and methods for applying prestress forces for various satellite modules have been provided, it should be understood that alternative prestressing mechanics and methods may be applied to the satellite modules such that a stabilizing force is distributed across the movable elements of the satellite module according to alternative embodiments. In addition, the prestressing embodiments described may be applied to other compactible satellite modules having different number, shape or configurations of movable elements.

Compactible Structure Deployment Mechanisms

In many embodiments deployment mechanisms are provided to deploy the compacted satellite modules (e.g., move the compactible elements of the satellite module from a compacted to a deployed configuration). In many embodiments an active or passive mechanism is interconnected with one or more portions of the compactible structures of the satellite module such that when activated the compacted structures of the satellite modules may be expanded into a deployed operational configuration.

Figure 46A:
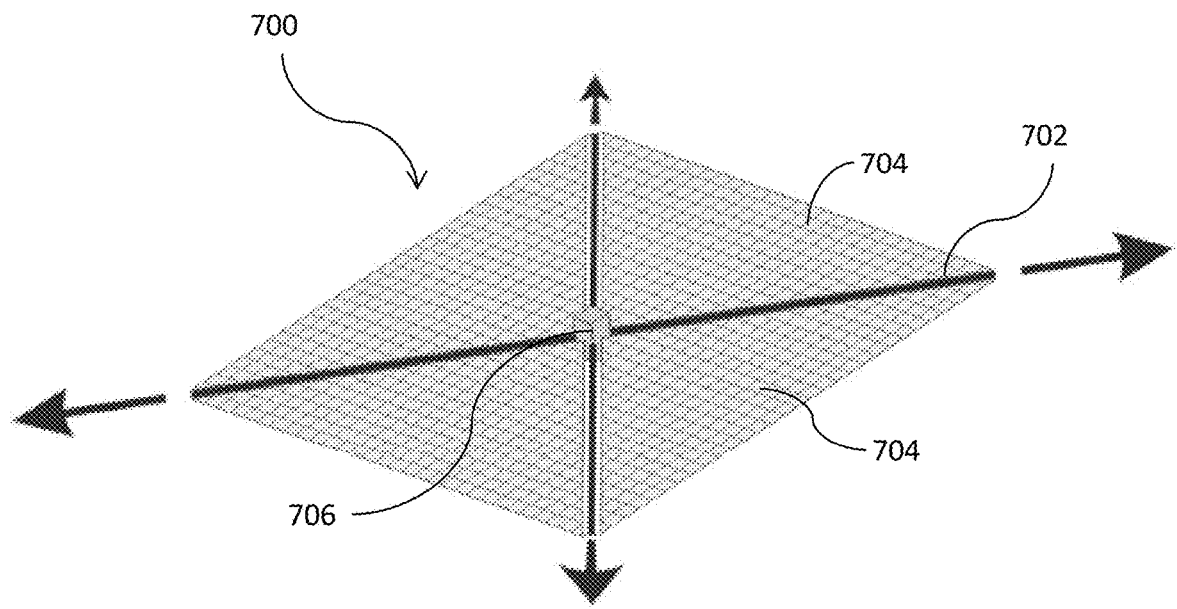
FIG. 46a conceptually illustrates a boom deployment mechanism for a compactable satellite module, according to embodiments.

In some embodiments a mechanically expandable member may be incorporated into the satellite module. An illustration of such a satellite module is provided in FIG. 46a where a satellite module 700 having a plurality of compactible structures 702 are disposed about a central hub 704. The compactible structures 702 are interconnected on at least one edge with a mechanically expandable member 706 such that as the mechanical member is urged outward the compactible structures are also expanded outward from the central hub. The expandable member may be motorized or may use stored energy, such as, compressed or bent expandable members, among others.

Figure 46B:
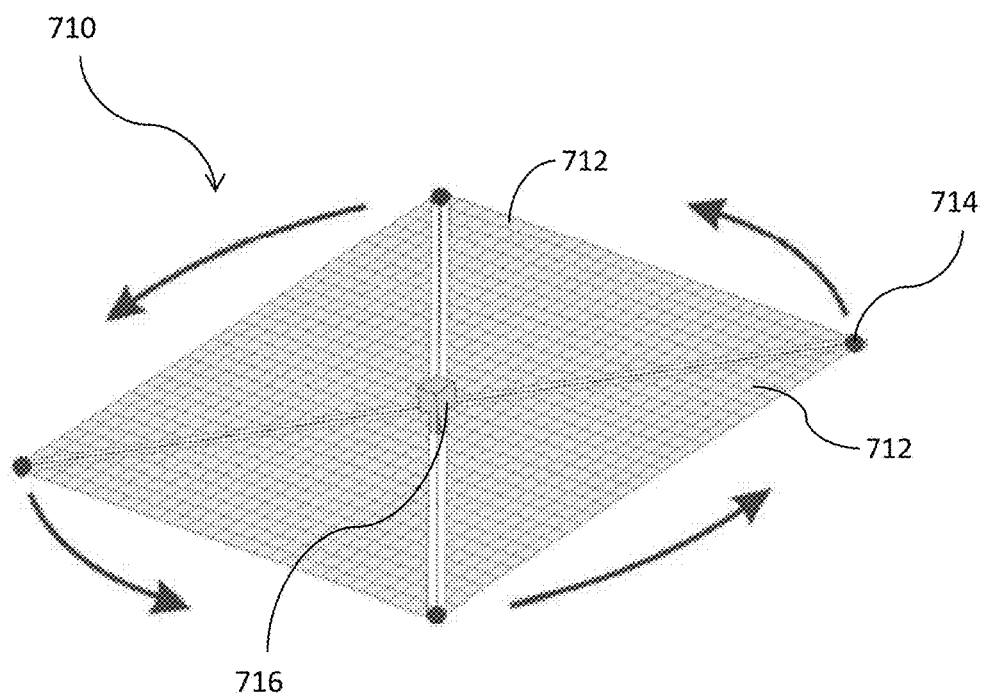
FIG. 46b conceptually illustrates a spin deployment mechanism for a compactable satellite module, according to embodiments.

In many embodiments the compactible structures of the satellite module may be configured such that motion of the satellite module provides the expansive deployable force. An illustration of one such embodiment is provided in FIG. 46b where weighted elements 720 are attached between a central hub 722 and at least a portion of each of the compactible structures 724 of the satellite module 726 such that when the central hub of the satellite module is spun the centrifugal force of the spinning hub causes the weighted elements to move outward thereby expanding the compactible structures. In such embodiments the satellite module may be made to spin continuously to provide a stabilization force to the compactible structures.

Figure 47A:
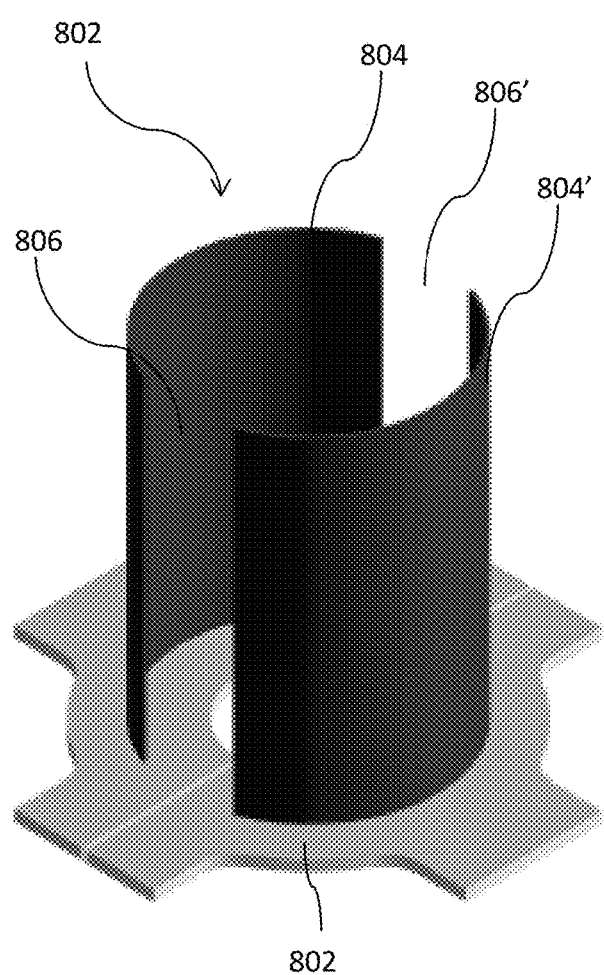
FIGS. 47a and 47b conceptually illustrate a packaging and deployment construct for a slip-folded compactible structure, according to embodiments.

Embodiments are also directed to packaging/deployment constructs for implementing a slip-wrapped satellite module. Some embodiments of such a slip-wrapping packaging/deployment construct in the form of a cage 800 and associated clip 801 is illustrated in FIGS. 47a (isometric view of cage) and 47b (sectional view of clip). In many embodiments, the cage 800 provides an unwrapping management device incorporating a hollow body 802 formed of two halves 804 and 804' and having two slots disposed therein 806 and 806'. Some slots 806 and 806' are formed across the two halves 804 and 804' of the hollow body. During operation the wrapped and folded satellite module would be positioned within the hollow body with the ends B and B' at the slot entrances such that they can be pulled therethrough by application of the forces (e.g., $F_B$ and $F_{B'}$). In many other embodiments the clip is used in conjunction with the cage and provides an unfolding management device. The clip in accordance with embodiments is rotatably mounted within the cage body 802 such that the clip may rotate relative thereto during the unwrapping. The clip incorporates moveable panel holding portions 808 and 808' interconnected via a central axial element 810. The holding portions are configured such that the top 812 and bottom 812' portions of at least some of the moveable panels within the stack of moveable panels are held within the midportion of the clip. Some embodiments of the holding portions provide sufficient holding pressure to the moveable panels such that the moveable panels are controllably deployed during unfolding one section at a time in a sequential manner. During operation, the ends A and A' of the stack of moveable panels of the unwrapped compactible structure are positioned such that during the unfolding the halves 804 and 804' of the cage body 802 are drawn apart as the moveable panels are unfolded when the forces (e.g., $F_A$ and $F_{A'}$) are applied to the ends A and A' thereof.

Figure 47B:
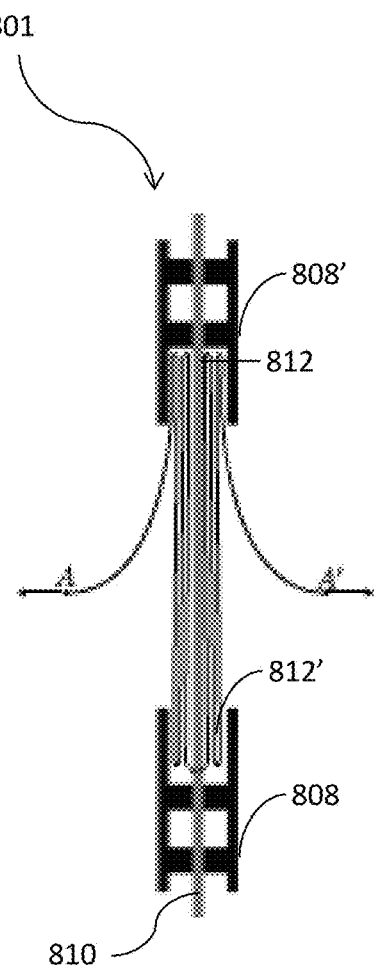
Figure 48:
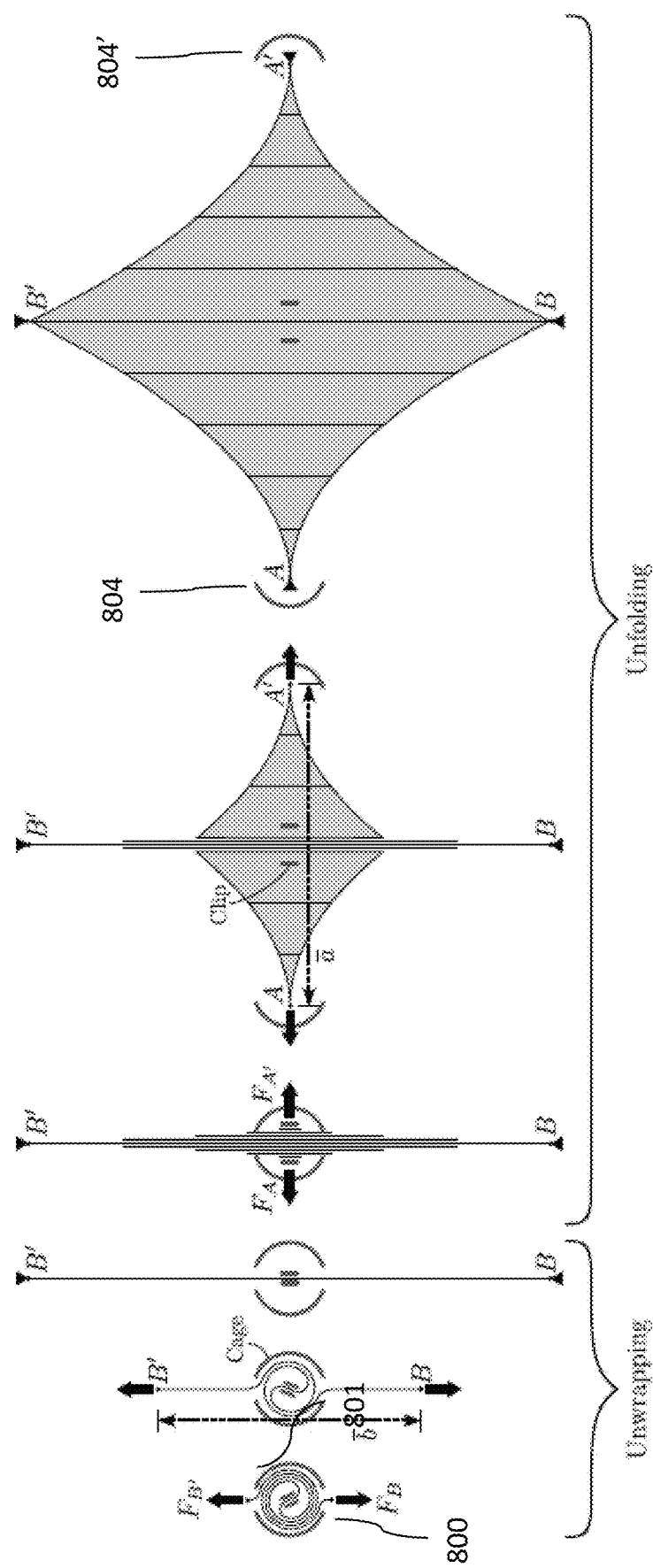
FIG. 48 conceptually illustrates the deployment of a slip-folded compactible structure implementing a packaging and deployment construct, according to embodiments.

Some embodiments for deploying a slip-wrapped compactible structure using the packaging and deployment construct of FIGS. 47a and 47b are illustrated in FIG. 48. As shown in some embodiments the unwrapping stage is implemented by pulling the two ends B and B' in opposite directions out of the cage 800 by applying appropriate forces (e.g., $F_B$ and $F_{B'}$). The application of force to the ends may be done in any order consecutively or simultaneously and the force is applied until such point that the entire lengths of the moveable panels of the compactible structure are unwrapped such that a stack of elongated folded moveable panels of the compactible structure is obtained. During the unwrapping the clip 801 will rotate within the cage 800. Once the unwrapping is complete the stack of moveable panels is unfolded by applying a force (e.g., $F_A$ and $F_{A'}$) at points A and A' of the stack of moveable panels. The application of force to the ends of the unwrapped stack moveable panels may be done in any order consecutively or simultaneously and the force is applied until such point that a fully deployed compactible structure is obtained. As shown during the unfolding the halves 804 and 804' of the cage are drawn away with the ends A and A'. Although the unwrapping/unfolding deployment methodology was described in relation to embodiments of a packaging/deployment construct it will be understood that such a unwrapping/unfolding method may be implemented using other suitable deployment mechanisms and packaging configurations.

Figure 49B:
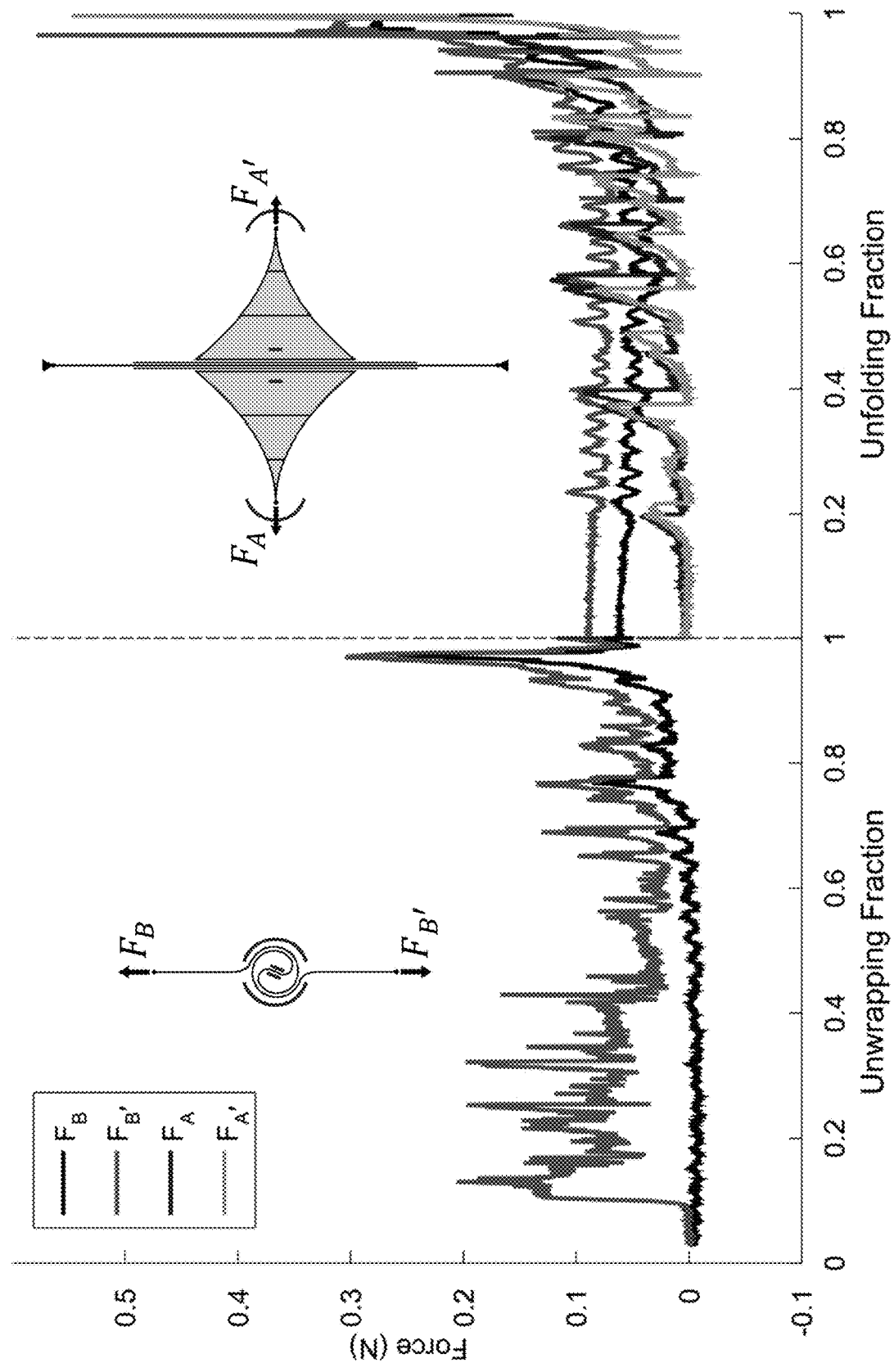

An exemplary embodiment of a compactible structure deployed in accordance with the slip-wrapped mechanisms and methods is presented in FIG. 49*a*. As shown a compactible structure with parabolic edges and ligament slipping folds having a $b/a=Pa/2F_x=1$, and a=1 m, h=25.4 μm, and being made from aluminized polyester film was provided. Since $b/a=Pa/2F_x$, $F_y/F_x=2$. As shown in the images, the deployment of the compactible structure occurred as described in the embodiments above, with a first unwrapping step followed by an unfolding step. During the deployment the forces required to deploy the compactible structure were measured. Results for both the unwrapping and unfolding steps are provided in FIG. 49*b*. Both in-plane and radial forces were measured, however, as the in-plane transverse forces were 20 times smaller than the radial forces they are not graphed. As shown in the graph the radial forces applied never exceeded 0.6 N. The deployment was displacement controlled at a rate of 11.9 mm/s. The peaks in the unfolding graph demonstrate the consecutive (as opposed to simultaneous) deployment of the moveable panels as there is an increase and decrease in the force applied as each panel is separately deployed. The test demonstrates that the deployment construct and methodology in accordance with embodiments operates to unwrap and unfold the compactible structure in a controlled manner.

Regardless of the mechanism chosen, in many embodiments the satellite module may be divided into any number and configuration of separate compactible structures with any number of hubs and deployment mechanisms (e.g., expandable members, weighted elements, etc.). In many embodiments the compactible structures are attached along at least two edges to more than one deployment mechanism such that more even expansion of the compactible structures may be obtained. In many embodiments, for example, multiple weights or expandable members may be attached to each of the compactible structures along multiple points or edges of the compactible structures. Some expandable members or weighted elements may be incorporated into the structure of the compactible structures. Many embodiments of deployment mechanisms may include deployment controls to controllably operate the compactible structures of the satellite modules so that the satellite modules are expanded into a deployed configuration when desired. Some embodiments of such deployment controls may be automated, such that the positioning or motion of the satellite hub automatically engages the deployment mechanism, such as, for example, by spinning the satellite module at a specified rate. Other embodiments may incorporate control circuits such that an external signal or command is required to activate the deployment mechanism. Such deployment controls may operate across an entire satellite module, may be disposed individually in each power generation tile, or a combination thereof.

Figure 50:
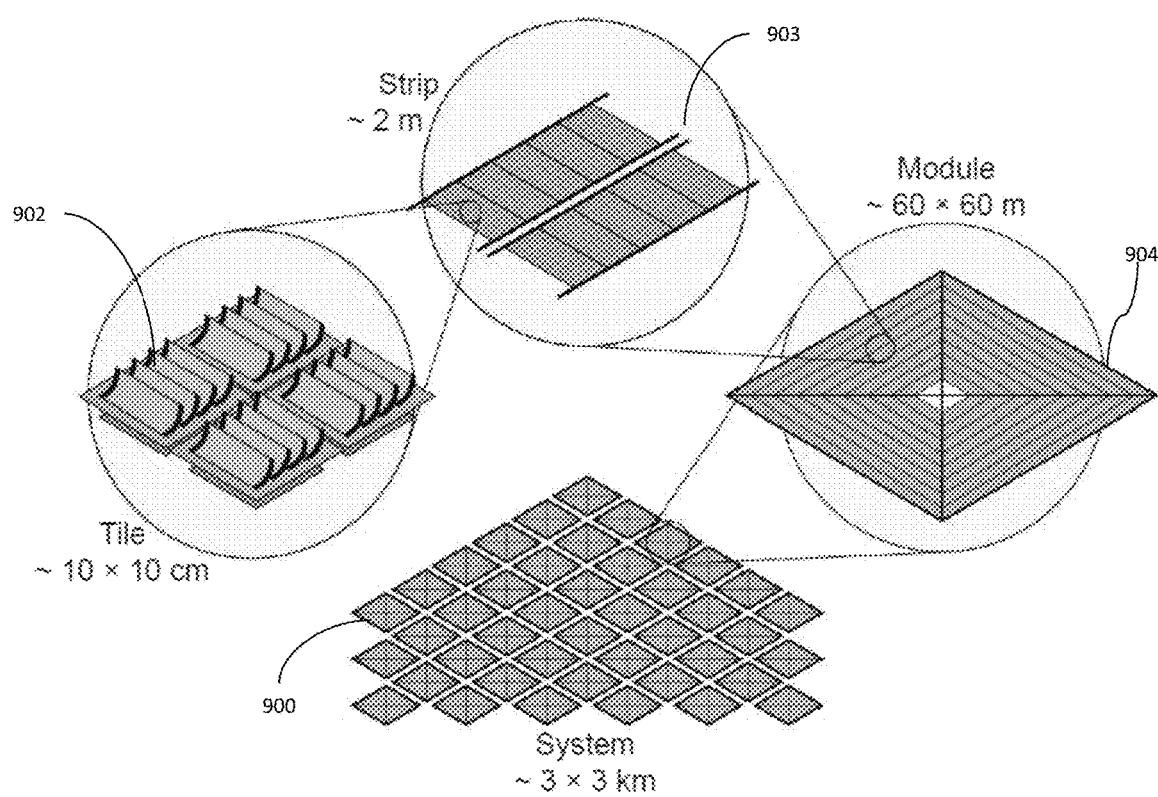
FIG. 50 conceptually illustrates a modular large-scale space-based solar power generation station according to embodiments.

Efficient Structural Architectures and Packing of Modules in Solar Space Stations Although a number of structures and methods have been described that relate specific module and tile designs according to various embodiments, it should be understood that many such designs may be implemented to improve the packing density of modules such that as little space as possible is disposed between such modules when assembled into an overall solar power station. In particular, as shown in FIG. 50, many embodiments are directed to a solar spacecraft (900) composed primarily of a large number of independent multifunctional modular power generating elements or tiles (902). These elements or tiles, are capable of photovoltaic power generation, synthesis of a microwave-frequency signal, and wireless power transmission. It is desired in the formation of many such spacecraft to create a dense arrangement of such tiles and place them into a geosynchronous orbit in a system capable of collecting solar power and transmit it wirelessly to a ground station on Earth.

In many such embodiments, a collection of such tiles are interconnected and held in a planar configuration by one or more light, structural frameworks (903), creating a geometric module (904) having specific dimension and configured to hold a specific number of such tiles (902). The geometry of this spacecraft module in many embodiments is sheet-like, i.e., has large in-plane dimensions (to collect solar power and to provide sufficient aperture for microwave power transmission), but comparatively small out-of-plane dimensions. To be launchable such modules are further compactible thus enabling each module, and each tile of each module, to be compacted (e.g., flattened), and to spring back into an original configuration when deployed. Importantly, such compactibility allows the spacecraft to be treated as a thin membrane, which is amenable to efficient methods of packaging, as described above and below. It should be understood that although dimensions may be provided for the various elements of such a solar spacecraft, these are only provided as an exemplary scale and that other relative dimensions may be used without deviating from the intended scoped of the described embodiments.

Although some embodiments of such compactible tile, module and spacecraft designs have been previously described there are many aspects of the design, construction, and operation of such a space solar power system, including methods of efficiently positioning or packing spacecraft modules together to form an overall solar power generating space station having the most efficient design possible, such design capable of having an overall system power efficiency as high as possible relative to total mass, etc. Considerations to such structural designs include, for example, areal density, packaged volume, deployed stiffness, and deployment precision. In particular, low area density (100 g/m$^2$) and low packaged volume are needed to reduce launch costs. Additionally, the spacecraft modules must be deployed to a precise shape, and maintain this shape within acceptable levels under applied loading. Accordingly, many embodiments are directed to spacecraft module designs that have low areal density, small packaged volume, and sufficient stiffness.

Figure 51:
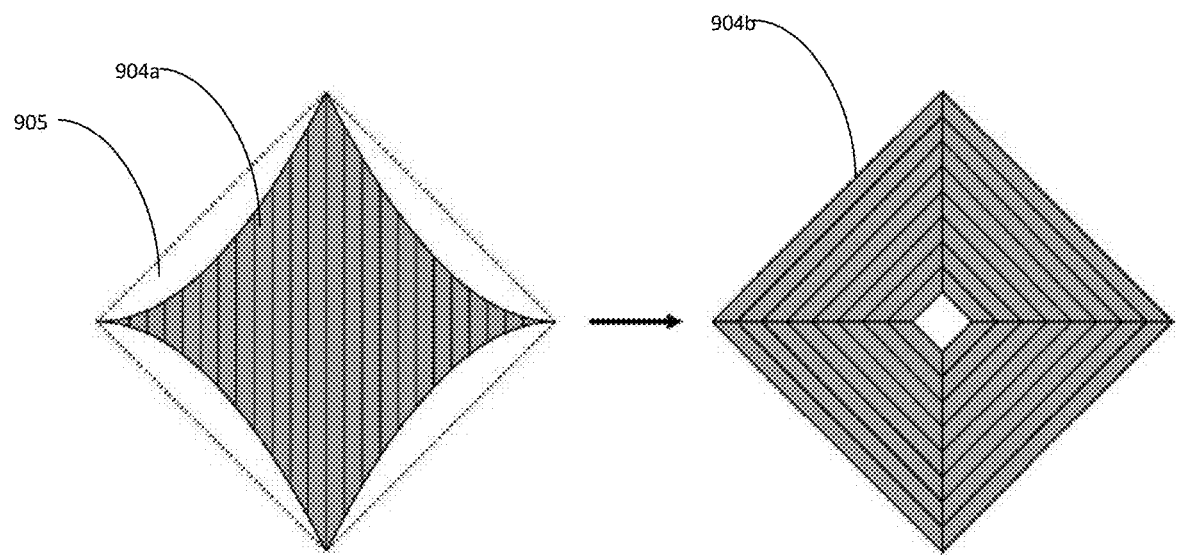
FIG. 51 conceptually illustrates a non-parabolic module of a modular large-scale space-based solar power generation station according to embodiments.
Figure 52A:
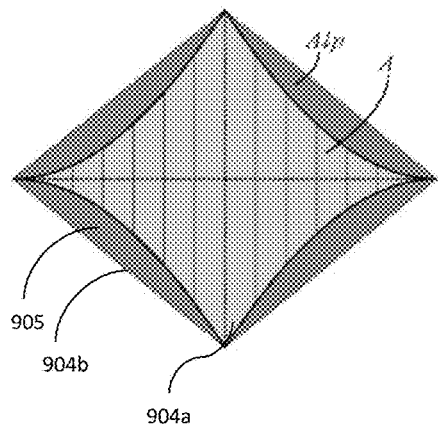
FIG. 52a conceptually illustrates a non-parabolic module of a modular large-scale space-based solar power generation station according to embodiments.
Figure 52B:
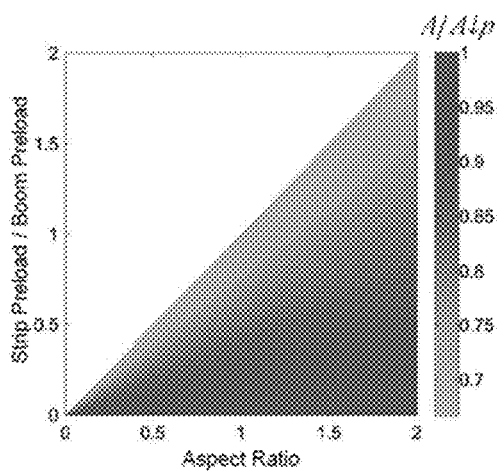
FIG. 52b provides a data graph showing the aspect ratio to boom load dependence for a modular large-scale space-based solar power generation station according to embodiments.

More particularly, although previous embodiments have described modules (904*a*) having parabolic edges (see, e.g., FIG. 50), it will be understood that in spacecraft utilizing such parabolic-edged modules, gaps (905) will naturally exist between the edges of modules when such modules are positioned adjacent each other in a close-packed configuration. Accordingly, in many embodiments efficient packing modules (904*b*) are provided having straight edges (i.e., non-parabolic outer edges) such that the modules, when placed in to alignment (as shown conceptually in FIG. 50 and in more detail in FIG. 51) fill the overall space more efficiently. Although the following discussion will focus on embodiments of such non-parabolic edged modules having a square geometry, it should be understood that any suitable straight-edged geometry may be used in conjunction with such modules, including, for example, triangular, square, hexagonal, etc. Eliminating gaps (905) between modules (904*b*) in the solar power generating station (as graphically demonstrated in FIGS. 52*a* and 52*b*) can decrease lost solar energy capture area and thus increase the overall power generation of the station.

Figure 53:
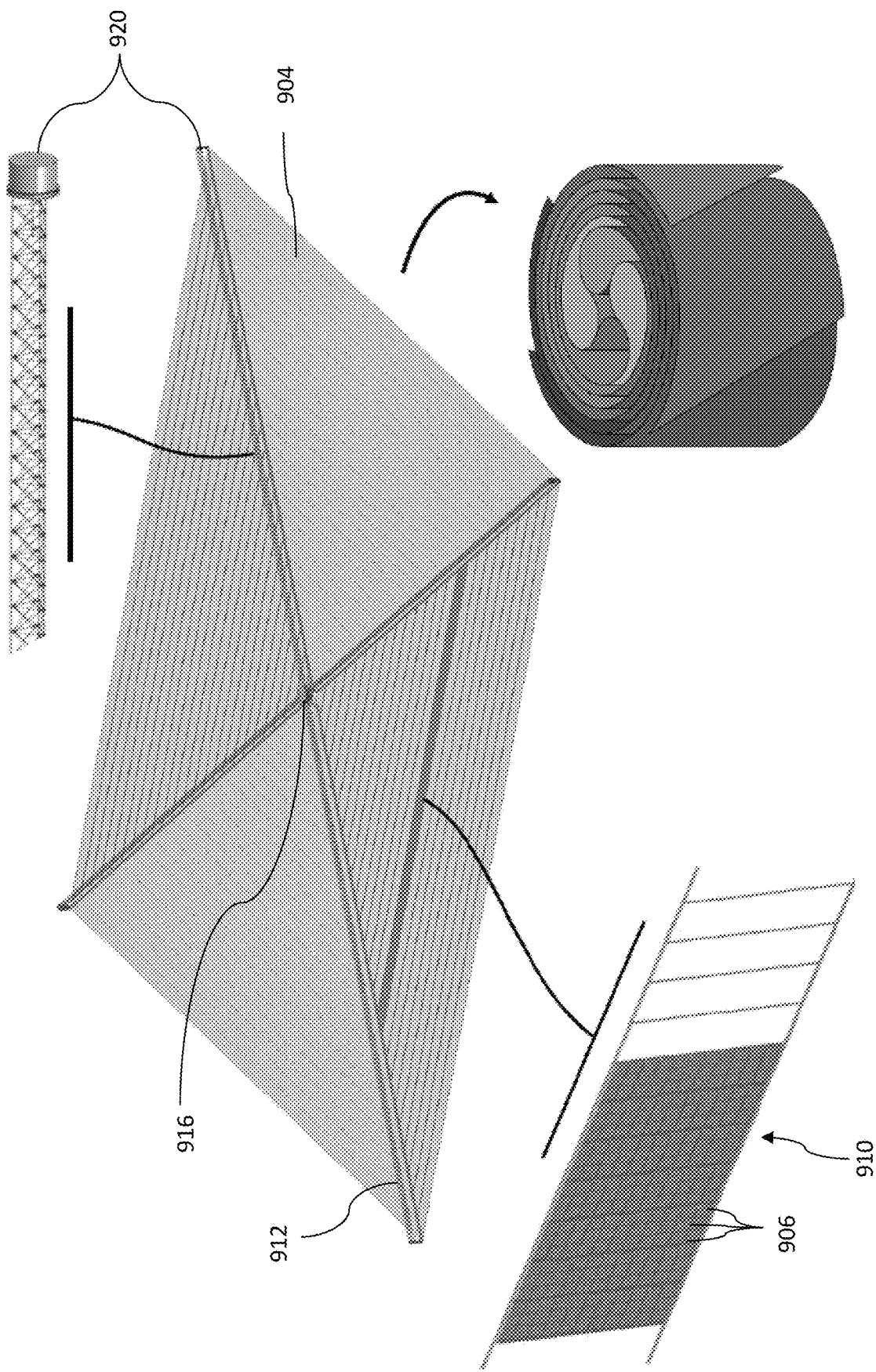
FIG. 53 conceptually illustrates a module and elements of a module of FIG. 50 according to embodiments.
Figure 55:
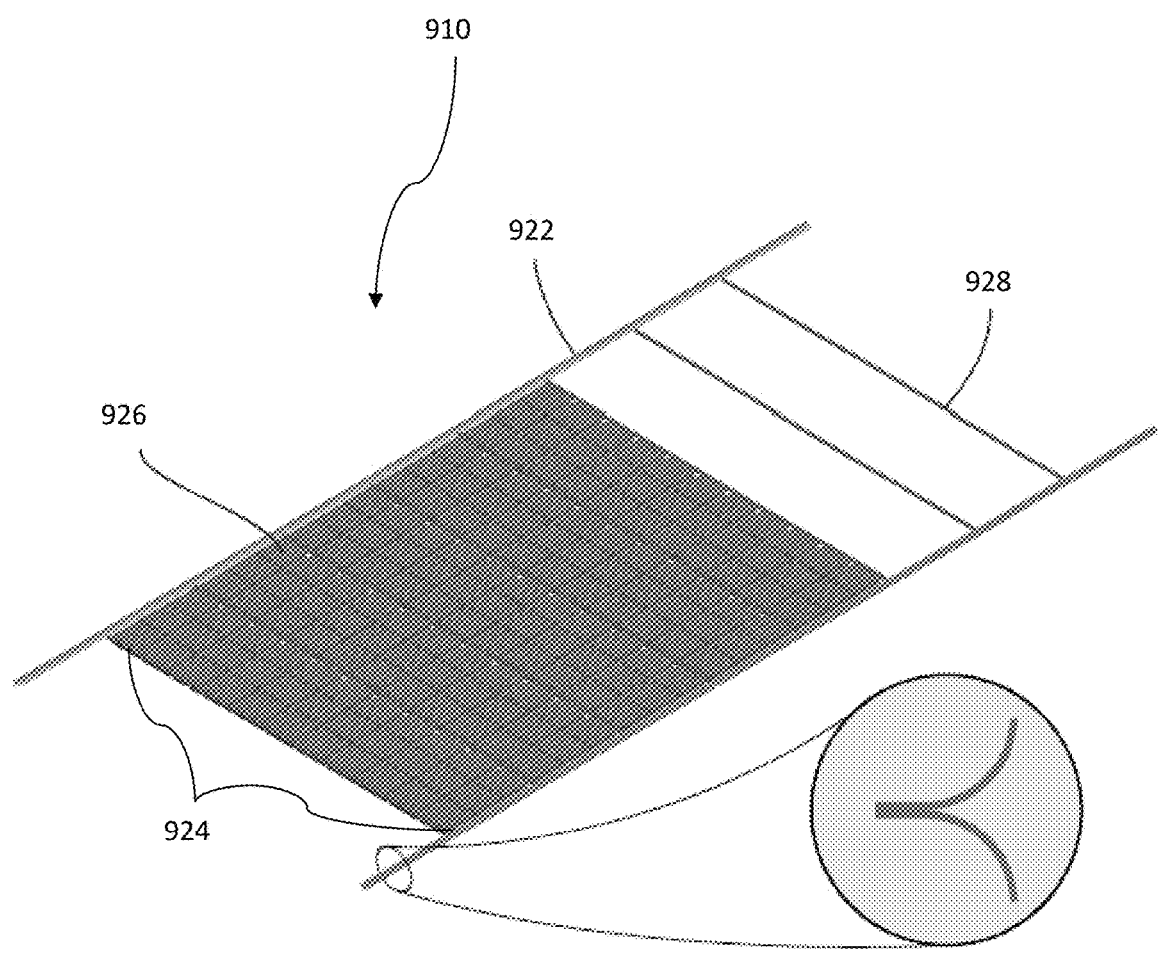
FIG. 55 conceptually illustrates a section of a module of FIG. 50 according to embodiments.

A conceptual diagram of a possible non-parabolic square module (904) in accordance with embodiments is shown in FIG. 53. As shown, in such embodiments the tiles (906) are arranged together in sections or strips (910). In many embodiments the strips (910) have the same width, but may have different lengths. (FIG. 55 provides a conceptual diagram of an embodiment of a segment of such a strip.) The strips in various embodiments may be arranged in a series of concentric geometric configurations, such as, for example, squares, triangle, hexagons, etc. (In the embodiment provided in FIG. 53 the concentric geometric shapes are squares.) A tensioning mechanism (either dynamic or static) is provided to extend the strips and provide tension thereto. In many embodiments as shown in FIG. 53, the strips are connected at either end to diagonal cords (912), wherein at one end the diagonal cords are attached to a central hub (916), and at the other end the diagonal cords are connected to tips of deployable booms (920) (e.g. a Northrop Grumman Astro Mast or an ATK coilable booms). In such embodiments the booms, clamped to the hub at the center, are located along the diagonals of the squares formed by the strips.

Figure 54:
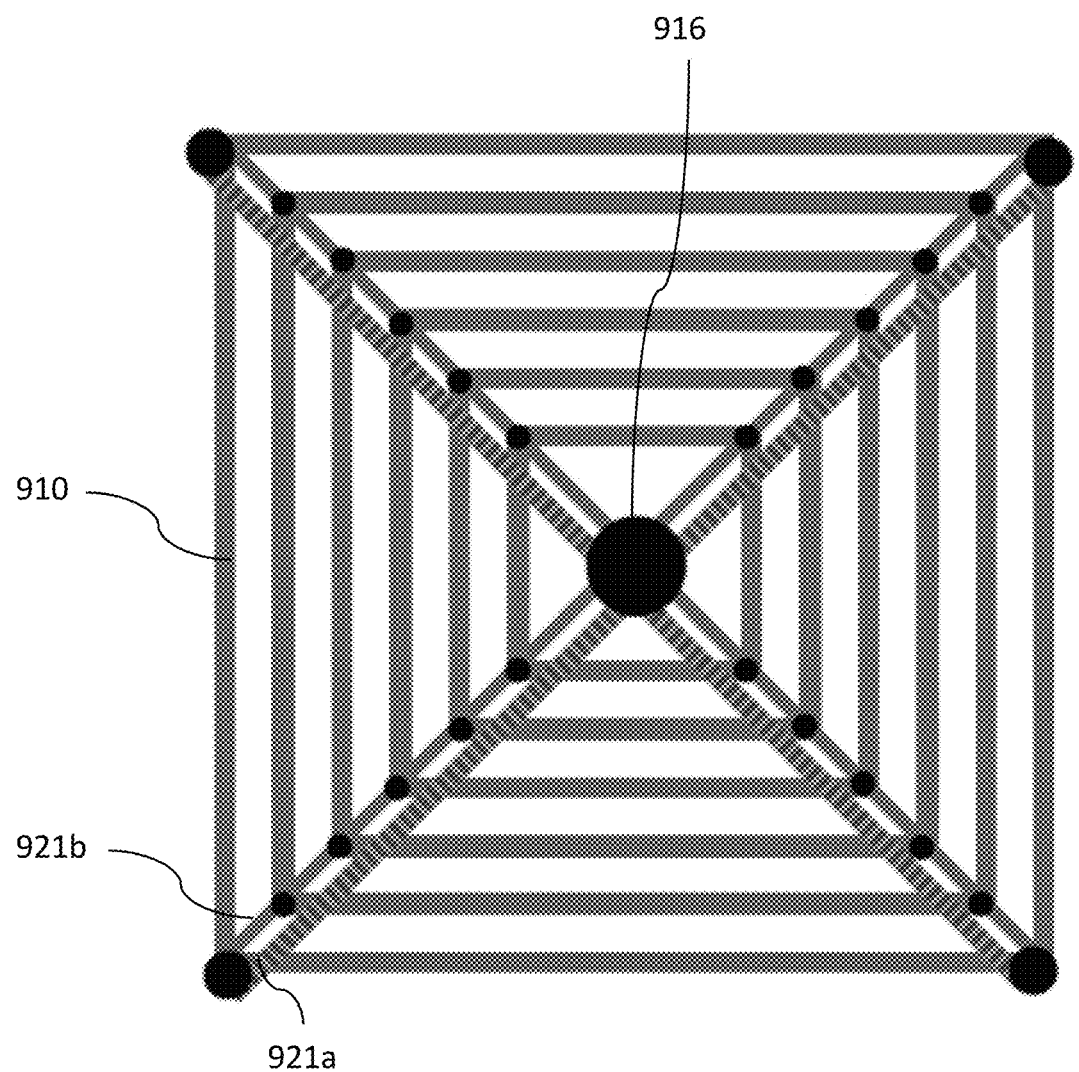
FIG. 54 conceptually illustrates a module of FIG. 50 according to embodiments.

According to various embodiments, different mechanisms may be utilized to limit the deformation of the strips, which can in turn reduce the ability of the various tiles of a module from being accurately aligned either for transmission or collection of energy. As shown schematically in FIG. 54, and described above, in many embodiments the module may be comprised of a plurality of strips (910) attached at their ends to two tensioning elements, which may be extendable booms (921*a*) and/or tensioning cords (921*b*) etc. These tensioning elements in many embodiments run along a diagonal and interconnect at a central hub (916). In such boom and hub constructions, the strips themselves may have no physical stiffness, but are made rigid by tensioning the booms or cords after deployment. For example, in various embodiments the diagonal cords may be tensioned, and the cord tension reacted by the booms. Although a tensioning boom mechanism is described in association with this embodiment, it should be understood that utilizing such booms as tensioning mechanisms is exemplary and other any of the other mechanisms described herein capable of providing the motive action during deployment and providing rigidity to the strips may be utilized with such non-parabolic module designs. For example, the strips (910) themselves might be formed with a stiff material that itself provides inherent rigidity.

Figure 56:
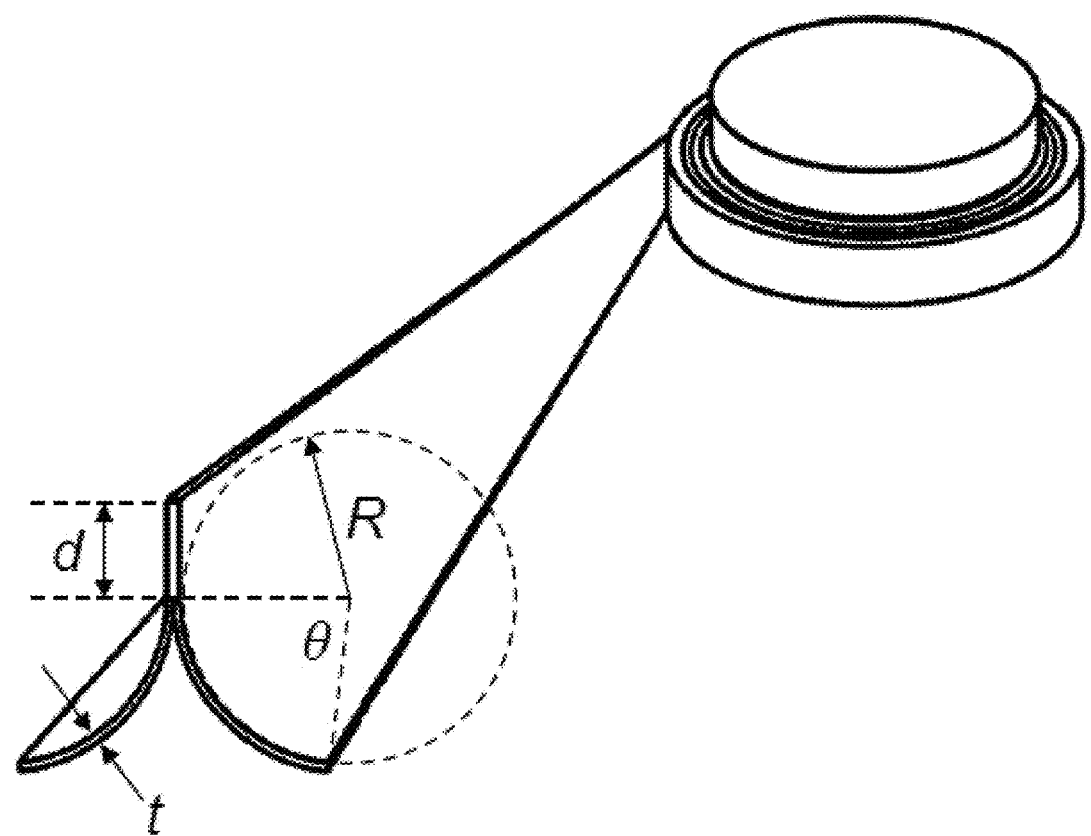
FIG. 56 conceptually illustrates a longeron according to embodiments.
Figure 57A:
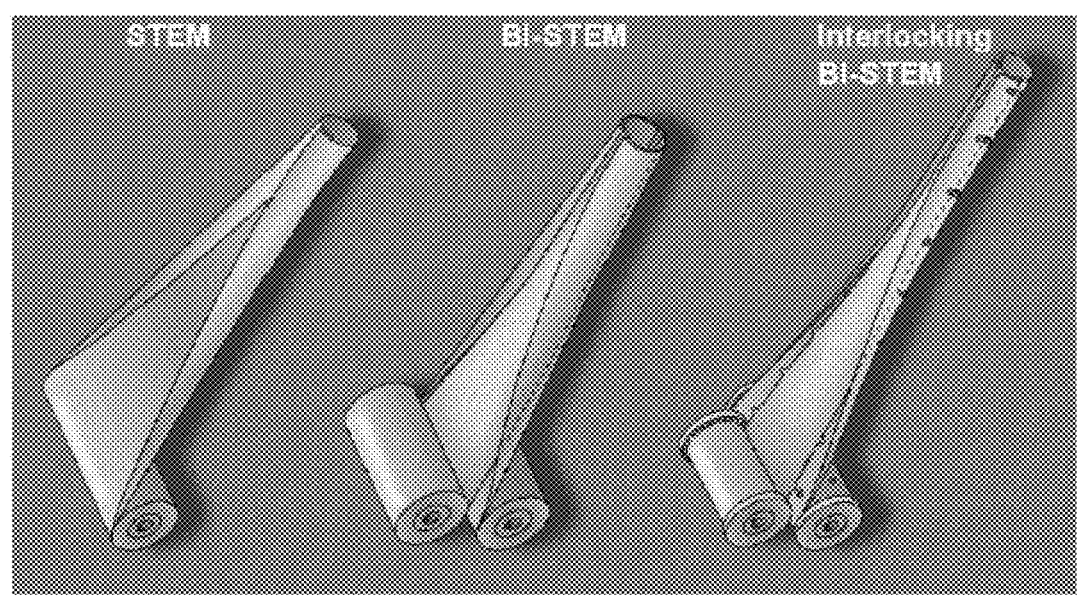
FIG. 57a conceptually illustrates longerons according to embodiments
Figure 57B:
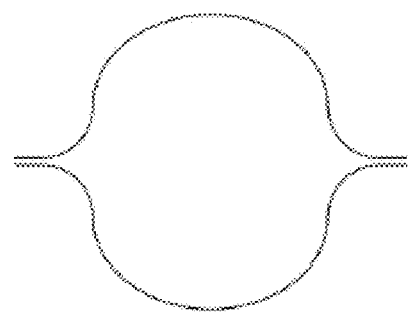
FIG. 57b conceptually illustrates the cross-section of a longeron of FIG. 54a according to embodiments.

Turning now to the construction of the strips (910), as shown in FIG. 55, in many embodiments a plurality of longerons (922) run the length of the strip (910) and support its edges (924). The individual power generating tiles (926) are positioned between these longerons and are connected thereto via a plurality of battens (928) formed of any suitable tensionable fiber or wire material. In such embodiments, the out-of-plane bending stiffness of the strips is at least partially provided by the longerons. To enable the compaction of the spacecraft these longerons must in turn be able to be flattened and rolled. As shown in FIGS. 56, 57*a* and 57*b*, many structural elements may be used as longerons in such embodiments including, for example, STEM booms (FIGS. 57*a* and 57*b*), lenticular booms, and TRAC booms (FIG. 56), among others. These longerons can be made from any suitable material, such as, for example, a metal or composite material, and as shown in FIG. 56, there are a number of geometric parameters that can be considered in designing a longeron, including, for example, spring thickness (t), spring radius (R), bonding section length (d), and spring opening angle (θ). In many embodiments, as shown in FIG. 56, a carbon fiber composite TRAC longeron may be utilized.

Given this structural architecture, it is then possible to calculate the properties of the individual structural elements that would provide an optimal design. In many embodiments a structural model may be created and implemented in a suitable modelling programs such as, for example, MATLAB to optimize the spacecraft structure. One exemplary embodiment utilized the following parameters:

The strips may be modeled as beams;
The diagonal cords may be modeled as lines under tension; and
The booms may be modeled as beam-columns.

In such a model four structural parameters may be used to control the deflected shape of the spacecraft module: the bending stiffness of the boom $EI_{boom}$, the bending stiffness of a strip $EI_{strip}$, the number of strips in each quadrant of the a module k (which controls the width w of each strip), and the diagonal cord tension T.

The loading experienced by the deployed spacecraft module can, in turn, be divided into two classes: dynamic and quasi-static. Expected sources of dynamic loading are attitude control forces and vibrational noise from attitude control actuators (e.g. thrusters, reaction wheels, or control moment gyros). As the attitude control system can be designed to decouple structural dynamics from the spacecraft module attitude dynamics, the attitude control forces will be small. Likewise, if the actuators are sufficiently isolated from the structure, the vibrational noise from these sources may also be made negligible. Expected sources of quasi-static loading are solar radiation pressure, gravity gradient, and D'Alembert forces produced during attitude control maneuvers. Of these, solar radiation pressure is expected to dominate, because the spacecraft module is anticipated for operation in a geosynchronous orbit where gravity gradient forces are minimal, and the attitude control maneuvers are expected to be slow. Therefore, solar radiation pressure loading of may be used as the loading case for embodiments of the structural design. It should be understood that spacecraft module may be configured for various environments and attitude control procedures and that these calculations could be reconsidered in view of those alterations in design without departing from the overall function of the spacecraft module.

Another useful metric in the design of the spacecraft is the specific power, which is the amount of power delivered to a ground station per unit mass of spacecraft module. In particular, the effects of structural deflections on power generation and transmission can be considered and balanced against the mass of the structural components. The most efficient tile arrangement is with all tiles pointed directly at the sun (which maximizes power generation efficiency), arrayed regularly in a single plane (which maximizes power transmission efficiency). Accordingly, any angular deviations from such an arrangement can reduce the performance of the concentrators, and any translational deviations can reduce the performance of the microwave phased array. It will be understood that if the translational deviations are small enough and slow enough, they can be measured and corrected for by introducing appropriate phase delays at each tile location. However, for a system to perform these measurements and corrections other signal processing would need to be implemented that would add to the complexity of the sytem. Thus, in many embodiment structural designs are provided to minimize the effect of angular and translational deviations from the nominal planar configuration of the tiles. In many such embodiments the performance metric that may be used to evaluate the structural design is the specific concentrated power, i.e., the total power concentrated on the photovoltaic cells divided by the total mass of the spacecraft module. The total concentrated power depends on the incoming solar power flux (which can be taken to be constant at 1370 $Wm^{-1}$) and the average tile concentrating efficiency.

Figure 58:
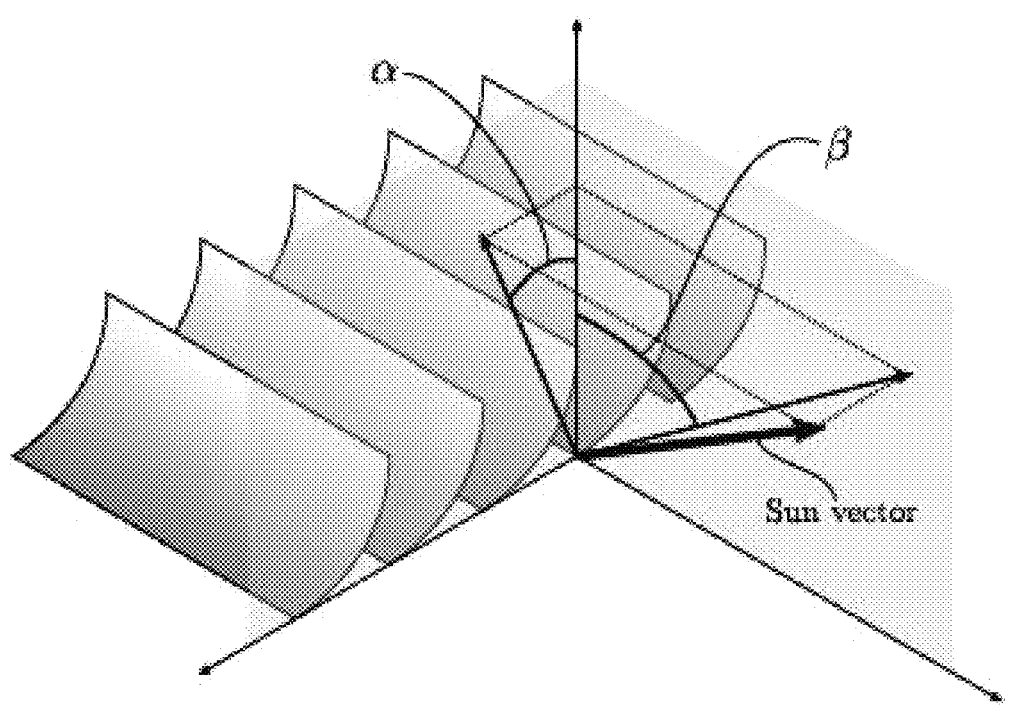
FIG. 58 conceptually illustrates the sun vector on a power generating tile according to embodiments.
Figure 59A:
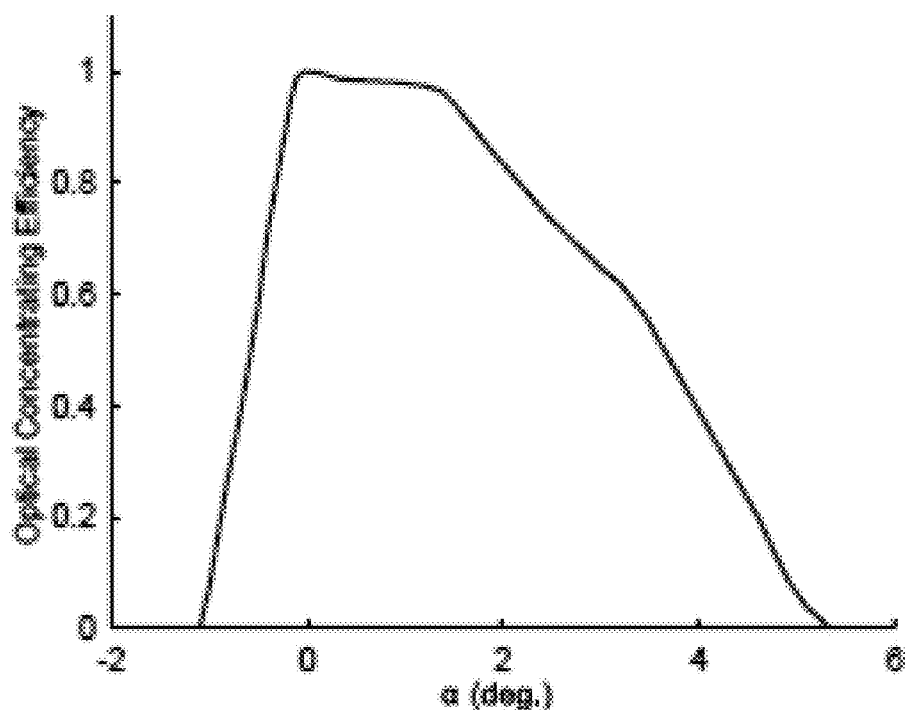
FIGS. 59a and 59b provide data graphs showing the efficiency variation with incident sun angles $\alpha$ and $\beta$ shown in FIG. 55 according to embodiments.
Figure 59B:
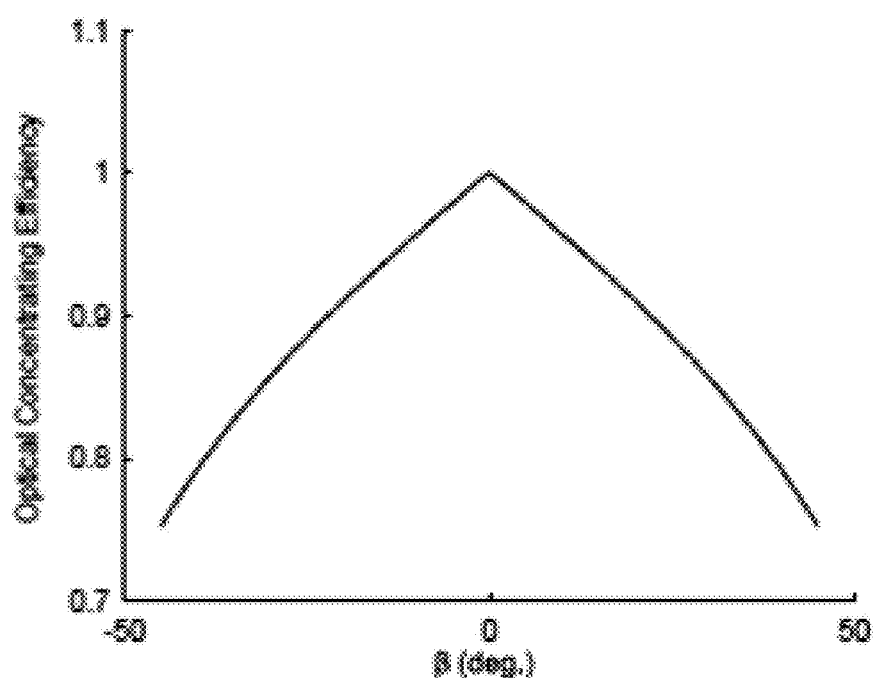

The performance of the concentrators in the tiles depends on the local sun angle. As shown in FIG. 58, the local sun vector can be decomposed into a component within the plane of concentration ($\alpha$), and a component perpendicular to this plane ($\beta$). The optical efficiency of the concentrators depends on the $\alpha$ and $\beta$ angles these components make with the local tile normal. As seen in FIGS. 59a and 59b, the sensitivity of the concentrating efficiency to $\alpha$ is much greater than the sensitivity to $\beta$.

In many embodiments the concentrators across the entire spacecraft may be arranged in parallel. In such embodiments the spacecraft can slew in a manner that changes the $\beta$ angle without greatly affecting the concentrating efficiency. If (as an alternative) the tiles are arranged in a 4-fold symmetric manner, the spacecraft would have to remain very closely sun-pointed (e.g., being able to deviate less 1° in either axis) to generate any power from more than half the tiles. However, in embodiments where the concentrators are all parallel, the spacecraft can slew ±20 in the $\beta$ direction allowing for greater operational freedom.

Figure 60:
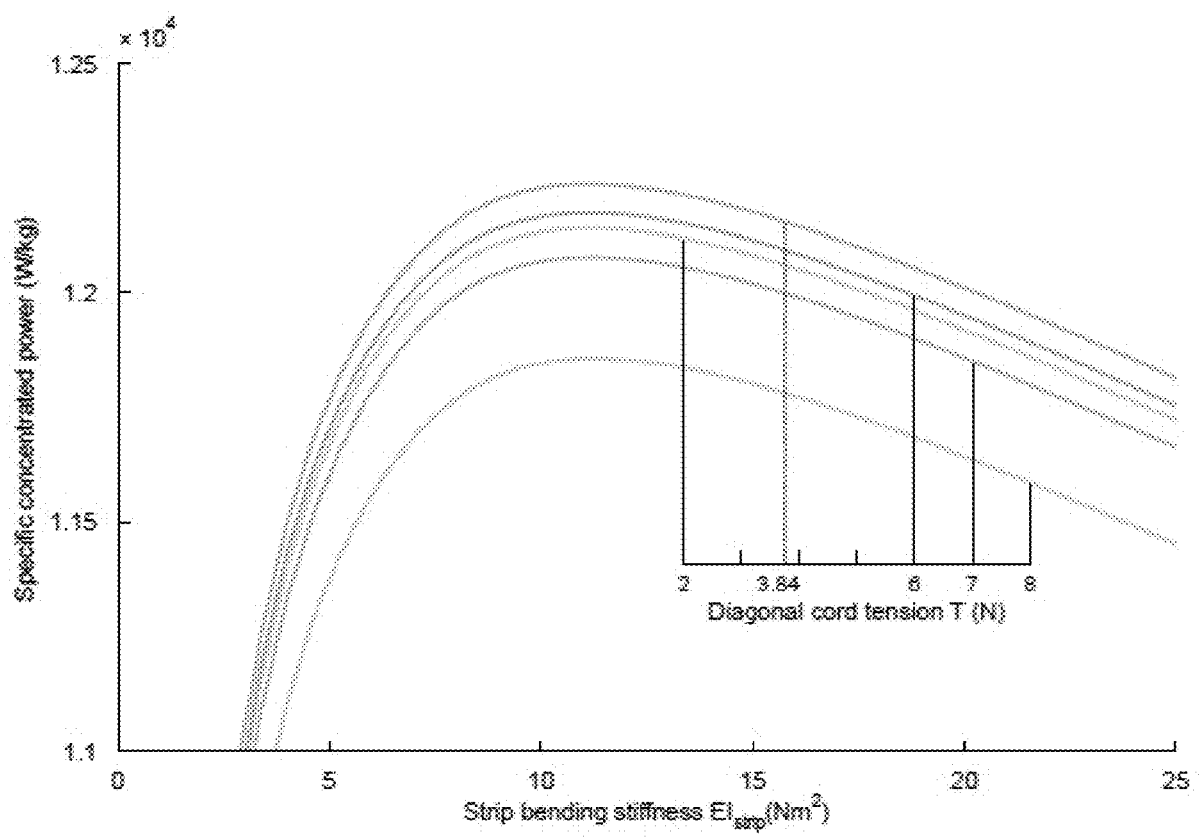
FIG. 60 provides data graphs of specific concentrated power as a function of diagonal cord tension and strip bending stiffness according to embodiments.
Figure 61:
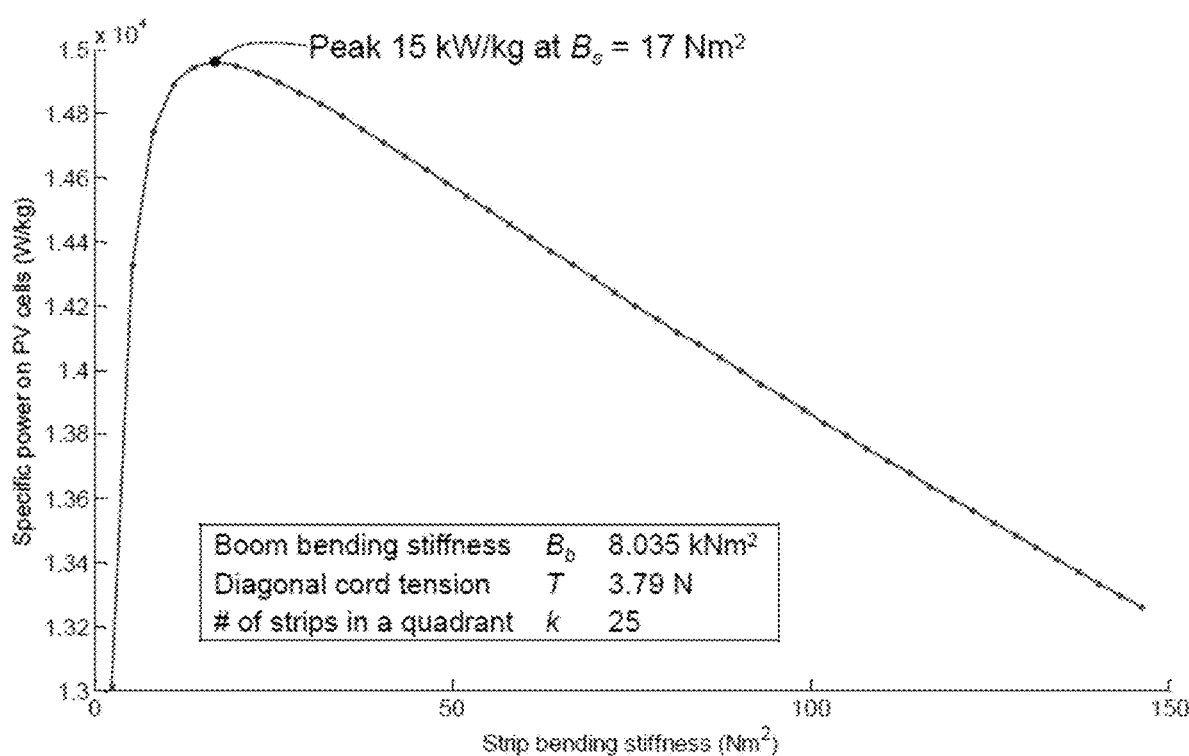
FIG. 61 provides data graphs of specific concentrated power as a function of strip bending stiffness according to embodiments.
Figure 62:
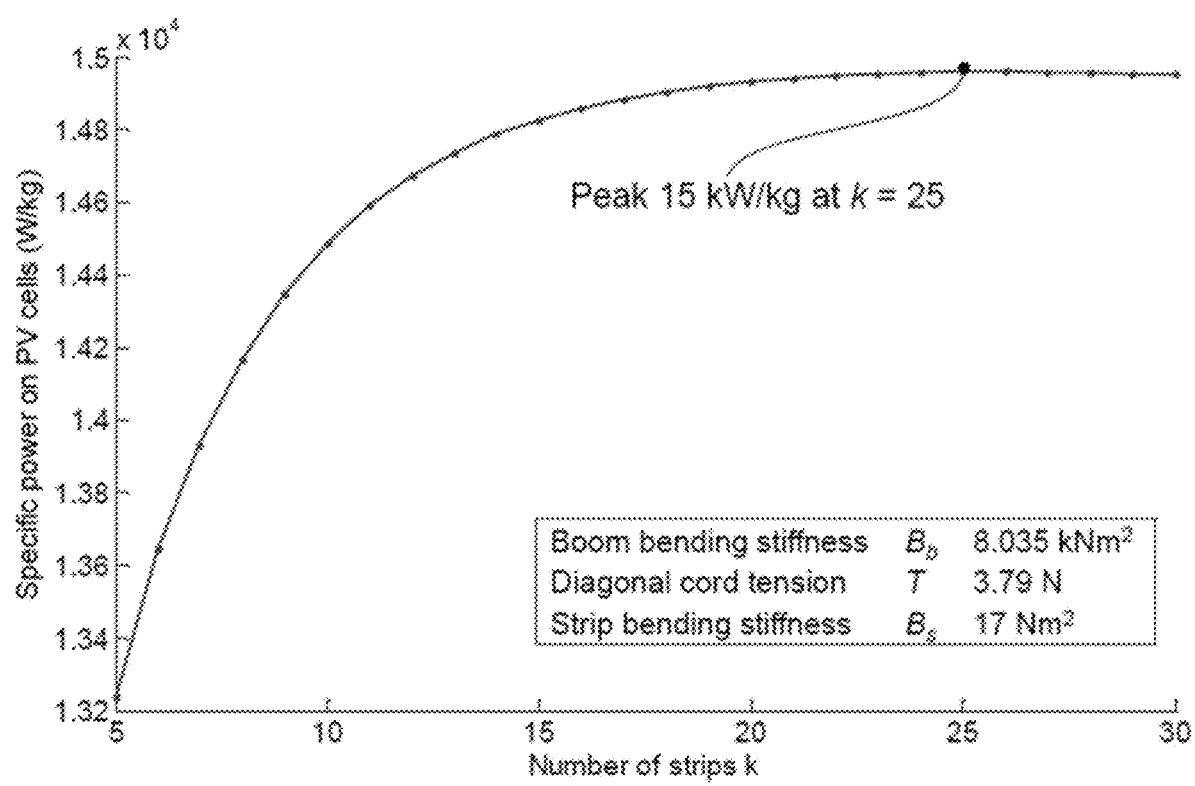
FIG. 62 provides data graphs of specific concentrated power as a function of number of strips according to embodiments.
Figure 63:
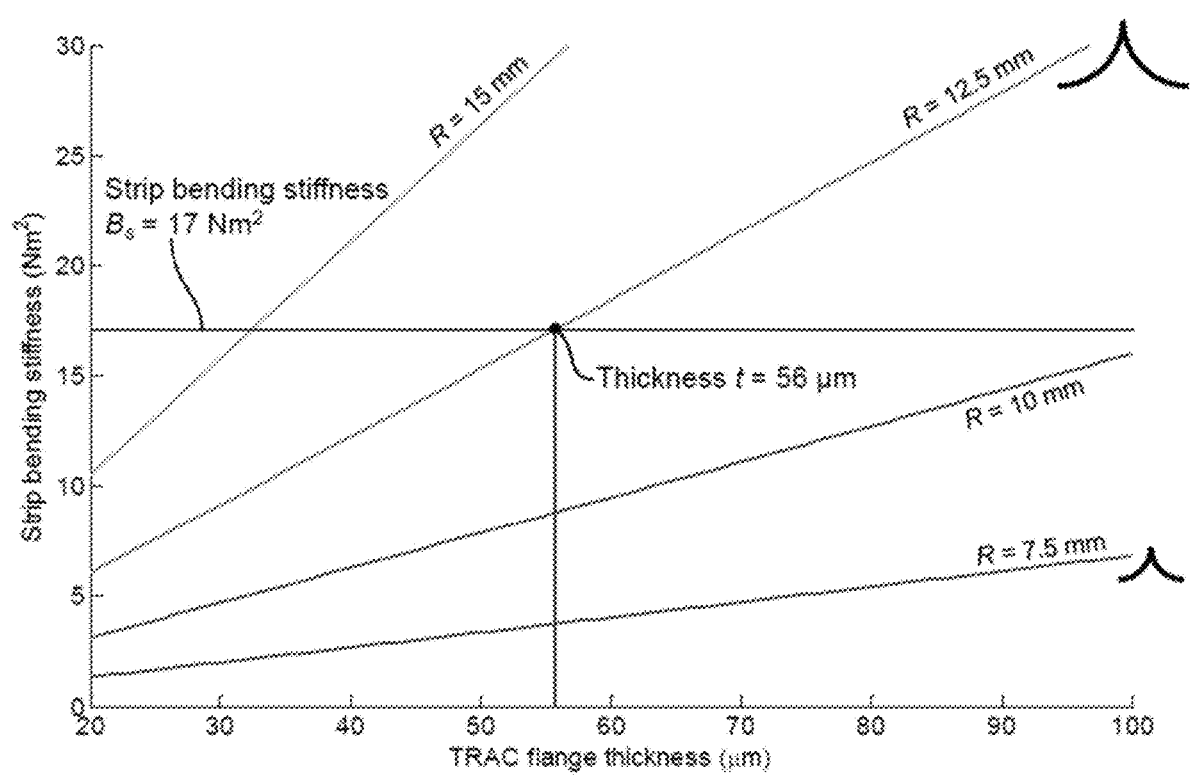
FIG. 63 provides data graphs of strip bending stiffness as a function of longeron design according to embodiments.

FIG. 60 shows how the specific concentrated power changes with the strip bending stiffness and the diagonal cord tension for a value of k=20. As shown, increased diagonal cord tension initially stiffens the spacecraft; after a certain point, however, increased compression in the boom reduces its effective bending stiffness, resulting in greater deflections. Increasing the strip bending stiffness also results in initial increases in specific concentrated power (as shown in FIG. 61), but after a certain point, the mass growth due to larger longeron cross-sections outpaces the growth in collected power from lower deflections. Accordingly, in many embodiments the module is designed having a diagonal cord tension T of from 2 to 7 N (in many embodiments from 2 to 6 N, and in still other embodiments around 3 to 4 N), and a strip bending stiffness $El_{strip}$ of from 5 to 20 $Nm^2$ (in many embodiments from 7 to 15 of from 5 to 20 $Nm^2$, and in other embodiments around 9 to 11 of from 5 to 20 $Nm^2$, and in still others around 10.78 $Nm^2$). Using these parameters it is then possible to calculate for specific tension and stiffness numbers peak number os strips and longeron thicknesses to achieve the desired parameters. For example, in various embodiments (as shown in FIG. 62) the number of strips is from 10 to 30, in other embodiments from 15 to 30 and in other embodiments from 20 to 27. Likewise, in various embodiments the longeron thickness may depend on the height of the longeron. As shown in FIG. 63, in many embodiments the longeron has an R value of greater than 10 mm and less than 20 mm, and in many embodiments from 12 mm to 15 mm, and a thickness of from 20 to 60 µm, and in various embodiments from 30 to 60 µm, and in other embodiments around 56 µm.

Regardless of the specific design of the supporting structure, as previously described the spacecraft packaging for a non-parabolic module in accordance with embodiments relies on slipping folds that connect the strips of the module to each other. As previously discussed (FIGS. 16 and 17) a slipping fold allows for both rotation about and translation (or slip) along the axis of the fold. Slipping folds allow for the strips of the modules to be folded and wrapped tightly and efficiently, while accommodating the finite thickness of each strip. Crucially, the strips experience no extension during folding and the maximum bending stresses in the wrapped state can be predicted and controlled. To implement this slip folding (as discussed in relation to FIG. 17) each strip is connected to its neighboring strips using ligaments, which allow for the transmission of tension between strips.

Figure 64:
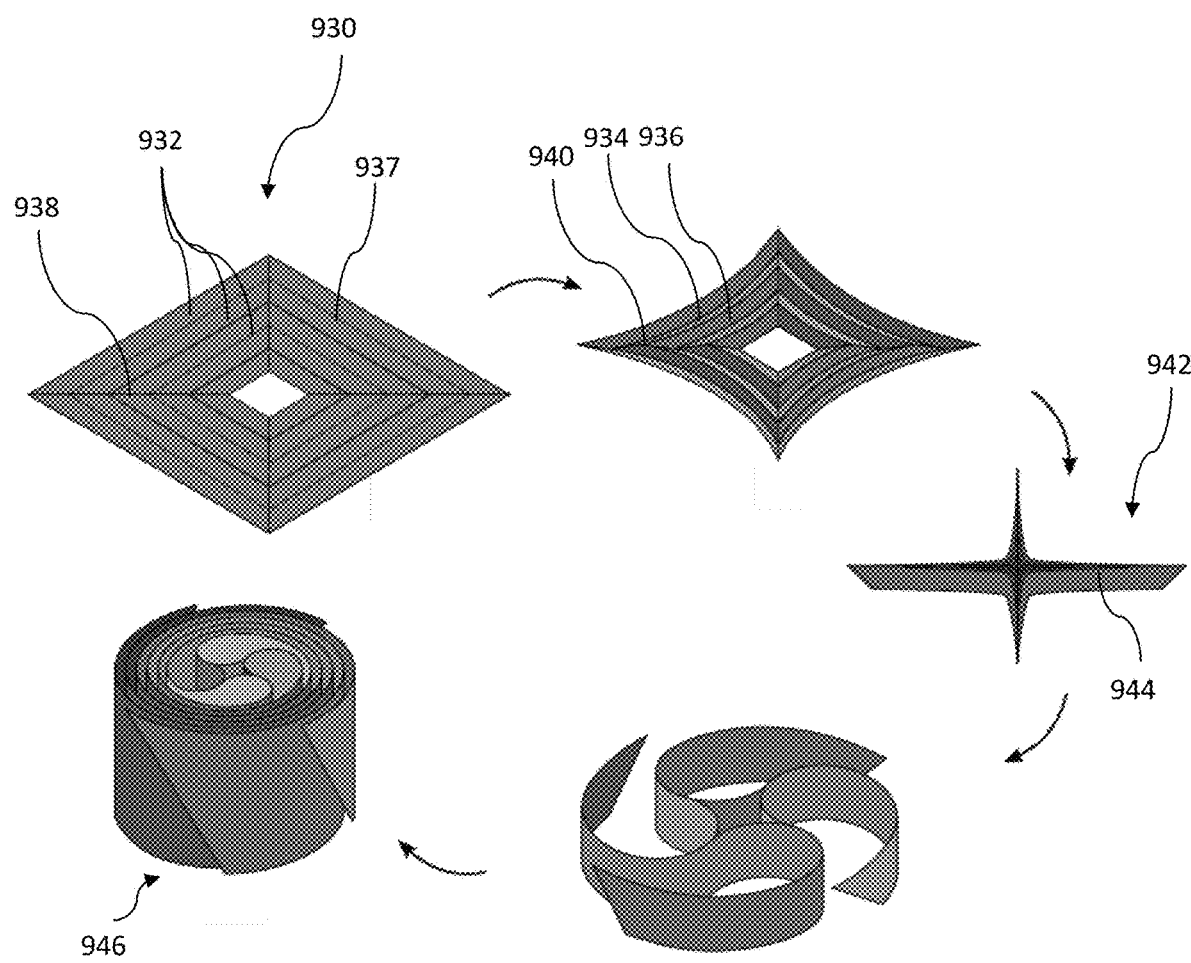
FIG. 64 conceptually illustrates a packaging scheme according to embodiments.

As shown in FIG. 64, in many embodiments the overall large-scale space-based solar generating spacecraft may comprise an array formed from a plurality of geometrically regular spacecraft modules (i.e., with non-parabolic outer edges). These spacecraft modules (930), as shown in the figure, are themselves formed of a plurality of concentric equally spaced squares (932) that are formed together by alternating between mountain (934) and valley (936) folds. In various embodiments the outermost fold (937) is a mountain fold and then the folds are alternated for each seam between the adjacent squares inward. In such embodiments, additional folds run along the diagonals (938) of the squares, creating degree-4 vertices (940) (i.e., points at which four folds meet) at every corner of every square (except the inner most and outer most squares). Note that although the embodiment discussed is for a square polygon, this folding scheme can be generalized for any regular polygon. In such an embodiment, as shown in FIG. 64, folding along these lines produces a star-like shape (942) with four arms (944). These arms can then be wrapped (as shown in FIGS. 61d to 61e) to form a compact packaged cylindrical form (946).

Figure 65:
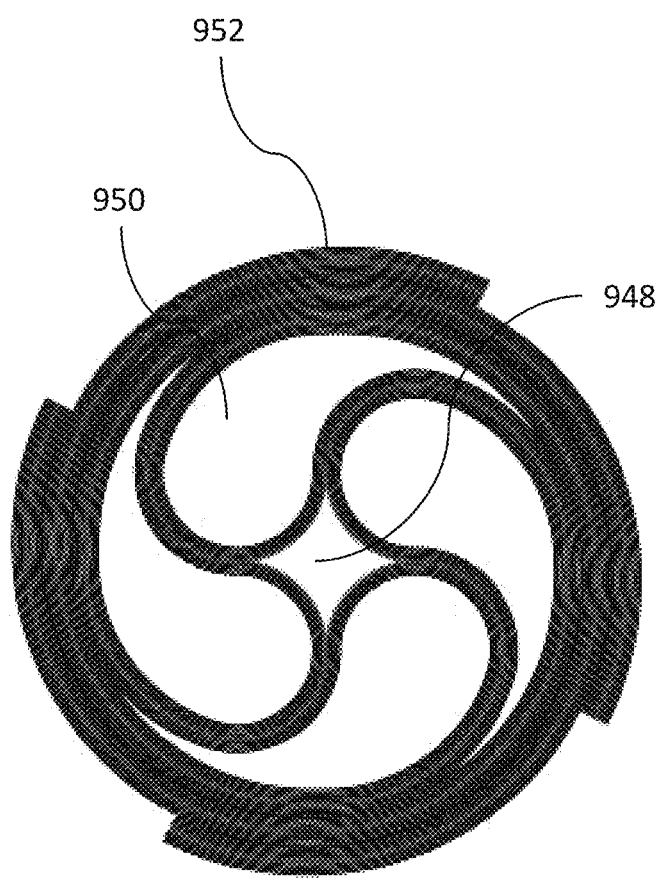
FIG. 65 conceptually illustrates a cross section of a compacted module according to embodiments.
Figure 66A:
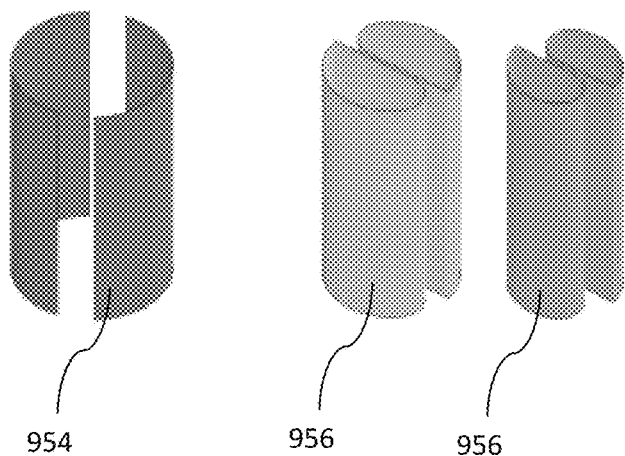
FIG. 66a conceptually illustrates outer cages and inner plugs according to embodiments.
Figure 66B:
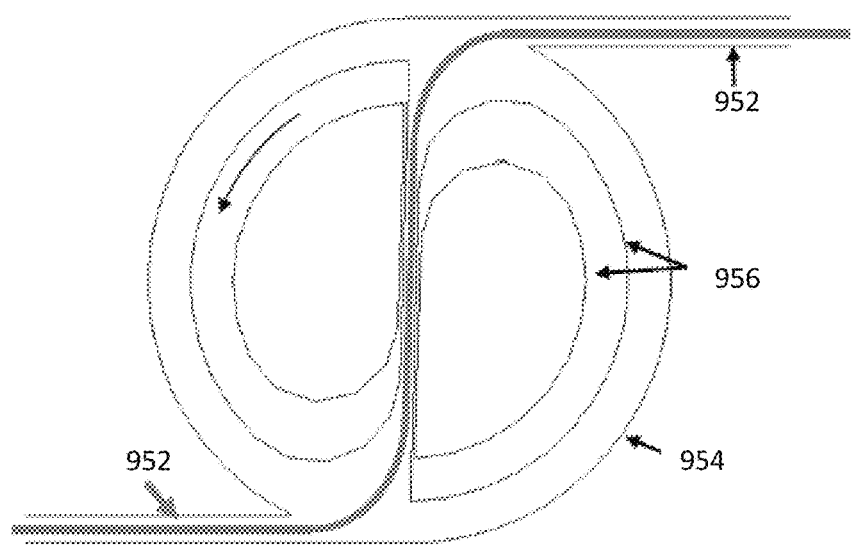
FIG. 66b conceptually illustrates a cross section of a compacted module incorporating outer cages and inner plugs according to embodiments.

As shown in FIG. 65, and discussed previously in relation to FIG. 22a, in many embodiments there are voids in the packaged form; one in the center (948), and one associated with each wrapped arm (950), and the size of these voids will be related to the thickness and maximum bend radius of the strips forming the module (952). Although one packaging scheme in which all the arms of the module are wrapped about each other is shown, it should be understood that other wrapping schemes may be utilized in accordance with embodiments, including wrapping techniques where each arm is wrapped individually or two adjacent arms are wrapped together. As shown in FIGS. 66a and 66b, to help preserve the configuration and relative placement of the various wrapped arms and ensure maximum efficiency in the wrapping, an outer cage (954) may be provided around the outside of the wrapped pack to define the outer contour of the wrapped module (952) and one or more inner plugs (956) may be provided to define and fill the voids (950) associated with each wrapped arm and to insure that a minimum radius of curvature is not exceed that might lead to damage to the compacted module.

Figure 67:
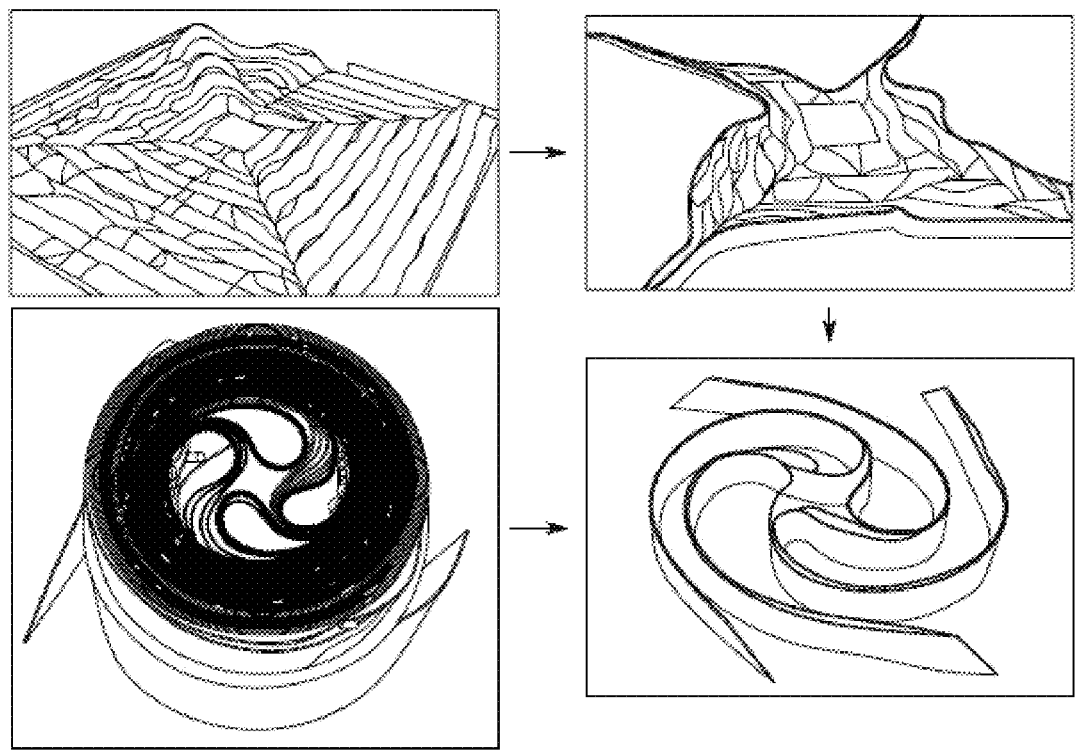
FIGS. 67 and 68 provide images of the packaging of an exemplary module according to embodiments.
Figure 68:
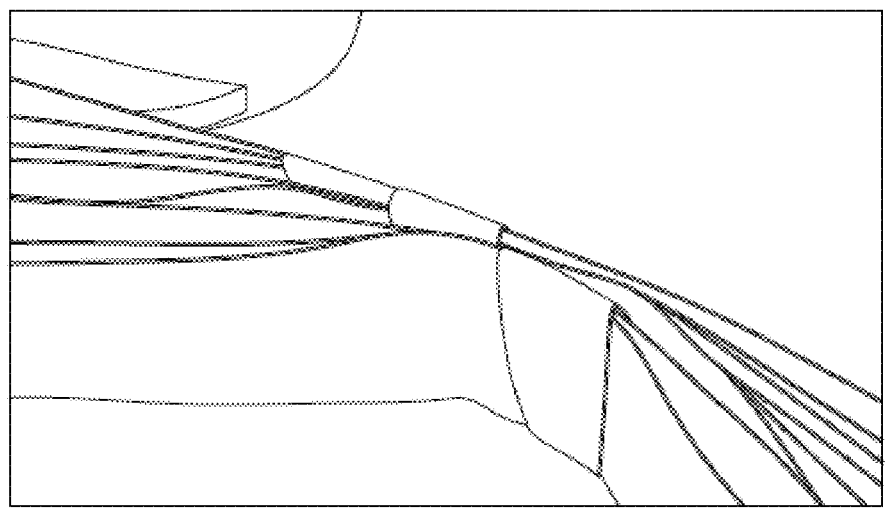

FIG. 67 shows the folding concept in accordance with various embodiments demonstrated on a 1 m×1 m, 50 µm thick Mylar membrane with 11 strips per quadrant. Packaged, it occupies a cylinder of 51 mm diameter and 40 mm height. This membrane model was constructed by laser-cutting slits in a Mylar film. As shown, the slits are interrupted by continuous ligaments between the strips. These ligaments are 1 mm wide and allow for slip between the strips, but can still transfer tension between strips. As described, similar ligament structures may be used in accordance with embodiments of a full-scale spacecraft module to connect adjacent strips. Although not shown in FIG. 67, in some embodiments the individual arms of the folded module may be held together via a releasable means (e.g., via loops, straps, clips etc.) after folding, as shown in FIG. 68.

As previously discussed, the use of slipping folds allows for the implementation of this fold pattern. Without slipping folds, this method of packaging does not allow for the accommodation of the thickness of the strips being folded. Although there are other ways to accommodate thickness in this fold pattern, such as, for example, the use of curved crease lines, such curved creases are not favorable, since they would disrupt the ability to provide a regular placement of tiles on the strips. By contrast, slipping folds allow for adjacent strips to slide past each other, accounting for the different radii of the strips in the wrapped configuration.

Figure 69C:
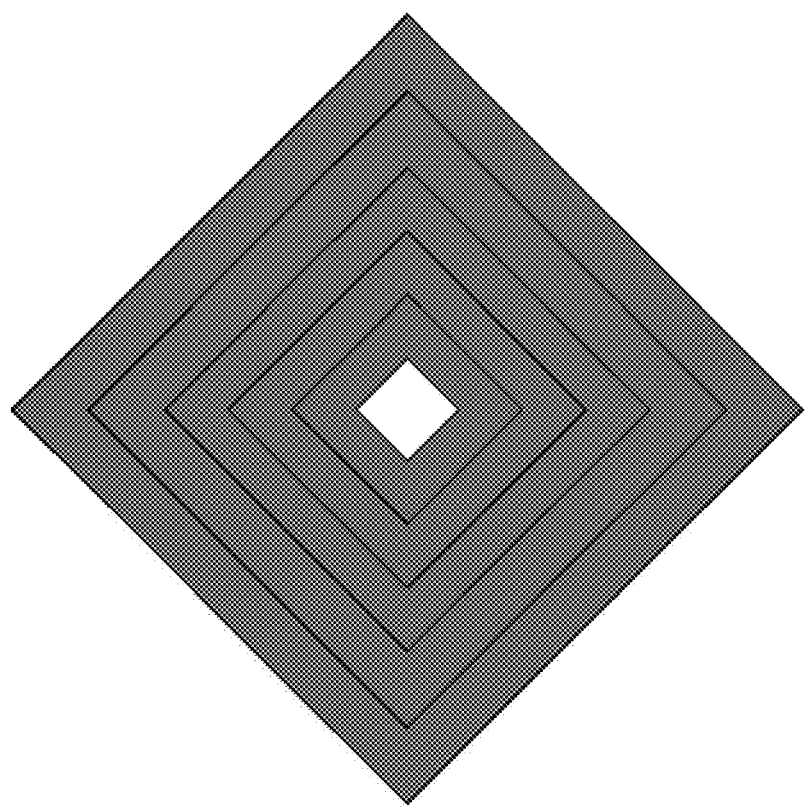
FIGS. 69a to 69c conceptually illustrate a gated deployment mechanism according to embodiments.
Figure 69B:
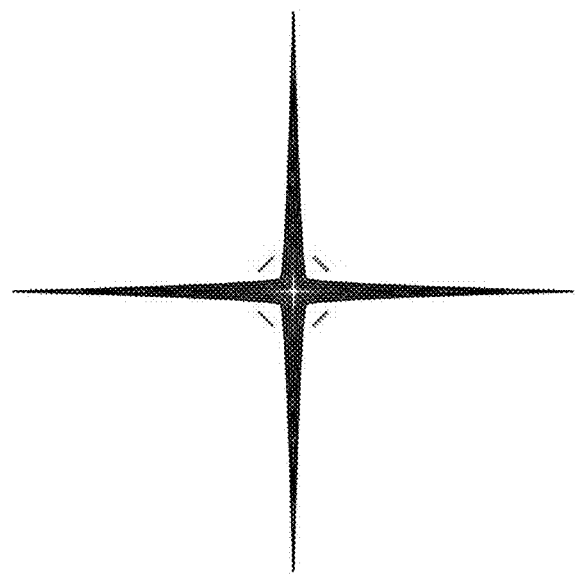
Figure 69A:
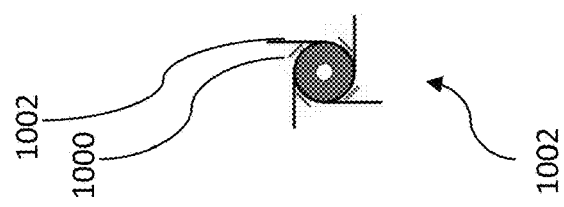

The presence of vertices in the non-parabolic module embodiments results in the need for different deployment techniques for the module. In particular, the presence of vertices results in the need to deploy (i.e., unfold) the various strips or sections of power generating tiles in a synchronized manner. However, it is preferable to deploy the outermost strips or sections of tiles last. Accordingly, in many embodiments mechanisms are provided to control or gate the deployment of the strips or sections of the module such that they are deployed sequentially. One such embodiment of a gated deployment mechanism is provided in FIG. 69. As shown, in such an embodiment a gates (1000) are provided between each of the arms (1002) of the wrapped module (1004). During deployment the gates (1000) prevent the sections from deploying until the arms are fully unrolled (as shown in FIG. 69b). And then the gates (1000) would be released allowing the various sections to be deployed in concert (as shown in FIG. 69c).

Figure 70A:
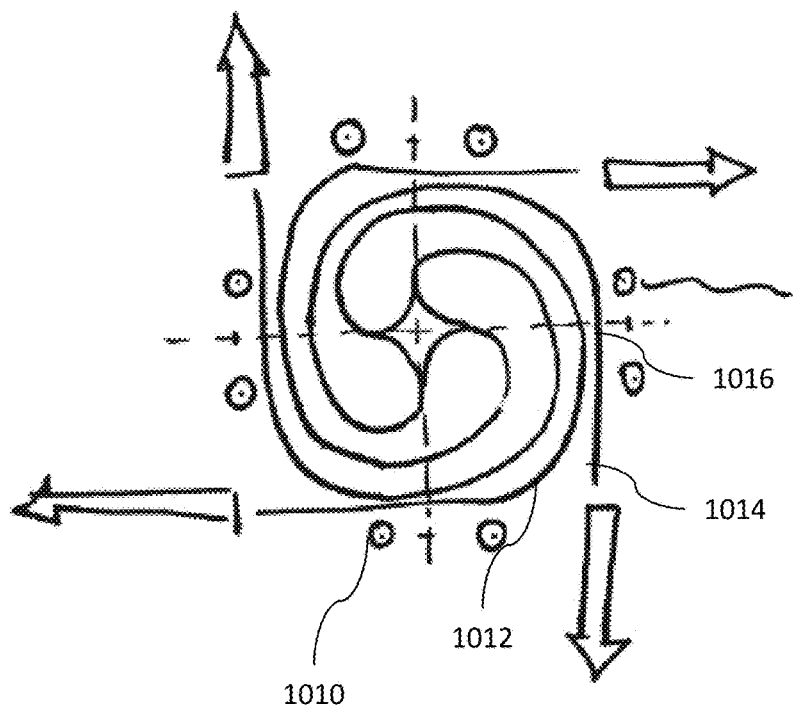
FIGS. 70a to 70f conceptually illustrate a roller deployment mechanism according to embodiments.
Figure 70B:
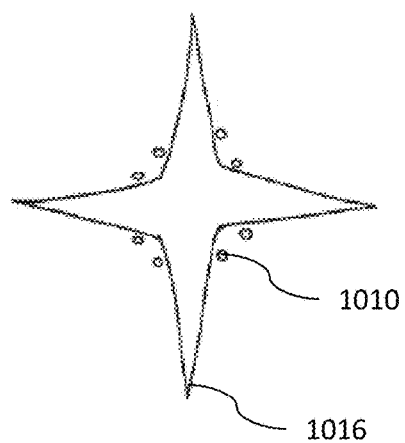
Figure 70C:
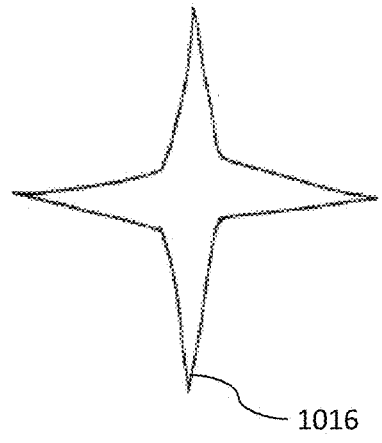
Figure 70D:
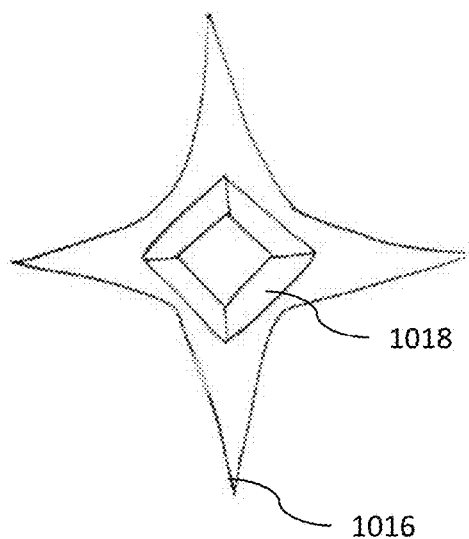
Figure 70E:
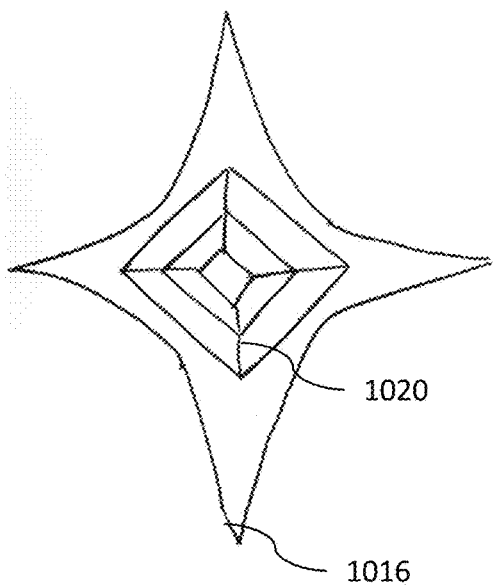
Figure 70F:
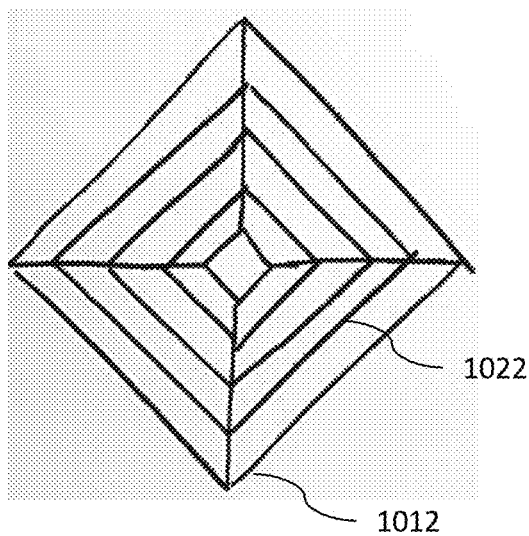
Figure 71:
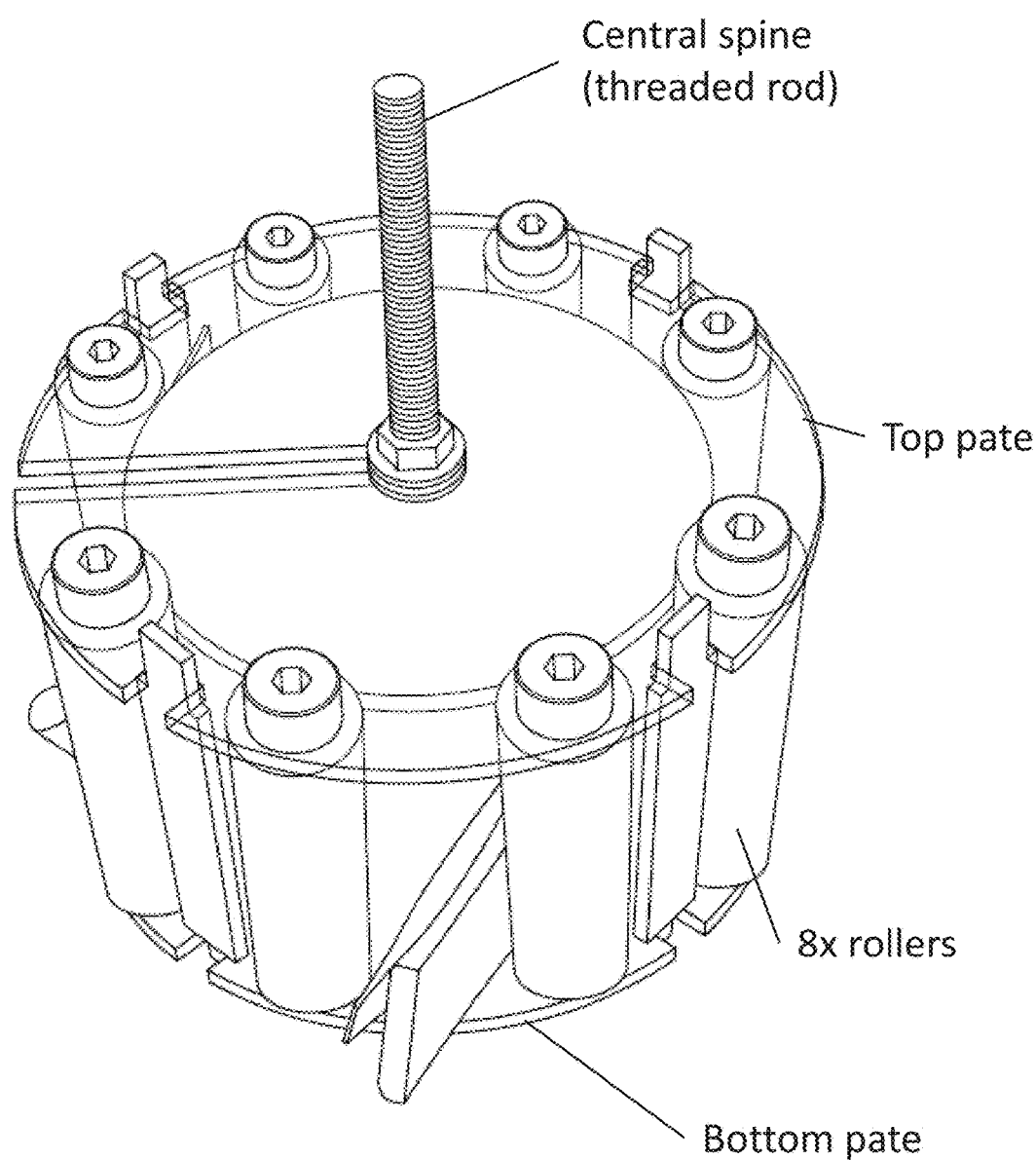
FIG. 71 provides an imaged of an exemplary roller deployment mechanism according to an embodiment.

An alternative method of deploying such a non-parabolic module using rollers in accordance with various other embodiments is provided in FIGS. 70a to 70f. As shown in 70a, in such embodiments a plurality of rollers (1010) are disposed on the sides of the compacted module (1012). During deployment the ends (1014) of the various arms (1016) of the module are first unwrapped by extending outward. Once extended (as shown in FIG. 70b) the rollers (1010) are positioned on the inner portion of the extended arms (1016). Once the arms (1016) are extended the rollers (1010) can be disengaged (as shown in FIG. 70c). Once the rollers are removed the individual mountain folds may be deployed beginning with the inner mountain fold (1018) (as shown in FIG. 70d), followed by the middle folds (1020) (as shown in FIG. 70e), and lastly ending with the outer mountain fold (1022) (as shown in FIG. 70f). In this manner the entire module (1012) can be unwrapped and unfolded in a sequential manner. An exemplary embodiment of an apparatus incorporating the roller design is provided in FIG. 71.

Utilizing the above design parameters, structures and methods, an exemplary spacecraft module can be designed. Accordingly, in many embodiments a spacecraft module having k=20 (i.e., 20 strips of 1.5 m width in a single quadrant), a diagonal cord tension T~3.84 N, and a strip bending stiffness $EI_{strip}$~10.78 Nm$^2$ is used. The mass of a 60 m×60 m module in such embodiments would be on the order of 368.89 kg, leading to an overall areal density of 102.47 gm$^2$. To achieve the desired strip bending stiffness of 10.78 Nm$^2$, the two longerons supporting the strip would each have a bending stiffness of half this value, i.e. ~5.39 Nm$^2$. Assuming a Young's modulus of 140 GPa (which is typical of common carbon fiber composites, a longeron cross-section with a flange radius of 10 mm and a flange thickness of 68.5 μm may be used. Likewise, a longeron flange thickness of 68.5 μm leads to a flattened longeron thickness of 137 μm. In embodiments where the flattened tiles and the flattened battens are thinner than the flattened longerons, the flattened strip thickness can be taken to be 137 μm. Since the length of the module in such embodiments is on the order of 60 m, the length-to-thickness ratio is $10^{5.64}$. The minimum radius can be calculated from the calculations of the bend radius previously described. The longerons are assumed to have a uniaxial strain limit of 1%, with an additional factor of safety of 2 against material failure, thus the maximum strain limit would be on the order of 0.5%. As described in relation to FIG. 23b, the packaging efficiency of an exemplary structure with the above parameters would be ~95.6%. Similarly, the packaged dimensions of the spacecraft module can be estimated using a kinematic model: a cylinder with diameter of 0.46 m and a height of 1.50 m. In this packaged form, the maximum slip can be estimated to be 16.8 mm. This informs the design of the longerons, as they must be able to provide this degree of slip. The final result of such an exemplary embodiment is an ultra lightweight spacecraft module that measures in a deployed form 60 m×60 m, has a mass of 369 kg (of which 288 kg, or 78%, is the tile mass), and can package into a compact cylindrical form.

While particular embodiments and applications of the present invention have been illustrated and described herein, it is to be understood that the invention is not limited to the precise construction and components disclosed herein and that various modifications, changes, and variations may be made in the arrangement, operation, and details of the methods and apparatuses of the present invention without departing from the spirit and scope of the invention as it is defined in the appended claims.

What is claimed is:

1. A space-based solar power station comprising:
   a plurality of unconnected compactible satellite modules disposed in space in an orbital array formation, wherein each of the compactible satellite modules comprises:
   a plurality of moveably interconnected structural elements such that the dimensional extent of the satellite modules in at least one axis is compactible;
   a plurality of power generation tiles disposed on each of the plurality of moveably interconnected structural elements such that the plurality of power generation tiles are disposed between the structural elements thereby forming a plurality of strips disposed parallel to each other, each of the power generation tiles having at least one photovoltaic cell and at least one power transmitter collocated thereon, the at least one photovoltaic cell and power transmitter in signal communication such that an electrical current generated by the collection of solar radiation by the at least one photovoltaic cell powers the at least one power transmitter, and where each of the at least one power transmitters comprises:
   an antenna, and
   control electronics that controls the phase of a radio frequency power signal that feeds the antenna so that the power transmitter is coordinated with power transmitters on other power generation tiles to form a phased array; and wherein an external perimeter of each of the modules is formed from the plurality of parallel strips and has straight edges such that the module defines a straight-edged geometric shape.

2. The space-based solar power station of claim 1, wherein the plurality of structural elements have a finite thickness and are foldable relative to each other by slip-folding.

3. The space-based solar power station of claim 2, wherein the plurality of structural elements fold relative to each other via alternating mountain and valley folds.

4. The space-based solar power station of claim 3, wherein the fold between the innermost structural elements is a mountain fold.

5. The space-based power station of claim 2, wherein the folded movably interrelated elements are further compacted by wrapping.

6. The space-based solar power station of claim 1, wherein adjacent structural elements fold together along a fold axis and slip a predetermined distance relative to each other along the fold axis, and wherein at least the edges of the structural elements transverse to the fold axis are continuously interconnected.

7. The space-based solar power station of claim 6, wherein material voids are formed along at least portions of the fold axis between the adjacent structural elements.

8. The space-based solar power station of claim 7, further comprising one or more interconnections that bridge the material voids.

9. The space-based solar power station of claim 7, wherein the interconnections comprise one or both ligament folds or hinges.

10. The space-based solar power station of claim 7, wherein the interconnections are one or more hinges selected from the group consisting of latchable, frictionless, and slippage.

11. The space-based solar power station of claim 5, wherein the plurality of moveably interconnected structural elements are configured to fold along the plurality of fold axes into a stack of a plurality of structural elements compacted along an axis transverse to the fold axis.

12. The space-based solar power station of claim 11, wherein the stack of a plurality of moveably interconnected structural elements is wrappable into a curved structure having a bend radius at which permanent deformation of the plurality of moveably interconnected structural elements is prevented.

13. The space-based solar power station of claim 12, wherein the bend radius does not exceed a minimum bend radius $R_{min}$ given by:

$$\frac{1}{R_{min}} = \frac{2\sigma_y}{Eh}$$

where h is the thickness of the individual structural elements, E is the material modulus of the structural elements, and $\sigma_y$ yield stress of the structural elements.

14. The space-based solar power station of claim 12, wherein the longitudinal ends of the stack of a plurality of structural elements undergo no slip during wrapping.

15. The space-based power station of claim 1, wherein the structural elements are prestressed such that a tensional force is distributed thereacross, the tensional force being sufficient to resist spatial deformation of the plane of the satellite module.

16. The space-based power station of claim 15, wherein the prestress tension is distributed across the structural elements by one or more stabilizing boom arms.

17. The space-based power station of claim 15, wherein the prestress tension is distributed across the structural elements by one or more weighted elements being subject to a centrifugal force applied by the rotation of the satellite module.

18. The space-based power station of claim 15, wherein adjacent structural elements are interconnected through slip-folds, and wherein the prestress tension is distributed anisotropically across the plurality of structural elements such that the tension applied along the slip-fold axis is much greater than the tension applied transverse to the slip-fold axis.

19. The space-based power station of claim 18, wherein the edges of the structural elements transverse to the slip-fold axis are continuously interconnected, and wherein the prestress tension is distributed to the plurality of structural elements through the edges of the structural elements.

20. The space-based power station of claim 15, wherein the structural elements comprise an outer supportive frame through which the prestress tension is applied, and wherein the power generation tiles are disposed within the outer supportive frame such that no prestress tension is distributed into the power generation tiles.

21. The space-based power station of claim 1, further comprising a deployment mechanism engageable with the plurality of structural elements to apply a force thereto such that the elements are moved relative to each other on application of the force.

22. The space-based power station of claim 21, wherein the deployment mechanism comprises one or more elongatable booms.

23. The space-based power station of claim 1, wherein the structural elements are comprised of a pair of parallel disposed longerons having a plurality of power generation tiles disposed therebetween.

* * * * *